(12) United States Patent
Teig et al.

(10) Patent No.: US 6,957,411 B1
(45) Date of Patent: *Oct. 18, 2005

(54) GRIDLESS IC LAYOUT AND METHOD AND APPARATUS FOR GENERATING SUCH A LAYOUT

(75) Inventors: Steven Teig, Menlo Park, CA (US); Andrew Caldwell, Santa Clara, CA (US); Etienne Jacques, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 315 days.

This patent is subject to a terminal disclaimer.

(21) Appl. No.: 10/229,108

(22) Filed: Aug. 26, 2002

Related U.S. Application Data

(63) Continuation-in-part of application No. 09/681,775, filed on Jun. 3, 2001, now Pat. No. 6,711,727, and a continuation-in-part of application No. 10/066,094, filed on Jan. 31, 2002, and a continuation-in-part of application No. 10/066,060, filed on Jan. 31, 2002, and a continuation-in-part of application No. 10/066,160, filed on Jan. 31, 2002, and a continuation-in-part of application No. 10/066,095, filed on Jan. 31, 2002, and a continuation-in-part of application No. 10/066,047, filed on Jan. 31, 2002, and a continuation-in-part of application No. 10/061,641, filed on Jan. 31, 2002, and a continuation-in-part of application No. 10/062,995, filed on Jan. 31, 2002, now Pat. No. 6,859,916, and a continuation-in-part of application No. 10/066,102, filed on Jan. 31, 2002, and a continuation-in-part of application No. 10/066,187, filed on Jan. 31, 2002, now Pat. No. 6,877,146, and a continuation-in-part of application No. 10/076,121, filed on Feb. 12, 2002, now Pat. No. 6,829,757, and a continuation of application No. 10/215,563, filed on Aug. 9, 2002.

(60) Provisional application No. 60/396,571, filed on Jul. 15, 2002, provisional application No. 60/388,518, filed on Jun. 12, 2002, provisional application No. 60/385,975, filed on Jun. 4, 2002, provisional application No. 60/351,459, filed on Jan. 22, 2002.

(51) Int. Cl.$^7$ .................. G06F 17/50; G06F 19/00; G03F 9/00
(52) U.S. Cl. .................. 716/13; 716/14; 716/9; 716/10; 716/21; 700/121; 430/5; 378/35
(58) Field of Search .................. 716/13, 14, 9, 716/10, 21; 700/121; 430/5; 378/35, 5

(56) References Cited

U.S. PATENT DOCUMENTS 4,615,011 A 9/1986 Linsker (Continued)

FOREIGN PATENT DOCUMENTS

JP 64-15947 1/1989 ........... H01L 21/82

(Continued)

OTHER PUBLICATIONS

Cho J.D., Wiring Space and Length Estimation in Two-Dimensional Arrays, May 2000, Computer-Aided Design of Integrated Circuits and Systems, IEEE Transactions on, vol. 19, Iss. 5, pp. 612-615.

(Continued)

*Primary Examiner*—Matthew Smith
*Assistant Examiner*—Phallaka Kik
(74) *Attorney, Agent, or Firm*—Stattler, Johansen & Adeli LLP

(57) ABSTRACT

Some embodiments of the invention provide a method of routing nets in a region of an integrated-circuit ("IC") layout. The method selects a net that has several routable elements. It then defines a route for the net. To define the route, the method uses a wiring model that specifies preferred non-Manhattan wiring directions. It also uses a manufacturing grid as the only grid for constraining the location of interconnect lines for connecting the net's routable elements.

31 Claims, 79 Drawing Sheets

U.S. PATENT DOCUMENTS

| | | | |
|---|---|---|---|
| 4,673,966 A | 6/1987 | Shimoyama | |
| 4,777,606 A | 10/1988 | Fournier | |
| 4,782,193 A | 11/1988 | Linsker | |
| 4,855,929 A | 8/1989 | Nakajima | |
| 5,097,422 A * | 3/1992 | Corbin et al. | 716/8 |
| 5,224,057 A | 6/1993 | Igarashi et al. | |
| 5,341,310 A * | 8/1994 | Gould et al. | 716/13 |
| 5,355,318 A * | 10/1994 | Dionnet et al. | 700/120 |
| 5,360,948 A | 11/1994 | Thornberg | |
| 5,375,069 A | 12/1994 | Satoh et al. | |
| 5,532,934 A | 7/1996 | Rostoker | |
| 5,552,996 A * | 9/1996 | Hoffman et al. | 700/121 |
| 5,578,840 A | 11/1996 | Scepanovic et al. | |
| 5,618,744 A | 4/1997 | Suzuki et al. | |
| 5,633,479 A | 5/1997 | Hirano | |
| 5,634,093 A | 5/1997 | Ashida et al. | |
| 5,635,736 A | 6/1997 | Funaki et al. | |
| 5,636,125 A | 6/1997 | Rostoker et al. | |
| 5,637,920 A | 6/1997 | Loo | |
| 5,650,653 A | 7/1997 | Rostoker et al. | |
| 5,657,242 A | 8/1997 | Sekiyama et al. | |
| 5,659,484 A | 8/1997 | Bennett et al. | |
| 5,663,891 A | 9/1997 | Bamji et al. | |
| 5,717,600 A | 2/1998 | Ishizuka | |
| 5,723,908 A | 3/1998 | Fuchida et al. | |
| 5,742,086 A | 4/1998 | Rostoker et al. | |
| 5,757,089 A | 5/1998 | Ishizuka | |
| 5,757,656 A | 5/1998 | Hershberger et al. | |
| 5,777,360 A | 7/1998 | Rostoker et al. | |
| 5,811,863 A | 9/1998 | Rostoker et al. | |
| 5,822,214 A | 10/1998 | Rostoker et al. | |
| 5,838,583 A | 11/1998 | Varadarajan et al. | |
| 5,856,927 A | 1/1999 | Greidinger et al. | |
| 5,859,449 A | 1/1999 | Kobayashi et al. | |
| 5,877,091 A | 3/1999 | Kawakami | |
| 5,880,969 A | 3/1999 | Hama et al. | |
| 5,889,329 A | 3/1999 | Rostoker et al. | |
| 5,889,677 A | 3/1999 | Yasuda et al. | |
| 5,898,597 A | 4/1999 | Scepanovic et al. | |
| 5,914,887 A | 6/1999 | Scepanovic et al. | |
| 5,973,376 A | 10/1999 | Rostoker et al. | |
| 5,980,093 A | 11/1999 | Jones et al. | |
| 6,006,024 A | 12/1999 | Guruswamy et al. | |
| 6,035,108 A | 3/2000 | Kikuchi | |
| 6,038,383 A | 3/2000 | Young et al. | |
| 6,058,254 A | 5/2000 | Scepanovic et al. | |
| 6,067,409 A | 5/2000 | Scepanovic et al. | |
| 6,068,662 A | 5/2000 | Scepanovic et al. | |
| 6,088,519 A | 7/2000 | Koford | |
| 6,110,222 A | 8/2000 | Minami et al. | |
| 6,111,756 A | 8/2000 | Moresco | |
| 6,123,736 A | 9/2000 | Pavisic et al. | |
| 6,128,767 A | 10/2000 | Chapman | |
| 6,150,193 A | 11/2000 | Glenn | |
| 6,154,873 A | 11/2000 | Takahashi | |
| 6,154,874 A | 11/2000 | Scepanovic et al. | |
| 6,155,725 A | 12/2000 | Scepanovic et al. | |
| 6,166,441 A | 12/2000 | Geryk | |
| 6,175,950 B1 | 1/2001 | Scepanovic et al. | |
| 6,209,123 B1 | 3/2001 | Maziasz et al. | |
| 6,216,252 B1 | 4/2001 | Dangelo et al. | |
| 6,219,823 B1 | 4/2001 | Hama et al. | |
| 6,219,832 B1 | 4/2001 | Buzbee | |
| 6,226,560 B1 | 5/2001 | Hama et al. | |
| 6,230,306 B1 | 5/2001 | Raspopovic et al. | |
| 6,247,167 B1 | 6/2001 | Raspopovic et al. | |
| 6,247,853 B1 | 6/2001 | Papadopoulou et al. | |
| 6,253,363 B1 | 6/2001 | Gasanov et al. | |
| 6,260,179 B1 | 7/2001 | Ohsawa et al. | |
| 6,262,487 B1 | 7/2001 | Igarashi et al. | |
| 6,286,128 B1 | 9/2001 | Pileggi et al. | |
| 6,289,495 B1 | 9/2001 | Raspopovic et al. | |
| 6,295,634 B1 | 9/2001 | Matsumoto | |
| 6,301,686 B1 | 10/2001 | Kikuchi et al. | |
| 6,307,256 B1 | 10/2001 | Chiang et al. | |
| 6,316,838 B1 | 11/2001 | Ozawa et al. | |
| 6,324,674 B2 | 11/2001 | Andreev et al. | |
| 6,324,675 B1 | 11/2001 | Dutta et al. | |
| 6,327,693 B1 | 12/2001 | Cheng et al. | |
| 6,327,694 B1 | 12/2001 | Kanazawa et al. | |
| 6,330,707 B1 | 12/2001 | Shinomiya et al. | |
| 6,349,403 B1 | 2/2002 | Dutta et al. | |
| 6,378,121 B2 | 4/2002 | Hiraga | |
| 6,385,758 B1 | 5/2002 | Kikuchi et al. | |
| 6,401,234 B1 | 6/2002 | Alpert et al. | |
| 6,405,358 B1 | 6/2002 | Nuber | |
| 6,407,434 B1 | 6/2002 | Rostoker et al. | |
| 6,412,097 B1 | 6/2002 | Kikuchi et al. | |
| 6,412,102 B1 | 6/2002 | Andreev et al. | |
| 6,415,427 B2 | 7/2002 | Nitta et al. | |
| 6,434,730 B1 | 8/2002 | Ito et al. | |
| 6,436,804 B2 | 8/2002 | Igarashi et al. | |
| 6,442,745 B1 | 8/2002 | Arunachalam et al. | |
| 6,448,591 B1 | 9/2002 | Juengling | |
| 6,463,575 B1 | 10/2002 | Takahashi | |
| 6,473,891 B1 | 10/2002 | Shively | |
| 6,490,707 B1 * | 12/2002 | Baxter | 716/2 |
| 6,490,713 B2 | 12/2002 | Matsumoto | |
| 6,505,331 B1 | 1/2003 | Bracha et al. | |
| 6,519,751 B2 | 2/2003 | Sriram et al. | |
| 6,526,555 B1 * | 2/2003 | Teig et al. | 716/11 |
| 6,543,043 B1 | 4/2003 | Wang et al. | |
| 6,546,540 B1 | 4/2003 | Igarashi et al. | |
| 6,557,145 B2 | 4/2003 | Boyle et al. | |
| 6,567,967 B2 | 5/2003 | Greidinger et al. | |
| 6,586,281 B1 | 7/2003 | Gabara et al. | |
| 6,601,227 B1 | 7/2003 | Trimberger | |
| 6,609,237 B1 | 8/2003 | Hamawaki et al. | |
| 6,645,842 B2 | 11/2003 | Igarashi et al. | |
| 6,656,644 B2 | 12/2003 | Hasegawa et al. | |
| 6,711,727 B1 * | 3/2004 | Teig et al. | 716/12 |
| 6,769,105 B1 * | 7/2004 | Teig et al. | 716/12 |
| 6,829,757 B1 * | 12/2004 | Teig et al. | 716/12 |
| 6,859,916 B1 * | 2/2005 | Teig et al. | 716/13 |
| 2001/0003843 A1 | 6/2001 | Scepanovic et al. | |
| 2001/0038612 A1 | 11/2001 | Vaughn et al. | |
| 2002/0043988 A1 | 4/2002 | Or-Bach et al. | |
| 2002/0100009 A1 | 7/2002 | Xing et al. | |
| 2002/0104061 A1 | 8/2002 | Xing et al. | |
| 2002/0107711 A1 | 8/2002 | Xing et al. | |
| 2002/0170029 A1 * | 11/2002 | Sriram et al. | 716/13 |
| 2002/0174413 A1 | 11/2002 | Tanaka | |
| 2002/0182844 A1 | 12/2002 | Igarashi et al. | |
| 2003/0005399 A1 | 1/2003 | Igarashi et al. | |
| 2003/0009737 A1 | 1/2003 | Xing | |
| 2003/0014725 A1 | 1/2003 | Sato et al. | |
| 2003/0025205 A1 | 2/2003 | Shively | |
| 2003/0051217 A1 * | 3/2003 | Cheng | 716/5 |
| 2003/0121017 A1 | 6/2003 | Andreev et al. | |
| 2003/0121018 A1 * | 6/2003 | Leung et al. | 716/12 |
| 2003/0188281 A1 | 10/2003 | Xing et al. | |
| 2004/0044979 A1 | 3/2004 | Aji et al. | |
| 2004/0088670 A1 | 5/2004 | Stevens et al. | |
| 2004/0157137 A1 * | 8/2004 | Juengling et al. | 430/5 |

FOREIGN PATENT DOCUMENTS

| | | | |
|---|---|---|---|
| JP | 02-262354 | 10/1990 | |
| JP | 03-173471 | 7/1991 | H01L 27/118 |
| JP | 04-000677 | 1/1992 | G06F 15/60 |
| JP | 05-102305 | 4/1993 | H01L 21/82 |
| JP | 05-243379 | 9/1993 | H01L 21/82 |
| JP | 07-086407 | 3/1995 | H01L 21/82 |
| JP | 09-162279 | 6/1997 | H01L 21/768 |

| JP | 11-296560 | 10/1999 | G06F 17/50 |
|---|---|---|---|
| JP | 2000-082743 | 3/2000 | H01L 21/82 |

OTHER PUBLICATIONS

Cong J. et al., DUNE—A Multilayer Gridless Routing System, May 2001, IEEE Transactions on Computer-Aided Design of Integrated Circuits and Systems, vol. 20, iss. 5, pp. 633-647.

Dion J. et al., Contour: A Tile-based Gridless Router, Mar. 1995, Digital Western Research Laboratory, research Report 95-3, pp. 1-22.

Schulz U., Hierarchical Physical Design System, CompEuro '89, VLSI and Computer Peripherals. VSLI and Microelectronic Applications in Intelligent Peripherals and their Interconnection Networks. Proceedings, May 8-12, 1989, pp. 5/20-5/24.

Tseng H-P. et al., A Gridless Multilayer Router for Standard Cell Circuits Using CTM Cells, Oct. 1999, IEEE Transactions on Computer-Aided Design of Integrated Circuits and Systems, vol. 18, iss. 10, pp. 1462-1479.

U.S. Appl. No. 10/066,060, filed Jan. 31, 2002, Steven Teig, Per the preliminary amendment dated May 30, 2003, the present application is a CIP of this application.

U.S. Appl. No. 10/066,160, filed Jan. 31, 2002, Steven Teig et al., Per the preliminary amendment dated May 30, 2003, the present application is a CIP of this application.

U.S. Appl. No. 10/066,095, filed Jan. 31, 2002, Steven Teig et al., Per the preliminary amendment dated May 30, 2003, the present application is a CIP of this application.

U.S. Appl. No. 10/066,047, filed Jan. 31, 2002, Steven Teig et al., Per the preliminary amendment dated May 30, 2003, the present application is a CIP of this application.

U.S. Appl. No. 10/061,641, filed Jan. 31, 2002, This application has the same specification and drawings (with the exception of the claims, summary, and abstract) as U.S. Appl. Nos. 10/066,060, 10/066,160, 10/066,095, 10/066,047, 10/066,094, 10/062,995, 10/066,102, and 10/066,187.

U.S. Appl. No. 10/066,094, filed Jan. 31, 2002, Steven Teig et al., Per the preliminary amendment dated May 30, 2003, the present application is a CIP of this application.

U.S. Appl. No. 10/076,121, filed Feb. 12, 2002, Steven Teig, Per the preliminary amendment dated May 30, 2003, the present application is a CIP of this application.

U.S. Appl. No. 10/062,995, filed Jan. 31, 2002, Steven Teig et al., Per the preliminary amendment dated May 30, 2003, the present application is a CIP of this application.

U.S. Appl. No. 10/066,102, filed Jan. 31, 2002, Steven Teig, Per the preliminary amendment dated May 30, 2003, the present application is a CIP of this application.

U.S. Appl. No. 10/066,187, filed Jan. 31, 2002, Steven Teig et al., Per the preliminary amendment dated May 30, 2003, the present application is a CIP of this application.

U.S. Appl. No. 10/228,736, filed Aug. 26, 2002, Steven Teig, Continuation of U.S. Appl. No. 10/215,563, which is a parent application to the present application.

U.S. Appl. No. 10/229,311, filed Aug. 26, 2002, Steven Teig, Continuation of U.S. Appl. No. 10/215,563, which is a parent application to the present application.

U.S. Appl. No. 10/215,563, filed Aug. 9, 2002, Steven Teig, The present application is a continuation of this application.

U.S. Appl. No. 10/215,896, filed Aug. 9, 2002, Steven Teig, Application with similar specification and drawings as the present application but with less material.

U.S. Appl. No. 10/219,675, filed Aug. 14, 2002, Steven Teig, Continuation of U.S. Appl. No 10/215,896.

U.S. Appl. No. 10/219,608, filed Aug. 14, 2002, Steven Teig, Continuation of U.S. Appl. No. 10/215,896.

U.S. Appl. No. 10/233,202, filed Aug. 28, 2002, Steven Teig, Continuation of U.S. Appl. No. 10/215,896.

U.S. Appl. No. 10/229,196, filed Aug. 26, 2002, Steven Teig, Continuation of U.S. Appl. No. 10/215,563, which is a parent application to the present application.

U.S. Appl. No. 10/288,870, filed Nov. 6, 2002, Steven Teig, Continuation of U.S. Appl. No. 10/076,121, which is a parent application of the present application.

U.S. Appl. No. 10/219,923, filed Aug. 14, 2002, Steven Teig, Continuation of U.S. Appl. No. 10/215,896.

U.S. Appl. No. 10/286,254, filed Oct. 31, 2002, Steven Teig, Continuation of U.S. Appl. No. 10/215,896.

U.S. Appl. No. 10/219,706, filed Aug. 14, 2002, Steven Teig, Continuation of U.S. Appl. No. 10/215,896.

U.S. Appl. No. 10/231,423, filed Aug. 28, 2002, Steven Teig, Continuation of U.S. Appl. No. 10/215,896.

U.S. Appl. No. 10/230,503, filed Aug. 28, 2002, Steven Teig, Continuation of U.S. Appl. No. 10/215,896.

U.S. Appl. No. 10/222,088, filed Aug. 14, 2002, Steven Teig, Continuation of U.S. Appl. No. 10/215,896.

U.S. Appl. No. 10/228,679, filed Aug. 26, 2002, Steven Teig, Continuation of U.S. Appl. No. 10/215,563, which is a parent application to the present application.

U.S. Appl. No. 10/229,202, filed Aug. 26, 2002, Steven Teig, Continuation of U.S. Appl. No. 10/215,563, which is a parent application to the present application.

U.S. Appl. No. 10/229,170, filed Aug. 26, 2002, Steven Teig, Continuation of U.S. Appl. No. 10/215,563, which is a parent application to the present application.

U.S. Appl. No. 10/286,630, filed Oct. 31, 2002, Steven Teig, Continuation of U.S. Appl. No. 10/215,563, which is a parent application to the present application.

U.S. Appl. No. 10/230,504, filed Aug. 28, 2002, Steven Teig, Continuation of U.S. Appl. No. 10/215,563, which is a parent application to the present application.

U.S. Appl. No. 10/215,923, filed Aug. 9, 2002, Steven Teig, Application regarding a path search technology described in the present application.

U.S. Appl. No. 10/226,483, filed Aug. 23, 2002, Steven Teig, Continuation of U.S. Appl. No. 10/215,923.

U.S. Appl. No. 10/226,774, filed Aug. 23, 2002, Steven Teig, Continuation of U.S. Appl. No. 10/215,923.

U.S. Appl. No. 10/232,795, filed Aug. 28, 2002, Steven Teig, Continuation of U.S. Appl. No. 10/215,923.

U.S. Appl. No. 10/231,369, filed Aug. 28, 2002, Steven Teig, Continuation of U.S. Appl. No. 10/215,923.

U.S. Appl. No. 10/233,312, filed Aug. 28, 2002, Steven Teig, Continuation of U.S. Appl. No. 10/215,923.

U.S. Appl. No. 10/227,016, filed Aug. 23, 2002, Steven Teig, Continuation of U.S. Appl. No. 10/215,923.

U.S. Appl. No. 10/226,482, filed Aug. 23, 2002, Steven Teig, Continuation of U.S. Appl. No. 10/215,923.

U.S. Appl. No. 10/285,844, filed Oct. 31, 2002, Steven Teig, Continuation of U.S. Appl. No. 10/215,923.

U.S. Appl. No. 10/286,253, filed Oct. 31, 2002, Steven Teig, Continuation of U.S. Appl. No. 10/215,923.

U.S. Appl. No. 10/288,033, filed Nov. 5, 2002, Steven Teig, Continuation of U.S. Appl. No. 10/215,923.

U.S. Appl. No. 10/335,179, filed Dec. 31, 2002, Steven Teig, Continuation of U.S. Appl. No. 10/215,923.

U.S. Appl. No. 10/285,758, filed Oct. 31, 2002, Steven Teig, Continuation of U.S. Appl. No. 10/215,923.

U.S. Appl. No. 10/286,598, filed Oct. 31, 2002, Steven Teig, Continuation of U.S. Appl. No. 10/215,896.

U.S. Appl. No. 10/286,584, filed Oct. 31, 2002, Steven Teig, Continuation of U.S. Appl. No. 10/215,896.

U.S. Appl. No. 10/335,074, filed Dec. 31, 2002, Steven Teig et al., CIP of U.S. Appl. Nos. 10/215,923, 10/215,896, and 10/215,563.

U.S. Appl. No. 10/334,665, filed Dec. 31, 2002, Steven Teig et al., CIP of U.S. Appl. Nos. 10/215,923, and 10/215,896, and 10/215,563.

U.S. Appl. No. 10/335,243, filed Dec. 31, 2002, Steven Teig et al., CIP of U.S. Appl. Nos. 10/215,923, 10/215,896, and 10/215,563.

U.S. Appl. No. 10/335,062, filed Dec. 31, 2002, Steven Teig, CIP of U.S. Appl. Nos. 10/215,923, 10/215,896, and 10/215,563.

Chen, H.F. et al., A Faster Algorithm for Rubber-Band Equivalent Transformation for Planar VLSI Layouts, IEEE Transactions on Computer-Aided Design of Integrated Circuits and Systems, vol. 15, No. 2, Feb. 1996, pp. 217-227.

Chip Model with Wiring Cost Map, Aug. 1983, IBM Technical Disclosure Bulletin, vol. 26, issu. 3A, pp. 929-933.

Dayan, T. et al., Layer Assignment for Rubber Band Routing, UCSC-CRI-93-04, Jan. 20, 1993.

Dayan, T., Rubber-Band Based Topological Router, A Dissertation, UC Santa Cruz, Jun. 1997.

Dood, P. et al. A Two-Dimensional Topological Compactor with Octagonal Geometry, 28th ACM/IEEE Design Automation Conference, pp 727-731, Jul. 1991.

Fujimura, K. et al, Homotopic Shape Deformation, Ohio State University, 10 Pages, no date.

Hama, T. et al., Curvilinear Detailed Routing Algorithm and its Extension to Wire-Spreading and Wire-Fattening, IBM Japan, Ltd., 6 Pages, no date.

Hama, T. et al., Topological Routing Path Search Algorithm with Incremental Routability Test, IEEE Transactions on Computer-Aided Design of Integrated Circuits and Systems, vol. 18, No. 2, Feb. 1999, pp. 142-150.

Kobayashi, K. et al., A New Interactive Analog Layout Methodology based on Rubber-Band Routing, UCSC-CRL-96-12, Jun. 13, 1996, pp. 1-36.

Lim, A. et al, A Fast Algorithm To Test Planar Topological Routability, Technical Report 94-012, pp. 1-16, no date.

Lu, Y., Dynamic Constrained Delaunay Triangulation and Application to Multichip Module Layout, A Thesis for Master of Science, UC Santa Cruz, Dec. 1991, 54 Pages.

Maley, F.M., Testing Homotopic Routability Under Polygonal Wiring Rules, Algorithmica 1996, 15: 1-16.

Morton, P. B. et al., An Efficient Sequential Quadratic Programming Formulation of Optimal Wire Spacing for Cross-Talk Noise Avoidance Routing, UCSC-CRL-99-05, Mar. 10, 1999, 16 Pages.

NN71091316, Use of Relatively Diagonal And Rectangular Wiring Planes n Multilayer Packages, Sep. 1971, IBM Technical Disclosure Bulletin, vol. No. 14, Issue No. 4, pp. 1316-1317.

Staepelaere, D. et al., Geometric Transformations for a Rubber-Band Sketch, A Thesis for a Master of Science in Computer Engineering, UCSC, Sep. 1992.

Staepelaere, D. et al., Surf: A Rubber-Band Routing System for Multichip Modules, pp 18-26, 1993.

Su, J. et al., Post-Route Optimization for Improved Yield Using Rubber-Band Wiring Model, 1997 International Conference on Computer-Aided Design, pp 700-706, Nov. 1997.

Wei-Ming Dai, W. et al., Routability of a Rubber-Band Sketch. 28th ACM-IEEE Design Automation Conference, 1991. pp. 45-65.

Xing, Z. et al., A Minimum Cost Path Search Algorithm Through Tile Obstacles, slide presentation, Apr. 3, 2001, 15 Pages.

Xing, Z. et al., Shortest Path Search Using Tiles and Piecewise Linear Cost Propagation, IEEE, 2002, pp. 145-158.

Xu, A More Efficient Distance Vector Routing Algorithm, UCSC-CRL-96-18, Mar. 1997, pp. 1-8.

Yu, M.-F. et al., Fast and Incremental Routability Check of a Topological Routing Using a Cut-Based Encoding, UCSC-CRL-97-07, Apr. 14, 1997.

Yu, M.-F. et al., Interchangeable Pin Routing with Application to Package Layout, UCSC-CRL-96-10, Apr. 25, 1996.

Yu, M.-F. et al., Pin Assignment and Routing on a Single-Layer Pin Grid Array, UCSC-CRL-95-15, Feb. 24, 1995.

Yu, M.-F. et al., Planar Interchangeable 2-Terminal Routing, UCSC-CRL-95-49, Oct. 19, 1995, pp. 1-20.

Yu, M.-F. et al., Single-Layer Fanout Routing and Routability Analysis for Ball Grid Arrays, UCSC-CRL-95-18, Apr. 25, 1995, pp. 1-24.

Ahuja, R. et al., Faster Algorithms for the Shortest Path Problem, Journal of the Association for Computing Machinery, vol. 37, No. 2, Apr. 1990, pp. 213-223.

Alexander, M. et al., Performance-Oriented Placement and Routing for field-programmable gate arrays, Proceedings of the European Design Automation Conference, pp. 80-85, 1995.

Alexander, M. et al., Placement and Routing for Performance-Oriented FPGA Layout, VLSI Design, vol. 7, No. 1, 1998, pp. 1-24.

Andou, H. et al., Automatic Routing Algorithm for VLSI, 22nd Design Automation Conference, 1985, pp. 785-788.

Bagga, J. et al., Internal, External, and Mixed Visibility Edges of Polygons, pp. 1-20, no date.

Berger, B. et al., Nearly Optimal Algorithms and Bounds for Multilayer Channel Routing, Journal of the Association for Computing Machinery, pp. 500-542, Mar. 1995.

Brady, L. et al., Channel Routing on a 60° Grid, extended abstract, pp. 926-931, no date.

Carothers, K., A Method of Measuring Nets Routability for MCM's General Area Routing Problems, 1999, pp. 186-192.

Chen, D-S. et al., A Wire-Length Minimization Algorithm for Single-Layer Layouts, IEEE, 1992, pp. 390-393.

Chen et al., Optimal Algorithms for Bubble Sort Based Non-Manhattan Channel Routing, May 1994, Computer-Aided Design of Integrated Circuits and Systems, IEEE Transactions vol.: 13 Issues, pp. 603-609.

Chen, H., Routing L-Shaped Channels in Nonslicing-Structure Placement. 24th ACM-IEEE Design Automation Conference, pp. 152-165, 1987.

Chen, H. et al., Physical Planning of On-Chip Interconnect Architectures, 2002, IEEE, International Conference, pp. 30-35.

Chen, S.-S. et al., A New Approach to the Ball Grid Array Package Routing, IEICE Trans. Fundamentals, vol. E82-A, No. 11, Nov., 1999, pp. 2599-2608.

Cheng, K. et al., Manhattan of Non Manhattan? A Study of Alternative VLSI Routing Architectures, pp 47-52, 2000.

Cheng, K., Steiner Problem in Octilinear Routing Model, A Thesis submitted for the Degree of Master of Science, National University Singapore, 1995, pp. 1-122.

Chiang, C. et al., Wirability of Knock-Knee Layouts with 45° Wires, IEEE Transactions on Circuits and Systems, vol. 38, Issue 6, pp 613-624, Jun. 1991.

Cong, J. et al., Efficient Heuristics for the Minimum Shortest Path Steiner Arborescence Problem with Applications to VLSI Physical Design, Cadence Design Systems, pp. 88-95, ACM, 1997.

Cong, J. et al., Multilevel Approach to Full Chip Gridless Routing, Nov. 2001, IEEE, pp. 396-403.

Cong, J. et al., Performance Driven Multi-Layer General Routing for PCB/MCM Designs, UCLA Computer Science Department, 1998, pp. 356-361.

Das, S. et al., Channel Routing in Manhattan-Diagonal Model, 9th International Conference on VLSI Design, Jan. 1996. pp. 43-48.

Das, S. et al., Routing of L-Shaped Channels, Switchboxes and Staircases in Manhattan-Diagonal Model, pp. 65-70, Jan. 1998.

Enbody, R. et al., Near-Optimal n-Layer Channel Routing, 23rd Design Automation Conference, 1986, pp. 708-714.

Finch, A.C. et al., A Method for Gridless Routing of Printed Circuit Boards, 22nd Design Automation Conference, 1985 ACM, pp. 509-515.

Gao, S. et al., Channel Routing of Multiterminal Nets, Journal of the Association for Computing Machinery, vol. 41, No. 4, Jul. 1994, pp. 791-818.

Gao, T. et al., Minimum Crosstalk Channel Routing, pp. 692-696, 1993 IEEE.

Gao, T. et al., Minimum Crosstalk Switchbox Routing, pp. 610-615, 1994 ACM.

Gonzalez, T. et al., A Linear Time-Algorithm for Optimal Routing, Journal of the Association for Computing Machinery, vol. 35, No. 4, Oct. 1988, pp. 810-831.

Guibas, L. et al., Optimal Shortest Path Queries in a Simple Polygon, 1987 ACM, pp. 50-63.

Hachtel, G.D. et al., Linear Complexity Algorithms for Hierarchical Routing, Jan. 1989, IEEE pp 64-80.

Hershberger, J., Efficient Breakout Routing in Printed Circuit Boards, Computational Geometry, 1997, ACM, pp. 460-462.

Hershberger, J., Finding the Visibility Graph of a Simple Polygon in Time Proportional to its Size, Preliminary Version, 1987 ACM, pp. 11-20.

Hightower, D., A Solution to Line-Routing Problems on the Continuous Plane, Bell Laboratories, Inc., pp. 11-34, no date.

Iso, N. et al., Efficient Routability Checking for Global Wires in Planar Layouts, IEICE Trans. Fundamentals, vol. E80-A, No. 10 Oct. 1997, pp. 1878-1882.

Khoo, K. et al., An Efficient Multilayer MCM Router Based on Four-Via Routing, 30th ACM/IEEE Design Automation Conference, 1993, pp. 590-595.

Ladage, L. et al., Resistance Extraction Using a Routing Algorithm, 30th ACM/IEEE Design Automation Conference, 1993, pp. 38-42.

Leach, G., Improving Worst-case Optimal Delaunay Triangulation Algorithms, Department of Computer Science, Jun. 15, 1992, pp. 1-7.

Leiserson, C. et al., Algorithms for Routing and Testing Routability of Planar VLSI Layouts, pp. 69-78, May 1985.

Lillis, J. et al., New Performance Driven Routing Techniques With Explicit Area/Delay Tradeoff and Simultaneous Wire Sizing, 33rd Design Automation Conference, 1996, 6 Pages.

Lipski, W. et al., A Unified Approach to Layout Wirability, Mathematical Systems Theory, 1987, pp. 189-203.

Lodi, E. et al., A 2d Channel Router for the Diagonal Model, pp. 111-125, Apr. 1991, Elsevier Science Publishers B.V.

Lodi, E. et al., A Preliminary Study of a Diagonal Channel-Routing Model, Algorithmica, 1989, pp. 585-597.

Lodi, E. et al., Lecture Notes in Computer Science, A 4d Channel router for a two layer diagonal model, pp. 464-476, Jul. 1988.

Lodi, E. et al., Routing in Times Square Mode, pp. 41-48, Jun. 1990 Information Processing Letters, North-Holland.

Lodi, E. et al., Routing Multiterminal Nets in a Diagonal Model, pp. 899-902, 1988.

Murooka, T. et al., Simplified Routing Procedure for a CAD-Verified FPGA, IEICE Trans. Fundamentals, vol. E82-A, No. 11 Nov. 1999, pp. 2440-2447.

Naclerio, N. et al., Via Minimization for Gridless Layouts, 24th ACM/IEEE Design Automation Conference, 1987, pp. 159-165.

Nam, G. et al, Satisfiability-Based Layout Revisited: Detailed Routing of Complex FPGAs Via Search-Based Boolean SAT, 1999, pp. 167-175.

Nestor, J. A New Look at Hardware Maze Routing, Proceedings of the 12th ACM Symposium on Great Lakes Symposium on VLSI, pp. 142-147, Apr. 2002.

Ng, C., A "Gridless" Variable-Width Channel Router for Macro Cell Design, 24th ACM/IEEE Design Automation Conference, 1987, pp. 633-636.

Olaverri, A.G. et al., On the Minimum Size of Visibilty Graphs, Universidad de Zaragoza no date.

Overtone, G., EDA Underwriter 2 Finding Space in a Multi-Layer Board, Electronic Engineering, Morgan-Grampian LTD, vol. 67, No. 819, pp. 29-30, Mar. 1995.

Pocchiola, M., Computing the Visibility Graph via Pseudo-Triangulations, 11th Computational Geometry, Vancouver, Canada, 1995 ACM, pp. 248-257.

Powers, K. et al., The 60° Grid: Routing Channels in Width d/square root 3, VLSI, 1991 Proceedings., First Great Lakes Symposium on Kalamazoo, MI, USA, pp 214-291, Mar. 1991.

Royle, J. et al., Geometric Compaction in One Dimension for Channel Routing, 24th ACM/IEEE Design Automation Conference, 1987; pp 140-145.

Schiele, W. et al., A Gridless Router for Industrial Design Rule, 27th ACM-IEEE Design Automation Conference, pp. 626-631, 1990.

Sekiyama, Y. et al., Timing-Oriented Routers for PCB Layout Design of High-Performance Computers, International Conference on Computer Aided Design, pp 332-335, Nov. 1991.

Soukup, J. et al., Maze Router Without a Grid Map, IEEE, 1992, pp. 382-385.

Takashima, Y. et al, Routability of FPGAs with Extrernal Switch-Block Structures, IEICE Trans. Fundamentals, vol. E81-A, No. 5, May 1998, pp. 850-856.

Teig, S. The X Architecture: Not your Father's Diagonal Wiring, International Workshop on System Level Interconnect Prediction, pp. 33-37, Apr. 2002.

Thakur, S. et al., Algorithms for a Switch Module Routing Problem, 1994, pp. 265-270.

Theune, D. et al., HERO: Hierarchical EMC-constrained routing, Nov. 1992, IEEE pp 468-472.

Tollis, I. Techniques for Wiring in Non-Square Grids, pp. 66-69, May 1989, IEEE.

Urrutia, J., On the Number of Internal and External Visibility Edges of Polygons, Department of CS, University of Ottawa, ON, Canada, Feb. 11, 1997.

Wang, D., Novel Routing Schemes for IC Layout, Part I: Two-Layer Channel Routing, 28th ACM/IEEE Automation Conference, 1991, pp. 49-53.

Yan et al., Three-Layer Bubble-Sorting -Based Non-Manhattan Channel Routing, ACM Transactions on Design Automation of Electronic Systems, vol. 5, No. 3, Jul. 2000, pp. 726-734.

Zhou, H. et al., An Optimal Algorithm for River Routing with Crosstalk Constraints, 1996, IEEE.

Zhou, H. et al., Optimal River Routing with Crosstalk Constraints, ACM Transactions on Design Automation of Electronic Systems, vol. 3, No. 3, Jul. 1998, pp. 496-514.

* cited by examiner

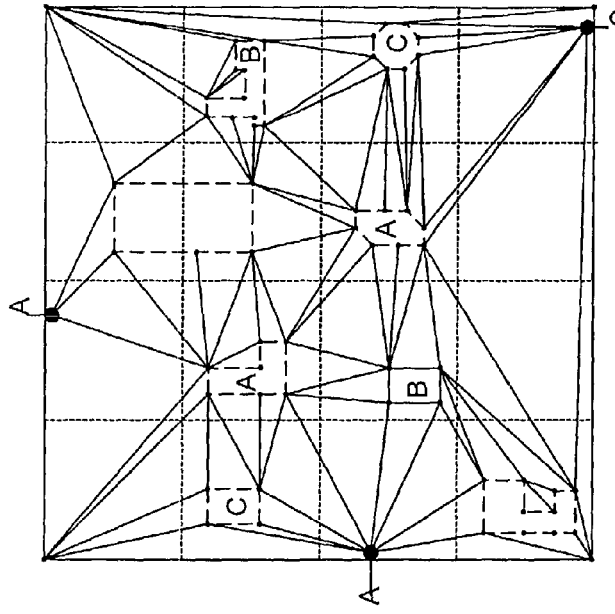
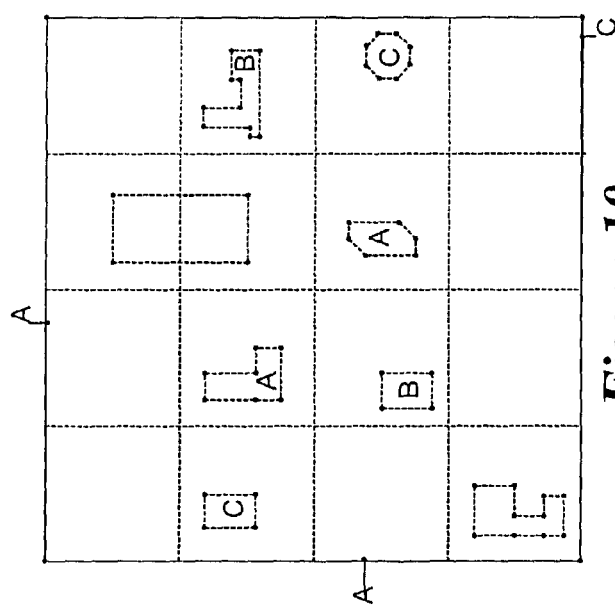
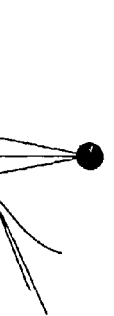
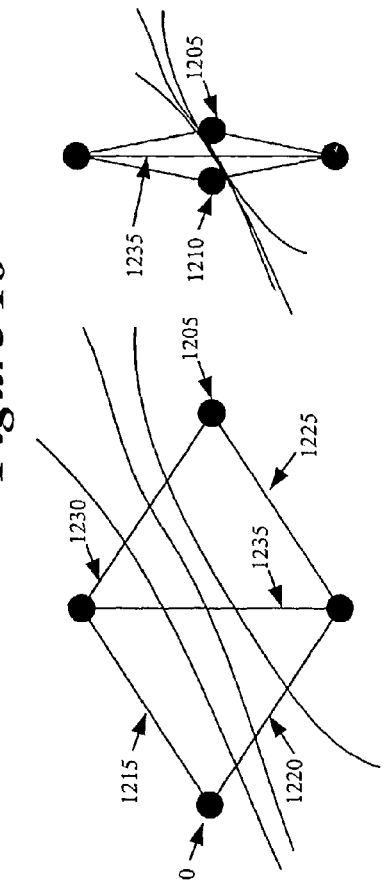
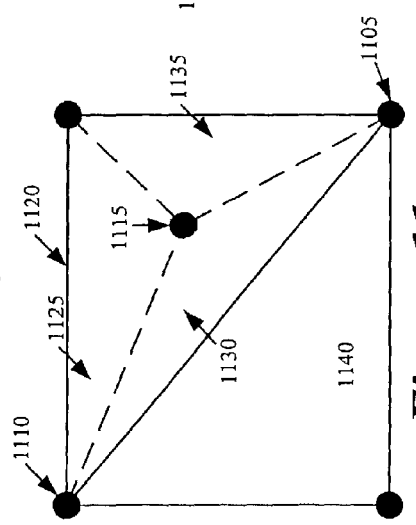
*Figure 10*
*Figure 18*
*Figure 13*
*Figure 12*
*Figure 11*

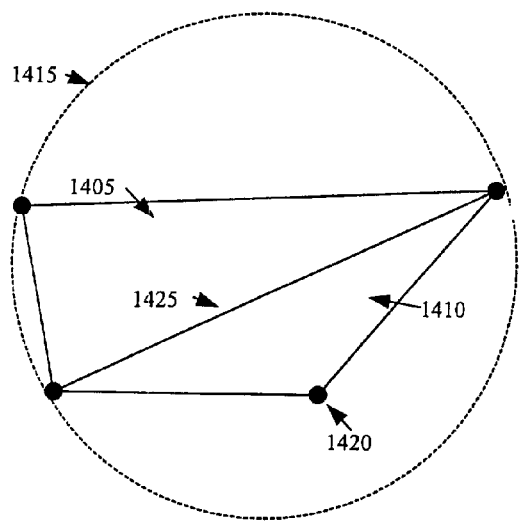
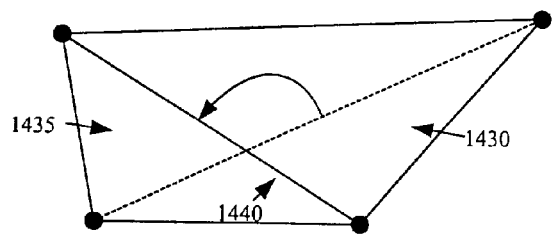
*Figure 14*
*Figure 15*
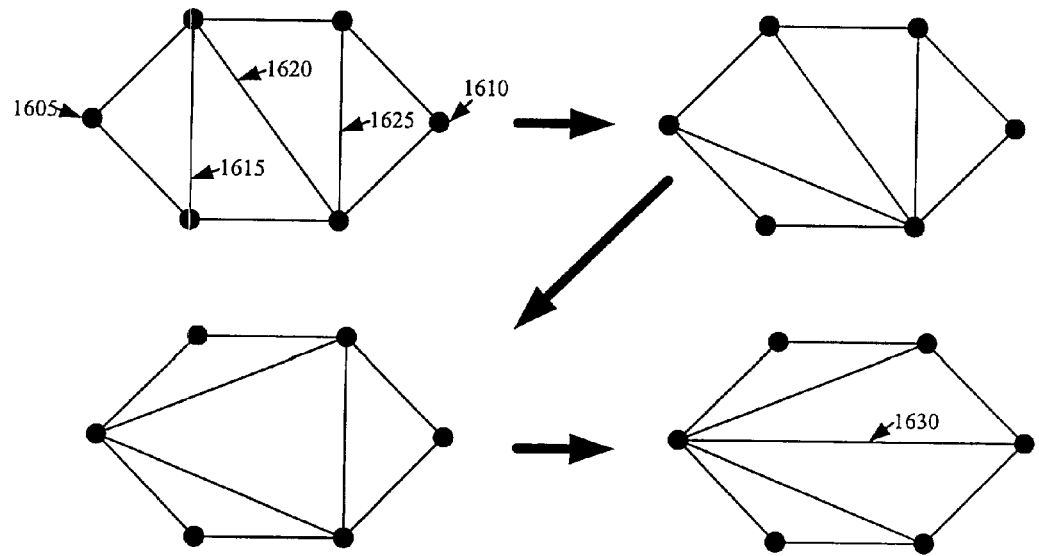
*Figure 16*

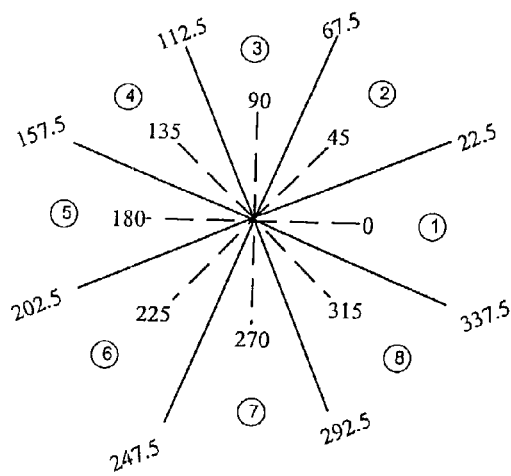
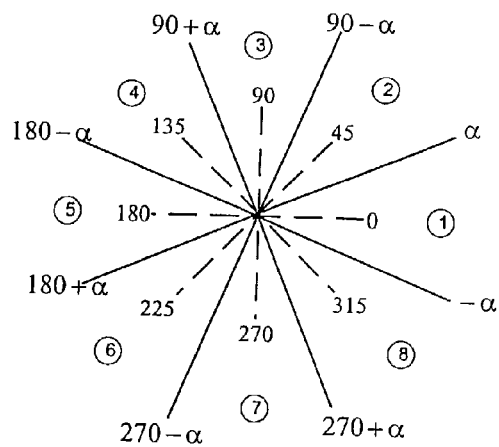
*Figure 20A*  *Figure 20B*
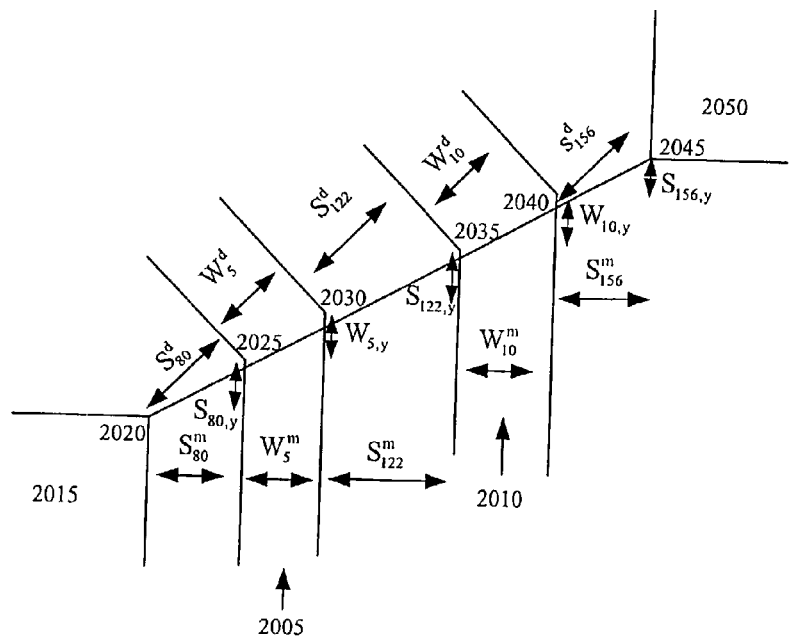
*Figure 20C*

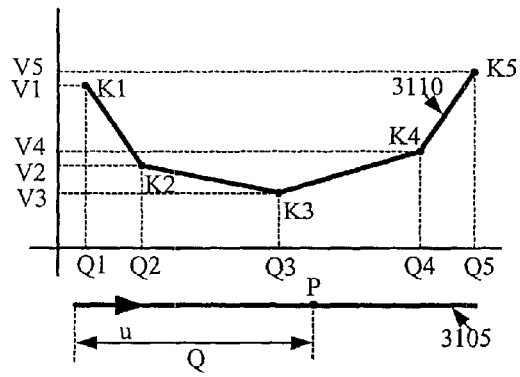
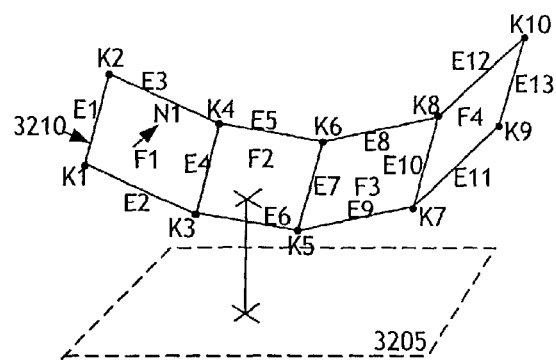
*Figure 31*      *Figure 32*
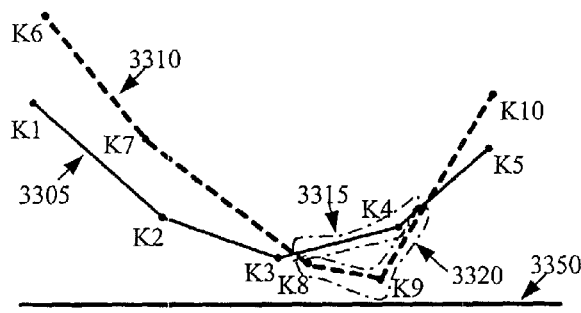
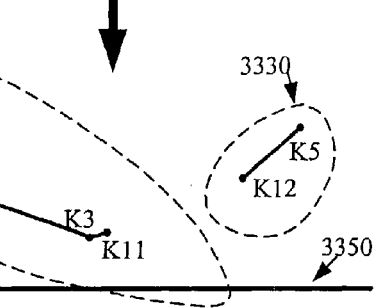
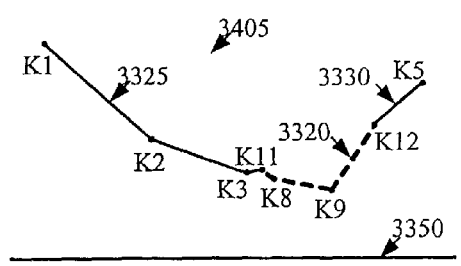
*Figure 33*      *Figure 34*

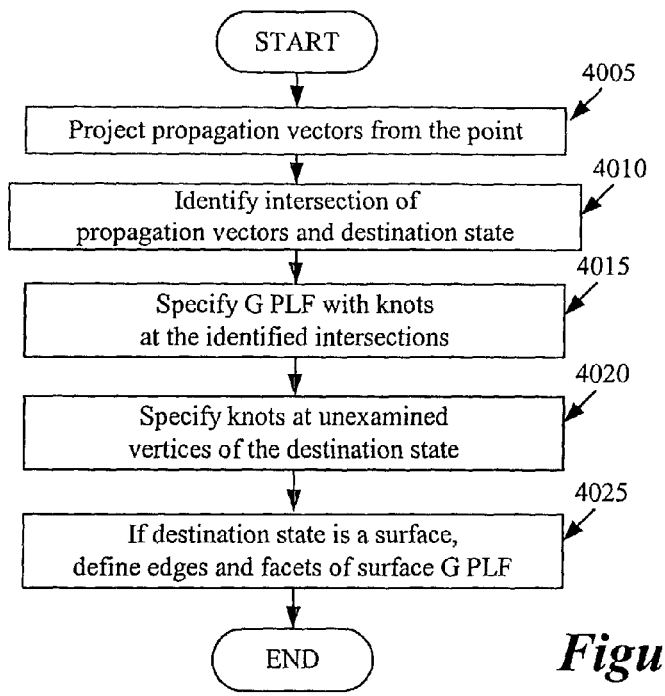
*Figure 40*
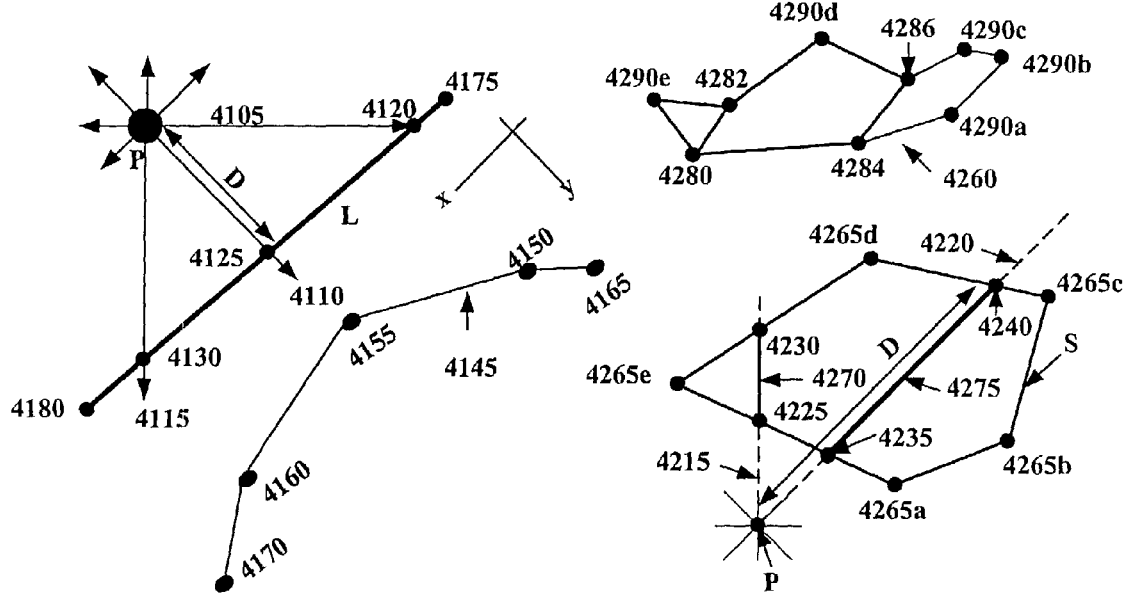
*Figure 41*
*Figure 42*

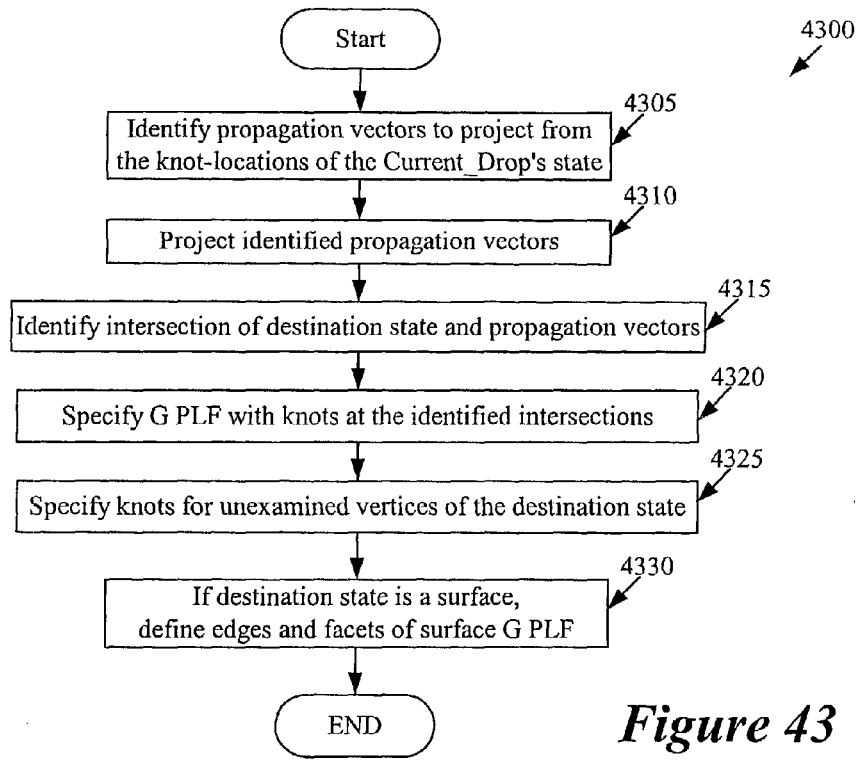
*Figure 43*
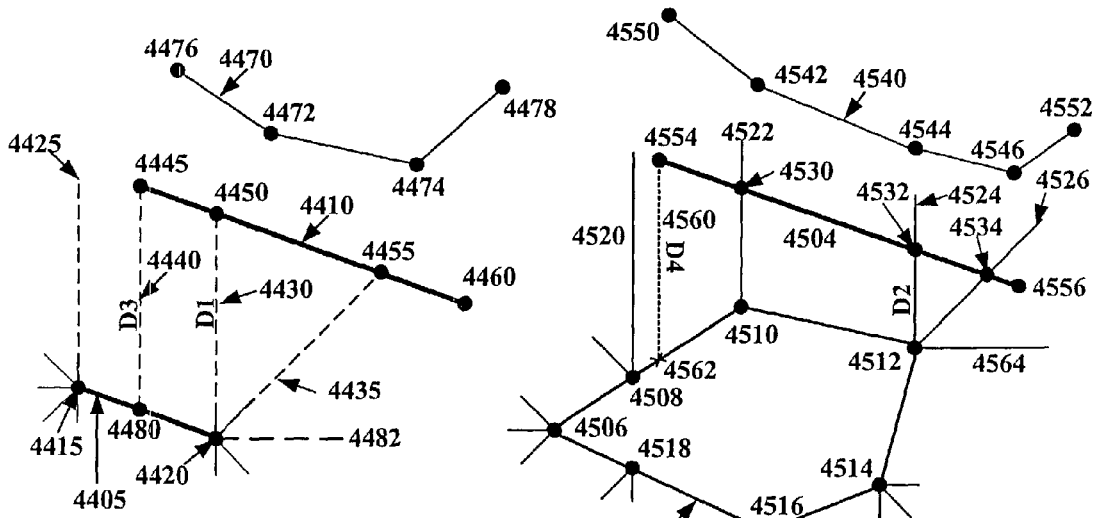
*Figure 44*  *Figure 45*

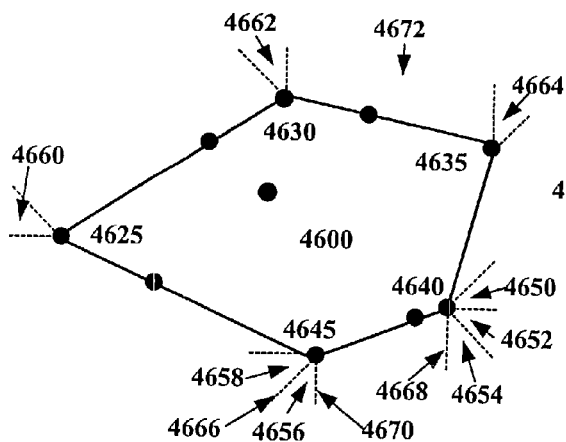
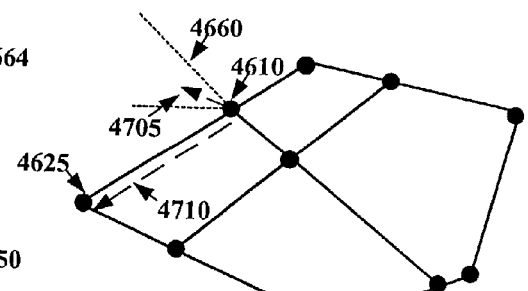
*Figure 46*          *Figure 47*
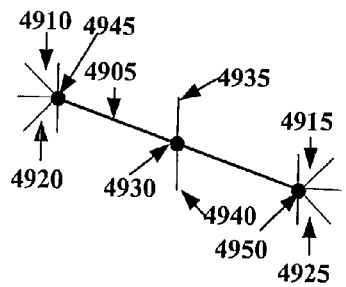
*Figure 49*
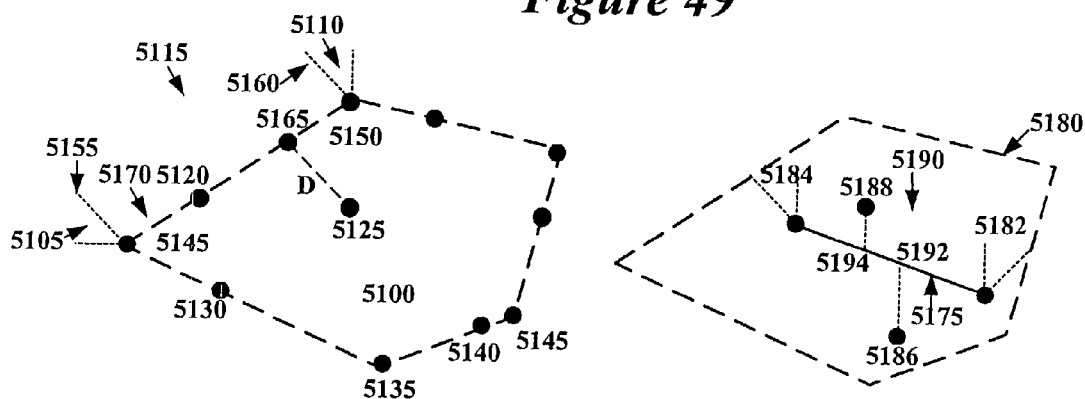
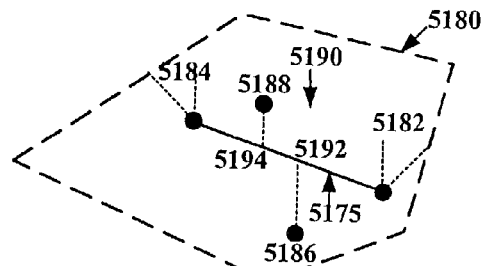
*Figure 51A*          *Figure 51B*

| Face |
|---|
| -Reference to 3 edges
-Reference to 3 nodes
-Up to two references for up to two face item |

*Figure 72*

| Edge |
|---|
| -Two references for up to two faces of the edge
-Capacity
-Flow
-Constrained
-Linked list of items on the edge starting with one of the edge's nodes and ending with its other node |

*Figure 73*

| Node |
|---|
| -Net Identifier
-One or more planar-path references to adjacent topological items in the same planar path
-A pair of via-path references to up and down topological via items
-A references to list of edges connected to the node
-For each edge, an edge reference to the next or previous topological item on the edge
-A reference to the geometry of the node
-Vertex number identifying the vertex of the geometry
-Location of the node |

*Figure 74*

| Edge Item |
|---|
| -Reference to its edge
-Net Identifier
-A pair of planar-path references to adjacent topological items in the same planar path
-A pair of edge references to the next and previous topological item on the edge |

*Figure 75*

| Face Item |
|---|
| -Reference to its face
-Net Identifier
-Up to 3 planar-path references for adjacent topological items in the same planar path
-A pair of via-path references for up and down topological via items
-Bounding polygon that defines legal face item locations
-Constraining Points and Distances |

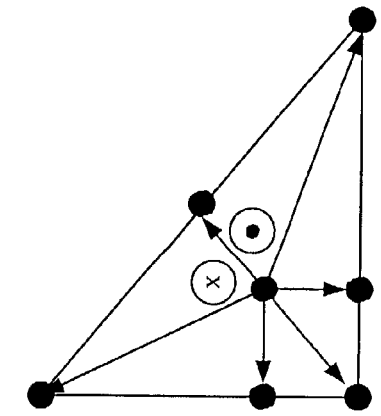
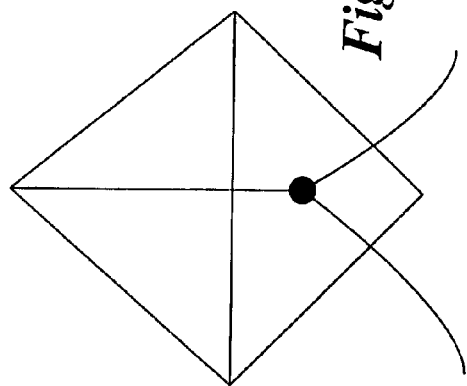
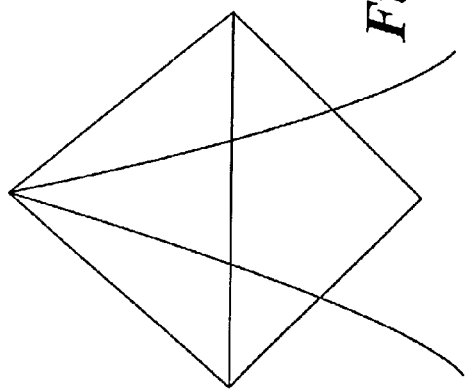
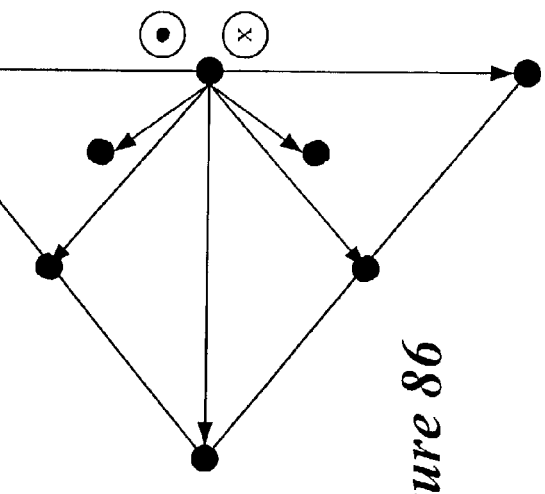
*Figure 83B*
*Figure 87*
*Figure 83A*
*Figure 86*
*Figure 85*

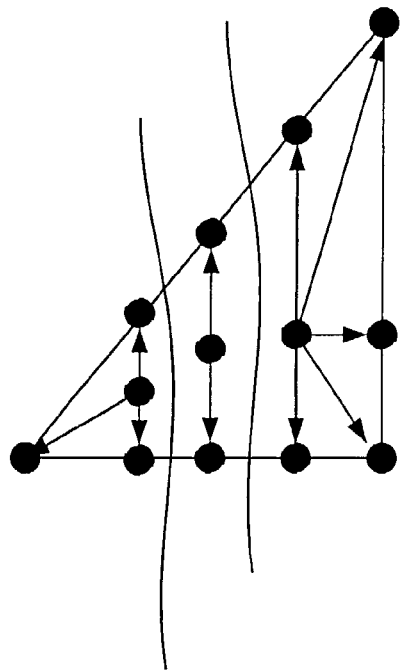
*Figure 90*
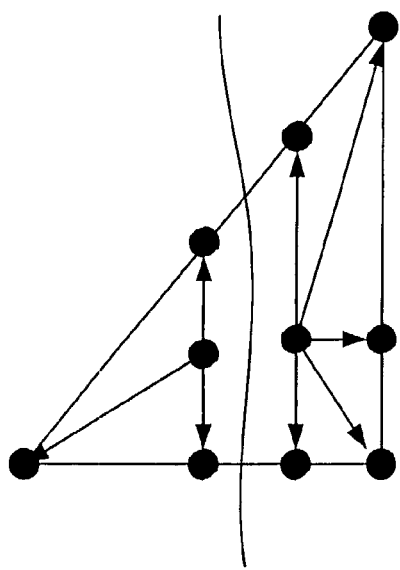
*Figure 88*
*Figure 89*

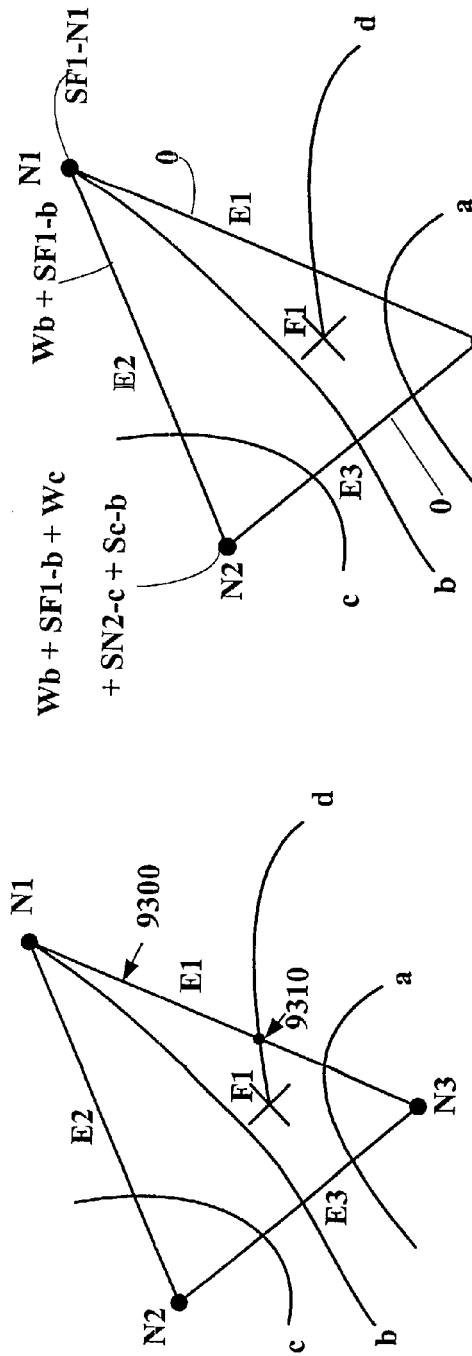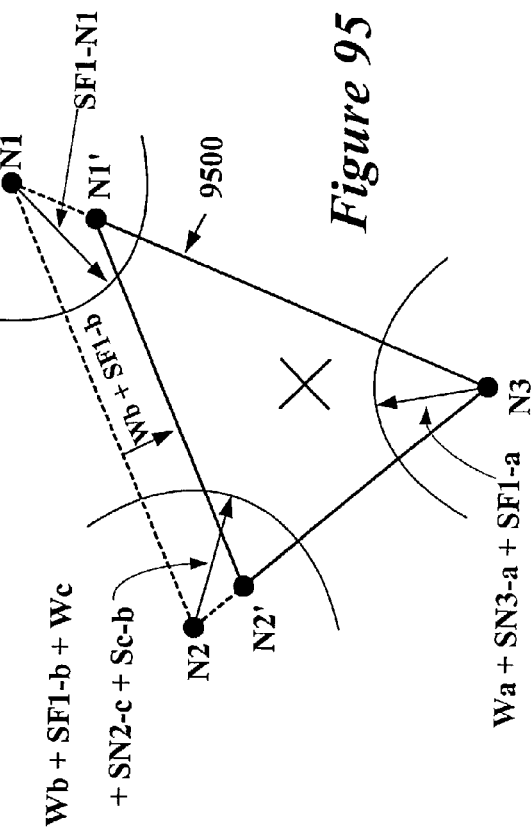

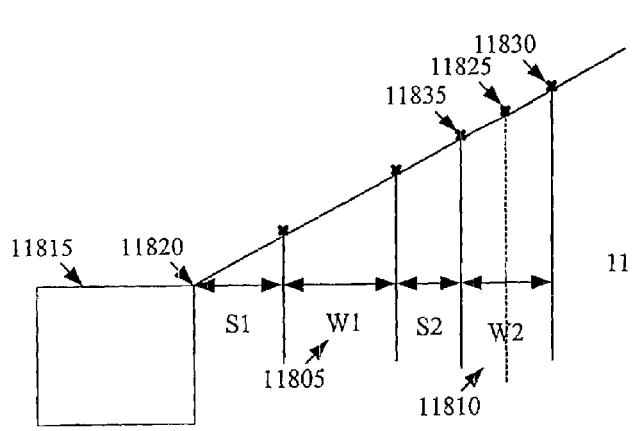
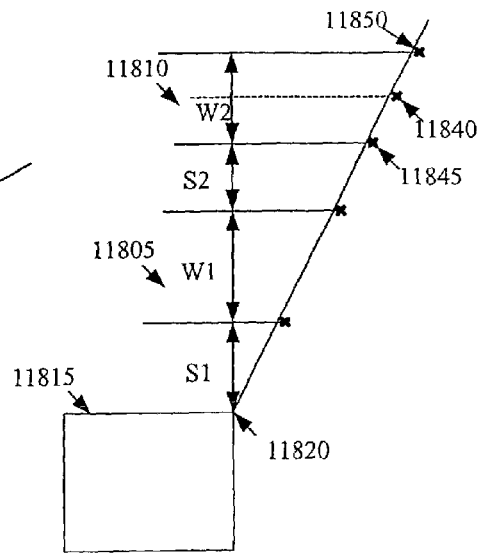
Figure 118
Figure 119
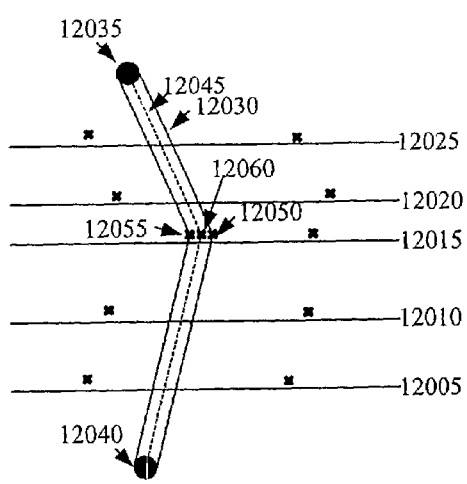
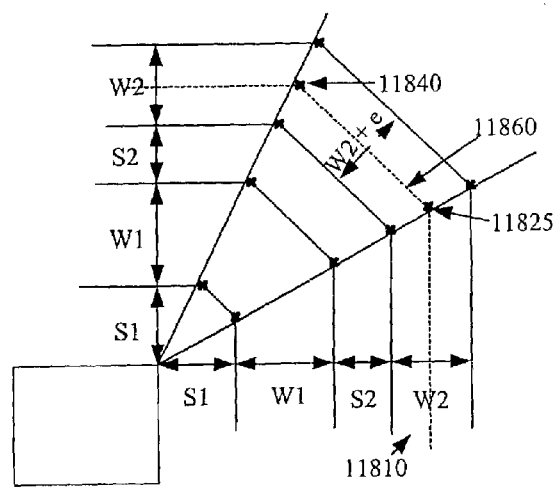
Figure 120
Figure 125

GRIDLESS IC LAYOUT AND METHOD AND APPARATUS FOR GENERATING SUCH A LAYOUT

CLAIM OF BENEFIT TO PRIOR APPLICATIONS

This patent application is a continuation of U.S. patent application Ser. No. 10/215,563, filed Aug. 9, 2002, which is incorporated herein by reference. This application is also a continuation-in-part of U.S. patent application Ser. No. 09/681,775, now U.S. Pat. No. 6,711,727, filed Jun. 3, 2001. This application further claims the benefit of U.S. Provisional Patent Application 60/396,571, filed Jul. 15, 2002; U.S. Provisional Patent Application 60/388,518, filed Jun. 12, 2002; U.S. Provisional Patent Application 60/385,975, filed Jun. 4, 2002; U.S. Provisional Patent Application 60/351,459, filed Jan. 22, 2002. This application is also a continuation-in-part of U.S. patent application Ser. No. 10/076,121, now U.S. Pat. No. 6,829,757, filed Feb. 12, 2002, a continuation-in-part of U.S. patent application Ser. No. 10/066,094, filed Jan. 31, 2002, a continuation-in-part of U.S. patent application Ser. No. 10/066,060, filed Jan. 31, 2002, a continuation-in-part of U.S. patent application Ser. No. 10/066,160, filed Jan. 31, 2002, a continuation-in-part of U.S. patent application Ser. No. 10/066,095, filed Jan. 31, 2002, a continuation-in-part of U.S. patent application Ser. No. 10/066,047, filed Jan. 31, 2002, a continuation-in-part of U.S. patent application Ser. No. 10/061,641, filed Jan. 31, 2002, a continuation-in-part of U.S. patent application Ser. No. 10/062,995, now U.S. Pat. No. 6,859,916, filed Jan. 31, 2002, a continuation-in-part of U.S. patent application Ser. No. 10/066,102, filed Jan. 31, 2002, a continuation-in-part of U.S. patent application Ser. No. 10/066,187, filed Jan. 31, 2002, now U.S. Pat. No. 6,877,146.

FIELD OF THE INVENTION

The invention is directed towards gridless IC layout and method and apparatus for generating such a layout.

BACKGROUND OF THE INVENTION

An integrated circuit ("IC") is a device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components."

An IC also includes multiple layers of wiring ("wiring layers") that interconnect its electronic and circuit components. For instance, many IC's are currently fabricated with metal or polysilicon wiring layers (collectively referred to below as "metal layers," "interconnect layers" or "wiring layers") that interconnect its electronic and circuit components. One common fabrication model uses five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction, and the preferred direction alternates between successive metal layers. IC designs often penalize non-preferred-direction wiring on a layer.

Many IC's use the Manhattan wiring model, which specifies alternating layers of preferred-direction horizontal and vertical wiring. In this wiring model, the majority of the wires can only make 90° turns. However, occasional diagonal jogs are sometimes allowed on the preferred horizontal and vertical layers.

Design engineers design IC's by transforming circuit description of the IC's into geometric descriptions, called layouts. To create layouts, design engineers typically use electronic design automation ("EDA") applications. These applications provide sets of computer-based tools for creating, editing, and analyzing IC design layouts.

EDA applications create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes.

Also, in this document, the phrase "circuit module" refers to the geometric representation of an electronic or circuit IC component by an EDA application. EDA applications typically illustrate circuit modules with pins on their sides. These pins connect to the interconnect lines.

A net is typically defined as a collection of pins that need to be electrically connected. A list of all or some of the nets in a layout is referred to as a netlist. In other words, a netlist specifies a group of nets, which, in turn, specify the required interconnections between a set of pins.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit modules; (4) routing, which completes the interconnects between the circuit modules; and (5) verification, which checks the layout to ensure that it meets design and functional requirements.

Routing is a key operation in the physical design cycle. It is generally divided into two phases: global routing and detailed routing. For each net, global routing generates a "loose" route for the interconnect lines that are to connect the pins of the net. After global routes have been created, the detailed routing creates specific individual routing paths for each net.

While some commercial routers today might allow an occasional diagonal jog, these routers do not typically explore diagonal routing paths consistently when they are specifying the routing geometries of the interconnect lines. This, in turn, increases the total wirelength (i.e., total length of interconnect lines) needed to connect the nets in the layout.

In addition, routers today are mostly gridded. The manufacturing processes for designing IC's specify a manufacturing grid that specifies manufacturable resolution. The boundary of all circuit elements is defined by the straight-line connections between adjacent manufacturing points. Gridded routers typically define arbitrary grids of intersecting lines to specify the available locations for routing interconnects. These arbitrary grids are often much coarser than the manufacturing grids (e.g., they are typically line-to-via spacing). Consequently, they arbitrarily limit the locations of interconnect lines and impose arbitrary spacing between the items in the layout. These arbitrary limits increase the size and efficiency of a design. The routing grids also discourage using arbitrary widths or spacing for interconnect lines. Furthermore, existing routers primarily utilize preferred-direction wiring to route their designs. Many IC layouts are designed by penalizing the use of interconnect lines in each particular layer when the interconnect lines are not in the preferred wiring direction of the particular layer. Such preferred-direction wiring leads to IC layouts and IC's that have most of their interconnect lines and wiring on each of their metal layers traverse in the same direction. Such IC layouts and IC's do not efficiently use the available spacing on the interconnect layers, and this adversely affects the size and efficiency of the layouts and the IC's.

SUMMARY OF THE INVENTION

Some embodiments of the invention provide a method of routing nets in a region of an integrated-circuit ("IC") layout. The method selects a net that has several routable elements. It then defines a route for the net. To define the route, the method uses a wiring model that specifies preferred non-Manhattan wiring directions. It also uses a manufacturing grid as the only grid for constraining the location of interconnect lines for connecting the net's routable elements.

BRIEF DESCRIPTION OF THE DRAWINGS

The novel features of the invention are set forth in the appended claims. However, for purpose of explanation, several embodiments of the invention are set forth in the following figures.

FIG. 10 illustrates the layout of FIG. 4 after nodes have been defined at each sub-region corner and at each port or obstacle geometry point.

FIG. 11 illustrates a triangulation technique.

FIGS. 12 and 13 illustrate why maximizing the minimal angle of decomposed triangles improves the likelihood that generated topological routes can be geometrized.

FIGS. 14 and 15 illustrate one manner for performing an edge-flipping operation.

FIG. 16 provides a pictorial example of a constraining operation.

FIG. 18 illustrates an example of how the layout of FIG. 4 might look after triangulation.

FIGS. 19 and 20 illustrate how some embodiments calculate edge capacities.

FIG. 31 illustrates an example of a line PLF that has four line segments.

FIG. 32 illustrates an example of a surface PLF.

FIG. 33 presents an example of filtering a first filtered PLF by a second filter PLF, where both PLF's are defined across a line.

FIG. 34 illustrates the minimum PLF for the two PLF's of FIG. 33.

FIG. 40 illustrates a process that propagates a PLF that is defined over a point to a line or a surface.

FIGS. 41 and 42 illustrate examples of propagating a PLF from a point P to a line L and to a surface S.

FIG. 43 illustrates a process for propagating a PLF from a line to another line or from a surface to a line, and FIGS. 44 and 45 provides examples for describing this process.

FIGS. 46–51 illustrate how some embodiments identify the propagation vectors that emanate from the knot locations of a line PLF or surface PLF.

FIGS. 59 and 61 illustrate processes that generate PLF's that express costs of expansions to an edge or a hole, while

FIGS. 72–76 illustrate data structure that defines a face, an edge, a node, an edge item, and a face item in some embodiments of the invention.

FIGS. 83A and 83B illustrate a process for inserting Steiner-tree face items in face.

FIGS. 85–89 illustrate possible expansions from edge items, nodes, and face items.

FIG. 90 illustrates three types of legality checking.

FIGS. 93–105 present several examples that illustrate the process of FIG. 91.

FIG. 110 illustrates four sets of adjacent Manhattan sectors, while

FIGS. 118 and 119 provide two examples for identifying the spacing and width requirements on constraining directions.

FIG. 120 illustrates an example of identifying a shortest partial path after constraining segments of the intersected path-defining edges.

FIG. 125 provides an example of a portion of a merged route.

DETAILED DESCRIPTION OF THE INVENTION

Figure 1:
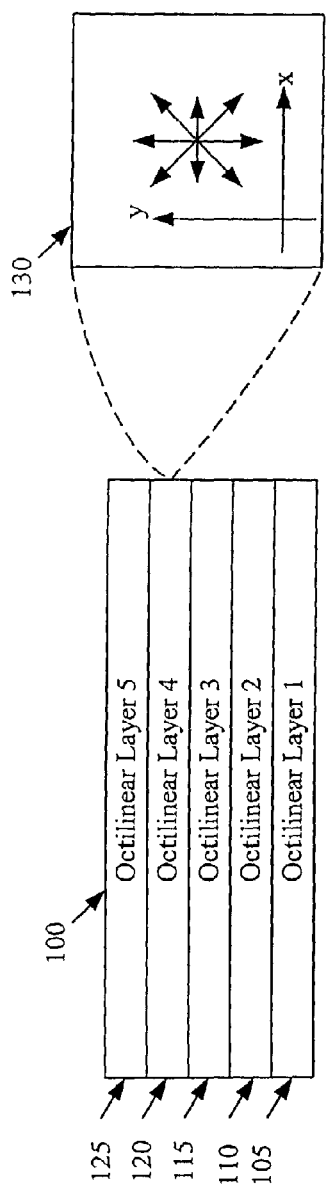
FIG. 1 illustrates a wiring model of some embodiments of the invention.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Non-Preferred Direction Architecture

Some embodiments of the invention utilize non-preferred-direction ("NPD") wiring models for designing IC layouts. An NPD wiring model has at least one NPD interconnect layer that has more than one preferred routing direction. Specifically, in such a wiring model, each NPD interconnect layer has at least two wiring directions that are equally preferable with respect to one another, and that are as preferable as or more preferable than the other wiring directions on that layer.

An NPD router that uses an NPD wiring model generates IC layouts with one or more NPD interconnect layers, with each having two or more preferred wiring directions. In some embodiments, such a router does not impose arbitrary penalty costs for routing (i.e., does not penalize wiring) in the two or more preferred directions of an NPD interconnect layer of its layout. Rather, such a router costs wiring (i.e., interconnect lines) in the preferred directions proportionately to the metric costs that they introduce in the design. The metric cost is a non-arbitrary cost that is based on putative chip performance, manufacturing considerations, or other real-world design consideration, and not an artificial characteristic of the router. The metric costs can be based on a number of properties of the wiring, such as resistance, delay, manufacturing yield, etc. A router can account for these metric costs by using costing functions that are based on the interconnect-line attributes, such as length, area, etc.

For instance, horizontal and ±45° wiring directions might be the preferred wiring directions of an interconnect layer. On such a layer, an NPD router would not impose an arbitrary penalty cost on routing in either the horizontal or ±45° directions, in order to deter routes in one of these directions. Instead, some embodiments might cost horizontal and +45° lines based solely on the length of the lines in these directions, while other embodiments might cost horizontal and +45° lines based solely on the area of the lines in these directions. Costing the lines based on their areas more accurately estimates the metric resistance and delay costs of the lines when the widths of the lines have to be different in different preferred directions. For instance, manufacturing design rules might require the preferred direction +45° wires to be wider than preferred direction horizontal wires on a layer. Such 45° lines would be more expensive than horizontal lines if area were used to cost the routes. This additional expense, however, is not an artificial penalty cost, but rather is an actual cost that relates directly to the metric cost that the +45° lines introduce into the design. It should be noted that such 45° lines would be less expensive than horizontal lines if delay were used as the primary metric for costing the routes.

FIG. 1 illustrates a wiring model 100 of some embodiments of the invention. This wiring model has five interconnect layers 105–125. In this five-layer model, none of the layers has a single preferred wiring direction. Instead, each layer allows 4 different preferred directions of wiring. Specifically, as illustrated by the top view 130 of the fifth interconnect layer 125, each layer of the wiring model 100 can have horizontal, vertical, and ±45° diagonal interconnect lines. Each layer is an octilinear layer, as it allows interconnect lines to traverse in eight separate vector directions from any given point.

In some embodiments, an interconnect line is "diagonal" if it forms an angle other than zero or ninety degrees with respect to the layout's Cartesian coordinate axes, which typically align with the layout's boundary and/or the boundary of the layout's expected IC. On the other hand, an interconnect line is "horizontal" or "vertical" if it forms an angle of 0° or 90° with respect to one of the coordinate axes of the layout. In the wiring model of FIG. 1, (1) the horizontal interconnect lines are parallel (i.e., are at 0°) to the x-axis, which is defined to be parallel to the base of the layout, (2) the vertical interconnect lines are parallel to the y-axis, which is defined to be parallel to the height and perpendicular (i.e., is at 90°) to the base of the layout, (3) the +45° diagonal interconnect lines are at +45° with respect to the x-axis, and (4) the −45° diagonal interconnect lines are at −45° with respect to the x-axis.

Other embodiments of the invention use different NPD wiring models. For instance, some embodiments of the invention's NPD wiring model include only diagonal interconnect lines, other embodiments use only horizontal and vertical interconnect lines, and yet other embodiments use diagonal interconnect lines with either horizontal or vertical interconnect lines but not both. Also, some embodiments use non-45' diagonal wiring. For example, some embodiments use horizontal, vertical and ±120° diagonal interconnect lines.

In addition, some embodiments have more than five layers, while other embodiments have fewer. Some embodiments also assign a single preferred direction for some of the layers, while allowing other layers not to have a single preferred wiring direction. For instance, some embodiments have preferred-direction Manhattan wiring for the first three layers (e.g., horizontal preferred-direction wiring for the first layer, vertical preferred-direction wiring for the second layer, and horizontal preferred-direction wiring for the third layer), and NPD wiring for the fourth and fifth layers.

By generating IC layouts with one or more NPD interconnect layers, some embodiments fabricate IC's that have NPD wiring for one or more of their metal layers (i.e., fabricate IC's with one or more NPD metal layers, with each having two or more preferred wiring directions). For instance, the wiring model 100 of FIG. 1 can be used to generate an IC layout with five NPD-interconnect layers. Such a layout can then be used to generate a five metal layer IC, where each of the metal layers has four equally preferable wiring directions.

Figure 2:
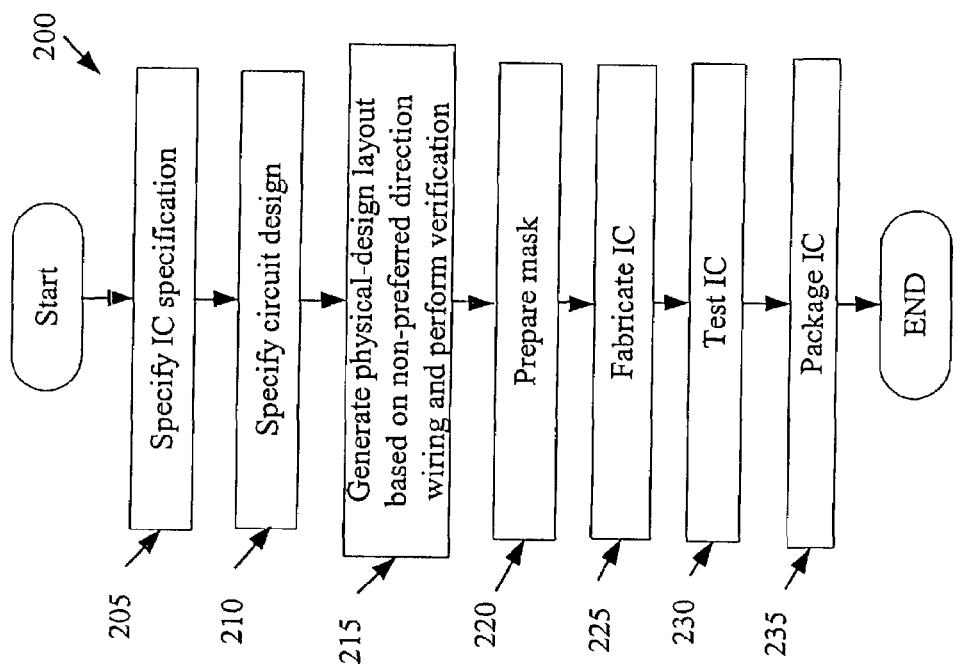
FIG. 2 illustrates a process that is used by some embodiments to produce IC's that utilize NPD-wiring models.

FIG. 2 illustrates a process 200 that is used by some embodiments to produce IC's that utilize NPD-wiring models. This process initially describes (at 205) the specification of an IC. The IC specification is a high-level representation that considers various factors, such as performance, functionality, physical dimension, etc. The process then specifies (at 210) the circuit design of the IC. This operation typically entails one or more sub-operations, such as specifying the IC's architectural design, functional design, logic design, etc. Numerous EDA tools exist for assisting in the creation of the system's circuit design.

After specifying the circuit design, the process specifies (at 215) a physical design layout for the IC. According to the invention, the process specifies the physical design layout based on an NPD-wiring model. The generation of physical design layouts that use the NPD-wiring model will be described below. At 215, the physical-design operation might result in the partitioning of the IC into multiple IC's (i.e., might result in the generation of one or more layouts that represent several IC's). Also, at 215, the process verifies the generated physical design layouts. Verification typically entails various operations, such as design-rule check, extraction, etc. These operations are to ensure that the generated layouts specify designs that meet the fabrication rules and perform the desired functionalities.

Once physical design and verification are completed, the process converts (at 220) the physical design layout into one or more sets of masks for one or more IC's. Each set of masks typically includes one mask for each wiring layer. Currently, each mask is typically a photo-lithographic mask that identifies spaces on a semiconductor wafer where certain materials need to be deposited, diffused and/or removed. Accordingly, at 225, the process uses the masks to fabricate one or more IC's. Specifically, the fabrication operation uses the masks to create devices on IC's and to define wiring that connect the devices. When the physical design layout uses an NPD-wiring model, the masks define NPD wiring on one or more layers of the IC's. After fabrication, the process 200 tests (at 230) the fabricated IC's. The process then (at 235) packages any IC that passes its tests, and then ends.

Some embodiments fabricate IC's that have at least one wiring layer that does not have a wiring direction with more that 50% of the wiring on that layer. Other embodiments fabricate IC's that have at least one wiring layer that does not have a wiring direction with more than 70% of the wiring on that layer. For instance; one such IC might predominantly include horizontal and vertical direction wiring on the wiring layer that does not have any wiring direction with more than 70% of the wiring.

II. Gridless Architecture

A gridless routing process is described below. This routing process is gridless as it does not require the interconnect lines to be positioned with respect to any grid that is coarser than the manufacturing grid, if any. In other words, the only grid that the interconnect lines might have to be aligned with is the manufacturing grid. The generated gridless layouts can be used, in turn, to fabricate IC's that have their metal lines aligned with the finer manufacturing grids instead of coarser non-manufacturing grids.

The gridless routing process described below generates gridless NPD octilinear layouts. However, one of ordinary skill will realize that this routing process can be used to generate other gridless layouts. In addition, even though a gridless NPD routing process is described below, some embodiments can use the invention's NPD routing in a gridded router that generates gridded NPD layouts.

III. NPD and Gridless Routing

A. Conceptual Flow.

Some embodiments generate gridless NPD layouts by using a detailed routing technique that does not specify a preferred wiring direction for any of its interconnect layers. The detail-routing embodiments described below use the NPD wiring model 100 of FIG. 1. However, one of ordinary skill will realize that other embodiments of the invention use different NPD wiring models.

In the embodiments described below, the detailed routing is performed after a global routing stage, which (1) partitions the routing region into global routing cells ("Gcells") and (2) defines, for each net, global routing paths that connect the Gcells containing the net's pins. One hierarchical global routing approach recursively divides the routing region into smaller sub-regions, and defines routing paths at each hierarchical level until reaching the lowest recursive level's sub-regions, which are the Gcells. Another global routing approach flatly divides the routing region into numerous Gcells and then defines the routing paths between the Gcells. Under either approach, the global router can use either an NPD wiring model or a preferred-direction wiring model.

Figure 3:
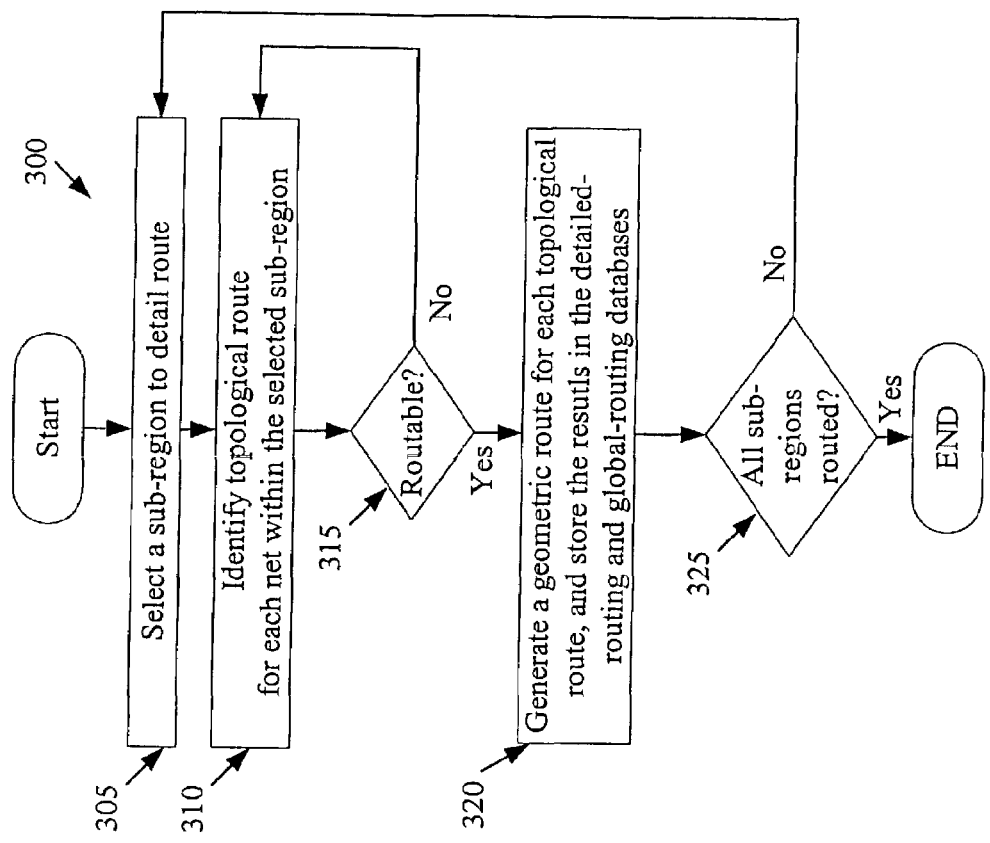
FIG. 3 presents a conceptual illustration of a routing process used by some embodiments of the invention.

FIG. 3 presents a conceptual illustration of a detail-routing process 300 used by some embodiments of the invention. This routing process defines detail routes for nets within a region of the IC layout. This region can be the entire IC layout, or a portion of this layout. As shown in this figure, this process initially selects (at 305) a sub-region of the IC layout region to detail route. The sub-region can be a portion of the IC layout, or the entire IC layout. Several manners for selecting such a region will be described below in Section III.B.

Next, for each particular net in the selected sub-region, the process identifies (at 310) a topological route that connects the particular net's routable elements in the sub-region. In the embodiments described below, a net has two or more pins, a pin can have one or more ports, and each port can have one or more geometries. In these embodiments, a net's routable elements are the port geometries, and a net is typically routed along one port of each of its pins. One of ordinary skill will realize, however, that other embodiments may define the routable elements of the nets differently.

A topological route is a route that is defined in terms of its relation to other layout items, such as pins, obstacles, boundaries, and/or other topological routes of other nets. As such, a topological route provides a general plan for how to route a net, without necessarily providing a specific geometric path to do so. One topological route represents a set of diffeomorphic geometric routes (i.e., a set of geometric routes that can be morphed into one another through a continuous sequence of perturbations without changing the route's path relative to any other pin, path or obstacle). A geometric route is one explicit realization of a topological route. A geometric route is defined in terms of exact coordinates that define the route as it travels through the interconnect layers. Several manners for identifying topological routes for each net within the selected sub-region will be described below.

After 310, the process determines (at 315) whether the identified topological routes identified at 310 are geometrically routable (i.e., whether there exists a design-rule-correct geometric route for each identified topological route). If so, the process transitions to 320, which will be described below. Otherwise, if the process determines (at 315) that the identified topological routes for some of the nets are not routable, it initially directs the topological router to generate additional topological routes that are more likely to have design rule-correct geometric routes. If the topological router repeatedly fails to generate geometrically routable topological routes, the detail-routing process flags one or more nets as unroutable, re-defines topological routes for some or all the nets, and then transitions to 320. Several manners for performing the routability checking will be described below.

At 320, the process generates these geometric routes and stores these routes in a detail-routing storage structure (such as a database). Several manners for generating geometric routes from topological routes will be described below. At 320, the process also converts the generated geometric detail routes into global routing paths, which it stores in a global routing storage structure (such as a database). This is done just in case the router has to detail route some Gcells again.

At 325, the process then determines whether it has generated detail routes for all the sub-regions of the IC region. If not, the process returns to 305 to select another sub-region and to repeat 310–320 to compute geometric routes in the newly selected sub-region. Otherwise, the process ends. After 325, some embodiments might repeat process 300 for certain congested sub-regions in order to alleviate the congestion in these regions, improve wiring quality, or fix violations left by previous attempts.

B. Region Selection.

As mentioned above, the detail-routing process 300 selects (at 305) a sub-region of the IC layout region to detail route. In some embodiments of the invention, this selection involves selecting several contiguous Gcells, and generating a sub-region by combining the selected Gcells. Several manners for selecting contiguous Gcells are disclosed in U.S. patent application entitled "Method and Apparatus for Generating Multi-Layer Routes" and having Ser. No. 10/076,121. One of ordinary skill will realize that other embodiments might select and combine Gcells in order to identify a sub-region, but rather might simply specify a portion or the entire IC layout as the sub-region.

In generating a sub-region by combining several contiguous Gcells, the process 300 adds any virtual pins ("vpins") of the Gcells in the periphery of the sub-region as geometries of the sub-region. Virtual pins are artificial pins that are set to account for the global route propagation into Gcells from other Gcells or higher-level slots. In the embodiments described below, the virtual pins are represented as single point geometries.

Figure 5:
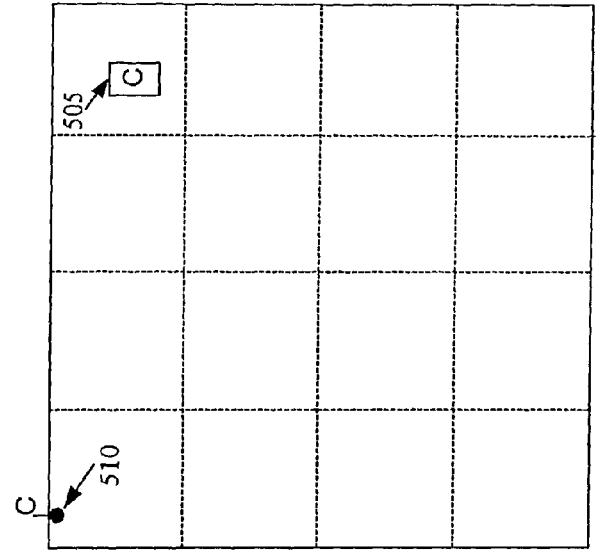
FIGS. 4 and 5 illustrate two layers of Gcells that have been combined to produce a sub-region.
Figure 4:
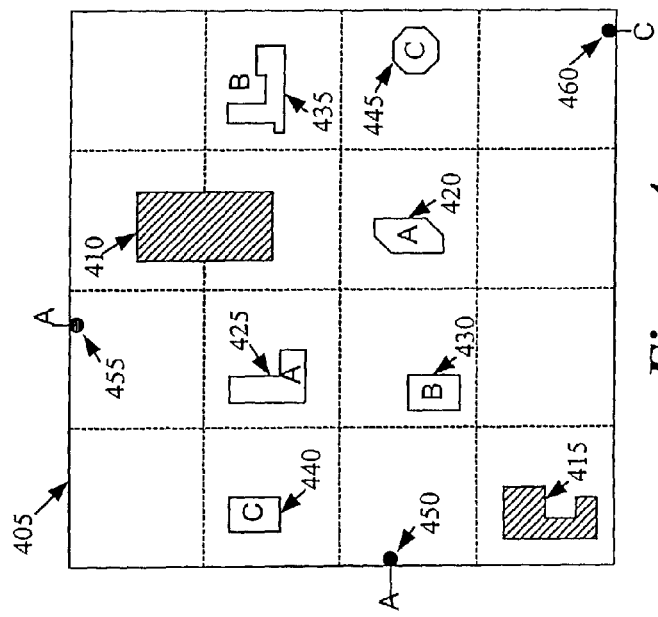

For example, FIGS. 4 and 5 illustrate two layers of 16 Gcells that have been combined to produce a sub-region 400. For sake of simplicity, this example assumes that the generated sub-region only has pins, virtual pins, and obstacles on the two layers shown in FIGS. 4 and 5. As shown in FIG. 4, the sub-region 400 includes two obstacles 410 and 415. This sub-region also includes port geometries of three nets A, B, and C. Again, for sake of simplifying the example, the port geometries 420–445 and 505 of nets A, B, and C are all from the same ports of their respective nets in the example illustrated in FIG. 4. As shown in FIGS. 4 and 5, the obstacle and port geometries can have a variety of shapes (e.g., convex or non-convex polygonal shapes, etc.). Also, these geometries have horizontal, vertical, and diagonal sides. As shown in FIG. 4, three of the twelve Gcells on the periphery include virtual pins 450, 455, 460, and 510 for nets A and C. During the sub-region generation, these four virtual pins 450, 455, 460, and 510 are added to the sub-region data structure as port geometries of nets A and C.

The detailed routing process 300 defines a sub-region based on various attributes. These attributes include a list of all obstacle and port geometries in the region, and a list (i.e., a netlist) that specifies the nets in the sub-region. In the embodiments described below, each net specifies one or more pins, each pin refers to one or more ports, and each port refers to one or more geometries. Other embodiments might specify a net differently. A sub-region is also defined by information about net properties on different layers. For different layers, this information can include minimum wire size, minimum spacing, minimum via size, minimum cost per unit length, etc. In some embodiments, this information also includes (1) different net widths on different layers, (2) different spacing between nets on different layers, and (3) different spacings between nets and unrelated geometries on different layers.

C. Topological Route Generation.

In some embodiments, a topological routing engine receives the sub-region defined at 205 (i.e., receives the problem instance). For each net in the received sub-region, the topological routing engine generates (at 310) a topological representation of a route that connects the net's routable elements. Different embodiments use different topological routing engines. Below, two topological routers are described that can be used as the topological routing engine. One topological routing engine is referred to as the Q* topological routing engine, while the other is referred to as the IDA* topological routing engine. Both engines are multi-layer topological routers. Accordingly, for each net in the sub-region, each engine generates a topological route (i.e., a topological representation of a route) that connects the net's routable elements on one or more layers. In other words, each router selects a net and, for the selected net, defines a topological route that connects the selected net's routable elements on one or more interconnect layers, before selecting another net for routing. To facilitate its multi-layer approach, each topological router uses vias that are defined topologically. These vias are referred to below as topological vias.

In addition, both topological routing engines can route sets of nets as an ensemble. Specifically, the Q* engine selects a set of nets in the sub-region. For the selected set, this engine might generate several different routing solution sets, where each solution includes a topological route for some or all of the nets in the set. From the identified set of solutions, this engine then selects the best solution set for the selected set of nets. Similarly, the IDA* routing engine selects a set of nets in the sub-region and deterministically traverses through the solution space to identify the best possible combination of topological routes for the selected set of nets. Both topological engines can consider the estimated routing cost of unrouted nets in the selected set while they are generating a solution set. These engines consider such estimated costs so that they can terminate examining a solution set when an estimated cost exceeds an acceptable threshold.

The IDA* routing engine uses an IDA* path search engine that identifies paths between sets of sources and targets in a depth-first, iterative-deepening manner. The Q* routing engine, on the other hand, uses a Q* path search process that finds the shortest topological route for each net. The Q* path search process also has a powerful shove operation that allows the topological routes of later-routed nets to shove the topological routes of earlier-routed nets. In the embodiments described below, this operation allows the earlier-routed nets to bend around the topological routes of later-routed nets. Accordingly, this operation reduces the routing constraints placed on later-routed nets by the routes of earlier-routed nets.

In the embodiments described below, both topological routers are NPD routers that use NPD wiring models (such as the wiring model of FIG. 1). In some embodiments, both topological engines allow nets to have different widths on different layers. They also can impose different spacing constraints between pairs of nets. The spacing constraint for a pair of nets can also be different on different layers. Both topological engines can also base their topological routes on different wiring models, such as a wiring model that employs only Manhattan lines, one that uses Manhattan and ±45° lines, one that uses Manhattan and ±120° lines, etc.

1. Q* Topological Routing Engine a. Overview

The Q* topological engine decomposes each layer of the sub-region that it receives into numerous polygons and embeds topological routes into the decomposed region. Different embodiments decompose the sub-region into different types of polygons, such as triangles, rectangles, etc. The embodiments described below use a triangulation decomposition operation that decomposes each layer of the sub-region into numerous triangular faces, each with three nodes and an edge between each pair of nodes. The decomposed sub-region is at times referred to below as the tessellated region.

Figure 6:
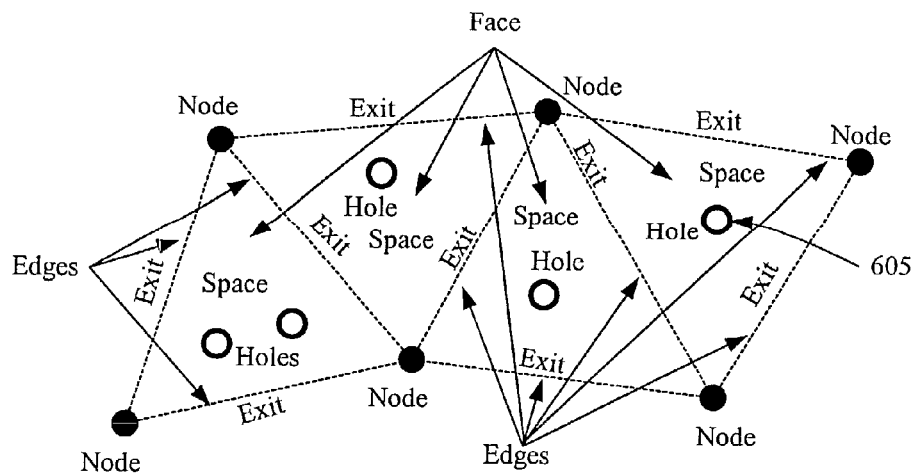
FIG. 6 illustrates a portion of a layer that has been triangulated into four triangular faces, each of which has a space, three nodes, and three edges, while FIG. 7 provides examples of topological routes that are formed by via nodes, Steiners, walls, joints, and nodes.

The initial triangulation also specifies one space within each face. FIG. 6 illustrates a portion of a layer that has been triangulated into four triangular faces, each of which has a space, three nodes, and three edges. For each layer of the sub-region, the initial triangulation operation adds a topological graph to the sub-region definition. Each layer's topological graph includes several nodes, edges, and faces. In the embodiments described below, nodes are defined at the obstacle-geometry vertices, port-geometry vertices, the four corners of the sub-region on each layer, and some or all of the vpins. The embodiments described below define edges between certain pairs of nodes in order to triangulate the sub-region. An edge can be part of up to two triangular faces. For each edge, the Q* topological engine stores the edge's capacity and length. It further stores the wire flow (route flow) across each edge.

Different embodiments define edges differently. In the embodiments described below, the Q* topological engine defines each edge as an ordered list of topological particles in the tessellated region. In these embodiments, the topological particles that can be on an edge (i.e., that can define an edge) are nodes, joints, and exits, which are described below.

Nodes are vertices of the tessellated region, as described above. Two nodes start and end each edge's ordered list of topological particles. A node can be part of multiple edges. A joint is a topological particle that is defined at the intersection of an edge and a net's route. An exit is a topological particle that is specified on an edge between each two non-exit particles on the edge. As illustrated in FIG. 6, an exit is the only topological particle between an edge's nodes, after the initial triangulation before any route has been embedded in the region. Whenever a joint is defined on an edge, it divides a previously undivided exit of the edge into two exits. Joints and exits are further described below.

Each triangular face has 3 edges, 3 nodes, and a set of "spaces" representing topological regions inside the face. After the initial triangulation, each face has one space within it, as shown in FIG. 6. When topological routes are embedded across a face, additional spaces are defined in the face. Every particle that is within a face or is on an edge of the face is associated with one or more spaces of the face. Some particles can be part of multiple spaces. Each space contains its face's nodes and exits just after the initial triangulation.

After the initial triangulation, the Q* engine embeds topological routes in the decomposed topological region. The Q* engine defines a topological route as an ordered list of topological particles in the decomposed topological region. Each embedded topological route is a graph that has several vertices and one or more wire segments that connect some or all the vertices. The wire segments are referred to as walls in the embodiments described below. In other words, a wall is a wire segment (i.e., an interconnect segment) that connects two vertices in a topological route. In the embodiments described below, the topological particles that can serve as vertices of a route are nodes, joints, "holes," "via nodes," and "Steiners."

A hole is a topological particle that represents a potential via between two spaces on two different layers. In the embodiments described below, a hole is defined between each pair of spaces that are on adjacent layers and that have sufficiently large overlap to accommodate a via. In other embodiments, however, holes might be defined between space pairs that are on different but not adjacent layers. A hole is part of both spaces that it connects. A space can contain several holes, one for each sufficiently overlapping space in an adjacent layer. FIG. 6 illustrates holes in several spaces.

When a net's topological route is embedded, a hole is converted into two via nodes, one in each space connected by the hole. In the embodiments described below, the two via nodes have an association (e.g., have a reference to one another) but do not have a wall (i.e., a wire segment) between them. Other embodiments might specify walls between related via nodes. A Steiner is a Steiner point (i.e., a vertex that connects to more than two walls) that is generated at the juncture between a pre-existing path of a net and a newly embedded path of the net.

Figure 7:
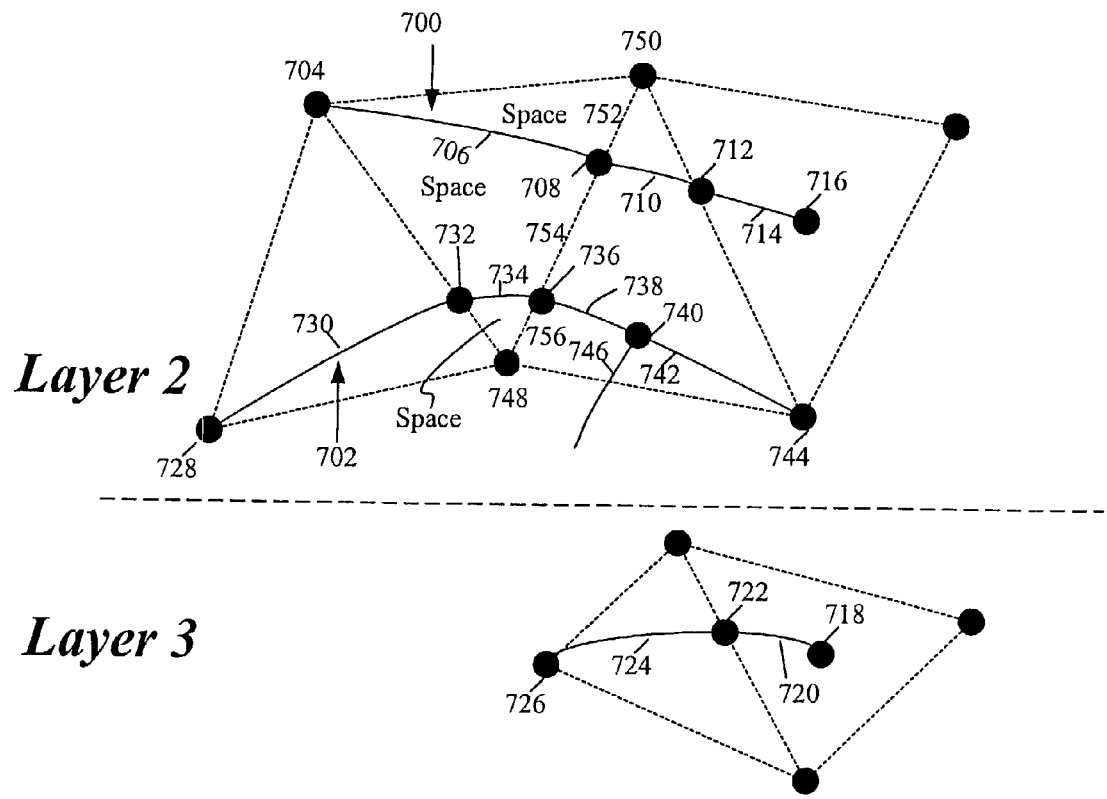

FIG. 7 provides examples of topological routes that are formed by via nodes, Steiners, walls, joints, and nodes. Specifically, this figure illustrates two embedded topological paths 700 and 702 (where a path in this instance is portion of a route). Both of these paths traverse several triangular faces on layer 2. Path 700 also traverses two triangular faces on layer 3, as it is a multi-layer route.

Path 700 is specified by the following ordered list of particles: node 704, wall 706, joint 708, wall 710, joint 712, wall 714, node 716, node 718, wall 720, joint 722, wall 724, and node 726. Path 702 is specified by the following ordered list of particles: node 728, wall 730, joint 732, wall 734, joint 736, wall 738, Steiner 740, wall 742, and node 744. FIG. 7 also illustrates a wall 746 of another portion of path 702's route.

As shown in FIG. 7, the embedded routes divide the faces that they completely cross into several spaces. For instance, these paths divide the face formed by vertices 704, 748, and 750 into three spaces. Also, a joint specifies the intersection of each route with each edge. Each joint connects to two exits, as each joint divides a previously undivided exit into two exits.

As mentioned above, path 702 includes a Steiner 740. This Steiner connects walls 738, 742, and 746. In addition, multi-layer route 700 includes two via nodes 716 and 718. These via nodes enable this path to traverse layers 2 and 3. These via nodes correspond to the hole 605 illustrated in FIG. 6. Specifically, the Q* engine converts this hole into the two via nodes 716 and 718 when it embeds the path 700.

Each net has a representation of its connectivity and topology. Each edge has an ordered list of the routes that cross it. In other words, a route's topological particles that are on edges appear on their edge's ordered list (e.g., linked list) in the topological order that their route crosses their edge. For the example illustrated in FIG. 7, the Q* engine specifies the edge between nodes 748 and 750 as an ordered list of the following particles: node 750, exit 752, joint 708, exit 754, joint 736, exit 756, and node 748. In this edge's ordered list, joints 708 and 736 of paths 700 and 702 appear in the order that their routes cross this edge.

As mentioned above, a topological route is a route that is defined in terms of its relation to other layout items. The Q* engine uses two different sets of associations to specify the topology of each topological route. The first set is the ordered list of topological particles on the route, and the second set is the ordered list of topological particles on the edges intersected by the route.

In the embodiments described below, certain particles (such as joints, via nodes, walls, and Steiners) that define a route are moveable, while other route-defining particles (such as port-geometry nodes) have a fixed location. The topological engine does not need to specify and store the location of moveable route-defining particles, as the routes are topologically defined. However, in the embodiments described below, the Q* topological engine specifies and stores locations for the route-defining particles in order to be able to compute wirelength accurately.

b. Overall Flow of the Q* Topological Router

Figure 8:
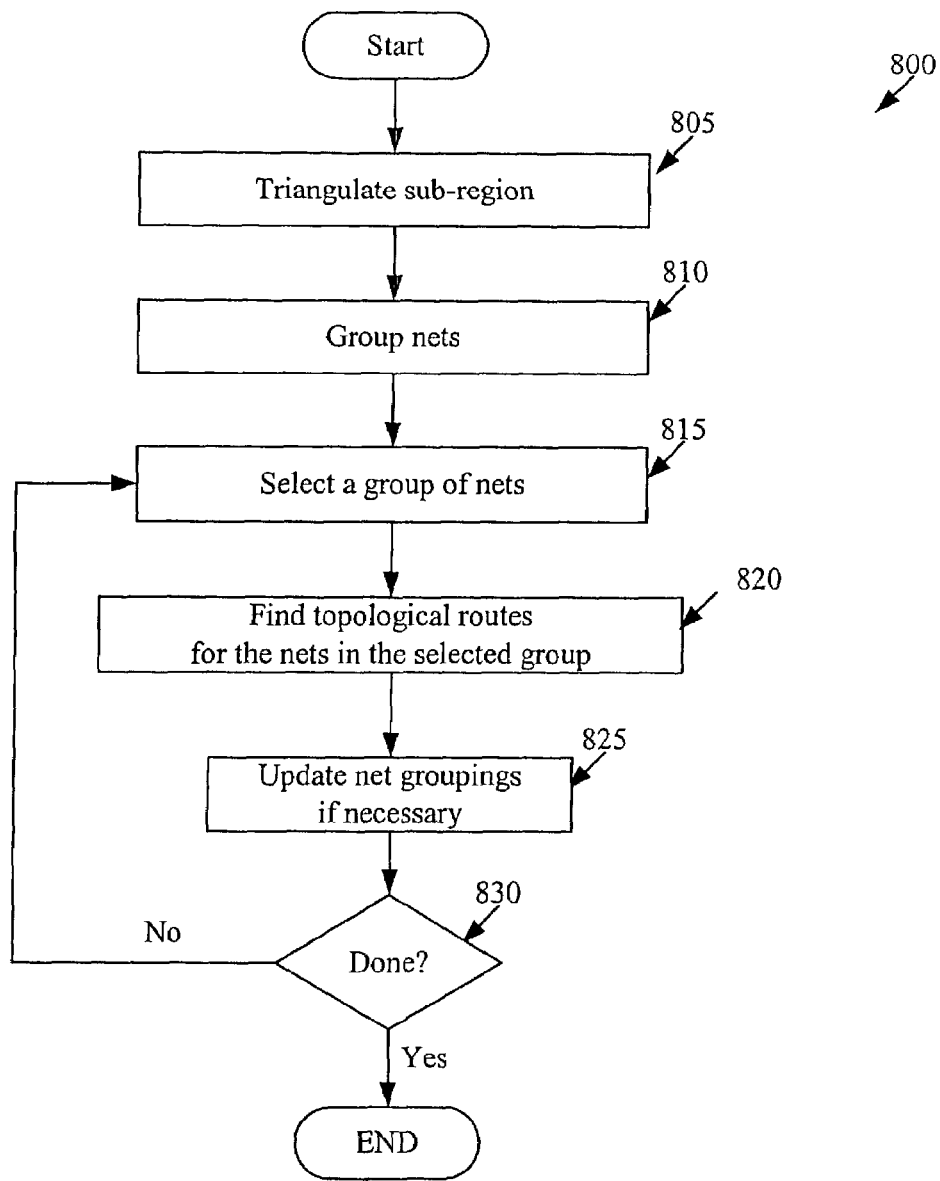
FIG. 8 illustrates a process that provides the overall flow of the Q* topological engine in some embodiments.

FIG. 8 illustrates a process 800 that provides the overall flow of the Q* topological engine in some embodiments. As shown in this figure, the process initially triangulates (at 805) the sub-region defined at 205. This triangulation will be further described below by reference to FIG. 9. After the triangulation, the process defines (at 810) an initial grouping of the nets in the sub-region. Different embodiments define the initial grouping differently. Some embodiments use a clustering approach that groups the nets that maximally interfere with each other. Some of these embodiments cluster the nets by (1) defining, for each net, a three-dimensional bounding box that contains the net's pins, (2) pair wise intersecting the bounding box of each net with each of the other nets, (3) computing the volume of intersection between the intersections, and (4) grouping the nets that have the greatest overlapping volume (i.e., that are likely to have the most amount of overlap). In some embodiments, the bounding boxes are rectangular bounding boxes that are defined with respect to a coordinate system that is rotated by 45° with respect to the coordinate system that is aligned with the sides of the layout. Some embodiments might use a multi-clustering approach that allows some or all nets to be in more than one clustered group.

After grouping the nets, the process selects (at 815) one of the groups identified at 810 for routing. Different embodiments make this selection differently. Some embodiments select the groups based on an initial ranking that depends on descending entropy values (i.e., descending estimated number of shortest routes) for all the nets in each group. Some embodiments specify the entropy of a net by (1) defining a grid of horizontal and vertical lines that are spaced apart by the minimum line to via spacing, (2) identifying the number of horizontal grid lines m and vertical grid lines n between the pins of each net, (3) computing the number of different n-element sets in an m-n element set (i.e., computing $$\binom{m-n}{n},$$

and (4) setting the net's entropy value equal to the log base 2 of this computation. The process 800 iterates through 815 several times. During some of the subsequent iterations, some embodiments select a group at 815 based on the number of unrouted or illegally routed nets in the group.

After selecting a group at 815, the process 800 calls (at 820) a solving engine to find a topological route for each net in the selected group. In the embodiments described below, the solving engine typically defines a legal or illegal route for each net in the group. In the circumstances that it cannot even find an illegal route for one or more nets, the solving engine notifies the process 800, which then takes this failure into account at 825 and 830 described below. The operation of the solving engine will be further described below by reference to FIG. 21.

Once the solving engine returns its solution (which may be incomplete) at 820, the process updates (at 825) the net groupings, if necessary. When necessary, the process updates the net groups based on the solution returned by the solving engine. The process 800 identified (at 810) the initial groupings based only on an estimated measure of interference between the nets. However, each time the process 800 receives a solution for a group of nets from the solving engine at 820, this process can receive or derive a more accurate measure of the interference between the nets in the groups. Based on this measure, the process might update the net groupings at 825. For instance, if the solution returned by the solving engine specifies that a net A uses the same edge as a net B, then the process updates the net groupings so that nets A and B are more likely to be clustered.

At 830, the process determines whether it should terminate. In some embodiments, the process terminates only if it has found a legal route for all the nets in the region, or if it has unsuccessfully tried a particular number of times to find a legal solution for all the nets. If the process determines at 830 that it should not terminate, it returns to 815 to select another group of nets, and then repeats 820–830 for this newly selected group of nets. The process ends when it decides to terminate at 830.

C. Triangulation

Different embodiments use different decomposition techniques to create a topological structure for embedding topological routes. The embodiments described below use triangulated graphs for each layer of the routed sub-region. Specifically, these embodiments use a constrained Delaunay triangulation ("CDT") technique. Several such techniques are disclosed in C. L. Lawson, "Transforming triangulations", Discrete Math, 3:365–372, 1972; C. L. Lawson, "Software for C Surface Interpolation," In J. R. Rice, editor, *Math Software III*, pp 161–194, Academic Press, New York, 1977; L. J. Guibas, D. E. Knuth, and M. Sharir, "Randomized Incremental Construction of Delaunay and Voronoi Diagrams", Algorithmica, 7:381–413, 1992.

Figure 9:
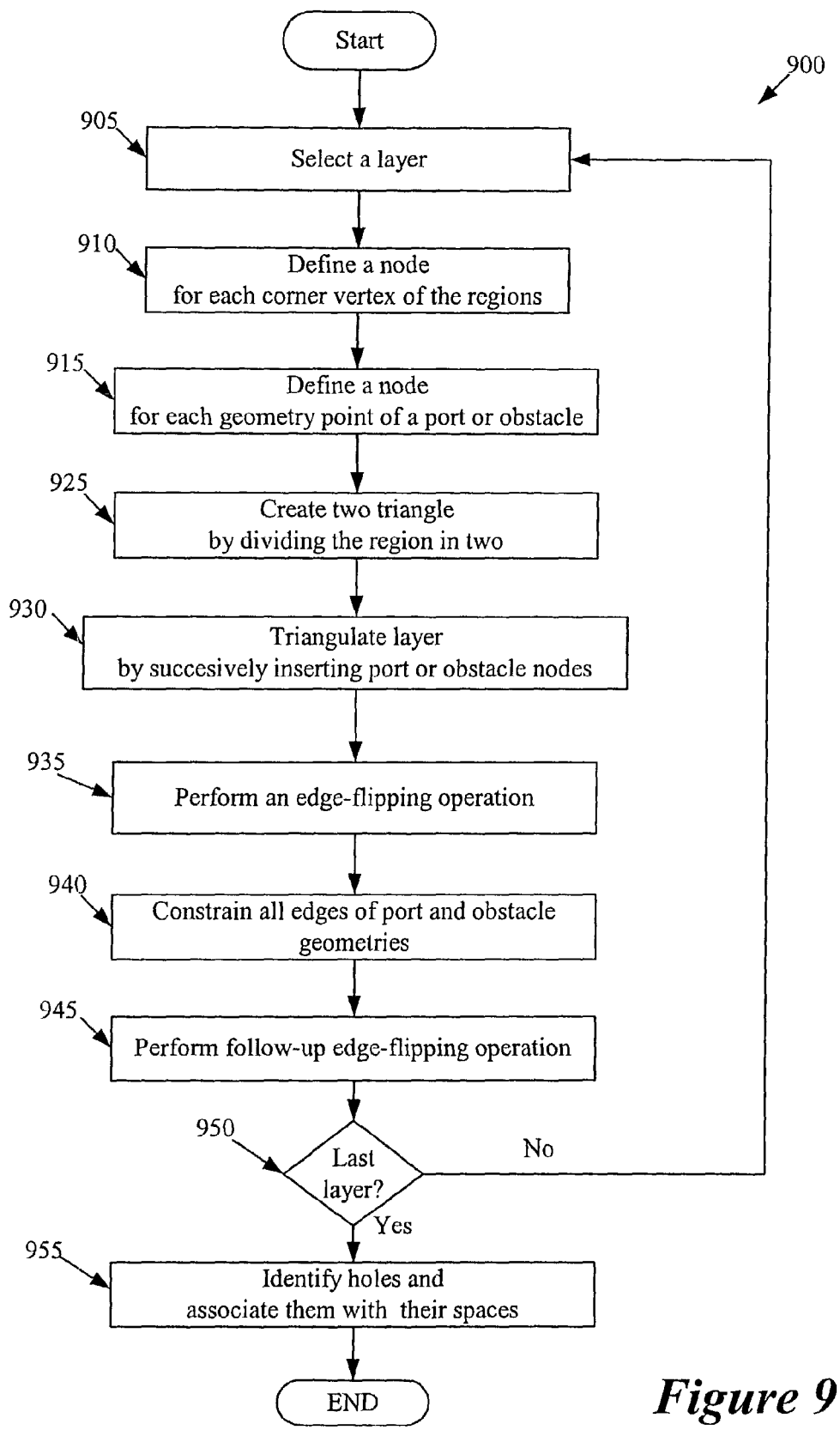
FIG. 9 illustrates a triangulation process that is used in some embodiment of the invention by the Q* topological routing engine.

FIG. 9 illustrates a triangulation process 900 that is used in some embodiment of the invention by the Q* topological routing engine. This process decomposes each layer of the sub-region into several triangular faces. Accordingly, this process initially selects (at 905) one of the layers of the sub-region. Next, the process (1) defines (at 910) a graph node at the location of each corner of the sub-region on that layer, and (2) defines (at 915) a graph node at the location of each geometry point of a port or obstacle in the selected sub-region layer.

Some embodiments also define one node for each vpin in the selected sub-region layer. Other embodiments define a graph node for only some of the vpins. For instance, some embodiments select as triangulation nodes vpins that are near interior geometry nodes that are close to the boundary. Of the remaining vpins, these embodiments designate as nodes every nth (e.g., $5^{th}$) vpin around the boundary. The vpins that are not specified as nodes, are specified as joints in some embodiments. Also, in some embodiments, the process 900 defines (at 915) nodes on the sides of certain geometries to ensure that there are sufficient edges to detect congestion in the IC region. FIG. 10 illustrates the layout of FIG. 4 after nodes have been defined at each sub-region corner and at each port or obstacle geometry point.

Next, as shown in FIG. 9, the process creates (at 925) two triangles by dividing the region along a diagonal line connecting two of the corner node vertices. The process then successively inserts (at 930) individual port or obstacle nodes in the created triangles to divide the triangles into smaller sub-triangles. Specifically, when a new node is inserted, the triangle containing that node is identified, and that triangle is further triangulated by connecting the newly inserted node to the vertices of the identified triangle. FIG. 11 illustrates this triangulation technique. In this example, two triangles 1120 and 1140 are created by connecting two diagonal nodes 1105 and 1110 of the sub-region layer. Next, a node 1115 is inserted in the sub-region. The triangle 1120 that contains this newly inserted node is then further triangulated into three smaller triangles 1125, 1130, and 1135 by connecting the newly inserted node to the vertices of triangle 1120. Each time the Q* topological engine defines (e.g., at 930) an edge between two nodes, it defines an exit between the two nodes. Also, each time the Q* topological engine defines a triangle (e.g., at 930), it defines the space within the triangle.

After defining a set of triangles at 930, the process performs (at 935) an edge-flipping operation to maximize the minimal angle of each triangle, i.e., to make the triangulation Delaunay. This operation is done in order to improve the likelihood that the topological routes produced by the Q* topological engine can be converted into specific geometric routes. To have an absolute guarantee that the generated topological routes can be geometrized, a visibility graph needs to be constructed to analyze every edge between any two graph nodes that have unobstructed views of each other in the relevant routing metric to ensure that each such edge is not overcongested. However, such an approach would be computationally expensive. Hence, instead of examining the edge between each such pair of graph nodes, some embodiments use an edge-flipping Delaunay triangulation as a good approximation of the visibility graph.

FIGS. 12 and 13 illustrate why maximizing the minimal angle of each triangle improves the likelihood that the generated topological routes can be geometrized. In these figures, nodes 1205 and 1210 do not have an edge between them. Hence, the Q* topological engine cannot measure the congestion of the straight-line path between these two nodes. It can, however, measure the congestion on edges 1215, 1220, 1225, 1230, and 1235. In FIG. 12, the triangles are equilateral triangles, and therefore have the largest minimal angles. As illustrated in FIG. 12, it is relatively unlikely that a set of topological routes exist that could overfill the capacity of the straight-line path between nodes 1205 and 1210 without overcongesting the capacity of edge 1235. However, as illustrated in FIG. 13, when the adjoining triangles have small minimal angles, it is quite possible that a set of paths overcongest the straight-line path between nodes 1205 and 1210 without overcongesting the capacity of the adjoining edge 1235.

Some embodiments perform an edge-flipping operation by identifying, for each triangle, a circle that encompasses all of the triangle's vertices. If that circle encompasses the vertex of another triangle as well, and if the two triangles do not jointly form a non-convex polygon, then the common edge between the two triangles is flipped. Flipping an edge between two triangles means deleting the existing common edge between the two triangles and defining a new common edge between the two vertices of the triangles that were not previously connected. The edge flipping operation typically results in a new pair of triangles that has larger minimal angles than the original pair of triangles. This operation defines necessary exits and spaces for the new triangles, and discards the original pair of triangles and their associate spaces. When a pair of abutting triangles form a non-convex structure, the common edge between them is not flipped.

FIGS. 14 and 15 illustrate one manner for performing the edge-flipping operation. FIG. 14 illustrates two triangles 1405 and 1410. Circle 1415 is the identified circle that encompasses all of the vertices of triangle 1405. This circle also includes the vertex 1420 of triangle 1410. As the two triangles do not form a non-convex polygon, the common edge 1425 between these two triangles is flipped. FIG. 15 illustrates the newly defined pair of triangles 1430 and 1435 and the edge 1440 between them. The edge 1425 between the triangles 1405 and 1410 would not have been flipped if the circle 1415 did not contain the vertex 1420 of triangle 1410.

After performing the edge-flipping operation at 935, the process performs (at 940) a constraining operation to ensure that a triangle edge exists (1) between each pair of successive points of an obstacle or port, and (2) at the sub-region boundary edges. FIG. 16 provides a pictorial example of this operation. This figure illustrates two successive pairs of obstacle or port points 1605 and 1610 that do not share an edge after the edge-flipping operation of 935. FIG. 16 illustrates the constraining operation flipping three different edges 1615, 1620, and 1625 until an edge 1630 exists between the two node points 1605 and 1610. Once this edge exists, it is identified as a constrained edge that should not be removed. Accordingly, this operation is referred to as a constraining operation, as it defines edges at sub-region boundaries and between successive pairs of geometry points, and then marks the edges as constrained.

Next, the process performs (at 945) a follow-up edge-flipping operation without flipping the edges constrained at 940. This follow-up operation is to try to maximize the minimal angle of the triangles as much as possible while respecting the constrained edges. The process then determines (at 950) whether it has examined all the sub-region's layers. If not, the process transitions back to 905 to select another layer and to repeat 910 through 945 to triangulate the newly selected layer.

Figure 17:
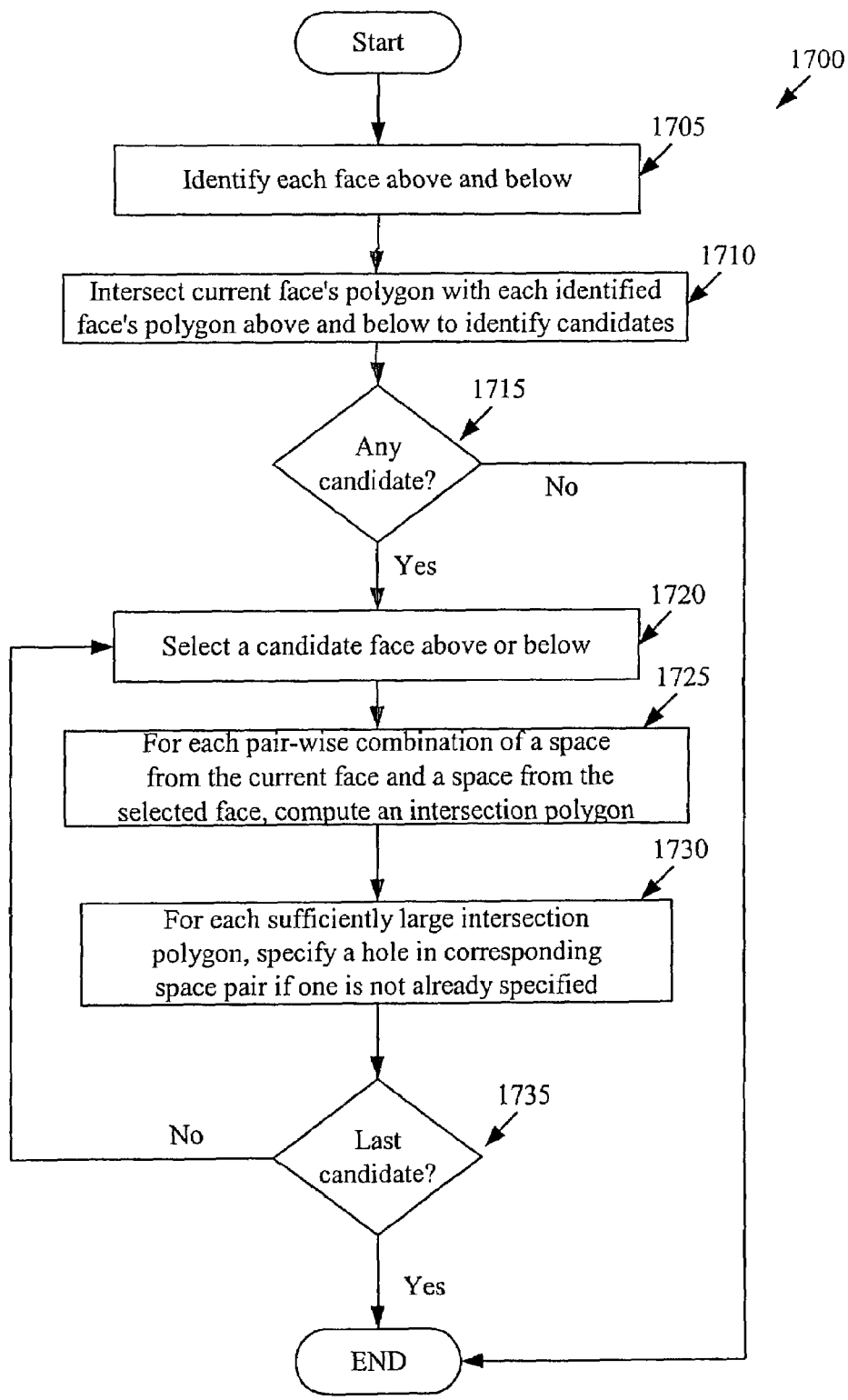
FIG. 17 illustrates a hole-identification process that can be used to try to specify holes within triangles.

Otherwise, the process identifies (at 955) holes in the spaces of the triangles that it defined. FIG. 17 illustrates a hole-identification process 1700 that the Q* topological routing engine can use to try to specify holes for the spaces of a triangle (referred to as the examined triangle). After triangulation, the topological engine performs (at 955) the process 1700 for each triangle that it has defined. This engine also uses this process at other stages in the routing process. In general, this engine uses all or some of this process each time it creates a new space (e.g., when it creates new triangles, or when modifies previously defined triangles).

The process 1700 initially identifies (at 1705) all triangular faces that overlap the examined triangular face in the layer above, and if applicable, in the layer below. The overlapping faces can be identified based on the x- and y-coordinates of the nodes of the faces. In some embodiments, the topological engine stores for each face a list of all faces that overlap it in the layers above and, if applicable, below.

The process then identifies (at 1710) the overlapping faces that are potential via destinations from the examined face. Specifically, for each triangle, the Q* topological engine in some embodiments stores a polygon that approximates the legal area where the center of vias can be in the face in the absence of any route crossing the face. The engine identifies the polygon for each face by identifying the closest point within the face that a via can be to each obstacle on the layer, accounting for the via size and/or shape, the required spacing to obstacles, etc. If the result is disjoint or non-convex, the engine approximates by using the convex hull of the legal locations.

The process 1700 uses the face polygons to identify quickly the overlapping faces that might be potential via destinations. In particular, at 1710, the process 1700 (1) intersects the examined face's polygon with the polygon of each overlapping face that it identified at 1705, and (2) identifies each overlapping face as a potential via destination if the intersection polygon computed for it has sufficient space for a via. The process 1700 then determines (at 1715) whether it identified at 1710 any overlapping face as a potential via destination. If not, the process ends. Otherwise, the process selects (at 1720) a potential via-destination face that it identified at 1710.

For each space within each face, the Q* topological routing engine stores a polygon that specifies the legal area where the center of vias can be in the space. The engine identifies the polygon for each space by identifying the closest point within the space that a via can be to each obstacle on the layer, accounting for the via size and/or shape, the required spacing to obstacles, the required spacing to other routes crossing the face, etc. If the result is disjoint or non-convex, the engine approximates by using the convex hull of the legal locations. A space's polygon might be identical to its face's polygon (which, in some embodiments, is the case after the initial triangulation) or might be different than its face's polygon (which, in some embodiments, is the case when topological routes cross the face).

The process 1700 specifies a hole for each pair of overlapping spaces when the intersection of the polygons of these spaces is at least a certain size (e.g., it is larger than a particular threshold value). Specifically, after selecting (at 1720) a potential via-destination face, the process 1700 identifies (at 1725) an intersection polygon for each combination of space pairs in the examined and selected faces. When the intersection polygon for a space pair is at least a certain size, the process then identifies (at 1730) a hole for the space pair, if one such hole does not already exist. The process then determines (at 1735) whether it has examined all the potential via-destination faces that it identified at 1710. If not, the process transitions back to 1720 to select another such face. Otherwise, the process ends.

The end result of the triangulation operations 900 is a set of triangulated sub-region layers, which can be used to embed and remove topological routes in the sub-region. FIG. 18 illustrates an example of how the layout of FIG. 4 might look after triangulation.

Figure 19A:
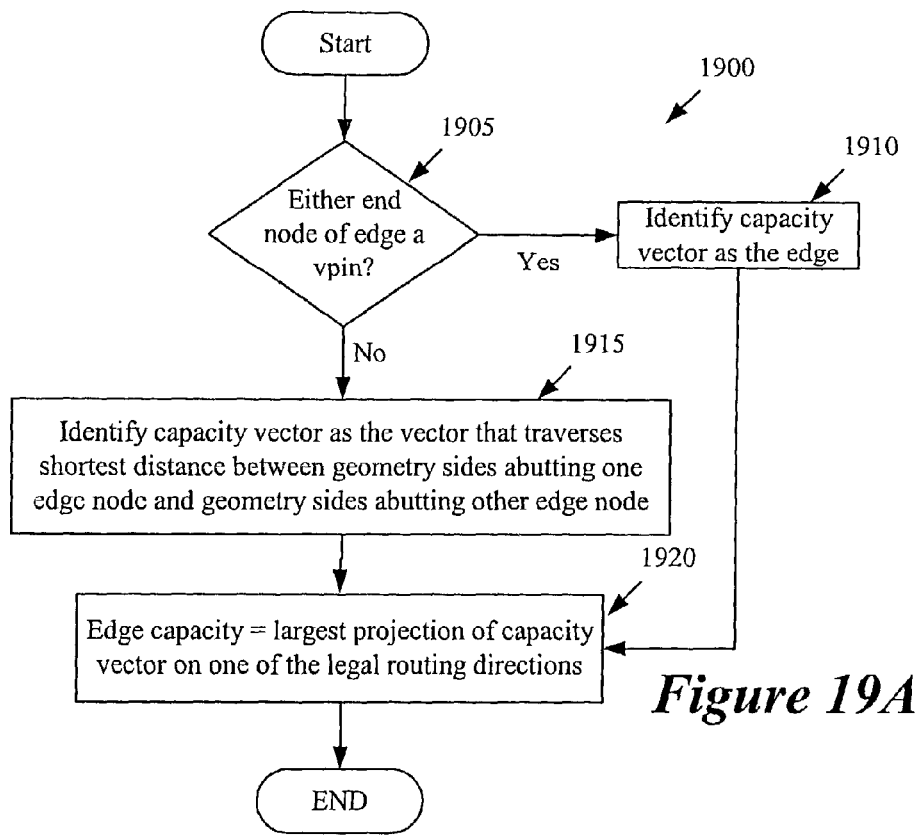

In some embodiments, the triangulation operation defines the capacity of each edge in the triangulated region. The above-described triangulation operation defines each edge's capacity whenever it creates the edge at 925 through 945. FIG. 19A illustrates a process 1900 that the topological engine can call each time it wants to identify the capacity of an edge in the triangulated sub-region. This process is designed to support multiple wiring models.

As shown in FIG. 19A, the process 1900 determines (at 1905) whether either node of the edge belongs to a vpin. If so, the process identifies (at 1910) the edge as the capacity vector. If not, the process identifies (at 1915) the capacity vector as the vector that traverses the shortest distance between the sides of the geometry abutting one of the edge nodes and the sides of the geometry abutting the other edge node.

After 1910 or 1915, the process 1900 defines the edge capacity as the length of the largest projection of the capacity vector onto one of the legal routing directions. The projection P of the capacity vector C onto a legal routing direction D is given by $$P = C * \cos \alpha,$$

where $\alpha$ is the angle between the capacity vector C and the legal routing direction D. Accordingly, the edge capacity is the magnitude of the projection vector. The largest projection of the capacity vector can be identified (at 1920) in a variety of ways. Some embodiments compute the magnitude of the capacity vector's projection onto all the legal routing directions and then select the largest. Others identify the routing direction that makes the smallest angle with the capacity vector, define this routing direction as the direction of projection, and then compute the projection of this capacity vector onto the identified routing direction.

Other embodiments might compute the edge capacities slightly differently from process 1900. For instance, some embodiments might define each edge (including an edge that does not connect to vpins) to be its own capacity vector. Some of these embodiments then specify each edge's capacity as the edge's largest projection onto one of the legal routing directions.

Figure 19B:
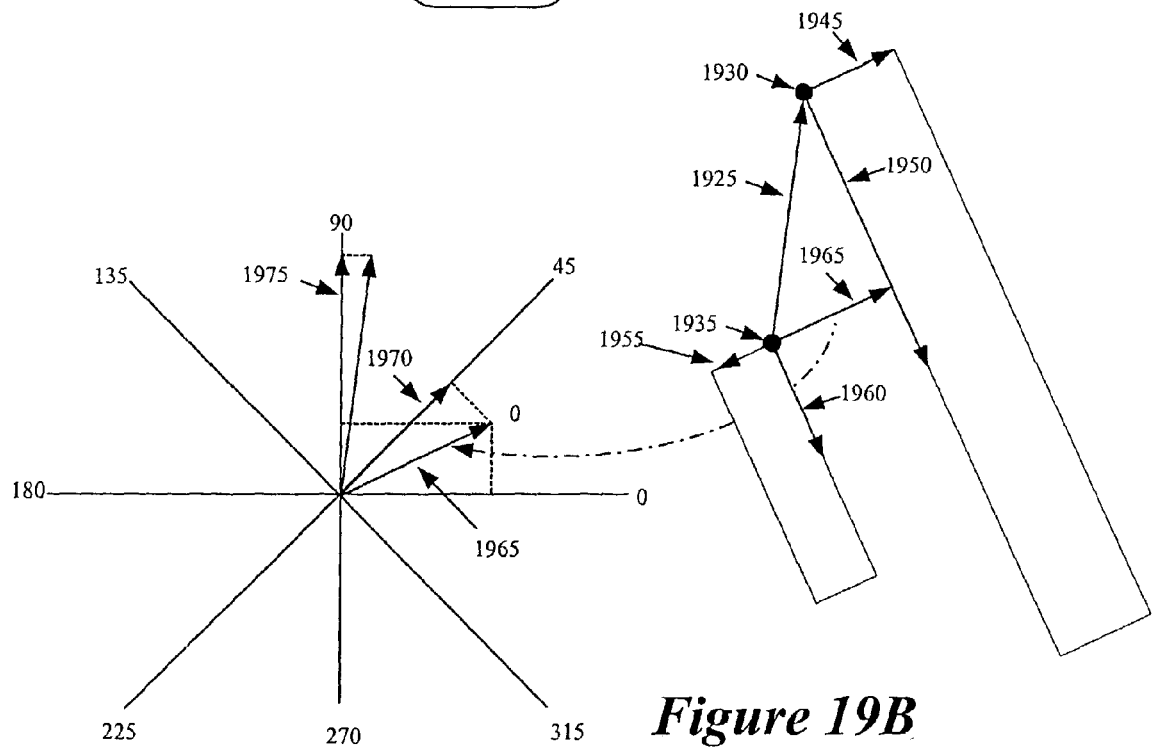

FIG. 19B illustrates the different ways discussed above for defining the capacity of an edge. FIG. 19B illustrates an edge 1925 between two nodes 1930 and 1935 on an octilinear layer like the one shown in FIG. 1. In this example, vector 1965 is the vector that traverses the shortest distance between sides 1945 and 1950 abutting node 1930 and sides 1955 and 1960 abutting node 1935. Some embodiments would select the edge 1925 as the capacity vector. For these embodiments, the projection 1975 is the largest projection of this capacity vector onto one of the legal routing directions, which in this case is the +90° direction. On the other hand, some embodiments would select the vector 1965 as the capacity vector. For these embodiments, the projection 1970 is the largest projection of the capacity vector 1965 onto a legal routing direction, which in this case is the +45° direction. Defining an edge's capacity based on its capacity vector's largest projection onto a legal routing direction provided by the wiring model enables the Q* topological engine to produce topological routes that are customized for different wiring models.

The embodiments described above identify an edge's capacity as the largest projection of the edge's capacity vector onto one of the legal routing directions. Other embodiments, however, might use other techniques to compute an edge's capacity from its capacity vector. For instance, some embodiments that use the octilinear wiring model of FIG. 1, (1) for each layer, identify eight sectors about the eight routing directions, (2) identify the sector of the edge's layer that contains the edge's capacity vector, and (3) project the capacity vector onto the routing direction associated with the identified sector.

FIG. 20A illustrates eight sectors that some embodiments identify for a particular layer about the eight routing directions of FIG. 1. These eight sectors are defined between eight constraining angles: 22.5°, 67.5°, 112.5°, 157.5°, 202.5°, 247.5°, 292.5°, and 337.5°. Some embodiments assume that these angles are the angles of edges that constrain the embedding of geometric routes about unrelated geometries in the layout. Some of these embodiments assume that net routes have equal widths and spacings in the Manhattan and diagonal directions on the particular layer. Computing the edge capacities by using the eight constraining angles and eight sectors illustrated in FIG. 20A is equivalent to defining the edge capacities as the largest projection of the capacity vectors onto the legal routing directions.

Other embodiments, however, define the eight constraining angles of a particular layer differently. Therefore, they compute some edge capacities that are different than the largest projection of the edge capacity vectors onto the legal routing directions. These embodiments allow the widths and spacings of nets to be different in the Manhattan and diagonal directions on the same layer. These embodiments define the constraining angles on a layer based on the worst combination of net spacings and widths in the Manhattan and diagonal directions on the layer. FIG. 20B illustrates eight such constraining angles for a particular layer. In this figure, the angle $\alpha$ can be computed based on the equation (1) below.

$$\alpha = \arctan \frac{S_{min,y} + W_{min,y}}{S_{min}^m + W_{min}^m}. \tag{1}$$

To understand this equation, the following variables need to be defined:

i is a number from 1 to n representing one of n nets;

k is a number from 1 to p representing one of p spacing constraints between nets and between nets and obstacles;

$S_k^m$ is a $k^{th}$ spacing between a net and another net or an unrelated geometry in a Manhattan direction of the particular layer;

$W_i^m$ is a width of the $i^{th}$ net in a Manhattan direction of the particular layer;

$S_k^d$ is the $k^{th}$ spacing constraint between a net and another net or an unrelated geometry in a diagonal direction of the particular layer, $W_1^d$ is the width of the $i^{th}$ net in the diagonal direction of the particular layer.

The values $S_{k,y}$ and $W_{i,y}$ are computed as follows:

$$S_{k,y} = ceil(S_k^d * \sqrt{2} - S_k^m); \text{ and} \tag{2}$$

$$W_{i,y} = ceil(W_1^d * \sqrt{2} - W_i^m), \tag{3}$$

where the "ceil" operation in the above equations signifies rounding up to the next manufacturing grid, as the spacings and widths are expressed in terms of manufacturing grid units and the routes are defined with respect to the manufacturing grid. Given the above definitions, the variables $S_{min,y}$ and $S_{min}^m$ are the related $k^{th}$ spacing constraints $S_{k,y}$ and $S_k^m$ that produce the smallest ratio $$\frac{S_{k,y}}{S_k^m}.$$

Similarly, the variables $W_{min,y}$ and $W_{min}^m$ are the related $i^{th}$ width constraints $W_{i,y}$ and $W_i^m$ that produce the smallest ratio $$\frac{W_{i,y}}{W_i^m}.$$

FIG. 20C provides an example that illustrates some of the variables mentioned above, and describes the derivation of the equation (1). This figure illustrates two nets 2005 and 2010 bending around an obstacle 2015 of a particular layer. In this figure, $S_{80}^m$ is the $80^{th}$ spacing constraint specifying the spacing between the net 2005 and the obstacle 2015 in the Manhattan directions of the particular layer, $S_{80}{}^D$ the $80^{th}$ spacing constraint specifying the spacing between the net 2005 and the obstacle 2015 in the diagonal directions of the particular layer, $W_5{}^m$ is the width of the net 2005 in the Manhattan directions of the particular layer, $W_5{}^D$ is the width of the net 2005 in the diagonal directions of the particular layer, $S_{122}{}^m$ is the $122^{nd}$ spacing constraint specifying the spacing between the nets 2005 and 2010 in the Manhattan directions of the particular layer, and $S_{122}{}^D$ is $122^{nd}$ spacing constraint specifying the spacing between the nets 2005 and 2010 in the Manhattan directions of the particular layer, $W_{10}{}^m$ is the width of the net 2010 in the Manhattan directions of the particular layer, $W_{10}{}^D$ is the width of the net 2010 in the diagonal directions of the particular layer, $S_{156}{}^m$ is the $156^{th}$ spacing constraint specifying the spacing between the net 2010 and an obstacle 2050 in the Manhattan directions of the particular layer, and $S_{156}{}^D$ is $156^{th}$ spacing constraint specifying the spacing between the net 2010 and the obstacle 2050 in the diagonal directions of the particular layer.

FIG. 20C illustrates $S_{80,y}$, $W_{5,y}$, $S_{122,y}$, $W_{10,y}$, $S_{156,y}$. In this figure, the points that define the route bends (i.e., in this case, the transitions from the $-45°$ direction to the vertical direction) are specified on the manufacturing grid. As shown FIG. 20C, $S_{80,y}$ is the difference in the y-coordinates of the vertex 2020 and the bend-defining point 2025 of the net 2005, $W_{5,y}$ is the difference in the y-coordinates of the bend-defining points 2025 and 2030 of the net 2005, $S_{122,y}$ is the difference in the y-coordinates of the bend-defining point 2030 of the net 2005 and the bend-defining point 2035 of the net 2010, $W_{10,y}$ is the difference in the y-coordinates of the bend-defining points 2035 and 2040 of the net 2010, and $S_{156,y}$ is the difference in the y-coordinates of the bend-defining point 2040 of the net 2010 and the vertex 2045 of the obstacle 2050.

The five equations below specify how $S_{122,y}$, $S_{80,y}$, $W_{5,y}$, $W_{10,y}$, and $S_{156,y}$ are computed in order to define the bend-defining points on the manufacturing grid.

$$S_{80,y} = ceil(S_{80}{}^d * \sqrt{2} - S_{80}{}^m);$$

$$W_{5,y} = ceil(W_5{}^d * \sqrt{2} - W_5{}^m);$$

$$S_{122,y} = ceil(S_{122}{}^d * \sqrt{2} - S_{122}{}^m);$$

$$W_{10,y} = ceil(W_{10}{}^d * \sqrt{2} - W_{10}{}^m);$$

$$S_{156,y} = ceil(S_{156}{}^d * \sqrt{2} - S_{156}{}^m).$$

In the example illustrated in FIG. 20C, the angle $\alpha_0$ of a line connecting the obstacle vertex 2020 and the first bend point 2025 is $$\arctan\left(\frac{S_{80,y}}{S_{80}^m}\right).$$

The angle $\alpha_1$ of a line connecting the obstacle vertex 2020 and the bend point 2035 is $$\arctan\left(\frac{S_{80,y} + W_{5,y} + S_{122,y}}{S_{80}^m + W_5^m + S_{122}^m}\right).$$

The angle $\alpha_2$ of a line connecting the obstacle vertices 2020 and 2045 is:

$$\alpha_2 = \arctan\left(\frac{S_{80,y} + W_{5,y} + S_{122,y} + W_{10,y} + S_{156,y}}{S_{80}^m + W_5^m + S_{122}^m + W_{10}^m + S_{156}^m}\right).$$

This angle $\alpha_2$ will always be greater or equal to the angle $\alpha_p$:

$$\alpha_p = \arctan\left(\frac{pS_{min,y} + (p-1)W_{min,y}}{pS_{min}^m + (p-1)W_{min}^m}\right),$$

where p–1 is the number of nets crossing a constraining edge. Equation (1) is obtained from the above equation, by realizing that for all p the angle $\alpha_p$ will be greater or equal to the angle provided by equation (1). The equation (1) reduces to:

$$\alpha = \arctan\frac{S_y + W_{min,y}}{S^m + W_{min}^m}$$

when the particular layer has only one spacing constraint $S^m$ in the Manhattan directions and one spacing constraint $S^d$ in the diagonal directions. If the particular layer has only one width $W^m$ in the Manhattan directions and one width $W^d$ in the diagonal directions for all nets, the equation (1) reduces further to:

$$\alpha = \arctan\frac{S_y + W_y}{S^m + W^m}.$$

After using equation (1) to compute the angle $\alpha$ for a particular layer, some embodiments specify the eight constraining angles for the particular layer. These eight constraining angles are illustrated in FIG. 20B. These eight angles specify eight sectors, where each sector is associated with a particular direction. These embodiments identify the capacity of each edge that is within the particular layer by first identifying the sector that contains the edge's capacity vector, and then project each edge's capacity vector onto the routing direction associated with the identified sector. For instance, if the angle of the capacity vector is between $\alpha$ and $90-\alpha$, the capacity vector falls within the sector between constraining angles $\alpha$ and $90-\alpha$. As shown in FIG. 20B, this sector's associated routing direction is the $45°$ direction. Accordingly, the capacity vector will be projected onto the $45°$ direction.

d. Solving Engine (1) Overall Flow

Figure 21A:
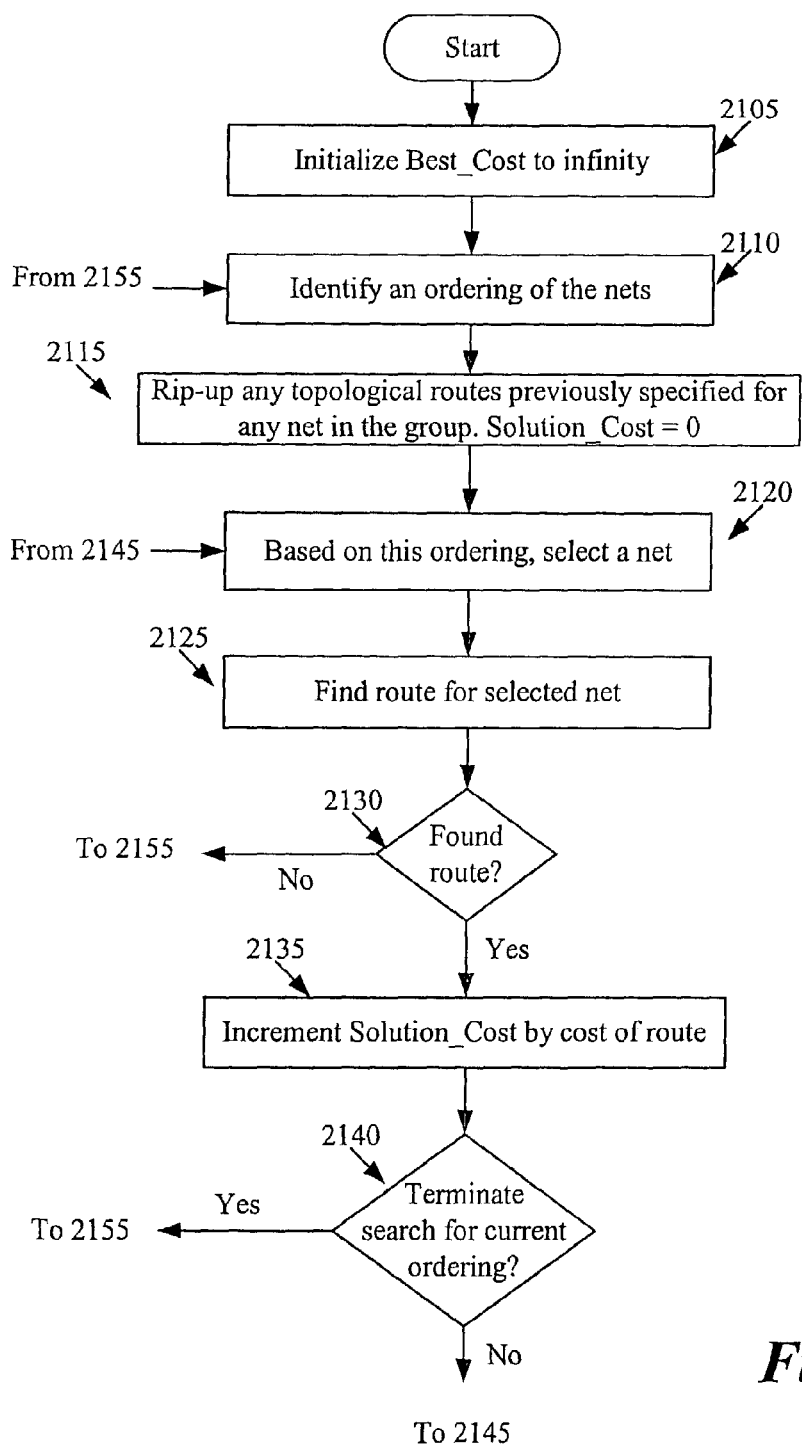
FIG. 21 illustrates the overall flow of a solving engine of some embodiments of the invention.
Figure 21B:
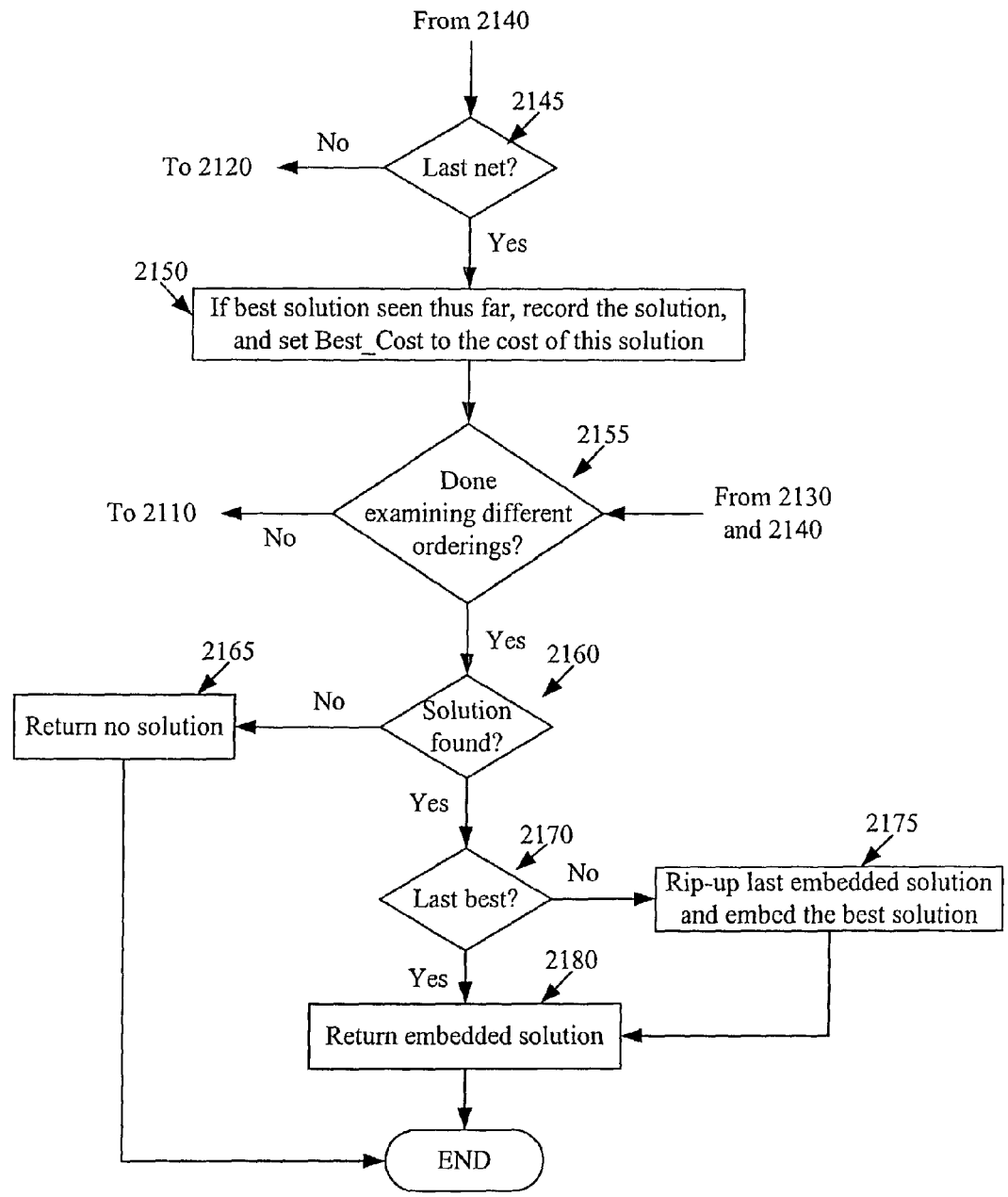

As mentioned above, the Q* topological routing engine calls (at 820) its solving engine to identify topological routes for a group of nets. FIG. 21 illustrates a process 2100 that the solving engine performs in some embodiments each time that the process 800 calls it at 820 and specifies a selected group of nets to route within a given sub-region. For each group of nets that it receives, the process 2100 generates several solutions based on different net orders, and then returns the best solution that it generates for the group. This exploration of the solution space is further enhanced by the modifications of the net groupings at 825.

As shown in FIG. 21, the process 2100 starts by setting (at 2105) a Best_Cost variable to a large number. This process uses this variable to identify the best solution for the nets that it examines. It also uses this variable to determine whether it should terminate generating routes based on a particular net order.

The process then identifies (at 2110) an ordering of the nets. As further described below, the process 2100 passes through 2110 several times. The process 2100 selects a different net order each time it returns to 2110. Different embodiments iterate through the different net orders differently. Some embodiments examine all ordering permutations, while other embodiments examine fewer permutations. Also, at 2110, some embodiments randomly select new net orderings, while other embodiments systematically examine different ordering permutations.

Some embodiments systematically examine different net orderings by using a heuristic to identify a net order the first time the process 2100 passes through 2110, and then specifying a different net order during each subsequent iteration of the process 2100 through 2110. For instance, in some embodiments, the process 2100 specifies an initial net order based on descending net entropies. Entropy provides a measure of difficulty for routing the nets. A high entropy net has many equivalently good options (i.e., has many shortest-cost routes), while a low entropy net has only a few good routes (i.e., has few shortest-cost routes). Some embodiments measure a net's entropy according to the approach described above for 815.

After specifying the initial net order based on a heuristic, the process 2100 in some embodiments specifies the subsequent net orders at 2110 by (1) identifying the nets that ended up with routes that were longer than anticipated in the previous iteration, and (2) specifying an ordered list with the identified nets higher on the list. Other embodiments use a least-discrepancy-search ("LDS") technique. Under this technique, the process 2100 still specifies the initial net order based on a heuristic the first time that it passes through 2110. During each subsequent iteration through 2110, the process selects a net order that has the fewest differences from the previously selected orderings. For instance, after the initial net order, the next series of iterations through 2110 select orderings that are identical to the initial ordering except that the positions of two of the nets are transposed. Similarly, the subsequent series of iterations through 2110 would explore orderings that are identical to the initial one except that the number of transposed net positions would be three, four, five, etc. Branch-and-bound techniques can be used to terminate iterating through a series of different orderings (e.g., terminate examining different ordering permutations that have the position of four nets transposed with respect to the initial ordering). Some embodiments that explore fewer than all possible permutations of net orders limit the number of permutations that they explore based on the number of nets in the received group of nets.

After specifying an ordered list of nets at 2110, the process rips out (at 2115) any topological route previously specified in the sub-region for any nets in the received group of nets. At 2115, the process also initializes a variable Solution_Cost to zero. Next, from the ordered list of nets specified at 2110, the process selects (at 2120) a net to route. It then calls (at 2125) a route-generation process to identify a route for the selected net. This route-generation process will be described further below by reference to FIG. 22.

Next, the process determines (at 2130) whether the route generation engine was able to identify a route for the selected net. If not, the process transitions to 2155, which will be further described below. Otherwise, the process increments (at 2135) the Solution_Cost by the cost of the route identified at 2130. Next, the process determines whether it should stop (at 2140) identifying routes for the current net order specified at 2110. In some embodiments, the process terminates (at 2140) finding routes for the current net order when the cost of the nets routed for the current net order (i.e., the current Solution_Cost) plus the estimated cost of the unrouted nets in the current net order exceeds the Best_Cost encountered thus far.

In some embodiments, the estimated cost of the unrouted nets equals the sum of the estimated cost for each unrouted nets. In some embodiments, each unrouted net's estimated cost equals the length of the net's minimum octilinear spanning tree or Steiner tree. Several manners for constructing octilinear spanning and Steiner trees for a net are described in U.S. patent application entitled "Method and Apparatus for Considering Diagonal Wiring in Placement" and having Ser. No. 09/731,891.

As mentioned above, the Best_Cost is initially set to a large number at 2105 for the group of nets. This cost is set to a lower number when the process 2100 finds a routing solution for the initial net order, assuming that at least one topological route can be defined for each net in the order irrespective of the route's cost. Each time the process 2100 finds a new solution for all the nets based on a different ordering, it sets the Best_Cost to the new solution's cost if the new solution has a lower cost than the previously defined Best_Cost.

If the process determines (at 2140) that it should stop identifying routes for the current net order, it transitions to 2155, which is further described below. Terminating a search for a particular net order when it is apparent that the search will not provide a better solution than the best solution already encountered speeds up the operation of the process 2100 so that it can examine more net orderings.

If the process determines (at 2140) that it should not terminate its search for the current net order, it determines (at 2145) whether it has examined all the nets on the current ordered list specified at 2110. If not, the process returns to 2120 to select another net and to repeat its operations for this newly selected net. Otherwise, the process determines (at 2150) whether the Solution_Cost for the current net order is better than the Best_Cost recorded thus far. If so, the process sets (at 2150) the Best_Cost to the Solution_Cost and records the solution (i.e., the set of topological routes) for the current order of the nets as the best solution (i.e., as the best set of topological routes).

The process then determines (at 2155) whether it has sufficiently examined different net orders. This determination depends on the technique that the process is using to search through the space of different net orders. These different techniques were described above. If the process determines (at 2155) that it should examine other net orders, it returns to 2110 to select another net order and then repeats its subsequent operations to identify a solution based on this order. Otherwise, the process determines (at 2160) whether it found a solution that included a route for all the nets in the received group of nets. If not, the process returns (at 2165) its failure to find a solution and the best partial solution that it encountered.

Otherwise, the process determines (at 2170) whether the solution embedded for the last net order was the best solution it examined. If so, the process transitions to 2180, which is further described below. Otherwise, it rips up (at 2175) the last embedded solution and embeds the best solution that it identified by examining the various net orderings. This embedding operation is similar to an embedding operation performed by the route generation process, which will be further described below. At 2180, the process returns the embedded solution and then ends.

(2) Route Generation Process

Figure 22:
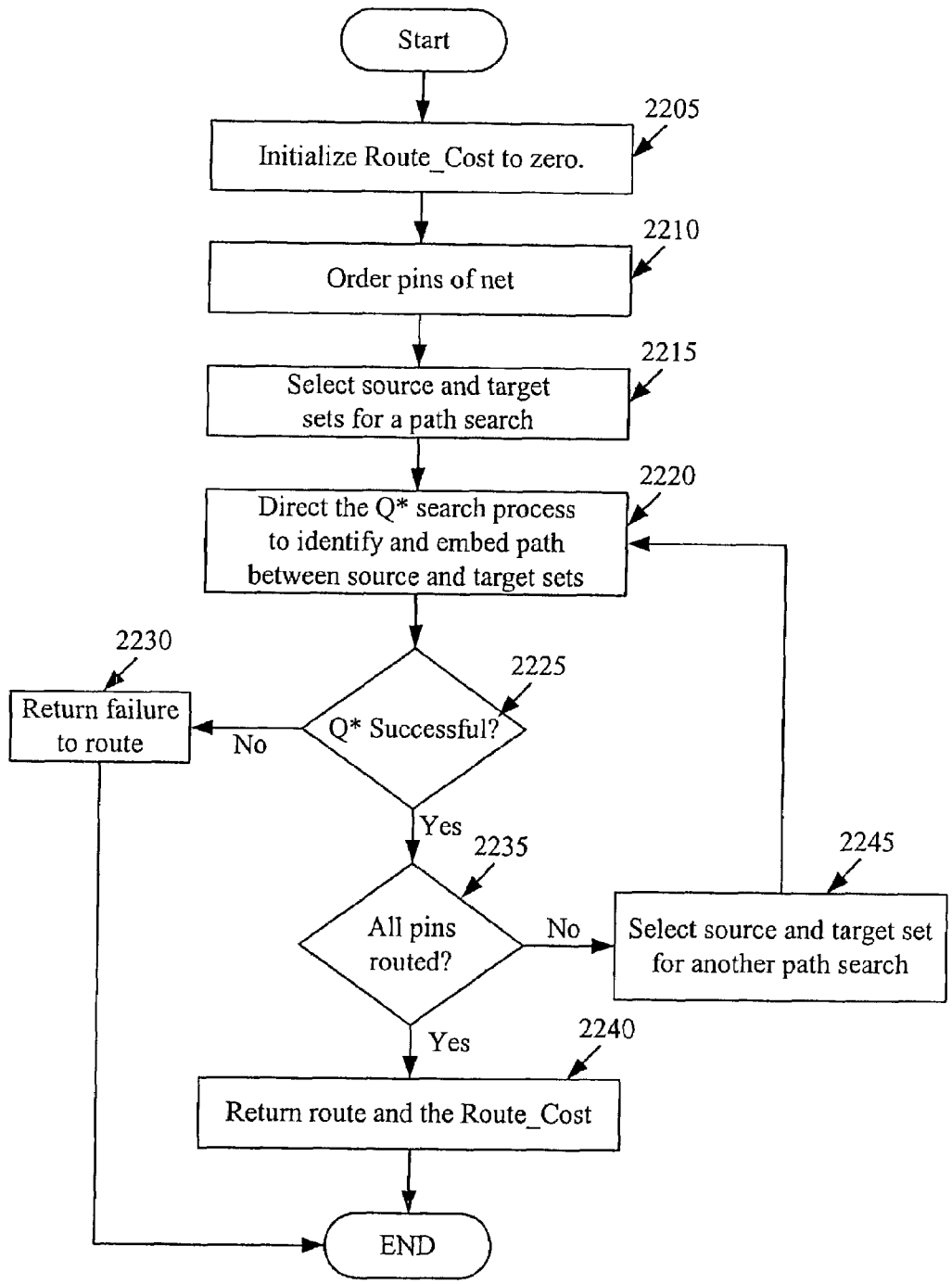
FIG. 22 illustrates a route generation process of some embodiments.
Figure 23:
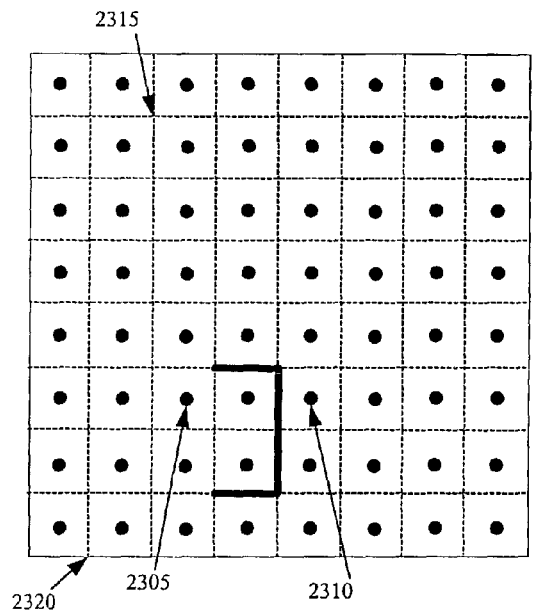
FIGS. 23–30 provide an example of an A* path search that uses such an $\hat{F}$ cost.

The solving engine directs (at 2125) a route generation process to construct the lowest-cost route for a particular net in a particular region. FIG. 22 illustrates a route generation process 2200 of some embodiments. The process 2200 starts (at 2205) by initializing a variable, Route_Cost, to zero. The process uses this variable to specify the cost of the route that it tries to construct for the net.

Next, at 2210, the process orders the pins of the net. Some embodiments order the pins based on their estimated distance (in the appropriate wiring model metric) to a chosen source pin. The process then specifies (at 2215) one pin of the net as the target of the path search and the remaining pins as sources of the search. At 2215, the process then specifies the nodes, exits, and/or holes (if any) of the target pin as the target particles, and specifies the nodes, exits, and holes (if any) of the selected source pins as the target particles. Some embodiments require the routed particles for each pin to be from the same port of that pin.

After specifying the source and target particles for a path search, the process directs (at 2220) the Q* path search process to identify and embed the lowest-cost path between the specified source and target sets. If the path search process embeds the lowest-cost path, the path search process increments the Route_Cost by the cost of the embedded path. The path search process is further described below by reference to FIG. 35.

At 2225, the route-generation process determines whether the path search process was able to identify and embed a path between the specified source and target sets. If not, the process 2200 has failed to find a route for the net. Accordingly, it returns (at 2230) a notification specifying its failure and then ends.

On the other hand, if the process determines (at 2225) that the Q* path search process identified and embedded a path, it determines (at 2235) whether it has routed all the pins of the net. If so, the process 2200 notifies (at 2240) the solving engine that it has embedded a route for the net and provides this route's associated Route_Cost.

If the process 2200 determines (at 2235) that it has not routed all the pins, the process specifies (at 2245) new source and target particles for another path search. In some embodiments, the process specifies the nodes, exits, and holes of the net's pins that are currently unrouted as source particles, and specifies the nodes, holes, exits, and/or walls of the net's previously routed pins and paths as target particles. One of ordinary skill will realize that other embodiments might specify source and target sets differently at 2245. For instance, some embodiments might specify the unrouted topological particles as the set of targets while specifying the routed particles and paths as the set of sources.

After specifying the source and target sets at 2245, the process 2200 returns to 2220 to direct the Q* path search process to identify and embed the lowest-cost path between the specified source and target sets. The operation of the process 2200 from 2220 was described above.

(3) Q* Path Search Process

The Q* path search process is a search process that can identify the lowest-cost path between source and target states in a graph with non-zero dimensional states. Such a path often (although not always) traverses through intermediate states. In a graph with non-zero dimensional states, a zero-dimensional state is a point, a one-dimensional state is a line, a two-dimensional state is a surface, a three-dimensional state is a volume, etc.

In the embodiments described below, the tessellated region, which was described above, is a multi-layer graph that the Q* path search explores. In the tessellated region, the source, intermediate, and target states are zero-, one-, or two-dimensional topological particles, such as nodes, lines, and surfaces. In other embodiments, the source, target, and intermediate states might be higher dimensional states (e.g., three-dimensional volumes, etc.).

In the embodiments described below, the Q* search process performs a best-first search operation. The following sections provide (i) an introduction to best first searches, (ii) a brief introduction to the Q* search, (iii) an introduction to the functions utilized by the Q* search in some embodiments, (iv) the overall flow of the Q* search in some embodiments, and finally (v) an example of a Q* search.

(i) Introduction to Best First Searches: A*

A best-first search is an iterative search that at each iteration tries to extend the partial solution with the best estimated cost. Best-first searches have often been used to identify the shortest path between source and target points in a multi-point search space. One such best-first search is the A* search. To identify a path between source and target points, the A* search starts one or more paths from the source and/or target points. It then iteratively identifies one or more path expansions about the lowest cost path, until it identifies a path that connects the source and target points. The typical cost of a path expansion in an A* search is an $\hat{F}$ cost, which is the cost of the path leading up to the path expansion plus an estimated cost of reaching a target point from the path expansion.

FIGS. 23–28 provide an example of an A* path search that uses such an $\hat{F}$ cost. In this example, the search process has to find the shortest path between a source point 2305 and a target point 2310 in a region 2320. The source and target points are part of a multi-point grid 2315 that is imposed over the region.

Figure 24:
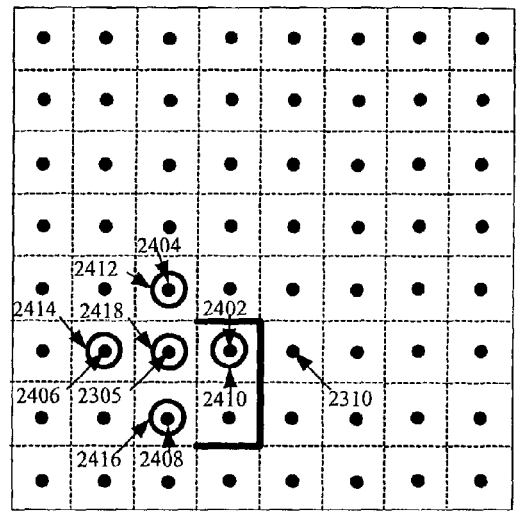

As shown in FIG. 24, the search process initially identifies four path expansions from the source point 2305 to four points 2402–2408 that neighbor the source point in the Manhattan directions. In FIGS. 24–28, the search process represents each path expansion by using a path identifier, called a "drop." More specifically, the search process represents each path expansion from one grid point (a start point) to another point (a destination point) by (1) specifying a drop, (2) associating the drop with the expansion's destination point, and (3) defining the specified drop's previous drop to be the drop of the expansion's start point. Drops allow the search to keep track of the paths that it explores.

The search process specifies four drops 2410–2416 for the expansions to the four points 2402–2408, as illustrated in FIG. 24. It also specifies a drop 2418 for the source point 2305. The source point drop 2418 is the previous drop of drops 2410–2416. The source point drop's previous drop is null, as it is the first drop in the path search.

For each drop 2410–2416, the search process computes an $\hat{F}$ cost based on the following formula:

$$\hat{F} = G + \hat{H}.$$

where (1) G specifies the cost of a path from the source point to the drop's grid point through the sequence of expansions that led to the drop, and (2) $\hat{H}$ specifies the estimated lower-bound cost from the drop's grid point to the target point. When computed in this manner, the $\hat{F}$ cost of a drop is the estimated cost of the cheapest path that starts at the source point, traverses through the sequence of expansions that led to the drop, and traverses from the drop to the target point.

To simplify the description of the example illustrated in FIGS. 23–28, the distance between each pair of horizontally or vertically adjacent grid points is 1. Accordingly, in FIG. 24, the G cost of each drop 2410–2416 is 1, as the grid point of each of these drops is one grid unit away from the source point. In FIGS. 24–28, a drop's $\hat{H}$ cost is computed as the Manhattan distance between the drop's point and the target point. Hence, the $\hat{H}$ cost of drops 2410, 2412, 2414, and 2416 are respectively one, three, three, and three, as these distances are respectively the Manhattan distances of the points of these drops from the target point.

Figure 25:
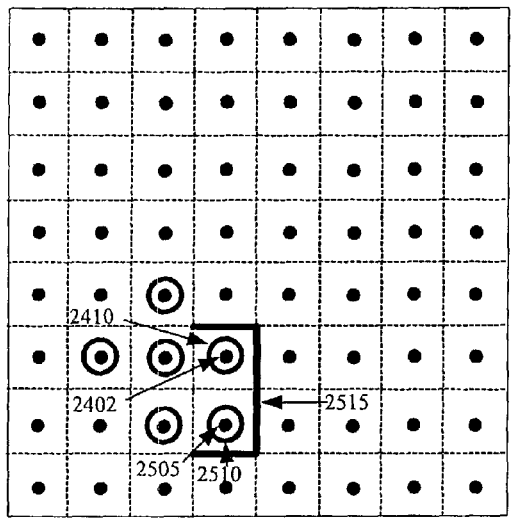

After costing these drops, the search process stores the drops 2410–2416 in a priority queue that is sorted based on their $\hat{F}$ costs. It then retrieves the drop with the lowest $\hat{F}$ cost from the priority queue. This drop is drop 2410. Since this drop's corresponding point (i.e., point 2402) is not the target point, the search process then identifies a path expansion from the retrieved drop's point 2402 to point 2505, as shown in FIG. 25. As shown in this figure, this expansion is the only viable expansion from the retrieved drop's point 2402 as the search has previously reached all other unblocked neighboring grid points (i.e., grid points that are not blocked by an obstacle 2515) through less expensive paths. The search process specifies a drop 2510 for this expansion, and computes this drop's G, $\hat{H}$, and $\hat{F}$ costs, which are respectively 2, 2, and 4. It then stores this specified drop in the priority queue.

After storing drop 2510 in the priority queue, the search process might retrieve either drop 2510, drop 2412, or drop 2414 from the priority queue, as each of these drops has an $\hat{F}$ cost of 4. However, if the search process retrieved drop 2510, it will not expand from this drop to its neighboring points that are not blocked by obstacle 2515 since all these neighboring points were previously reached less expensively. Also, if the search process retrieves drop 2414, it will identify drops that will be more expensive than drop 2412.

Figure 26:
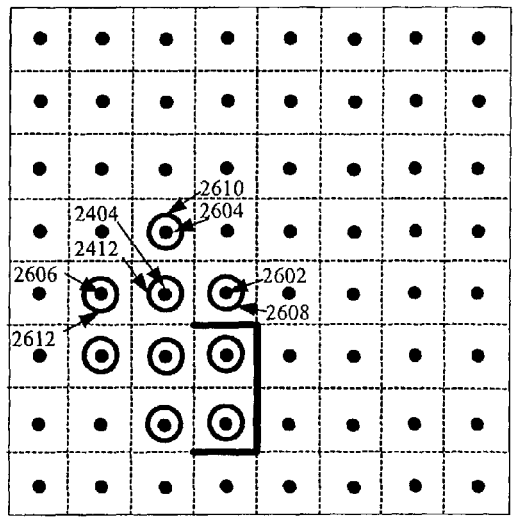

When the search process retrieves drop 2412 from the priority queue, it checks whether this drop's point is the target point. When it discovers that it is not, the process (1) identifies expansions to three neighboring points 2602–2606 about this drop's point, as shown in FIG. 26, (2) specifies three drops 2608–2612 for the three identified expansions, as shown in FIG. 26, (3) computes each specified drop's G, $\hat{H}$, and $\hat{F}$ costs, (4) defines each specified drop's previous drop (which in this case is drop 2412), and (5) stores each newly specified drop in the priority queue based on its $\hat{F}$ cost.

Figure 27:
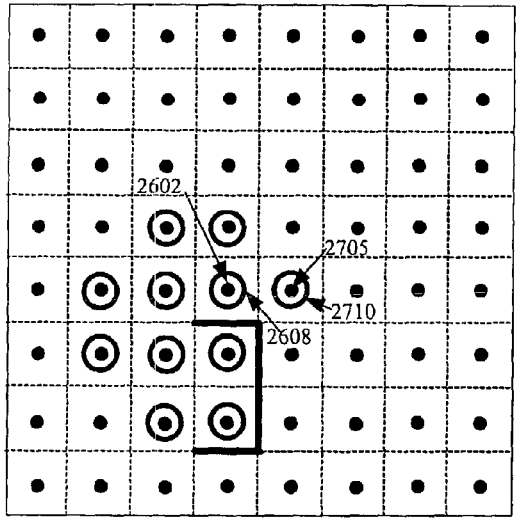
Figure 28:
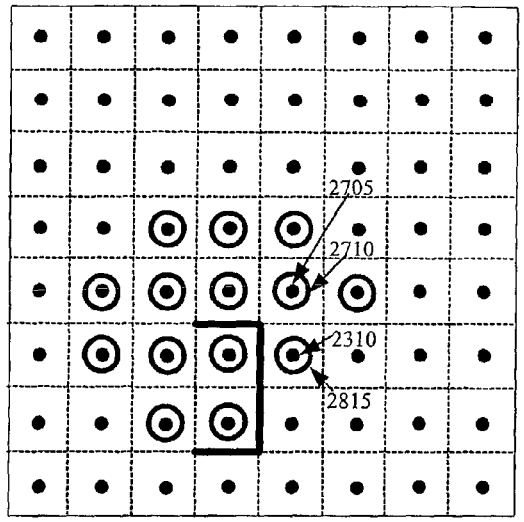

Next, as illustrated respectively in FIGS. 27 and 28, the search process performs these six operations first for drop 2608 and then for drop 2710, since these two drops are the ones with the lowest $\hat{F}$ costs during the next two iterations of the search process. As illustrated in FIG. 27, the drop 2710 is specified for an expansion about drop 2608's point 2602.

Figure 29:
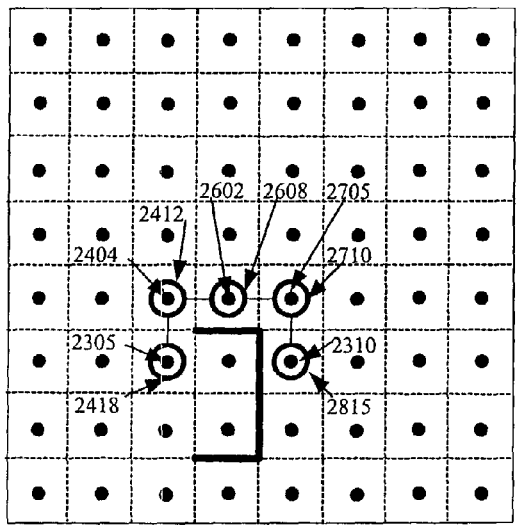
Figure 30:
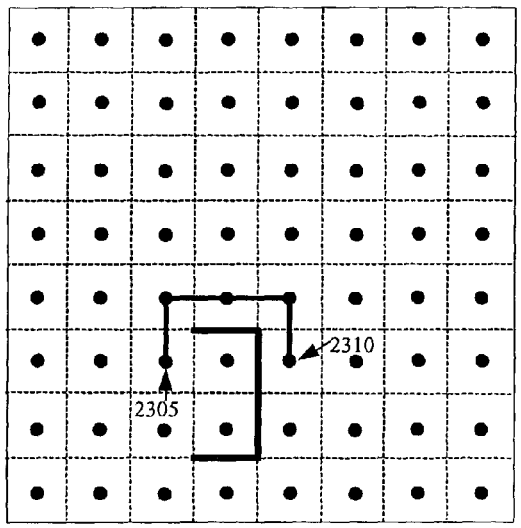

As shown in FIG. 28, one of the expansions about drop 2710 reaches the point 2310. The search process creates, costs, and stores a drop 2815 for this expansion. It then retrieves this drop in its next iteration, and then realizes that this drop's point is the target point. Accordingly, at this juncture, it terminates its path search operation. It then commences a path-embedding, back-trace operation that uses the previous-drop references of the drops 2815, 2710, 2608, 2412, and 2418 to identify the sequence of drops that reached the target point 2310 from the source point 2305. This operation embeds a path along the grid points associated with the identified sequence of drops. FIGS. 29 and 30 illustrate the back-trace operation and the resulting embedded path.

(ii) Brief Introduction to Q*

The A* search is not suitable for finding the lowest-cost path in a graph with non-zero dimensional states. This is because the A* search computes a single cost value for the expansion to any state in the graph, while the actual cost can vary across a non-zero dimensional state. Accordingly, some embodiments use the Q* search, which can identify the lowest-cost path in a graph with non-zero dimensional states. In the embodiments described below, the source, intermediate, and target states in the graph are zero-, one-, or two- dimensional topological particles, such as nodes, lines, and surfaces.

In the embodiments described below, the Q* search process has two phases: (1) a path exploration phase, during which the process identifies a path between the specified source and target particles, and (2) a path-embedding phase, during which the process embeds the identified path. During the path exploration phase, the Q* search starts one or more paths from the source and/or target particles. It then iteratively identifies one or more expansions about the lowest cost path, until it identifies a path that connects the source and target states. Each identified expansion about a path is from a "current particle" (also called "start particle") reached by the path to a "destination particle" that neighbors the current particle.

Like the A* search example described above, the embodiments described below cost each expansion based on an $\hat{F}$ cost that can be expressed as:

$$\hat{F} = G + \hat{H}. \quad (4)$$

In the A* search example, the $\hat{F}$, G, and $\hat{H}$ costs always provide a single value for a state in a search space. However, in a Q* search, these costs can be functions that are defined over the entire destination particle of an expansion or one or more portions of this destination particle.

Accordingly, in equation (4), the $\hat{F}$ cost is a function that expresses the estimated cost of a path that traverses from a source through the expansion's destination particle to a target. The G cost is a function that expresses the cost of the path that has reached the expansion's destination particle. The $\hat{H}$ cost is a function that expresses an estimated cost of a path from the expansion's destination particle to the target set. In the embodiments described below, the $\hat{H}$ cost function expresses the lower-bound estimate of the shortest path from the expansion's destination particle to the target set. Accordingly, in these embodiments, the $\hat{F}$ cost function expresses the estimated cost of a lowest-cost path from the source through the expansion's destination particle to a target. Also, in these embodiments, the G function and hence the $\hat{F}$ function account for several different types of path costs, such as a distance cost, route-piercing cost, via cost, wire-shoving costs, etc. Hence, the $\hat{F}$ function of equation (4) allows the embodiments described below to identify the lowest-cost path between the source and target sets. Other embodiments, however, might utilizes a different $\hat{F}$ function, as further described below.

(iii) PLF's and Filter Function

In the embodiments described below, the G, $\hat{H}$, and $\hat{F}$ functions are convex piecewise linear functions ("PLF"), although in other embodiments they might be other types of functions. In the embodiments described below, each PLF's domain is either a point, a line, or a surface in the tessellated region. In the discussion below, PLF's that are defined over a point are called point PLF's, PLF's that are defined across lines are called line PLF's, and PLF's that are defined across surfaces are called surface PLF's.

A point PLF maps the point over which it is defined to a single value. A line PLF is a PLF with a domain that is a line. Such a PLF can be specified by a sequence of vertices, called knots, that represent the endpoints of its line segments. FIG. 31 illustrates an example of a line PLF 3110 that has four line segments. This PLF specifies a PLF-value for each point P that is offset by an amount Q along an edge 3105 (i.e., for each real number Q that defines a point P on the edge at Q·u, where u is a unit vector of L). Each knot of a line PLF can be specified in terms of an offset value Q and a PLF-value V. Also, the knots of a line PLF can be sorted in an order based on their offset values. Accordingly, the five knots K1–K5 that are at the endpoints of PLF 3110's four line segments can represent this PLF of FIG. 31. These five knots can be represented by the following ordered list of offset and PLF-value pairs: (Q1, V1), (Q2, V2), (Q3, V3), (Q4, V4), (Q5, V5).

A surface PLF is a set of one or more planar surfaces, called facets. FIG. 32 illustrates an example of a surface PLF. This PLF 3210 has four facets (F1-F4), each of which has a different slope. This PLF is defined across a surface 3205. For each x-y value in the surface 3205, the surface PLF 3210 provides a PLF-value (V).

Each surface PLF can be represented by a set of knots, a set of edges between the knots, and a set of facets defined by the edges. Using this approach, the surface PLF 3210 of FIG. 32 can be represented by a list of knots K1–K10, a list of edges E1–E13, and a list of facets F1–F4. Some embodiments represent (1) a surface-PLF knot with an x,y coordinate, a PLF-value at that coordinate, and a list of edges that are incident upon the knot, (2) a surface-PLF edge by a pair of references to two knots that the edge connects, and (3) a surface-PLF facet by a list of edges, a normal vector (e.g., x, y, z coordinate values), and a z-intercept, where z is the axis in which the PLF-values are defined. For instance, in the example in FIG. 32, the list of edges for the knot K1 specifies edges E1 and E2, the list of knots for edge E4 specifies knots K3 and K4, and the list of edges for facet F1 identifies edges E1–E4. For facet F1, a normal vector N1 and a z-intercept are also specified.

In the embodiments described below, the Q* search maintains another function, called the filter function, for each topological particle that can serve as a source, intermediate, or target state in the tessellated region. In the embodiments described below, the filter function is a PLF. A particle's filter function expresses the lowest path cost that the search process has been able to identify from the source set to each point on the particle during a path search. As further described below, the Q* search in the embodiments described below uses the particle filter functions to determine whether a potential expansion to a destination particle is a viable one (i.e., whether the expansion provides a cheaper path to any portion of the destination particle than previously identified expansions to the destination particle). This search makes this determination for an expansion when it initially identifies the expansion and also later if it expands about it.

Filtering is when a first PLF F1 (a filtered PLF) is compared with a second PLF F2 (a filter PLF) to determine whether any portion of the F1 needs to be discarded. The filter and filtered PLF's have overlapping domains (i.e., domain(F1)∩domain(F2)≠null). In the embodiments described below, filtering discards the portion of the filtered PLF F1 that is larger than the corresponding portion of the filter PLF (i.e., discards every portion of F1 where F1(V)≧F2(V)). FIG. 33 presents an example of filtering a first filtered PLF 3305 by a second filter PLF 3310, where both PLF's are defined across a line 3350. Each PLF is represented by its sequence of knots, which is sorted by the domain-offset values. Knots K1–K5 specify the first PLF while knots K6–K10 specify the second PLF 3310. As shown in this figure, this filtering discards portion 3315 of PLF 3305 as the PLF-values of this portion are larger than the PLF-values of the corresponding portion 3320 of filter PLF 3310. After the filtering operation, two portions 3325 and 3330 of the PLF 3305 remain. Knots K1–K3 and K11 specify the first remaining portion 3325, while knots K12 and K5 specify the second remaining portion (where knots K11 and K12 are at the intersection of the PLF's 3305 and 3310).

Filtering PLF's will be further described below. The filtering that is described below not only filters the first PLF, but also defines the second filter PLF to be the minimum of the first and second PLF's. A minimum of two PLF's F1 and F3 is another PLF F3 that specifies a PLF-value for each location V in the intersection of F1's domain and F2's domain that is equal to the smallest PLF-value specified by the first and second PLF's for that location (i.e., F3(V)=min (F1(V), F2(V)). FIG. 34 illustrates the minimum PLF 3405 for the two PLF's 3305 and 3310 of FIG. 33. The portion 3325 and 3330 of this minimum function corresponds to the remaining portion of the filtered PLF 3305, while the portion 3320 of this minimum function is from the original filter PLF 3310. Knots K1–K3, K11, K8, K9, K12, and K5 specify the minimum function 3405.

(iv) The Q* Path Search Process

Figure 35A:
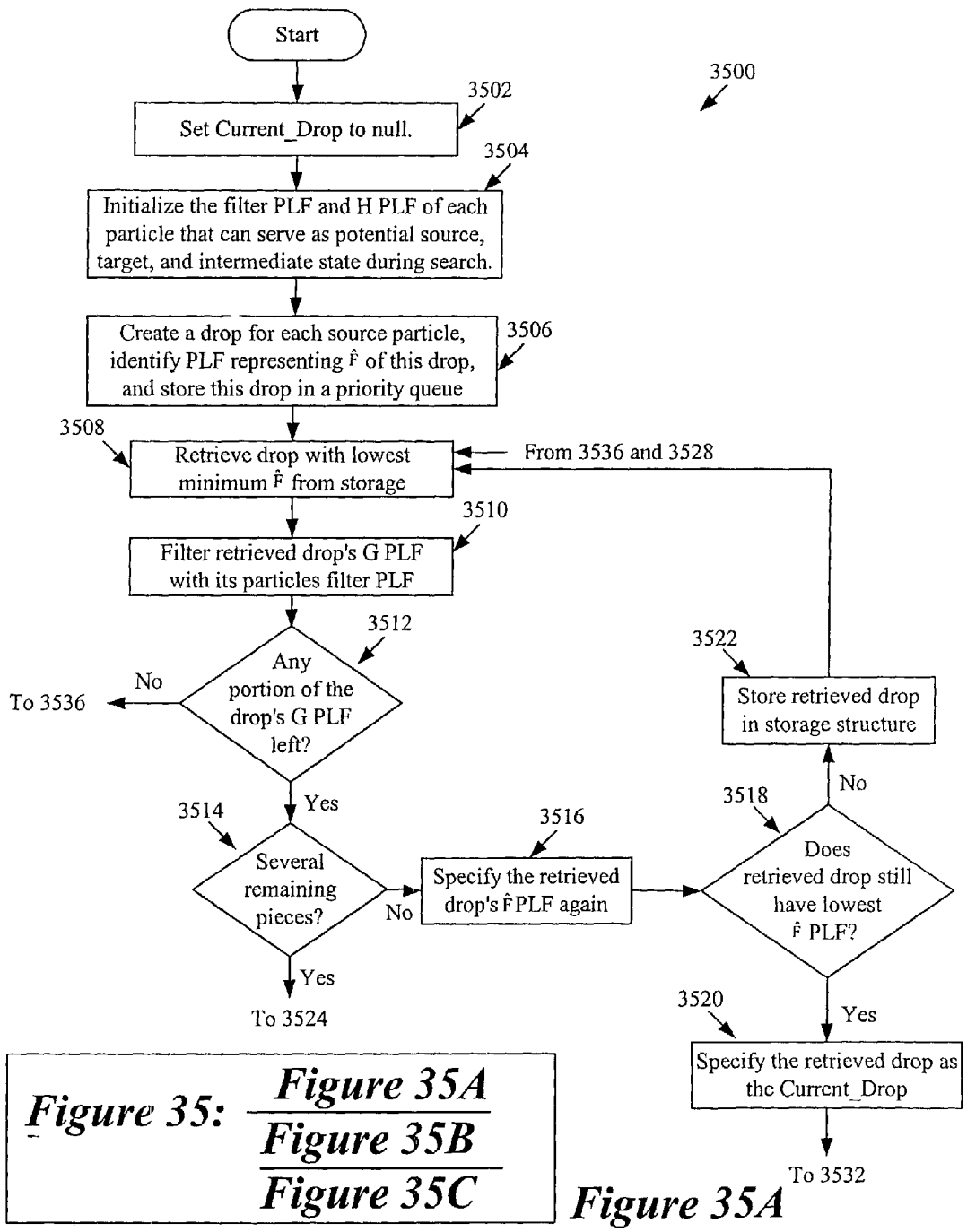
FIG. 35 illustrates a Q* path search process of some embodiments of the invention.
Figure 35B:
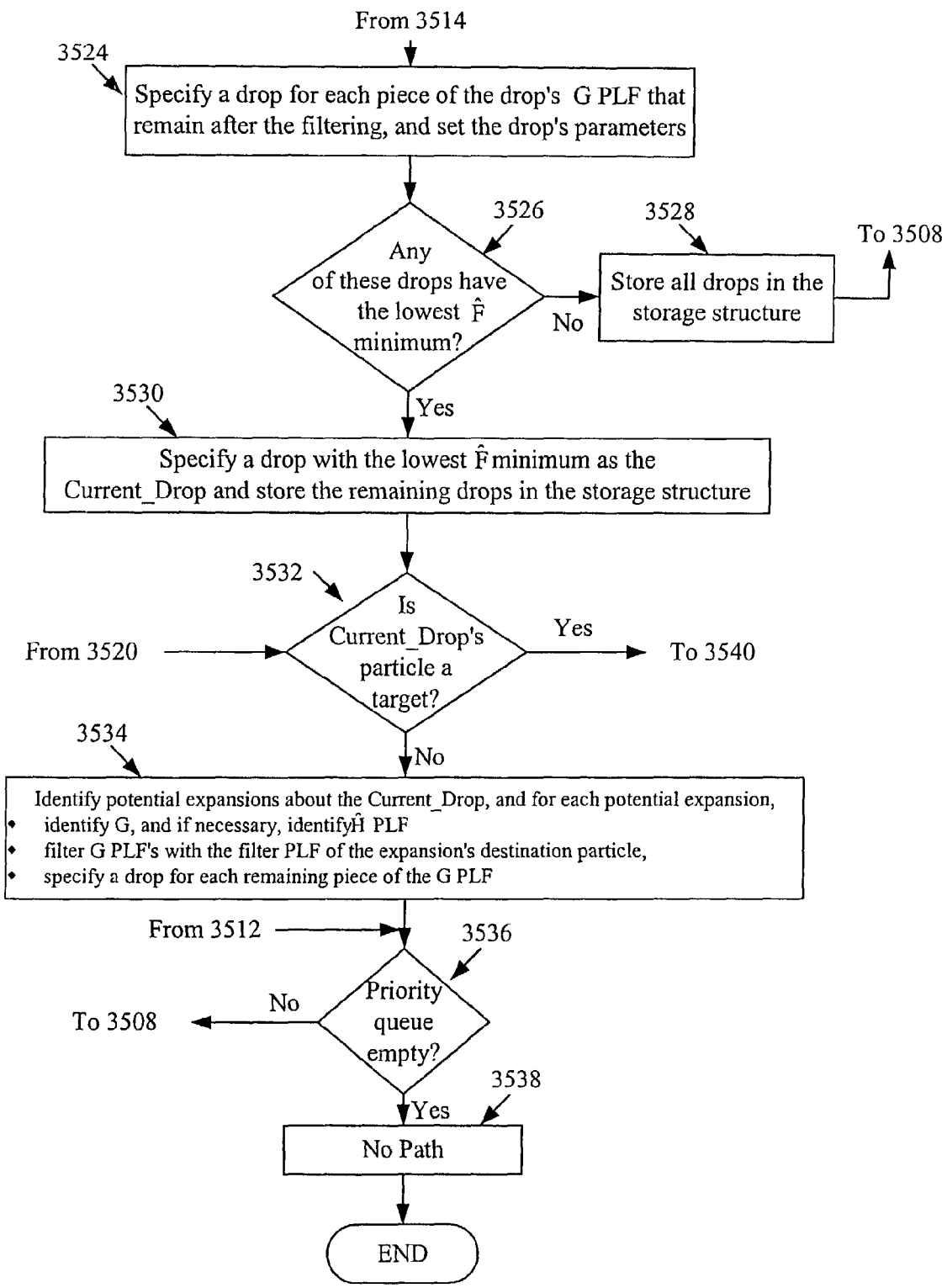
Figure 35C:
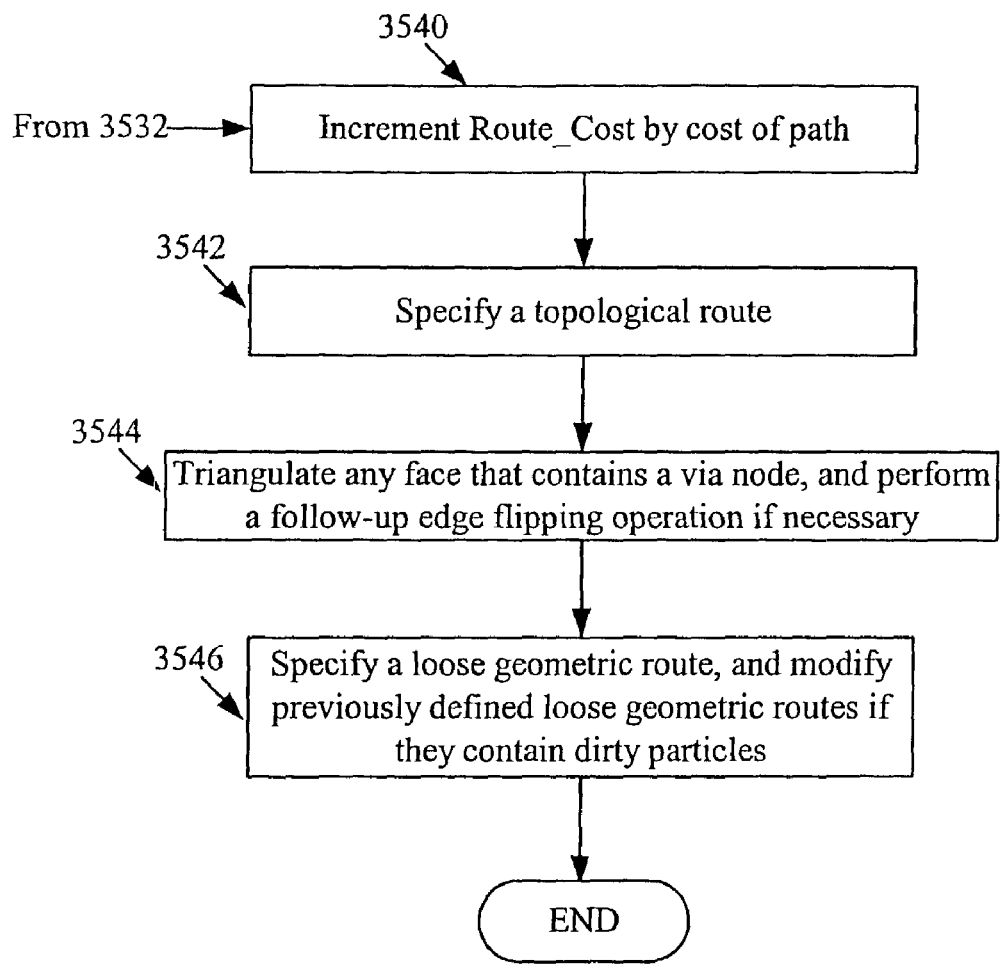

The route-generation process 2200 directs (at 2220) the Q* search process to identify and embed the lowest-cost path between specified source and target particles in the tessellated region. FIG. 35 illustrates a Q* search process 3500 of some embodiments of the invention. As shown in this figure, the process 3500 initially sets (at 3502) a variable Current_Drop to null. As in the above-described A* search example, the process 3500 uses drops to represent path expansions. Specifically, this process represents an expansion from one topological particle (called a "start particle" or "current particle") to another topological particle (called a "destination particle") by a "drop" that associates with the destination particle and refers back to the drop of the start particle. One of ordinary skill will realize that other embodiments might not use drops or might implement drops differently.

At 3504, the process 3500 initializes filter and $\hat{H}$ PLF's for each topological particle in the tessellated region that can serve as a start, intermediate, or target particle for a path search. For each such topological particle, the process 3500 maintains (1) the filter PLF to express the lowest path cost that the process has been able to identify from the source set to the particle during a path search, and (2) the $\hat{H}$ PLF to express the estimated distance between the particle and the target set. The process 3500 stores the $\hat{H}$ PLF for each particle so that it only has to compute the $\hat{H}$ PLF once for each particle. In some embodiments, the process initializes the filter and $\hat{H}$ PLF's to "infinite". Also, in the embodiments described below, nodes, exits, and holes are the topological particles that can serve as start particles during a path search, while nodes, holes, exits, and walls are the topological particles that can serve as intermediate and target particles during the path search.

Next, for each source particle that the process 2200 specified for the current path search, the process 3500 (at 3506) identifies and sets the particle's $\hat{H}$ PLF and sets the particle's filter PLF to zero. The generation of a particle's $\hat{H}$ PLF is described below. At 3506, for each source particle, the process 3500 also specifies a drop, defines the source particle as the drop's particle, defines the drop's prior drop as null, sets the drop's G PLF to zero, and sets the drop's $\hat{F}$ PLF equal to the source particle's $\hat{H}$ PLF. The process stores the specified drops in a storage structure. In the embodiments described below, the storage structure is a priority queue (e.g., a heap) that is sorted based on the minimum of the $\hat{F}$ PLF of each drop.

At 3508, the process then retrieves from the priority queue a drop with the smallest minimum $\hat{F}$ value. Next, the process filters (at 3510) the retrieved drop's G PLF with the filter PLF of this drop's particle. As further described below, the process performs this filtering operation to ensure that the retrieved drop is still valid. After the process 3500 stored the retrieved drop in the priority queue, it might have created and stored other drops that represent cheaper expansions to the retrieved drop's particle. These cheaper expansions would have modified the filter PLF of the retrieved drop's particle.

Figure 36:
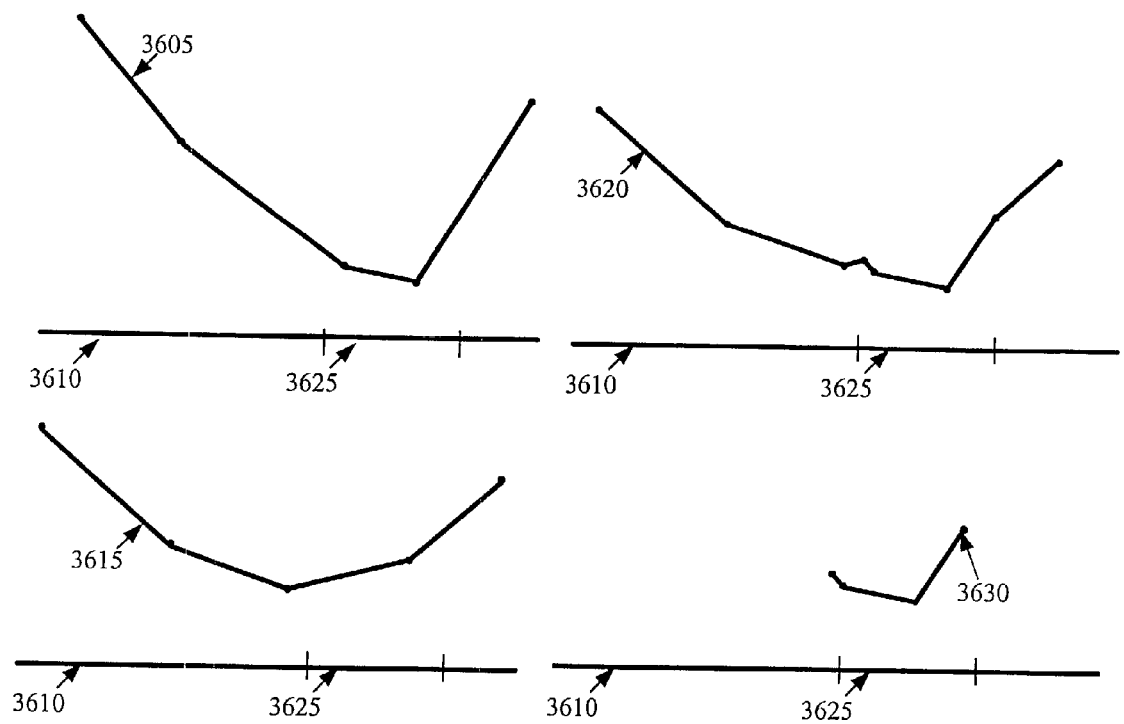
FIGS. 36–39 provide examples for describing the process of FIG. 35.

FIG. 36 illustrates one such situation. This figure illustrates a G PLF 3605 of a first expansion to a line 3610. This G PLF is also the filter function of the line 3610 after the first expansion. FIG. 36 illustrates a G PLF 3615 of a second expansion to the line 3610. The second expansion's G PLF 3615 is smaller than the first expansion's G PLF 3605 over the entire line 3610 except for the portion 3625 of the line. After the second expansion is identified, the filter function of the line 3610 is set to the minimum of the second expansion's G PLF and the filter function's original PLF (which, as mentioned above, is identical to the first expansion's G PLF). This new filter function is the PLF 3620 in FIG. 36.

Accordingly, after retrieving a drop from the priority queue, the process 3500 filters (at 3510) the drop's G PLF with its particle's filter function to ensure that the drop still represents the best valid expansion to one or more portions of its particle. In the example illustrated in FIG. 36, the filtering of the G PLF 3605 of the first expansion to (i.e., the first drop on) the line 3610 with the line's filter PLF 3620 after the second expansion results in the PLF 3630. This PLF 3630 corresponds to the portion of the original PLF 3605 of the first expansion that is smaller than the second-expansion's PLF 3615. This PLF 3630 is defined over a much smaller domain (i.e., segment 3625) than the original PLF 3605 for the first expansion. Filtering one function against another will be further described below.

At 3512, the process determines whether any portion of the Current_Drop's G PLF remains after the filtering operation. If the process determines (at 3512) that at least one portion of the Current_Drop's G PLF remains after the filtering, the process determines (at 3514) whether the filtering operation at 3510 resulted in two or more convex pieces of the retrieved drop's G PLF.

If the filtering did not result in two or more convex pieces, the process specifies (at 3516) the retrieved drop's $\hat{F}$ PLF again, as some portions of this drop's G PLF might have been discarded because of the filtering operation, and such a modification would discard some portions of this drop's $\hat{F}$ PLF. Next, the process determines (at 3518) whether the retrieved drop's $\hat{F}$ PLF minimum is greater than the lowest $\hat{F}$ PLF minimum of the drops that are currently stored in the priority queue. If so, the process stores (at 3522) the retrieved drop again in the priority queue, and then transitions back to 3508 to select another drop. Otherwise, the process specifies (at 3520) the retrieved drop as the Current_Drop and then transitions to 3532, which will be further described below.

If the process determines (at 3514) that the filtering at 3510 resulted in two or more convex pieces of the retrieved drop's G PLF, the process specifies (at 3524) a drop for each remaining piece and sets their parameters as follows. The process defines each specified drop's particle as the retrieved drop's particle. It also sets each specified drop's previous drop identically to the retrieved drop's previous drop (which might be null). The process also sets each specified drop's G PLF equal to the portion of the retrieved drop's G PLF for which the drop was specified. It also sets each specified drop's $\hat{F}$ PLF equal to the sum of (1) the specified drop's G PLF, and (2) the portion of the retrieved drop's $\hat{H}$ PLF with the same domain as the specified drop's G PLF.

At 3526, the process then determines whether any of the drops created at 3524 has the lowest $\hat{F}$ PLF minimum of all the drops stored in the priority queue. If not, the process stores (at 3528) the drops specified at 3524 in the priority queue based on the minimum of the $\hat{F}$ PLF of each drop. From 3528, the process transitions back to 3508 to select another drop. On the other hand, if the process determines (at 3526) that at least one drop specified at 3524 has the lowest $\hat{F}$ PLF minimum of all the drops stored in the priority queue, the process identifies (at 3530) as the Current_Drop a drop that was specified at 3524 and that has the lowest $\hat{F}$ PLF minimum. At 3530, the process also stores the remaining specified drops in the priority queue based on the minimum of the $\hat{F}$ PLF of each drop.

Figure 37:
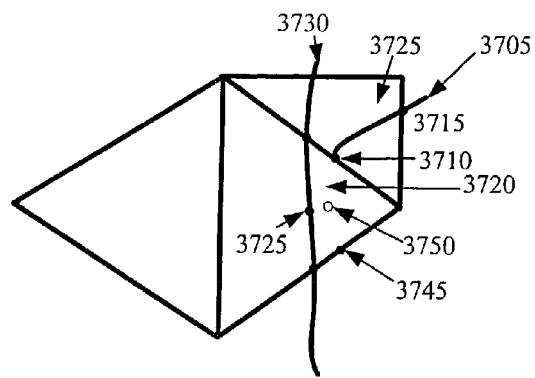

From 3530, the process transitions to 3532. The process also transitions to 3532 from 3520. At 3532, the process determines whether the Current_Drop's particle is a target. If not, the process tries (at 3534) to expand the path search about the Current_Drop. Specifically, at 3534, the process tries to identify one or more potential expansions about the Current_Drop. Some embodiments identify potential expansions about the Current_Drop by (1) identifying a set of valid spaces to which a path can expand from the Current_Drop's particle, and (2) identifying destination particles in each identified space. A valid space is one that contains the Current_Drop's particle but does not contain the particle of the prior drop in a path search (i.e., does not contain the particle of the Current_Drop's previous drop). FIG. 37 illustrates an example of a valid expansion space for a planar expansion. This figure illustrates a path search 3705 that has a last drop 3710 and a second-to-last drop 3715. The particles of both these drops are part of space 3725. The particle of drop 3710 is also part of space 3720. Consequently, space 3720 is a valid expansion space for drop 3710, but space 3725 is not. There can be multiple viable expansion spaces as a retrieved drop's particle (such as a node) can be in multiple spaces. One of ordinary skill will realize that other embodiments might identify potential expansions about the Current_Drop differently. For instance, some embodiments might define a valid space for an expansion differently. One such embodiment might not require that the Current_Drop's particle to be part of the valid space.

After the process identifies (at 3534) a set of valid spaces to which the path can expand from the Current_Drop's particle, it identifies (at 3534) potential destination particles in each identified space. In some embodiments, a path can expand towards exits, walls and holes, as well as the selected net's nodes, in a valid expansion space. One of ordinary skill will realize that other embodiments might specify other potential expansion particles in a valid expansion space.

In the example illustrated in FIG. 37, the path search can expand from drop 3710 to exit 3745, hole 3750, and wall 3725. Wall 3725 belongs to a route 3730 of another net. The path generation process 3500 might allow a path expansion to the wall of another net's previously defined path because it might allow later defined routes to rip up earlier defined routes. In such cases, expanding to the walls of another net's path is assessed a penalty, as further described below.

In some situations, the process 3500 cannot identify (at 3534) any potential expansions to another particle. However, when the process identifies one or more potential expansions at 3534, the process performs the following four operations at 3534. First, it specifies the $\hat{H}$ PLF of each potential expansion's destination particle if it had not previously been set for the current path search (i.e., for the current source and target sets). The generation of the $\hat{H}$ PLF is described below. Second, the process specifies a G PLF for each potential expansion. The generation of the G PLF for an expansion (i.e., the costing of an expansion) is described below. Third, it filters the G PLF of each potential expansion with the filter PLF of the expansion's destination particle. This filtering operation also sets the destination particle's filter PLF equal to the minimum of the filtered G PLF and the destination particle's previous filter PLF. Filtering two PLF's is described below. Fourth, the process specifies a drop for each convex piece (if any) of a G PLF of a potential expansion that remains after the filtering operation. For each specified drop, the process (1) sets the drop's G PLF equal to the remaining piece of the filtered G PLF for which the drop was created, (2) associates the drop with its expansion's destination particle, (3) sets the drop's previous drop to the Current-Drop, and (4) sets the drop's $\hat{F}$ PLF to the sum of the drop's G PLF and the portion of its destination particle's $\hat{H}$ PLF that is defined over the domain of the drop's G PLF. The process stores each drop it creates at 3534 in the priority queue.

From 3534, the process transitions to 3536. The process also transitions to 3536 if it determines at 3512 that no portion of a retrieved drop's G PLF remains after the filtering at 3510. At 3536, the process determines whether the priority queue that stores the drops is empty. If so, the process has failed to find a path between the specified source and target sets. Accordingly, it returns (at 3538) a notification specifying its failure and then ends. On the other hand, when the process determines (at 3536) that the priority queue is not empty, the process transitions back to 3508 to retrieve the next lowest-cost drop from this priority queue and then to perform the subsequent operations for this drop.

The process has found a path between the source and target sets when it determines (at 3532) that the Current_Drop's particle is a target. In this situation, the process transitions from 3532 to 3540. At 3540, the process 3500 increments the Route_Cost by the cost of the identified path between the source set and the Current_Drop's particle. This cost is the minimum cost of the Current_Drop's G PLF.

After 3540, the process topologically embeds (at 3542) the identified path between the source set and the target. Starting at the Current_Drop on the target, the topological embedding "back traces" the sequence of drops that reached the target and generates an ordered list of topological particles that define the topological path. Generation of such an ordered list entails creation of wall particles between each pair of non-wall, non-via particles in the topological path, and can also entail the creation of joints, Steiners, and via nodes. Also, each time the topological-embedding process defines a joint on an edge, it marks all other joints on the edge as "dirty," which signifies that their locations need to be later updated. The topological embedding process is further described below.

After the topological embedding operation, the process triangulates (at 3544) further any face that contains a via node that was defined during the topological embedding operation. Specifically, the process embeds a topological path by replacing each hole with one via node on each layer traversed by the hole. The process then triangulates each face that contains one of the via nodes (i.e., decomposes each face that contains a new via node into three triangles by defining an edge between the via node and each of the face's nodes). Via nodes that replace via holes are moveable in some embodiments. In these embodiments, they can be shoved during routability checking to alleviate congestion about them.

At 3544, the process also might perform a follow-up edge-flipping operation on the new triangles that were created at 3544. This edge-flipping operation is similar to the edge-flipping operation at 935. In addition, at 3544, the process also creates one or more spaces for the new triangles and modifies the topological description of the routes of nets that cross the new tessellated edges. At 3544, the process marks the joints of the routes that cross the new triangulated edges as "dirty" so that their positions can be later updated. At 3544, the process also tries to create holes for the new spaces that it defined at 3544, and computes the capacity of each new edge that it created at 3544.

After 3544, the process defines (at 3546) a loose geometric path for the topological path that it specified at 3542. This entails specifying a location of each joint, via node, and Steiner on the path. At 3546, the process also re-computes the location of the joints that were marked dirty during the topological embedding and edge flipping operations of 3542 and 3544. This computation also affects the location of holes and Steiners. The geometric embedding operation is further described below.

One of ordinary skill will realize that the Q* path-generation process might be implemented differently in other embodiments. For instance, some embodiments might utilize non-convex PLF's. Also, in some embodiments, the $\hat{H}$ cost function might not specify a lower bound on the shortest path between a drop's particle and a target set. In addition, some embodiments might compute the $\hat{F}$ function slightly differently. For instance, some embodiments might express the $\hat{F}$ function as:

$$\hat{F}=G+2*\hat{H}.$$

Such a function would bias the search process to expand about the drops that are closer to the target set. Alternative embodiments might express the $\hat{F}$ function as:

$$\hat{F}=G+\hat{H}+\hat{J},$$

where Ĵ represents the estimated computational effort needed to complete the path from the current drop. The embodiments that use alternative F̂ function do not satisfy the admissibility requirement (i.e., they do not produce consistently the lowest-cost path between source and target sets). On the other hand, the embodiments that use the F̂ function of equation (4) do satisfy this requirement.

(v) Example of the Q* Search Process

Figure 38:
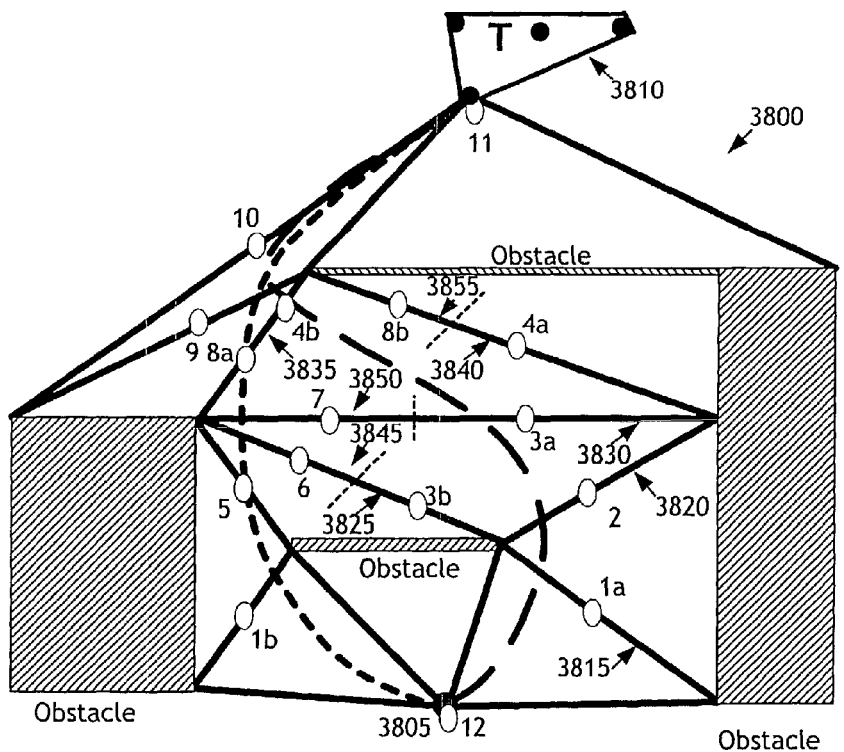

FIG. 38 presents an example of the Q* path search. In this example, the Q* search process is used to construct the lowest-cost path between a single source node 3805 and a set of target nodes 3810 in a triangulated graph 3800. To simplify this example, the only source and target particles are nodes, and the only intermediate particles are edges. Also, this example accounts only for the distance costs, and ignores spacing constraints on edges due to obstacles.

FIG. 38 illustrates several sets of expansions identified during a path exploration phase. The expansions are represented by drops 1a, 1b, 2, 3a, 3b, 4a, 4b, 5–7, 8a, 8b, 9, 10, and 11. In this example, the Q* path search starts by identifying and storing drops 1a and 1b about the source node 3805. This process then successively identifies the sequence of drops 2, 3a and 3b, and 4a and 4b. It identifies this sequence by successively (1) identifying each of the drops 1a, 2, and 3a as the drops in the priority queue with the lowest F̂ function minimum, and (2) identifying viable expansions about each of the edges of these drops. Once the process creates and stores expansion drops 4a and 4b as viable expansions from drop 3a, the process identifies drop 1b as the drop with the lowest F̂ function minimum in the priority queue. Accordingly, it then successively identifies the sequence of drops 5, 6, 7, 8a, 8b, 9, 10, and 11 that reaches the target set 3810. The process identifies this sequence by successively (1) identifying each of the drops 5, 6, 7, 8a, 9 as the drops in the priority queue with the lowest F̂ function minimum, and (2) identifying viable expansions about the edge of each of these drops.

In this example, two expansions are identified to each of the following four edges 3825, 3830, 3835, and 3840. The search process identifies the first expansions (i.e., identifies drops 3a, 3b, 4a, and 4b) to these edges when it expands about drops 1a, 2, 3a, 3b, and 4a, while it identifies the second expansions (i.e., identifies drops 6, 7, 8a, and 8b) to these edges when it expands about drops 5, 6, and 7. The second set of drops (i.e., drops 6, 7, and 8b) that are identified for the edges 3825, 3830, and 3840 are only specified over portions 3845, 3850, and 3855 of these edges. This is because the filtering operations that were performed to assess the viability of these second expansions to edges 3825, 3830, and 3840 resulted in the filtering of their G PLF's outside of the portions 3845, 3850, and 3855. However, the second drop 8a on edge 3835 is defined over the entire edge, as the filtering operation that the process performs before identifying this drop does not filter any portion of this expansion's G PLF. This is because the entirety of the edge 3835 can be reached more cheaply through the sequence of drops 1b, 5, 6, and 7 than through the sequence of drops 1a, 2, and 3a.

Figure 39:
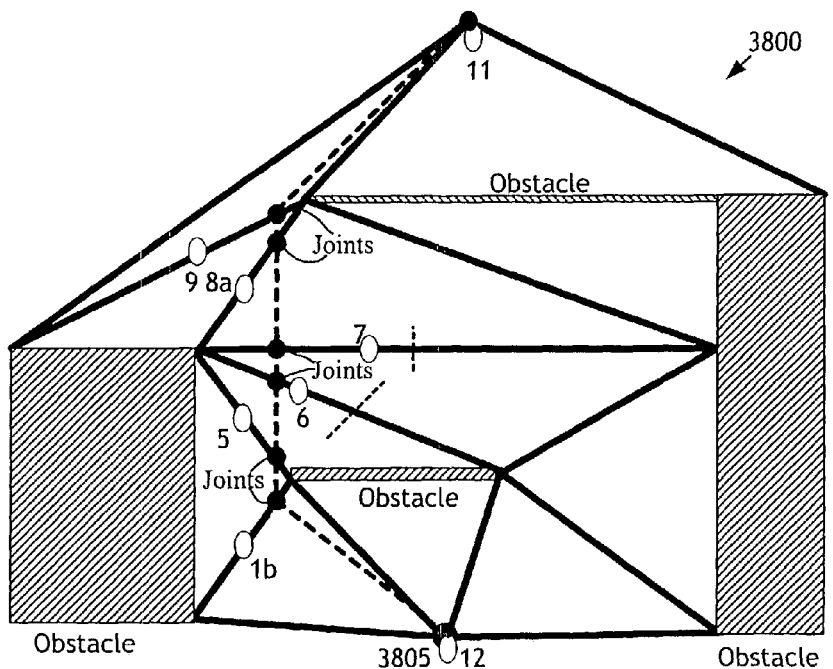

In the example illustrated in FIG. 38, the lowest-cost path is the one represented by drops 11, 9, 8a, 7, 6, 5, 1b, and 12, where drop 12 is the drop created for the source node 3805. After identifying this sequence of drops, the Q* search process embeds a path for this sequence. An approximation of this embedded path is illustrated in FIG. 39. As shown in FIG. 39, joints are defined at the intersection of the embedded path and the edges that this path intersects.

(4) Computing G PLF

When the process 3500 identifies (at 3534) a potential expansion from the Current_Drop's particle to a destination particle, this process specifies (at 3534) a G PLF for such a potential expansion. In some embodiments, the process 3500 computes this G PLF by (1) propagating the Current_Drop's G PLF to the destination particle, and (2) for certain expansions, adding one or more penalty costs to the PLF resulting from the propagation.

(i) Propagation

Propagating the Current_Drop's G PLF to an expansion's destination particle generates a PLF that expresses the distance and penalty costs of reaching the Current_Drop's particle plus the distance cost of reaching the expansion's particle from the Current_Drop's particle. In other words, the propagation accounts for the extra distance cost of going from the Current_Drop's particle to the expansion's particle.

Some embodiments limit each propagation operation to only the portion of the expansion's destination particle to which a path can expand from the Current_Drop. The discussion below uses the phrase "destination state" to refer to the portion of an expansion's destination particle to which a path can expand from the Current_Drop. This discussion also uses the phrases "the Current_Drop's domain" or "the start domain" to refer to the domain of the Current_Drop's G PLF.

Nine different propagation operations are described below for nine pair-wise combinations of expansions between points, line, and surfaces. In these propagation operations, points represent nodes, lines represent edge- and wall-segments to which a path can expand, and surfaces represent portions of holes to which a path can expand.

As mentioned above, a hole is specified between each pair of overlapping spaces when the intersection of the two polygons of the overlapping spaces is larger than a threshold size. Such a hole represents a potential via that can be anywhere in the polygonal intersection of the two polygons of the two overlapping spaces. In some embodiments, a path for a net can expand to each portion of a hole. These embodiments might specify the same width and spacing constraints for all nets being routed at a given time, or might construct each hole for the worst case of constraints (e.g., construct the polygons of the hole's overlapping spaces for the worst case of constraints).

Alternatively, some embodiments construct each hole based on the best case of constraints (e.g., construct the polygons of the hole's overlapping spaces for the best case of constraints). For an expansion of a path of a net to a hole, these embodiments then identify a sub-set of the hole's polygon (i.e., the polygonal surface represented by the hole) to which the net's path can expand given the spacing constraints for the net. These embodiments identify such a sub-set by identifying within the hole's polygon a polygon that specifies the legal area for the center of a via for the net. These embodiments identify such a polygon within a hole polygon in the same manner that they identified the hole polygon in the first place. They identify the closest point within the hole's polygon that a via can be to each obstacle on the layer, accounting for the via size and/or shape, the required spacing to obstacles, the required spacing to other routes crossing the face, etc. If the result is disjoint or non-convex, these embodiments approximate the polygon as the convex hull of the legal locations. In some cases, such a polygon might be identical to the hole's polygon.

(1st) Expansion from Point to Point

To perform a propagation operation for an expansion that goes from an expansion start point to an expansion destination point (e.g., goes from one node to another node), the process 3500 identifies the distance between the two points and adds this distance to the G PLF of the start point (i.e., to the Current_Drop's G PLF). In some embodiments, the process measures the distance between two points in an IC layout using only a specified set of wiring directions that are specified by the layout's wiring model. For instance, when two points are on an octilinear layer (like any of the layers of FIG. 1) that can have horizontal, vertical, and ±45° diagonal interconnect lines, the distance between the two points is the shortest distance that can be traversed by using horizontal, vertical, and ±45° diagonal interconnect lines. As disclosed in U.S. patent application entitled "Hierarchical Routing Method and Apparatus that Utilize Diagonal Routes," and having Ser. No. 10/013,813, now U.S. Patent Application No. 2003/0018947 the shortest distance between two points for such an octilinear wiring model:

$$\text{Distance} = L + S*(sqrt(2)-1), \quad (5)$$

where L and S respectively represent the long and short sides of a rectangular bounding box that is aligned with the layout's x-y axes and that encompasses the two points. This manner of computing the shortest distance does not disfavor or penalize any preferred wiring direction over another preferred wiring direction.

Numerous other operations below require the computation of the distance between two points. The embodiments described below compute each such distance according to the above-described equation (5).

(2nd) Expansion from Point to Line or Point to Surface

FIG. 40 illustrates a process 4000 that propagates a PLF that is defined over a point to a line or a surface. This process is described below by reference to FIG. 41, which illustrates an example of propagating a PLF from a point P to a line L, and FIG. 42, which illustrates an example of propagating a PLF from a point P to a surface S.

As show in FIG. 40, the process 4000 initially projects (at 4005) vectors in all available interconnect directions from the Current_Drop's point. These vectors are referred to below as propagation vectors. The embodiments described below utilize the wiring model illustrated in FIG. 1. Accordingly, these embodiments project vectors in the 0°, 45°, 90°, 135°, 180°, 225°, 270°, and 315° directions. FIGS. 41 and 42 illustrate eight propagation vectors emanating from their points P in 0°, 45°, 90°, 135°, 180°, 225°, 270°, and 315° directions. Some embodiments do not project vectors in all interconnect directions. Instead, they project only the propagation vectors that will intersect the destination state. These propagation vectors are the vectors that fall within a triangle defined by the start-state point and the leftmost and rightmost vertices of the destination state.

At 4010, the process then identifies the intersection of the projected propagation vectors and the destination line or surface. A propagation vector intersects with a line at a point that is the location of a knot of the destination's line PLF. FIG. 41 illustrates the intersection of the propagation vectors 4105, 4110, and 4115 at three points 4120, 4125, and 4130 along line L. A propagation vector intersects a surface either (1) at only a vertex of the surface, or (2) at two points on the surface boundary and an edge that runs through the surface. FIG. 42 illustrates the intersection of two propagation vectors 4215 and 4220 with the surface S along edges 4270 and 4275, which respectively terminate on boundary point pair 4225 and 4230 and point pair 4235 and 4240.

Next, for the expansion to the destination state, the process 4000 then specifies (at 4015) a G PLF with knots at the intersections identified at 4010. Specifically, for a destination line, the process 4000 specifies (at 4015) a knot at each point of the destination line that a propagation vector intersects. FIG. 41 illustrates a G PLF 4145 with three knots 4150, 4155, and 4160 for the three intersection points 4120, 4125, and 4130. For a destination surface, the process 4000 specifies (at 4015) a knot at each surface vertex intersected by a propagation vector and a knot at each surface boundary point intersected by a propagation vector. FIG. 42 illustrates a G PLF 4260 with four knots 4280, 4282, 4284, and 4286 that are defined for four boundary intersection points 4225, 4230, 4235, and 4240.

At 4015, the process 4000 sets the PLF-value of each knot that it specifies at 4015. The PLF-value of a knot specified at 4015 equals (1) the Current_Drop's PLF-value at the start point, plus (2) the distance between the knot's x,y coordinates and the start point P, where this distance is measured along the direction of the propagation vector that was used to identify the knot. For example, in FIG. 41, the PLF-value of knot 4155 equals the PLF-value at point P plus the distance D between point P and intersection point 4125 along the direction of propagation vector 4110. In FIG. 42, the PLF-value of knot 4286 equals the PLF-value at point P plus the distance D between point P and intersection point 4240 along the direction of propagation vector 4220.

At 4020, the process specifies knots for the expansion's G PLF at the location of any unexamined vertex of the destination state. The vertices of a destination line are its endpoints. A line endpoint is an unexamined vertex if none of the projected propagation vectors intersect the destination line at the endpoint. The PLF-value of an unexamined endpoint of a destination line equals (1) the Current_Drop's PLF-value at the start point, plus (2) the distance (according to the equation (5)) between the start point and the endpoint. For instance, in FIG. 41, the process specifies two knots 4165 and 4170 at the endpoints 4175 and 4180 of the line L, and specifies the PLF-value of each of these knots as the PLF-value at point P plus the distance (according to equation (5)) between point P and each knot location 4175 or 4180.

The vertices of a destination surface are the vertices of the edges that define the surface's external boundary. Such a vertex is an unexamined vertex if none of the propagation vectors intersect the destination surface at the vertex. In FIG. 42, the destination surface S has five vertices 4265, all of which are "unexamined" as they are not at the intersection of the propagation vectors and the surface. Accordingly, five knots 4290 are specified at the unexamined vertices 4265. The PLF-value for each such knot equals (1) the distance (according to equation (5)) between the start point and the surface's vertex that corresponds to the knot, plus (2) the Current_Drop's PLF-value at the start point. For instance, the PLF-value of knot 4290a equals the PLF-value at the start point P plus the distance (according to equation (5)) between point P and vertex 4265a.

For a destination surface, the process 4000 uses (at 4025) the knots specified at 4015 and 4020 to specify the edges and facets of the surface PLF that is defined over the destination surface. For each facet, the process defines a normal and a z-intercept. Standard plane-defining techniques can be used to derive the normal and z-intercept values of a facet from three points on the facet. For each facet, the process 4000 identified at least three knots at 4015 and 4020.

(3rd) Line to Line or Surface to Line

FIG. 43 illustrates a process 4300 for propagating a PLF from a line to another line or from a surface to a line. This process is described by reference to FIG. 44, which illustrates the propagation of a line PLF from a line 4405 to another line 4410, and FIG. 45, which illustrates the propagation of a surface PLF from a surface 4502 to a line 4504.

As shown in FIG. 43, the process 4300 initially identifies (at 4305) the propagation vectors that emanate from the locations on the Current_Drop's domain that are locations of knots in the Current_Drop's G PLF. The identification of these propagation vectors are further described below by reference to FIGS. 46-51. In FIG. 44, knots are located at points 4415 and 4420 on line 4405. In FIG. 45, knots are located at vertices 4506–4518 of surface 4502.

Next, at 4310, the process 4300 projects the propagation vectors identified at 4305. FIG. 44 illustrates the projection of five propagation vectors from knot-location 4415 and five propagation vectors from knot-location 4420. In FIG. 45, three propagation vectors are projected from each of the vertices 4506, 4512, and 4514, two propagation vectors are projected from each of the vertices 4508 and 4518, and one propagation vector is projected from each of the vertices 4510 and 4516. In some embodiments, the process 4300 does not project (at 4310) vectors in all interconnect directions. Instead, it projects only the propagation vectors that will intersect the destination state. In these embodiments, this process projects propagation vectors that fall within a triangle defined by the knot-location and the leftmost and rightmost vertices of the destination line or surface.

The process 4300 identifies (at 4315) the intersection of the destination line and the propagation vectors that were projected at 4310. FIG. 44 illustrates the intersection of the propagation vectors 4430 and 4435 and the line 4410 at points 4450 and 4455. FIG. 45 illustrates the intersection of the propagation vectors 4522, 4524, and 4526 and the line 4504 at points 4530, 4532, and 4534.

Each intersection identified at 4315 is a knot in the expansion's G PLF. Accordingly, for the expansion to the destination line, the process specifies (at 4320) a line G PLF with a knot at each intersection identified at 4315. At 4320, the process computes the PLF-value of each knot specified at 4320. The PLF-value of each destination-state knot equals (1) the PLF-value of the Current_Drop's knot that was used to identify the destination-state knot, plus (2) the distance between the x,y coordinates of the Current_Drop and destination-state knots, where this distance is measured along the projected propagation vector that identified the destination-state knot.

For instance, in FIG. 44, the PLF-value of knot 4472, which is defined at the intersection 4450 of the propagation vector 4430 and the line 4410, equals (1) the PLF-value of the Current_Drop's G PLF at 4420 on the line 4405, plus (2) the distance D1 between points 4420 and 4450 along the direction of the propagation vector 4430. Similarly, in FIG. 45, the PLF-value of knot 4544, which is defined at the intersection 4532 of the propagation vector 4524 and the line 4504, equals (1) the PLF-value of the Current_Drop's G PLF at 4512 on the surface 4502, plus (2) the distance D2 between points 4512 and 4532 along the direction of the propagation vector 4524.

At 4325, the process specifies knots for the expansion's G PLF at the location of unexamined vertices of the destination line, and then terminates. As mentioned above, an unexamined vertex of a destination line is an endpoint of the line that does not intersect any of the projected propagation vectors. An unexamined destination-line vertex can be in either (1) a "wedge" that is defined by two propagation vectors that emanate from the same location on the Current_Drop's domain, (2) a "channel" that is defined by two parallel propagation vectors that emanate from two different locations on the Current_Drop's domain. The PLF-value of a knot specified for an unexamined vertex that is within a wedge defined by two propagation vectors emanating from the same start-state location equals (1) the PLF-value of Current_Drop's G PLF at the start-state location, plus (2) the distance (according to the equation (5)) between the start-state location and the unexamined vertex. On the other hand, the PLF-value of a knot specified for an unexamined vertex that is within a channel defined equals (1) the length of a line segment that is parallel to the two channel-defining vectors and that starts at the unexamined vertex and terminates at the start domain, plus (2) the PLF-value of the Current_Drop's G PLF at the point that the line segment terminates on the start domain. The line segment terminates on the start domain on a second line segment that is between the two knot locations from which the two channel-defining vectors emanate. When the start domain is a surface, the second line segment (1) is an edge on the boundary of the surface if the two knot locations are boundary vertices of the surface, and (2) is a line segment within the surface if the two channel-defining knot locations are within the surface.

For instance, in FIG. 44, endpoint 4445 of the line 4405 falls within a channel defined by propagation vectors 4425 and 4430. The distance between endpoint 4445 and line 4405 is the length D3 of a line segment 4440 that is parallel to vectors 4425 and 4430. Accordingly, the PLF-value of the knot 4476 specified at endpoint 4445 equals the length D3 plus the PLF-value of the Current_Drop's G PLF at point 4480, which is the location that line segment 4440 intersects line 4405. The endpoint 4460, on the other hand, is within a wedge defined by two propagation vectors 4435 and 4482 that emanate from the start-state location 4420 on the line 4405. Accordingly, the PLF-value for the knot 4478 that is specified at 4460 equals (1) the PLF-value of the Current_Drop's G PLF at the start-state location, plus (2) the distance between points 4460 and 4420 according to the equation (5).

In FIG. 45, endpoint 4554 falls within a channel defined by propagation vectors 4520 and 4522. The distance between endpoint 4554 and surface 4502 is the length D4 of a line segment 4560 that is parallel to vectors 4520 and 4522. Accordingly, the PLF-value of the knot 4550 specified at point 4554 equals the length D4 plus the PLF-value of the Current_Drop's G PLF at point 4562, which is the location that the line segment 4560 intersects the surface boundary. The endpoint 4556, on the other hand, is within a wedge defined by two propagation vectors 4526 and 4564 that emanate from the start-state location 4512. Accordingly, the PLF-value for the knot 4552 that is specified at 4556 equals (1) the PLF-value of the Current_Drop's G PLF at the start-state location 4512, plus (2) the distance between points 4512 and 4556 according to the above-described equation (5).

FIGS. 46–51 illustrate how some embodiments identify the propagation vectors that emanate from the knot locations of a line PLF or surface PLF. These embodiments identify the propagation vectors based on the following observations. At most eight propagation-vector wedges can be defined about a Current_Drop's domain when the octilinear wiring model such as the one illustrated in FIG. 1 is used. Knots can be the only sources for wedges.

As mentioned above, each wedge is defined by two propagation vectors that emanate from the same knot location. Two wedges are abutting wedges when they share a propagation vector, while two wedges are adjacent wedges when they have parallel propagation vectors. For instance, FIG. 46 illustrates eight wedges 4650–4664 that are defined about five knot locations 4625–4645 from a surface PLF's domain 4600. In this figure, there are three abutting wedge pairs, and five adjacent wedge pairs. For instance, wedges 4658 and 4656 are abutting wedges as they share vector 4666, while wedges 4654 and 4656 are adjacent wedges as their vectors 4668 and 4670 are parallel.

The parallel propagation vectors of two adjacent wedges define a freeway. For instance, a freeway 4672 exits between adjacent wedge pairs 4662 and 4664 in FIG. 46. This freeway either (1) defines a channel when no other propagation vectors emanates from a knot location that falls within the freeway, or (2) contains two or more channels when other propagation vectors that are parallel to the freeway emanate from knot location(s) that fall(s) within the freeway. At most there are eight adjacent wedge pairs about a Current_Drop's domain. Consequently, there are at most eight freeways between the adjacent wedge pairs.

Some embodiments define the direction of the propagation vectors that emanate from an a Current_Drop's domain by performing the following three operations. First, they identify the knot location for each wedge. Second, these embodiments identify one or more freeways between adjacent wedge pairs. Third, for each identified freeway, these embodiments determine whether to treat the freeway as one channel, or to define additional channels within the freeway by defining one or more propagation vectors that are parallel to the freeway-defining vectors and that emanate from knot location(s) that fall within the freeway. The first operation (i.e., the identification of the knot location for each wedge) is described below by reference to FIGS. 47 and 48. The second and third operations (i.e., the identification of freeways and additional channels within the freeways) are then described by reference to FIGS. 49–51.

Figure 48:
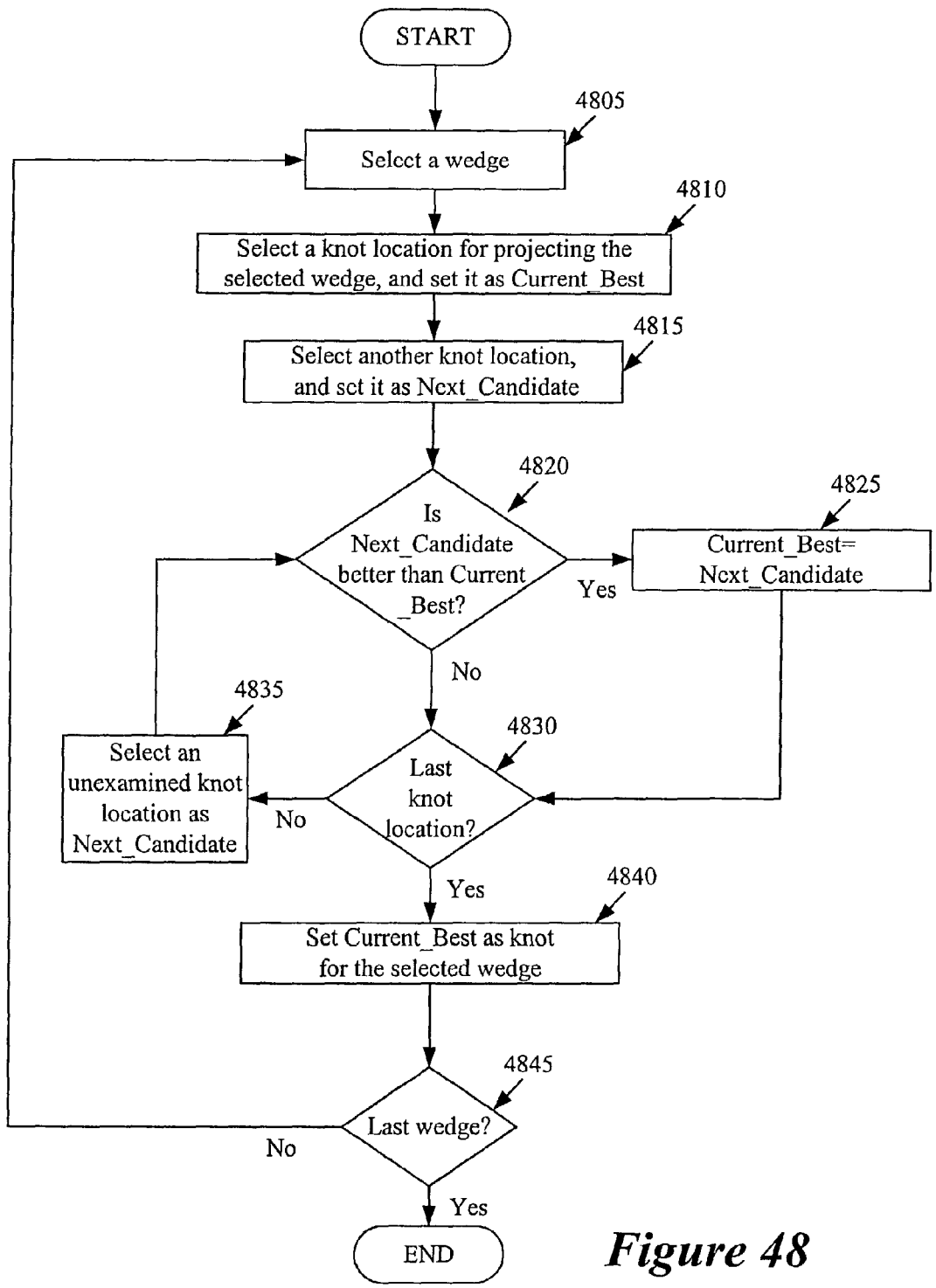

FIG. 48 illustrates a process 4800 that identifies the knot location for each propagation-vector wedge that emanates from the Current_Drop's domain, which can be a line or a surface. This process will be described by reference to an example illustrated in FIG. 47. This example illustrates how one of the wedges of the PLF-surface domain 4600 of FIG. 46 is identified.

The process 4800 initially selects (at 4805) a wedge. There are eight wedges when the octilinear wiring model of FIG. 1 is used. The process then selects (at 4810) a knot location as the first candidate location for the source of the selected wedge, and records this knot location as the current best (Current_Best) location for the selected wedge. FIG. 47 illustrates a selected wedge 4660 and a first candidate knot location 4610. Next, at 4815, the process selects a second candidate knot location for the source of the selected wedge and records it as Next_Candidate location. In FIG. 47, the second candidate location is location 4625.

At 4820, the process then determines whether the Current_Best knot location is a better candidate location than the Next_Candidate location. This determination ensures that all locations in the wedge are best reached from the source of that wedge, when both distance and PLF-value is considered. To make this determination, the process performs the following four operations. First, the process uses the selected wedge's "vector," which in some embodiments is defined to be a unit vector that bisects the wedge (i.e., it is midway between the two vectors that define the wedge). FIG. 47 illustrates the vector 4705 of the selected wedge 4660.

Second, the process computes the dot product of the selected wedge's vector and a vector that starts from Current_Best knot location and terminates on Next_Candidate knot location. This computation quantifies whether the Next_Candidate knot location is closer to an arbitrary point in the wedge than the Current_Best knot location. FIG. 47 illustrates a vector 4710 from the Current_Best location 4610 to the Next_Candidate location 4625.

Third, after computing the dot product, the process computes a Cost_Delta, which is the difference in the PLF-values of Next_Candidate location and the Current_Best location according to the Current_Drop's G PLF (Cost_Delta=G PLF(Next_Candidate)–G PLF (Current_Best)). For the example in FIG. 47, the Cost_Delta is the difference in the PLF-values at locations 4625 and 4610.

Fourth, the process determines whether the computed dot product is greater than the Cost_Delta. If not, the Current_Best location is better than the Next_Candidate location, and the process transitions from 4820 to 4830, which is further described below. If so, the Next_Candidate location is a better location for the wedge than Current_Best location, and the process transitions from 4820 to 4825. At 4825, the process sets the Current_Best location equal to the Next_Candidate location, and then transitions to 4830. At 4830, the process determines whether it has examined all knot locations for the wedge selected at 4805. If not, the process selects (at 4835) another knot location, sets this knot location as the Next_Candidate, and transitions to 4820 to compare this newly selected Next_Candidate with the Current_Best.

When the process determines at 4830 that it has examined all the locations of knots in the Current_Drop's G PLF, the process defines (at 4840) Current_Best as the knot location for the selected wedge. The process then determines (at 4845) whether it has examined all the wedges. If not, it returns to 4805 to select another wedge and to repeat its operations for this wedge. Otherwise, it ends.

After identifying the locations of the wedges, the Q* engine has to specify the channels between the wedges. When two wedges abut (i.e., when they share a propagation vector), no channel can exist between the wedges. However, when two wedges are adjacent wedges (i.e., when they have parallel propagation vectors), one or more channels can be defined in the freeway defined by the parallel vectors of the adjacent wedge pairs.

If the Current_Drop's domain is a line, the Q* engine examines each adjacent wedge pair that is defined along the line. If no knot location exists on the line segment between the adjacent wedge pair, then the Q* engine defines the freeway between the adjacent wedge pair as a channel. If one or more knot locations exist on the line segment between an adjacent wedge pair, the Q* engine examines each knot location to determine whether they are sources of propagation vectors. The engine initially sorts in descending order the PLF-values of the knot locations between the adjacent wedge pair. If there is only one knot location between the adjacent wedge pair, the engine simply adds this PLF-value to its sorted list. The engine then selects the largest PLF-value on the sorted list. The Q* engine then identifies the channel that contains the knot location corresponding to the selected PLF-value. This channel is the freeway formed by the adjacent wedge pair when the knot location is the first location between the wedge pair that is examined. When the knot location is not the first location between the wedge pair, the channel might be formed by one or two propagation vectors that the engine specified for knot locations (between the wedge pair) that it previously examined.

The engine next determines whether the selected PLF-value for the knot location is less than the PLF-value that can be obtained by linearly interpolating between the values at the knot locations of the vectors that define the channel that contains the selected PLF-value's knot location (i.e., determines if the selected value is below a line that connects the PLF-values at the knot locations from which the identified-channel's vectors emanate). If so, the engine specifies a channel-defining vector at the knot location associated with the selected PLF-value. This specified vector is parallel to the parallel vectors of the adjacent wedge pair.

FIG. 49 illustrates an example of a knot location 4930 that is between two adjacent wedge pairs (where one pair is formed by wedges 4910 and 4915 and one pair is formed by wedges 4920 and 4925). This knot location is examined for each of these adjacent wedge pairs. When the engine examines location 4930 for adjacent wedges 4910 and 4915, it determines whether the PLF-value of this location is smaller than the PLF-value that can be obtained for this location by linearly interpolating between the PLF-values at knot locations 4945 and 4950 that serves as the emanating location of the wedges 4910 and 4915. In FIG. 49, it is assumed that the PLF-value of location 4930 is less than the PLF-value that can be obtained through the linear interpolation. Accordingly, two propagation vectors 4935 and 4940 are defined for the knot location 4930. The propagation vector 4935 is parallel to the parallel vectors of adjacent wedges 4910 and 4915, while the propagation vector 4940 is parallel to the parallel vectors of adjacent wedges 4920 and 4925.

Figure 50:
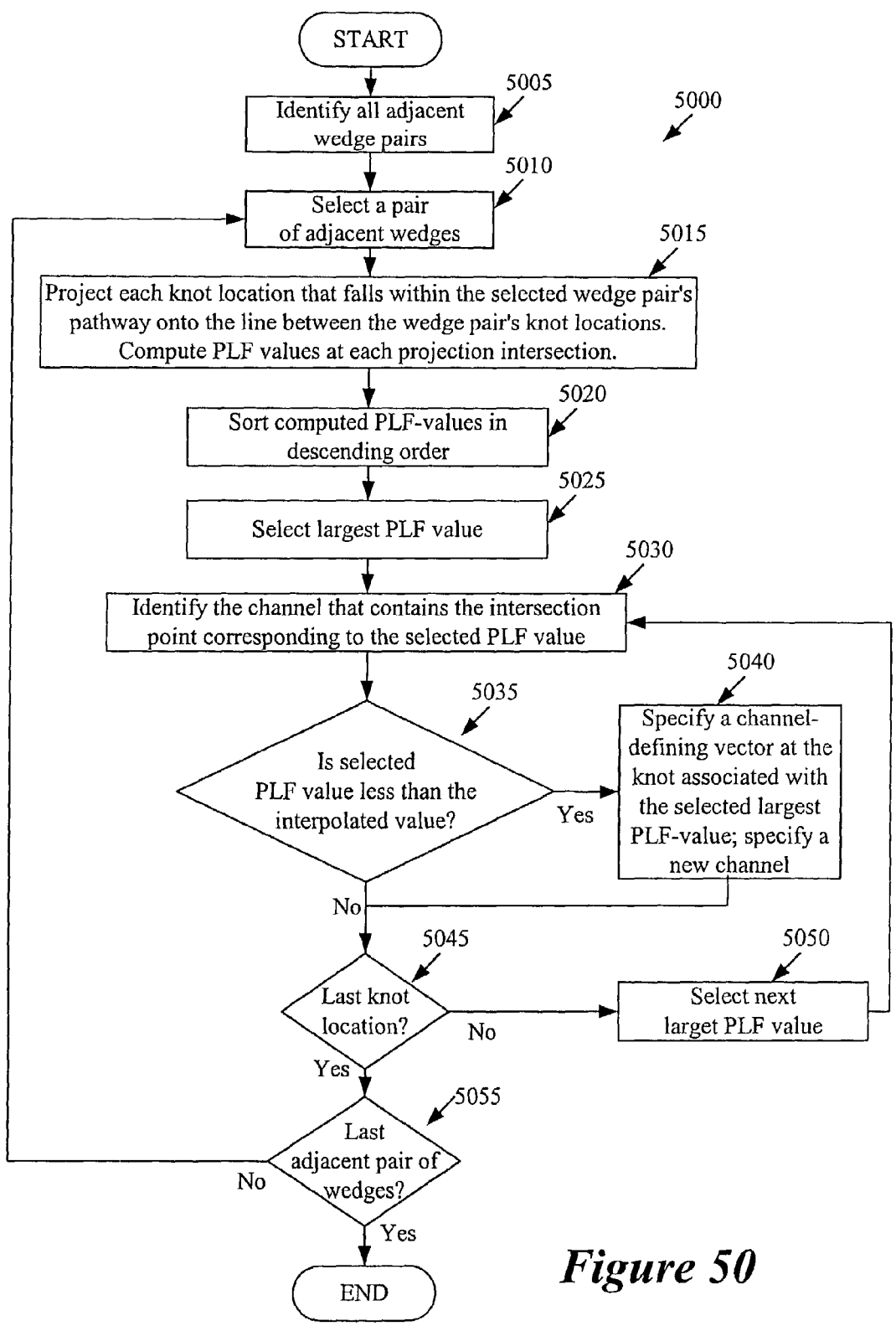

FIG. 50 illustrates a process 5000 for defining channels between adjacent wedge pairs when the Current_Drop's domain is a surface. This process will be described by reference to FIG. 51A, which illustrates the domain 5100 of a surface PLF. The process 5000 initially identifies (at 5005) all adjacent wedge pairs. It then selects (at 5010) one of the adjacent wedge pairs. In FIG. 51A, the selected pair of adjacent wedges are wedges 5105 and 5110.

Next, at 5015, the process projects each location of a knot (in the Current_Drop's G PLF), which falls within the freeway that the selected wedge pair defines, towards a line that connects the knot locations from which the wedge pair emanates. The projection is in a direction that is parallel to the adjacent-wedge-pair vectors that define the freeway. In FIG. 51A, knot locations 5120, 5125, 5130, 5135, 5140, and 5142 fall within the freeway 5115 between the adjacent wedges 5105 and 5110. Also, the two wedges emanate from knot locations 5145 and 5150, and an edge 5170 exists between these two locations. Knot location 5120 lies on the edge 5170, and hence does not need to be projected towards this line segment. On the other hand, knot locations 5125, 5130, 5135, 5140, and 5142 need to be projected towards this line segment in the direction of the vectors 5155 and 5160 that define the freeway 5115. FIG. 51A illustrates the projection of knot location 5125 towards this edge.

At 5015, the process then computes a cost at the intersection of each projection with the line. The cost at each intersection point equals the sum of the PLF-value of the G PLF at the intersection point plus the distance between the projected knot location and the intersection of the knot-location's projection and the line. In FIG. 51A, the intersection of the projection of knot location 5125 is point 5165 on the edge 5150. Its computed cost equals the distance D between knot location 5125 and point 5165 and the value of the G PLF at the point 5165. The distance D between a projected knot location and the intersection of its projection and the line might be a positive or a negative value depending on position of the knot location with respect to the line that connects the knot locations from which the adjacent wedge pair emanates. For instance, FIG. 51B illustrates an edge 5175 within the domain 5180 of a surface PLF. This edge connects to adjacent wedge pair 5182 and 5184. FIG. 51B also illustrates two knot locations 5186 and 5188 that fall within the freeway 5190 (defined by the wedge pair 5182 and 5184) on opposing sides of the edge 5175. The distance D1 between knot location 5186 and this knot's projection point 5192 on the edge 5175 is positive, but the distance D2 between the knot location 5188 and this knot's projection point 5194 on the edge 5175 is negative. The distance D2 is negative because the knot location 5188 is on the side of the edge 5175 that is in the direction of the freeway-defining wedge vectors.

At 5020, the process sorts the computed PLF-values in descending order. It then selects (at 5025) the largest PLF-value on the sorted list. The process then identifies (at 5030) the channel that contains the intersection point corresponding to the PLF-value selected at 5025. This channel is the freeway that the adjacent wedge pair selected at 5010 defines at the first iteration through 5030 for the selected wedge pair. In the subsequent iterations through 5030, the propagation vectors that the process 5000 might identify for the knot locations between the adjacent wedge pair might define this channel partially or completely.

After 5030, the process determines whether the selected PLF-value for the intersection point is less than the PLF-value that can be obtained by linearly interpolating between the values at the two knot locations of the vectors that define the channel that contains the intersection point (i.e., determines if the selected value is below a line that connects the PLF-values at the knot locations of the identified-channel's vectors). For instance, in FIG. 51A, the process 5100 has the PLF-value at the knot locations 5145 and 5150. From these two PLF-values the process can linearly interpolate the value of any point on the line 5150 between these two locations. Accordingly, if the first selected PLF-value is the PLF-value at the intersection point 5165 for the knot location 5125, the process determines (at 5130) whether the cost computed for this knot location's projection onto point 5165 is less than the value that can be obtained for this point by linearly interpolating between the values specified at knot locations 5145 and 5150.

If the process determines (at 5135) that the selected PLF value is not less than the value that can be obtained through the linear interpolation, the process transitions to 5045, which is further described below. Otherwise, the process specifies (at 5040) a channel-defining vector at the knot location associated with the selected PLF-value. This specified vector is parallel to the parallel vectors of the adjacent wedge pair. From 5040, the process transitions to 5045.

At 5045, the process determines whether it has examined all the knot locations that fall within the freeway defined by the adjacent wedge pair. If not, the process selects (at 5050) the next largest PLF-value in the sorted list that it created at 5020. The process then performs 5030 and 5035 for the intersection point that corresponds to the PLF-value selected at 5050. As mentioned above, the first iteration through 5030 identifies the freeway as the channel that contains the intersection point corresponding to the PLF-value selected at 5025. However, a subsequent iteration through 5030 from 5050 might identify a different channel that contains the intersection point corresponding to the PLF-value selected at 5050. This is because, if the process iterates through 5040 one or more times, it defines more propagation vectors that break the freeway into smaller and smaller channels. When the process 5000 identifies (at 5030) a smaller channel (i.e., a channel that covers only a portion of the freeway) that contains the intersection point corresponding to the selected PLF-value, it derives (at 5035) the interpolated value based on PLF-value of the knot locations from which the vectors that define the channel emanate.

When the process determines at 5045 that it has examined all the knot locations that fall within the selected wedge pair's freeway, the process determines (at 5055) whether it has examined all the adjacent wedge pairs. If not, the process transitions back to 5010 to select an unexamined wedge pair. Otherwise, the process terminates.

(4th) Line to Surface

Figure 52:
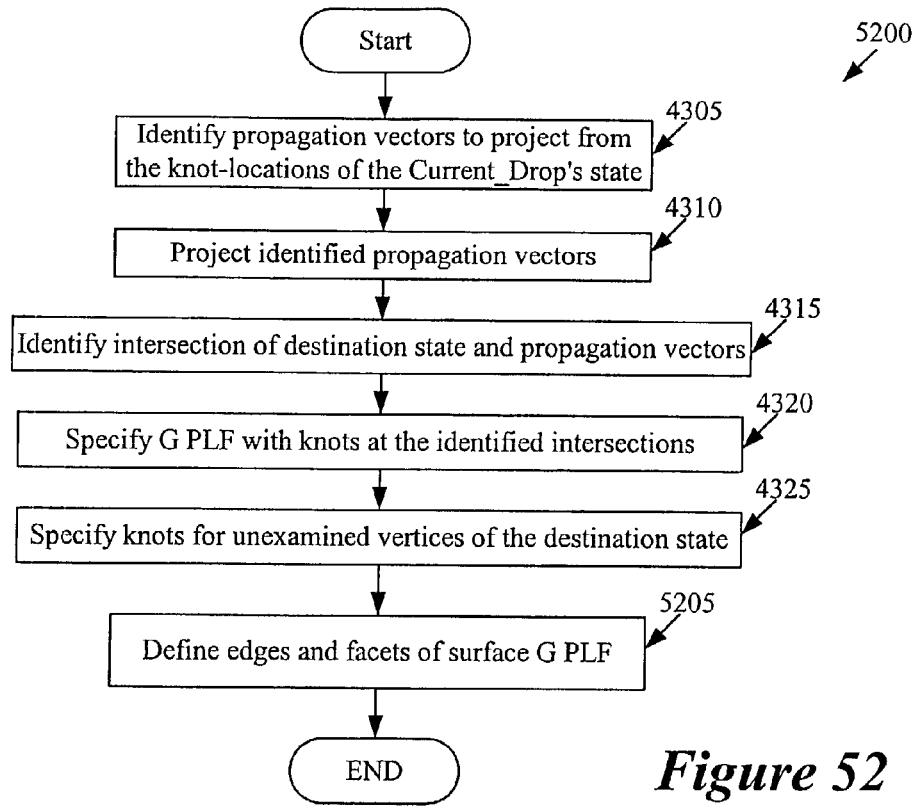
FIG. 52 illustrates a process for propagating a G PLF from a line to a surface.

FIG. 52 illustrates a process 5200 for propagating a G PLF from a line to a surface. The process 5200 is quite similar to the process 4300 of FIG. 43. Accordingly, similar reference numbers are used for similar operations of the two processes. The process 5200 has only a few minor differences with the process 4300. Propagating a PLF to a surface results in a surface PLF. Hence, after 4325, the process 5200 uses the attributes of the knots that it specifies to define edges and facets of a surface PLF, and to define the normal and z-intercept values of the facets.

Also, in process 5200, a propagation vector intersects the destination surface either at only a vertex or along an edge that runs through the surface and connects two points on the boundary of the surface. For the case where the propagation vector intersects the surface only at a vertex, the process 5200 would specify (at 4320) a knot at the vertex's x,y coordinates. For the case where the propagation vector runs through the surface, the process 5200 would specify (at 4320) two knots at the surface boundary points where the propagation vector intersects the surface boundary.

Figure 53:
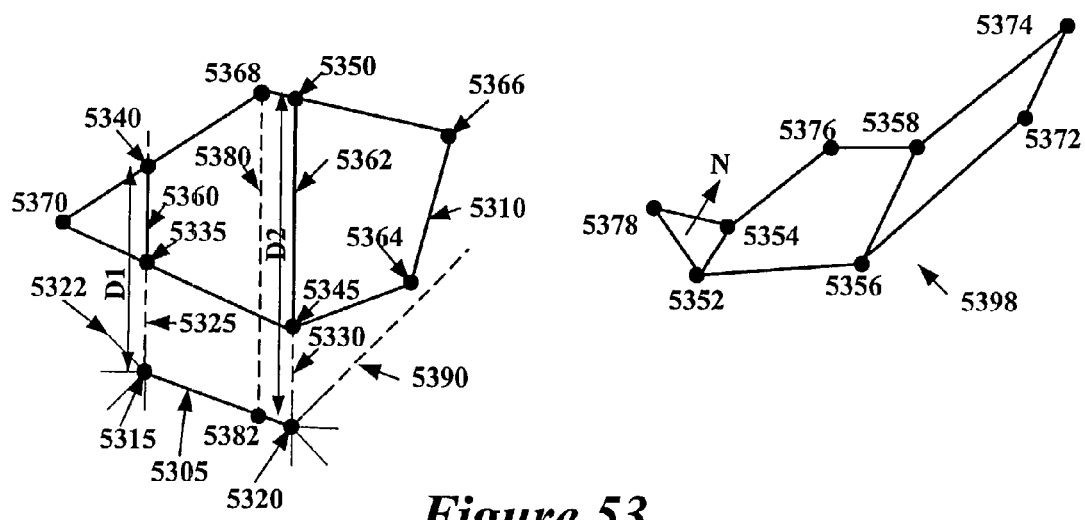
FIG. 53 illustrates an example for propagating a G PLF from a line to a surface.

FIG. 53 presents an example that illustrates the propagation of a G PLF from a line 5305 to a surface 5310. For such a propagation, the process 5200 would initially identify (at 4305) the propagation vectors that emanate from the locations on the Current_Drop's line that are locations of knots in the Current_Drop's G PLF. These propagation vectors are identified based on the process described above by reference to FIGS. 46–51. In FIG. 53, the knots are located at points 5315 and 5320 on line 5305. From each of these points, five propagation vectors are projected. From these points, some embodiments would project only the propagation vectors that would intersect the destination surface, as mentioned above.

Next, at 4310 and 4315, the process 5200 projects the propagation vectors identified at 4305, and identifies their intersections with the destination surface. In FIG. 53, the propagation vectors 5325 and 5330 that emanate from points 5315 and 5320 intersect the destination surface along edges 5360 and 5362, which respectively terminate on boundary point pair 5335 and 5340 and point pair 5345 and 5350.

The process 5200 then starts to specify (at 4320) a G PLF that is defined over the destination surface. Specifically, at 4320, the process specifies a knot at each intersection of the propagation vectors and the boundary of the destination surface. In FIG. 53, the process starts to specify a surface PLF 5398 by specifying four knots 5352, 5354, 5356, and 5358 at the identified intersections 5335, 5340, 5345, and 5350. The PLF-value of each specified destination knot equals (1) the PLF-value of the start knot that was used to identify the destination knot, plus (2) the distance between the x,y coordinates of the start and destination knots, where this distance is measured along the projected propagation vector that identified the destination knot. For instance, the PLF-value of knot 5354 that is specified for the location 5340 equals the distance D1 between 5340 and 5315, plus the PLF-value of the Current_Drop's G PLF at 5315.

At 4325, the process 5200 then specifies knots for the destination's PLF at the location of the unexamined vertices of the destination. In FIG. 53, the unexamined vertices of the destination surface are vertices 5364, 5366, 5368, and 5370. For these vertices, the process 5200 specifies knots 5372, 5374, 5376, and 5378. The PLF-value of each of these knots is computed based on whether the knot's corresponding destination-surface vertex falls within a propagation-vector wedge or channel.

For instance, the unexamined vertex 5370 falls within a wedge defined by two propagation vectors 5325 and 5322 that project from 5315. Accordingly, the PLF-value of knot 5378 at vertex 5370 equals (1) the PLF-value of the Current_Drop's G PLF at point 5315, plus (2) the distance (according to equation (5)) between points 5315 and 5370. On the other hand, the unexamined vertex 5368 falls within a channel defined by two parallel propagation vectors 5325 and 5330 that project from two different points 5315 and 5320. The distance between the vertex 5368 and the line 5305 is the length D2 of a line segment 5380 that is parallel to vectors 5325 and 5330. This line segment intersects line 5305 at 5382. Hence, the PLF-value of knot 5376 at vertex 5368 equals (1) the length D2, plus (2) the Current_Drop's G PLF-value at 5382.

After 4325, the process 5200 uses (at 5205) the knots specified at 4320 and 4325 to specify the edges and facets of the surface PLF that is defined over the destination surface. For each facet, the process defines a normal and a z-intercept. FIG. 53 illustrates three facets and ten edges that define these three facets.

(5th) Surface to Point or Line to Point

Figure 54:
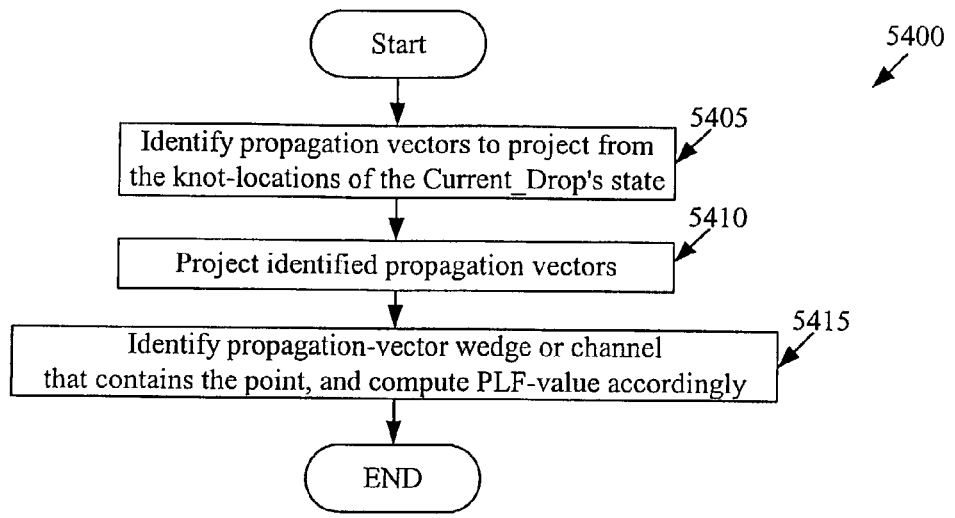
FIG. 54 illustrates a process for propagating a PLF from a line to a point or from a surface to a point.

FIG. 54 illustrates a process 5400 for propagating a PLF from a line to a point or from a surface to a point. This process is described by reference to FIG. 55, which illustrates the propagation of a line PLF from a line 5505 to a point 5520, and FIG. 56, which illustrates the propagation of a surface PLF from a surface 5602 to a point 5620.

Figure 55:
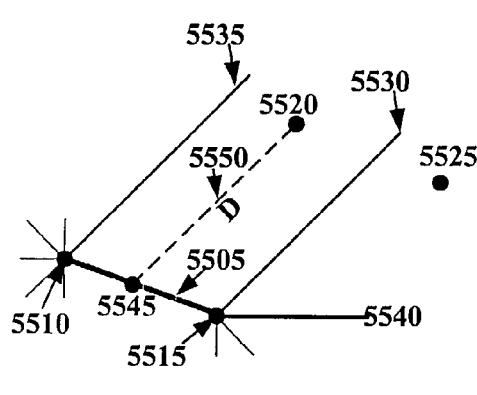
FIGS. 55 and 56 describe the process of FIG. 54.
Figure 56:
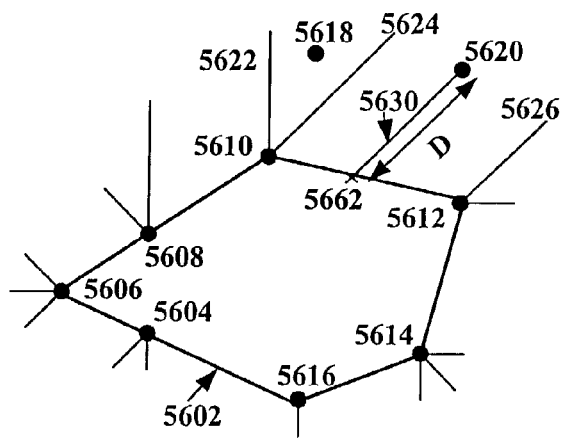

As shown in FIG. 54, the process 5400 initially identifies (at 5405) the propagation vectors that emanate from the locations on the Current_Drop's domain that are locations of knots in the Current_Drop's G PLF. The identification of these propagation vectors was described above by reference to FIGS. 46–51. In FIG. 55, knots are located at points 5510 and 5515 on line 5505. In FIG. 56, knots are located at vertices 5604–5616 of surface 5602.

Next, at 5410, the process 5400 projects the propagation vectors identified at 5405. FIG. 55 illustrates the projection of six propagation vectors from knot-location 5510 and four propagation vectors from knot-location 5515. In FIG. 56, three propagation vectors are projected from each of the vertices 5606 and 5614, two propagation vectors are projected from each of the vertices 5604, 5608, 5610, and 5612, and one propagation vector is projected from vertex 5616.

The process 5400 then identifies (at 5415) the propagation-vector wedge or channel that contains the destination point. As mentioned above, a propagation-vector "wedge" is defined by two propagation vectors that emanate from the same location on the start domain, while a "channel" is defined by two parallel propagation vectors that emanate from two different locations on the start domain. After identifying the wedge or channel in which the destination point falls, the process computes (at 5415) the PLF-value at the destination point. The PLF-value at the destination point that is within a wedge equals (1) the PLF-value of Current_Drop's G PLF at the start domain vertex from which the wedge's propagation vectors emanate, plus (2) the distance (according to equation (5)) between this vertex and the destination point. On the other hand, the PLF-value at a destination point that is within a channel equals (1) the length of a line segment that is parallel to the two channel-defining vectors and that starts at the destination point and terminates at the start domain, plus (2) the PLF-value of the Current_Drop's G PLF at the point that the line segment terminates on the start domain. The line segment terminates on the start domain on a second line segment that is between the two knot locations from which the two channel-defining vectors emanate. When the start domain is a surface, the second line segment (1) is an edge on the boundary of the surface if the two knot locations are boundary vertices of the surface, and (2) is a line segment within the surface if the two channel-defining knot locations are within the surface.

For instance, in FIG. 55, the destination point 5520 falls within a channel defined by two propagation vectors 5530 and 5535. The distance between the destination point 5520 and line 5505 is the length D of a line segment 5550 that is parallel to vectors 5530 and 5535. Accordingly, the PLF-value at destination point 5520 equals the length D plus the PLF-value of the Current_Drop's G PLF at point 5545, which is the location that line segment 5550 intersects line 5505. If the destination point was point 5525 that is within the wedge defined by propagation vectors 5530 and 5540, the PLF-value at point 5525 would be (1) the PLF-value of the Current_Drop's G PLF at point 5515, plus (2) the distance (according to equation (5)) between points 5515 and 5525.

In FIG. 56, the destination point 5620 falls within a channel defined by two propagation vectors 5624 and 5626. The distance between the destination point 5620 and surface 5602 is the length D of a line segment 5630 that is parallel to vectors 5624 and 5626. Accordingly, the PLF-value at destination point 5620 equals the length D plus the PLF-value of the Current_Drop's G PLF at point 5662, which is the location that line segment 5630 intersects surface 5602. If the destination point was point 5618 that is within the wedge defined by propagation vectors 5622 and 5624, the PLF-value at point 5618 would be (1) the PLF-value of the Current_Drop's G PLF at point 5610, plus (2) the distance (according to equation (5)) between points 5610 and 5618.

After 5415, the process 5400 terminates.

(6th) Expansion from Surface to Surface

A G PLF is propagated from a surface to another surface when, for example, the expansion is from one hole to another hole. In the embodiments described below, such an expansion would define a topologically stacked via, which is a topologically defined via that would start and end on two non-adjacent layers. A topologically defined stacked via does not always result in a geometrically stacked via.

A viable expansion from one hole to another would require that the start and destination surfaces (i.e., the portions of the hole polygons to which a path can expand) have sufficient overlap. Some embodiments define the G PLF of such an expansion only over the region of the destination polygonal surface that overlaps the start polygonal surface (i.e., only at the intersection of the domains of the start and destination surfaces). In this region, the expansion's G PLF would be identical to the Current_Drop's G PLF for the corresponding region of the start surface. Of course, the expansion's G PLF might have new knots and might have modified edge and facet descriptions to account for the boundary of the overlapping regions.

Figure 57:
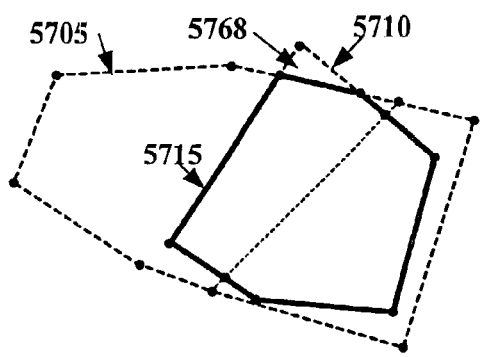
FIG. 57 presents an example that illustrates an expansion from a start surface to a destination surface.

FIG. 57 presents an example that illustrates an expansion from a start surface to a destination surface. Two spaces in layers 2 and 3 might contain the start surface, while two spaces in layers 3 and 4 might contain the destination surface. FIG. 57 illustrates a start polygonal surface 5705 and a destination polygonal surface 5710. This figure also illustrates a region 5715 that the polygons 5705 and 5710 overlap. It also illustrates the G PLF 5720 that is defined over the start surface 5705. This figure illustrates a projected view of the G PLF 5720 onto the x,y plane, in order to simplify the visual presentation of this PLF.

In FIG. 57, the overlap region 5715 is sufficiently large. Hence, the expansion is viable, and a G PLF needs to be computed for the expansion. FIG. 57 illustrates that the expansion's G PLF 5770 is defined only over the overlapping portion 5715. This PLF 5770 is identical to the portion of the Current_Drop's G PLF 5720 that is defined across the overlapping region 5715. However, the PLF 5770 has new knots and modified edge and facet descriptions in order to account for the boundary of the overlap region. In particular, the expansion's G PLF 5770 will include two facets 5725 and 5730. Facets 5725 and 5730 have the same normal as the two facets 5740 and 5745 of the Current_Drop G PLF. However, these facets have slightly different knots and edges. Specifically, facet 5725 includes knots 5750, 5754, 5756, 5764, and 5766, while facet 5730 includes knots 5756, 5758, 5760, 5762, and 5764. All these knots specify the boundaries of facets 5725 and 5730, which are smaller than the facets 5740 and 5745 of the Current_Drop's PLF. Also, the edge 5772 between facets 5725 and 5730 is shorter than the edge between facets 5740 and 5745.

(ii) Penalty Cost

Propagating the Current_Drop's G PLF to a potential destination particle specifies an initial G PLF for a potential expansion. If the potential expansion needs to be penalized, the process 3500 adds to the initial G PLF one or more penalty costs associated with the potential expansion. Some embodiments penalize expansions to holes, expansions to overcongested edges and expansions to walls of other nets. Some embodiments also penalize expansions that shove routes of other nets along edges or within faces.

(1st) Penalty for Expansion to Overcongested Edges

Figure 58:
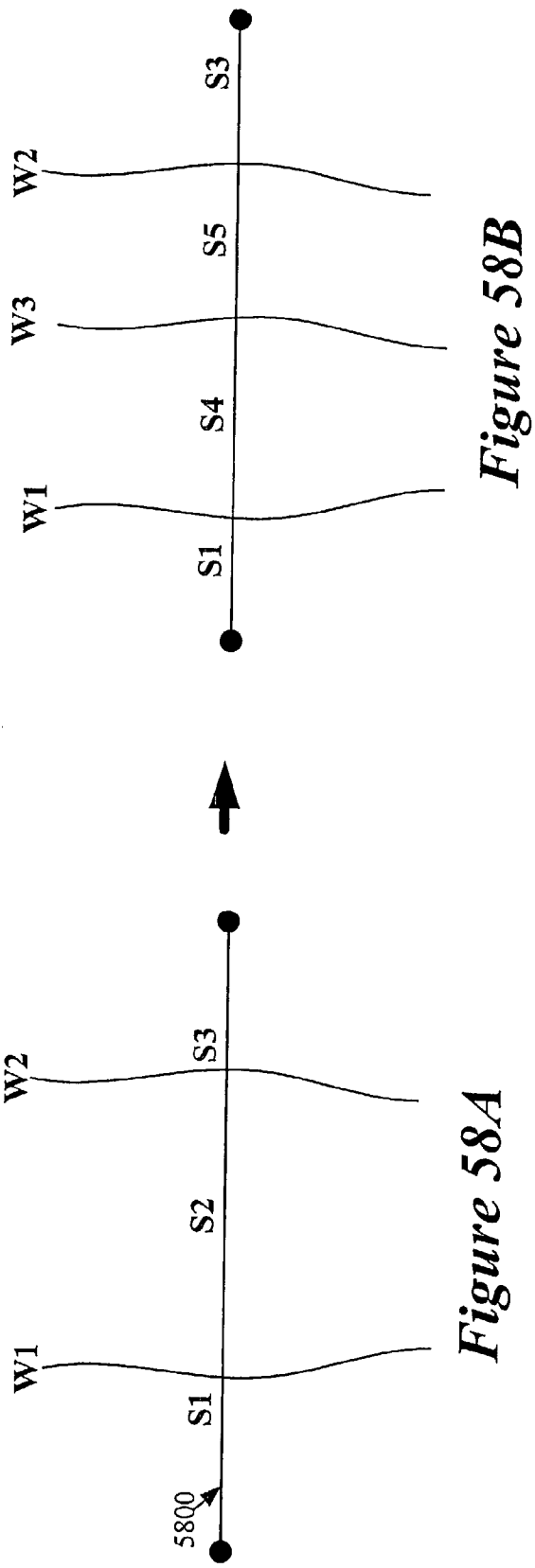
FIGS. 58A and 58B illustrate how to compute the flow across an edge after a potential expansion.

Process 3500 allows a path to expand to the exits of overcongested edges. The route flow across an edge equals the width of the net routes crossing the edge plus the spacing between the crossing net routes and between the net routes and the edge nodes. FIGS. 58A and 58B illustrate how to compute the flow across an edge after a potential expansion. Specifically, FIG. 58A illustrates the center-lines of topological routes for two nets that were previously inserted across an edge 5800. The two routes have widths W1 and W2 and spacing S1 and S3, respectively, towards their adjacent edge nodes. Also, the spacing between the two routes is defined as S2. FIG. 58B illustrates how the edge 5800 would look like after a third route is inserted across it.

The flow of this edge equals the sum of the following: (1) the minimum spacing S1 between net 1 and its adjacent node, (2) the width W1 of net 1, (3) the minimum spacing S4 between nets 1 and 3, (4) the width W3 of net 3, (5) the minimum spacing S5 between nets 3 and 2, (6) the width W2 of net 2, and (7) the minimum spacing S3 between net 3 and its adjacent node.

When the route flow is equal to or less than the capacity of the edge, the expansion is allowed and legal. On the other hand, when this flow is larger than the edge capacity, the expansion is still allowed, but it is recorded as an illegal expansion. Some embodiments compute the capacity of each edge according to the processes described above by reference to FIGS. 19 and 20.

Some embodiments pretabulate in a storage structure the widths for each net on each layer and the spacing requirements between each net and every other net, pin, or obstacle on each layer. Accordingly, in these embodiments, the path-generation process 3500 retrieves these values from the storage structure when it needs them (e.g., when it is computing edge capacities).

An expansion to an edge that is overcongested before or after the expansion is assessed an extra penalty cost. This penalty is called a congestion penalty. In some embodiments, this congestion penalty is a pre-defined penalty constant. In other embodiments, this penalty is a constant that is derived based on the congestion of the edge. This constant is linearly or non-linearly (e.g., quadratically) proportional to the amount of over-congestion on the edge.

(2nd) Expansion to Holes

Expansions to holes are also assessed a penalty cost. This penalty can be different for holes between different layer pairs if the cost introduced by a via between different layer pairs is different. A via introduces a variety of costs in a design, and the penalty can take into account all these costs. For instance, from a resistance or delay point of view, a via might cost fifty times more than the resistance or delay of a unit length of a wire. Accordingly, the penalty might be 50 (i.e., the via can be counted as a wire that is 50 units long). Alternatively, each via might reduce the manufacturing yield by some amount. This reduction can also be accounted for by equating it to a wirelength and adding it to the cost function.

(3rd) Expansion to Walls of Other Nets

As mentioned above by reference to FIG. 37, the process 3500 allows the path for one net to expand to the wall of another net (i.e., to specify a drop for an expansion to the wall of another net). The process, however, adds a rip penalty to the cost (i.e., G PLF) of an expansion to a wall of another net. This is because if such a drop is ever retrieved from the storage structure, the expansions that are defined about this drop will require piercing of the other net's route. In some embodiments, the rip penalty is larger than two via penalties. Such a penalty ensures that the path search only rips another net's route when it has reasonably exhausted all other viable expansions on the same layer or in the layers above or below.

(4th) Expansion that Shoves Previously Defined Routes

Some embodiments also penalize expansions that shove routes of other nets along edges or within faces.

Shoving Other Routes Along Edges

Figure 59:
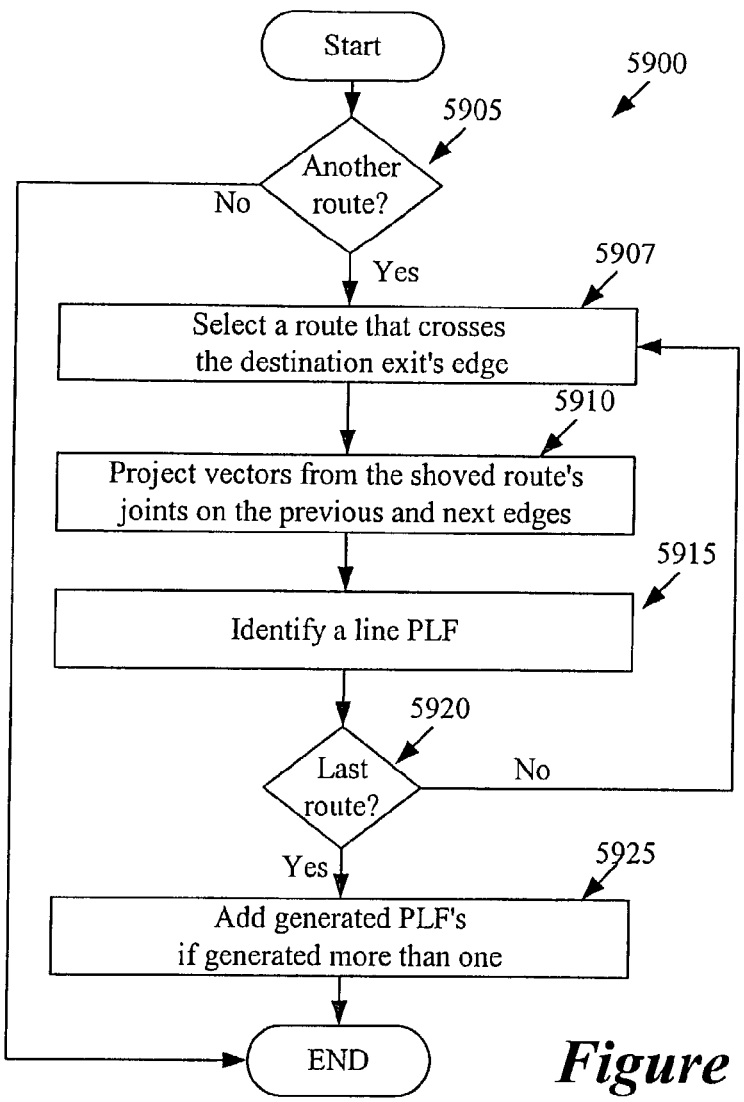
Figure 60:
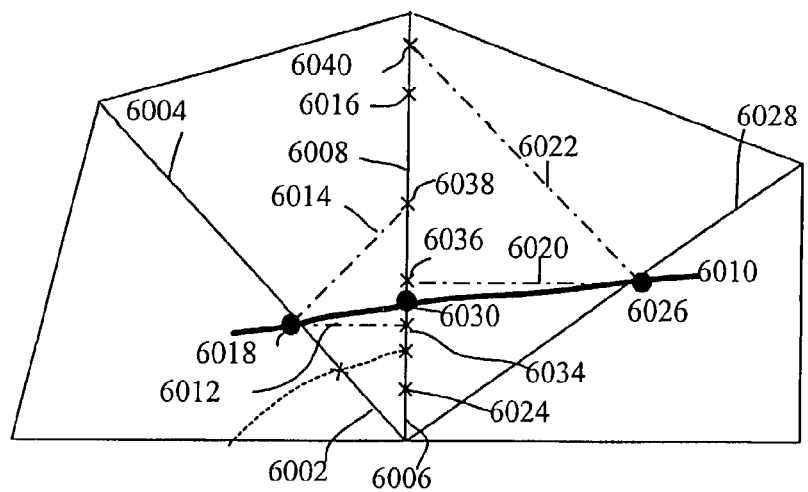
FIGS. 60 and 62 present examples that describe these processes.

A potential expansion to an edge might cause the other net routes on the edge to have to be shoved along that edge. FIG. 59 illustrates a process 5900 that generates a line PLF that expresses the extra shoving cost of an expansion to an exit on an edge with one or more net routes crossing it. This process is described by reference to FIG. 60, which illustrates an expansion from an exit 6002 on a first edge 6004 to an exit 6006 on a second edge 6008. In FIG. 60, a previously defined route 6010 of another net crosses the second edge 6008. This route also crosses edges 6004 and 6028. Joints 6018, 6030, and 6028 specify this route's crossing of edges 6004, 6008, and 6028.

As shown in FIG. 59, the process 5900 initially determines (at 5905) whether the route of at least one other net intersects the edge that contains the destination exit. If not, the process terminates. Otherwise, the process 5900 selects (at 5907) one of the routes that crosses the destination exit's edge.

Next, at 5910, the process identifies the vectors to project from the selected route's joints on the edges that the shoved route crosses before and after the destination edge (i.e., before and after the edge containing the expansion's destination exit). Some embodiments project vectors in each available interconnect-line direction that falls within a four-sided polygon that is formed by the selected route's two joints and by two points that define the exit's domain (i.e., maximum possible boundaries) along its edge. The boundary-defining points are defined based on the spacing and width constraints and obstacle constraints on the destination exit's edge. For instance, in FIG. 60, points 6016 and 6024 are the two boundary-defining points of the exit. The destination exit's boundaries cannot be defined beyond these two points without violating required spacing and width constraints between the net routes crossing the edge and between the nets and obstacles near the edge.

The points 6016 and 6024 define a four-sided polygon along with joints 6018 and 6026. Within this polygon, two vectors 6012 and 6014 are projected from joint 6018 on edge 6004, and one vector 6020 is projected from joint 6026 on edge 6028. By projecting vectors from the joints 6018 and 6026, the process 5900 assumes that these joints will remain fixed as the route's joint 6030 is shoved along the edge 6008. FIG. 60 also illustrates a vector 6022 that emanates at a 135 0 angle from joint 6026. This vector is not projected as it does not fall within the polygon defined by points 6016, 6018, 6024, and 6026 (i.e., this vector would intersect the edge 6008 outside of the destination exit's domain).

After identifying (at 5910) the vectors to project from the previous and next joints of the shoved route, the process 5900 identifies (at 5915) the intersection of the identified vectors and the destination edge. In FIG. 60, projection vectors 6012, 6014, and 6020 intersect the destination edge at points 6034, 6036, and 6038.

At 5915, the process specifies a line PLF that is defined over the destination exit's domain and that expresses the cost of shoving the route along the destination exit's domain. The expansion to the destination exit necessarily requires the shoving of one or more routes on the edge when this exit's edge does not have any portion to which the path can expand without shoving the selected route. In this situation, the process specifies a knot in the line PLF for each intersection point identified at 5910. In this situation, the process also specifies two knots for the two points that define the exit's maximum possible boundaries along its edge. For each knot that the process specifies in this situation, the process computes a PLF-value that equals (1) the distance (according to equation (5)) between the knot's location and the location of the selected route's joint on the previous edge, plus (2) the distance (according to equation (5)) between the knot's location and the location of the selected route's joint on the next edge, minus (3) the current length (according to equation (5)) of the route between its previous and next joints.

On the other hand, when the destination exit's edge has a segment to which the path can expand without shoving any route on the edge, the process specifies a knot at each identified intersection point that is outside the segment that can be expanded to without shoving other routes. In this situation, the process also specifies a knot at each of the two boundary points of this segment (i.e., the segment to which the path can expand without shoving any route) and sets the PLF-value of these knots to zero. The PLF-value of each of the other knots that the process specifies at this stage equals (1) the distance (according to equation (5)) between the knot's location and the location of the selected route's joint on the previous edge, plus (2) the distance (according to equation (5)) between the knot's location and the location of the selected route's joint on the next edge, minus (3) the current length (according to equation (5)) of the route between its previous and next joints.

In the example illustrated in FIG. 60, the PLF-value of a knot specified at point 6038 is (1) the distance (according to equation (5)) between point 6038 and joint 6018, plus (2) the distance (according to equation (5)) between point 6038 and joint 6026, minus (3) the length (according to equation (5)) of the route between its joints 6018 and 6026.

The line PLF that the process defines at 5915 expresses the additional wirelength due to shoving of the selected route along the edge. After 5915, the process determines (at 5920) whether it has generated such a line PLF for each route that crosses the destination exit's edge. If not, the process returns to 5907 to select another route and to repeat operations 5910-5920 for this newly selected route. When the process determines (at 5920) that it has generated a line PLF for each route that crosses the destination exit's edge, it adds (5925) the PLF's that it generated if it generated more than one PLF. After 5925, it then terminates.

Shoving Other Routes in a Face

Figure 61:
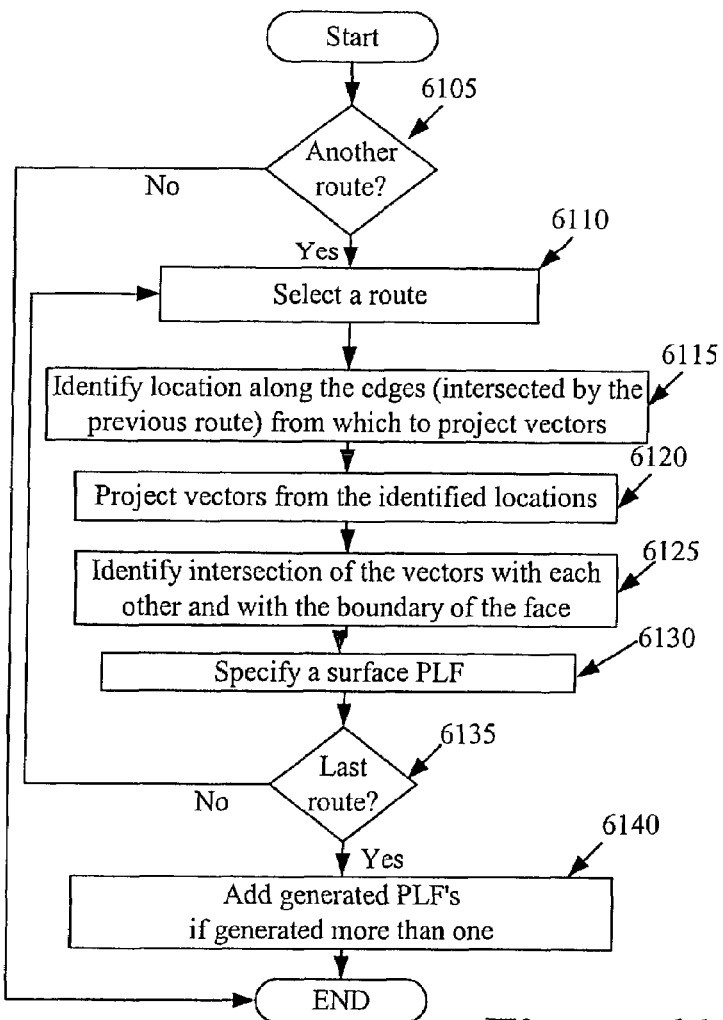
Figure 62:
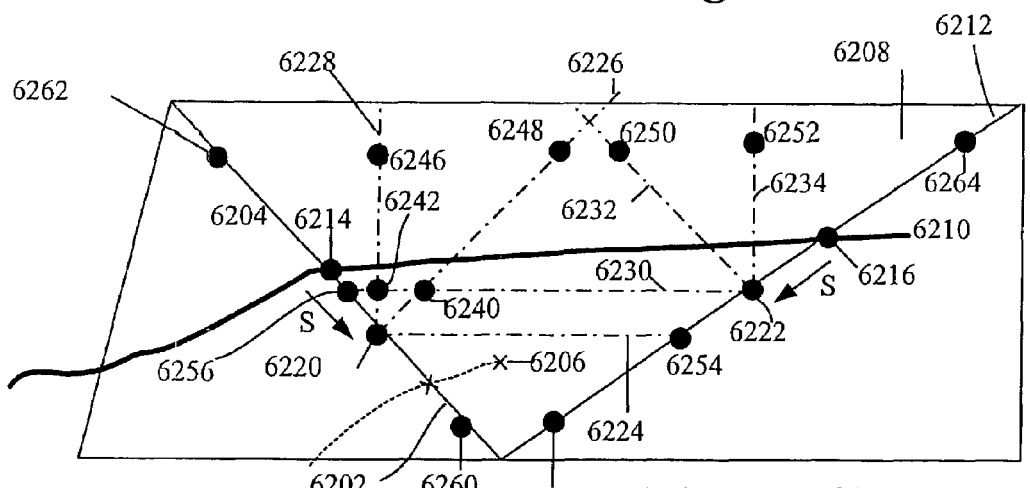

A potential expansion to a surface (e.g., a hole or a portion of a hole) within a face might cause the other net routes that intersect the face to be shoved within the face. FIG. 61 illustrates a process 6100 that generates a surface PLF that expresses the extra shoving cost of an expansion to a surface that has one or more other net routes crossing its face. This process is described by reference to FIG. 62, which illustrates an expansion from an exit 6202 on a first edge 6204 to a hole 6206 in a face 6208. In FIG. 62, a previously defined route 6210 of another net crosses the face 6208. This route crosses the first edge 6204 and a second edge 6212 at two joints 6214 and 6216.

As shown in FIG. 61, the process 6100 initially determines (at 6105) whether the route of at least one other net intersects the face that contains the destination surface. If not, the process terminates. Otherwise, the process 6100 selects (at 6110) a route that intersects the destination surface's face. It then identifies (at 6115) two locations from which to project vectors on the edges of the destination surface's face. In some embodiments, these two locations are a distance S away from the selected route's joints along the edges of these joints. The distance S accounts for the via width and the minimum spacing between the current net's route (i.e., the route of the net currently being routed) and the selected route. FIG. 62 illustrates two points 6220 and 6222 that are a distance S away from joints 6214 and 6216 of the route 6210.

Next, the process 6100 projects (at 6120) vectors from the locations identified at 6105. Some embodiments project vectors in each available interconnect-line direction that falls within the destination surface's face. FIG. 62 illustrates (1) three vectors 6224, 6226, and 6228 that are projected from location 6220 on edge 6204, and (2) three vectors 6230, 6232, and 6234 that are projected from location 6222 on edge 6212. By projecting vectors from locations 6220 and 6222 that are identified from joints 6214 and 6216, the process 6100 assumes that the joints 6214 and 6216 will remain fixed as the route is shoved within face 6208.

After projecting vectors at 6120, the process 6100 identifies (at 6125) the intersection of the projected vectors (1) with the boundary of the destination polygonal surface and (2) with each other within the boundary of the destination polygonal surface. In FIG. 62, the projection-vector intersections are at points 6240 and 6242. The projection vectors intersect the boundary of the destination surface at 6246–6256.

At 6130, the process specifies a surface PLF that is defined over the destination surface and that expresses the cost of shoving the route in this surface. The process specifies a knot at each identified intersection point, unless the intersection point is within a portion of the destination surface to which the path can expand without shoving the selected route. The process sets the PLF-value of each knot that is specified at such an intersection point equal to (1) the distance (according to equation (5)) between the knot's location and the location of the selected route's joint on one edge of the destination surface's face, plus (2) the distance (according to equation (5)) between the knot's location and the location of the selected route's joint on the other edge of the destination surface's face, minus (3) the current length (according to equation (5)) of the route between the two joints. For instance, the PLF-value of a knot specified at point 6240 is the (1) the distance between point 6240 and location 6220, plus (2) the distance between point 6240 and location 6222, minus (3) the length of the route between joints 6214 and 6216. Similarly, the PLF-value of a knot specified at intersection point 6246 equals the sum of the distance between this point and points 6220 and 6222, minus the length of the route between joints 6214 and 6216.

The intersection of one or more projected vectors with each other or with the destination-surface boundary might fall within a portion of the destination-surface to which a path can expand without shoving the route. Of these intersection points, knots are specified only for those points that might define the boundary between the destination-surface portion that a path can expand to without shoving the selected route and the destination-surface portion that a path can only expand to by shoving the selected route. In general, the process 6100 specifies three or more knots to define the facet for the destination-surface portion that a path can expand to without shoving the selected route. This facet is a zero-shove cost facet, and hence the PLF-value of its knots will be zero. In FIG. 62, the points 6220, 6254, 6260, and 6266 specify the portion of the destination surface to which a path can expand without shoving the route 6210. In some cases, a destination surface will not have any portion to which a path can expand without shoving the selected route. At 6125, the process also specifies knots at the remaining unexamined vertices of the destination surface. For instance, in the example illustrated in FIG. 62, the process specifies knots at the vertices 6262 and 6264.

After specifying all the knots, the process specifies (at 6130) the edges and facets of the surface PLF from the specified knots and the vectors that were used to define these knots. The process also computes and specifies (at 6130) the normal and z-intercept values for each specified facet. After 6130, the process determines (at 6135) whether it has generated a surface PLF for each route that crosses the destination-hole's face. If not, the process returns to 6110 to select another route and to repeat operations 6115-6135 for this newly selected route. When the process determines (at 6135) that it has generated a surface PLF for each route that crosses the destination surface's face, it adds (6140) the PLF's that it generated if it generated more than one PLF. After 6140, it then terminates.

(5) Adding PLF's

The process 3500 adds point, line, and surface PLF's. Adding two PLF's at a point is trivial, as their values are simply added. A constant function can be added to a line or surface PLF by incrementing the PLF-values of all knots of the line or surface PLF by value of the constant function.

(i) Adding Two Line PLF's

Adding two convex line PLF's that are defined across the same domain can also be efficiently done by taking advantage of the piecewise linear nature of the functions. At any point Q, the sum of two convex line PLF's PLF1 and PLF2 that are defined over the same line is the sum of PLF-values of PLF1 and PLF2 at that point, as illustrated by the equation below.

$$V=PLF1(Q)+PLF2(Q).$$

Accordingly, in some embodiments, the process 3500 adds two line PLF's by performing the following two operations. First, it initializes to null a PLF3 that is to represent the sum of the two PLF's. Second, it specifies a knot in PLF3 at each unique knot location in either PLF1 or PLF2. The value of each specified knot in PLF3 is the sum of the PLF-values in PLF1 and PLF2 at the specified knot's location. In some embodiments, the process 3500 examines the knots of PLF1 and PLF2 based on the order that they appear, i.e. the process starts from one end of the line over which the PLF's are defined and traverses to the other end. If a first line PLF (F1) is defined over a larger portion of a line than a second line PLF (F1), the first and second PLF's can be summed over their overlapping portion of their domains by (1) specifying a third line PLF (F3) that is equal to the first PLF but is only defined over the overlapping portion, and (2) performing the above described approach to obtain the sum of the second and third PLF's (F2 and F3).

(ii) Adding Two Surface PLF's

Figure 63:
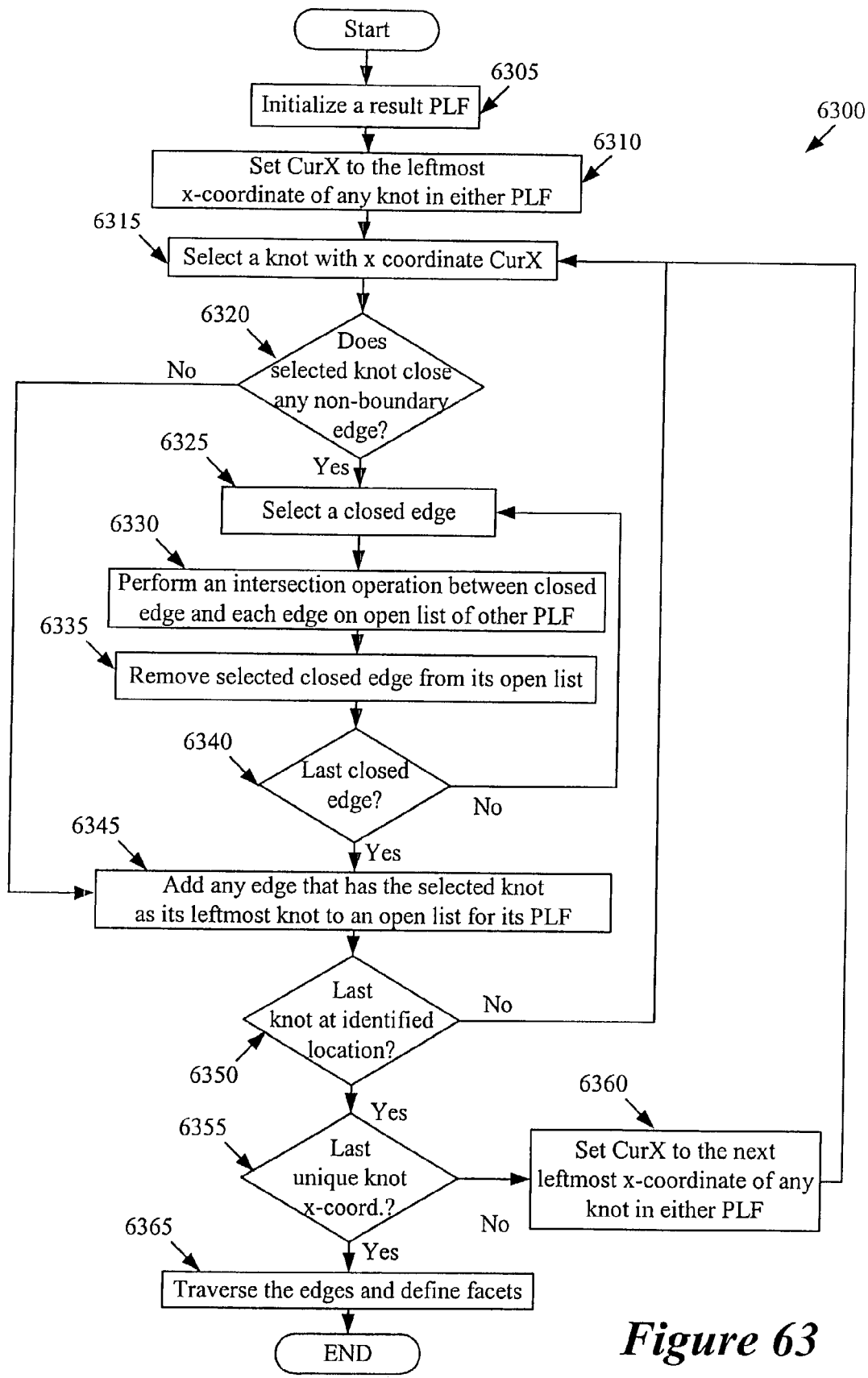
FIGS. 63–65 illustrate how to add two surface PLF's.
Figure 64:
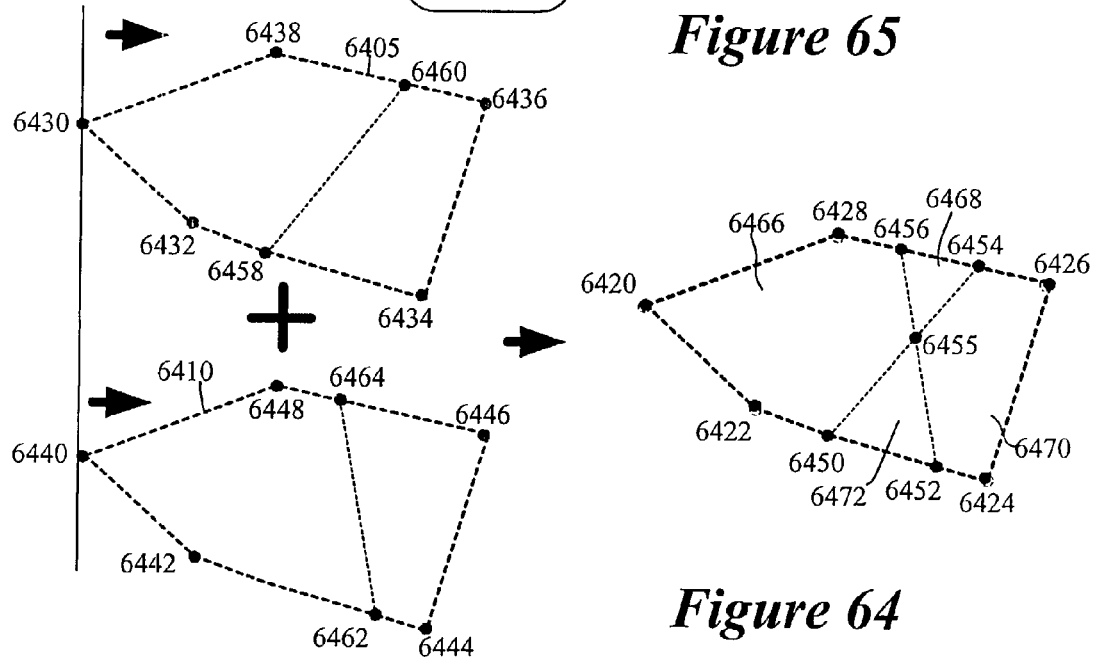

FIG. 63 illustrates a specific process 6300 for adding two surface PLF's that have overlapping but potentially different domains. To add two surface PLF's, this process performs a line sweep operation that identifies the intersection of the two polygonizations. This process is described by reference to FIG. 64, which illustrates an example where two surface PLF's 6405 and 6410 are added to produce a third surface PLF 6415. In FIG. 64, the PLF's are projected onto the x,y plane in order to simplify their visual presentation.

As shown in FIG. 63, the process 6300 initializes (at 6305) a new PLF ("result PLF") that will eventually represent the sum of the two PLF's. Next, at 6310, the process identifies the leftmost knot location in either PLF, and sets a variable CurX to the x-coordinate of the identified knot location. The process then selects (at 6315) a knot in either PLF that has an x-coordinate equal to CurX. There might be several knots with a particular x-coordinate in each PLF. To address this situation, some embodiments use the convention that when two or more knots in a PLF have the same x-coordinate, the process should select (at 6315) the knot that has the smallest y-coordinate and that has not yet been examined. At 6315, the process specifies a knot in the result PLF at the x,y location of the selected knot, if one such knot has not already been specified. At 6315, the process sets the PLF-value of the specified knot as the sum of the PLF-values of the two PLF's at the specified knot's x,y coordinates.

As further described below, each time the process 6300 encounters a knot that "opens" an edge (i.e., encounters a new edge) in its left-to-right sweep, it adds the edge to a list of open facets for the selected knot's PLF. Some embodiments use the convention that a knot opens an edge if (1) its x-coordinate is smaller than the x-coordinate of the other knot of its edge, or (2) its y-coordinate is smaller than the y-coordinate of the other knot of its edge when both edge knots have the same x-coordinate.

Before adding a new edge to the open list, the process 6300 determines (at 6320) whether the selected knot closes any edge in the selected knot's PLF. In some embodiments, a knot closes an edge if (1) its x-coordinate is larger than the x-coordinate of the other knot of its edge, or (2) its y-coordinate is larger than the y-coordinate of the other knot of its edge when both edge knots have the same x-coordinate. If the process determines (at 6320) that the selected knot does not close any edges, the process transitions to 6345, which is further described below. If the selected knot does close an edge, the process selects (at 6325) an edge that the selected knot closes. It then performs (at 6330) an intersection operation between the closed edge and each edge on the open list of the other PLF.

Figure 65:
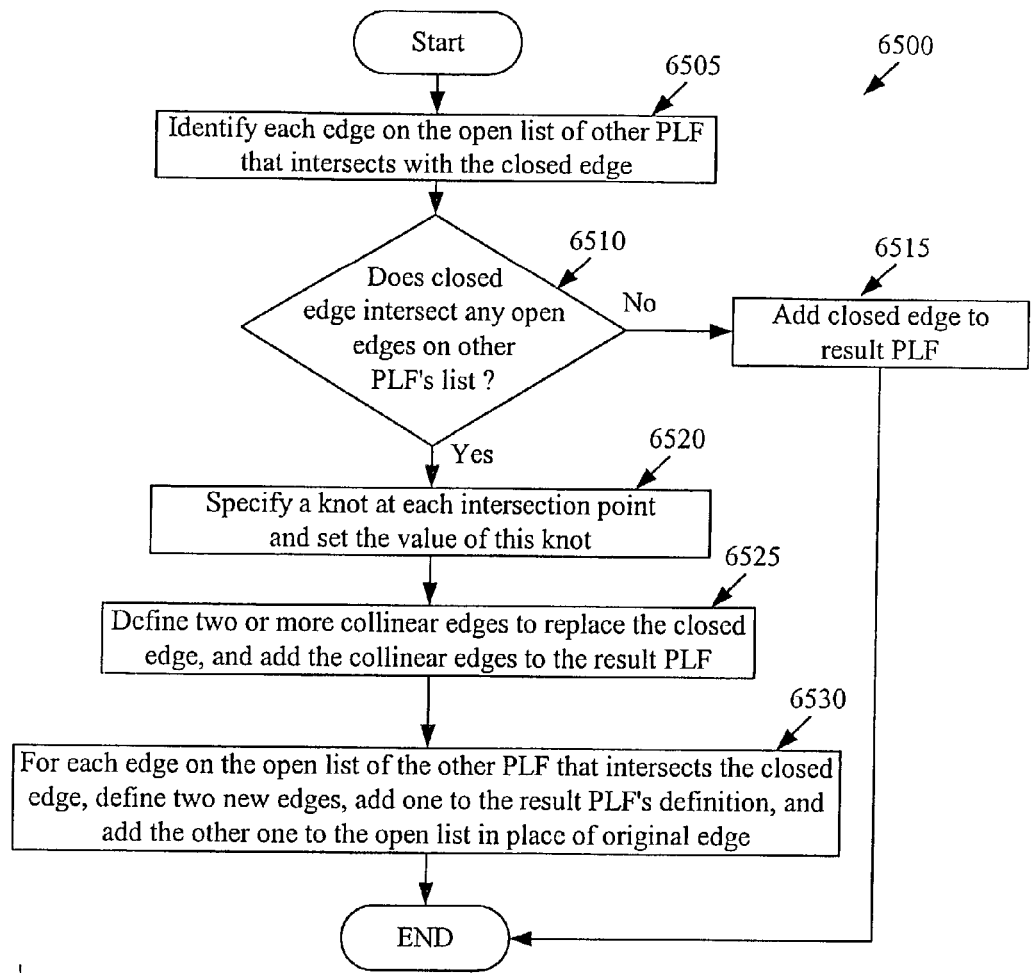

FIG. 65 illustrates the intersection process 6500. This process initially compares (at 6505) the closed edge with each edge on the open list of the other PLF in order to identify each intersection of the closed edge with another edge. It then determines (at 6510) whether it identified at 6505 the intersection at a point of the closed edge with any of the open edges of the other PLF.

If the process determines (at 6510) that the closed edge does not intersect any open edge, the process adds (at 6515) the closed edge to the result PLF and then terminates. Otherwise, the process specifies (at 6520) a knot at each point that the closed edge intersects one of the open edges of the other PLF. The value of each specified knot is the sum of the two PLF's at the location of the specified knot. For instance, in FIG. 64, when the edge between knots 6458 and 6460 in the first PLF 6405 closes, the process 6500 identifies this edge's intersection with the edge between knots 6462 and 6464 in the second PLF 6410. At the intersection of these two edges, the process 6500 identifies a knot 6455 in the third PLF 6415. The value of the knot 6455 equals the sum of the values of PLF's 6405 and 6410 at this knot's x, y coordinates.

After specifying one or more knots at 6520, the process 6500 defines (at 6525) two or more collinear edges to replace the closed edge, and adds the collinear edges to the result PLF. In FIG. 64, the process identifies (at 6525) two new edges, one between knots 6450 and 6455, and one between knots 6455 and 6454. It then adds these two edges to the definition of the third PLF 6415, in place of adding the closed edge between knots 6450 and 6454.

For each particular edge on the open list of the other PLF that intersects the closed edge, the intersection process 6500 (at 6530) (1) defines two new edges, (2) adds one of the two edges to the result PLF, and (3) replaces the particular edge with the other of the two edges. The process uses the knot specified at 6520 at the intersection of the closed edge and an open edge to define the two new edges for the open edge. For instance, in FIG. 64, the process (at 6530) would define two edges for the open edge between knots 6462 and 6464. One of the two edges is between knots 6462 and 6455, and one edge is between knots 6455 and 6464. The process would add the edge between knots 6455 and 6464 to the result PLF. It would also replace the edge between knots 6462 and 6464 on the open list of PLF 6410 with the edge between knots 6455 and 6464. After 6530, the process terminates.

After the process 6300 performs the intersection process at 6330, the process 6300 removes (at 6335) the selected closed edge from its open list. It then determines (at 6340) whether it has examined all the edges that the selected knot (i.e., the knot selected at 6315) closes. If not, the process transitions back to 6330 to select another closed edge.

Otherwise, the process adds (at 6345) any edge that the selected knot opens to the list of "open" edges for the selected knot's PLF. After 6345, the process determines (at 6350) whether it has examined each knot in each PLF with an x-coordinate CurX. If not, the process transitions back to 6315 to select another knot with the x-coordinate CurX. If so, the process transitions to 6355, where it determines whether it has examined all the unique x-coordinates of knots in either PLF. If not, the process sets (at 6360) CurX to the next leftmost x-coordinate of any knot in either PLF.

When the process determines (at 6355) that it has examined all the unique x-coordinates of knot locations in both PLF's, it examines (at 6365) the edges added to the result PLF and identifies facets formed by related sets of edges. At 6365, the process also identifies the normal and z-intercept of each facet based on the knot values of the facet. When one (F1) of the PLF's being summed is defined over a larger portion of a surface than the other PLF (F2), the process 6300 can limit (at 6365) the surface PLF's definition that represents the sum of these two PLF's to cover only the overlapping domain of the two PLF's. Alternatively, before 6305, the process 6300 could generate a third PLF (F3) that is equal to the first PLF but is only defined over the domain of the second PLF (i.e., only defined over the portion of the surface that both PLF's F1 and F2 are defined).

FIG. 64 illustrates the result of the addition of the two PLF's 6405 and 6410. In this figure, the first PLF 6405 has five boundary knots 6430-6438 that are at the same location as five boundary knots 6440–6448 of PLF 6410. For these five pairs of knots, the process identifies five knots 6420–6428 in the third PLF 6415. In the third PLF 6415, the process also identifies four knots for the other four unique knots 6458-6462 in the two PLF's 6405 and 6410. As described above, it also specifies a knot 6455 at the intersection of two non-boundary edges of the two PLF's. In turn, these knots specify 13 edges that define four facets 6466–6472.

(6) Filtering PLF's

After identifying the G PLF of a potential expansion, the path-generation process 3500 filters (at 3534) the expansion's G PLF with the filter PLF of the destination particle. This filtering operation also sets the destination particle's filter PLF equal to the minimum of its original filter PLF and the expansion's G PLF. Filtering a point PLF for an expansion to a point is trivial. The expansion is discarded when its PLF-value is greater than the filter function value at that point. Otherwise, it is kept, and the point's filter function is set to the expansion's PLF-value.

(1st) Filtering Two Line PLF's and Identifying their Minimum

Figure 66:
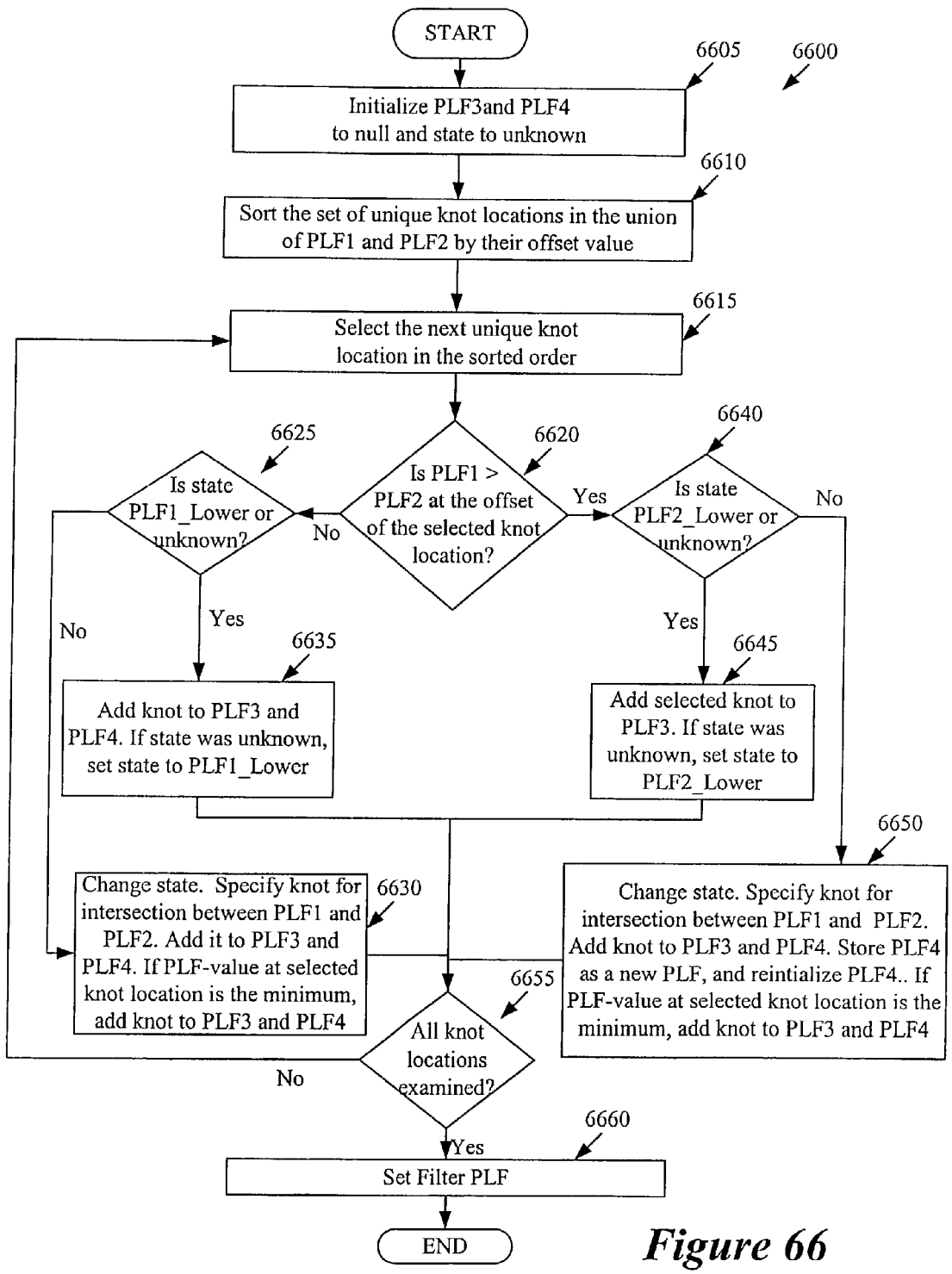
FIG. 66 illustrates a process that performs filtering and minimum operations for an expansion to a line.

FIG. 66 illustrates a process 6600 that performs the filtering and minimum operations for an expansion to a line (i.e., an expansion to an exit or a wall). Specifically, this function filters a filtered PLF (PLF1) by a filter PLF (PLF2), which may be non-convex. In the embodiments described below, the filter PLF2 is defined across a topological particle, while the filtered PLF1 might be defined across only a portion of the topological particle. Accordingly, the process 6600 performs its filtering and minimum operations for only the portion of the particle over which the filtered PLF1 is defined. Other embodiments might perform the filtering over the entire particle. In the embodiments described below, the filtering operation discards the portions of the filtered PLF that are larger than the corresponding portions of the filter PLF. Other embodiments, however, might not discard these portions, but rather might set the PLF-values in these portions to infinite. These embodiments then would not need to define several drops when several pieces of the filtered PLF remain after the filter.

As shown in FIG. 66, the process 6600 initially sets (at 6605) a state variable to "Unknown" and sets two PLF's PLF3 and PLF4 to null. The process uses PLF3 to represent the minimum of the filtered and filter PLF, while it uses PLF4 to keep track of the remaining portions of the filtered PLF. As the minimum, PLF3 will represent at each offset Q along the line the minimum of PLF1(Q) and PLF2(Q). PLF3 might end up being a non-convex PLF. As PLF1 and PLF2 are, PLF3 is defined over the line and will be represented by a sequence of knots that is sorted based on the offset values of the knots.

Next, at 6610, the process identifies the unique knot locations in both PLF1 and PLF2 and generates a set of unique knot locations that are sorted based on the offset values of the knots in this set. The process then selects (at 6615) the first location in the sorted set. The process then determines (at 6620) whether the filtered PLF1 is greater than the filtered PLF2 at the location selected at 6615.

If not, the process determines (at 6625) whether the state is PLF1__Lower or unknown. When the process determines at 6625 that the state is PLF1__Lower or is unknown, the process (at 6635) specifies a knot at selected location, sets its value to the value of PLF1, and adds the specified knot to PLF3 and PLF4. At 6635, the process also sets the state to PLF1__Lower if the state was previously unknown. In this situation, the process performs these operations because (1) if the state is unknown, this knot is at the first knot location and it is from the filtered PLF, and (2) if the state is PLF1__Lower, this knot is from the same PLF as the last knot added to PLF3 (i.e., PLF1 and PLF2 have not crossed between the last knot added to PLF3 and this knot, and during this internal PLF1 has been the smaller PLF). From 6635, the process transitions to 6655, which will be further described below.

On the other hand, when the process determines at 6625 that the state is PLF2__Lower, the knot at selected location is from a different PLF than the last knot added to PLF3. Hence, PLF1 and PLF2 have crossed between the last knot added to PLF3 and this knot. During this internal, PLF2 started smaller and ended larger. Accordingly, the process transitions to 6630 to perform several operations to account for this crossing. At 6630, the process initially sets the state to be PLF1__Lower. It then identifies the offset value Q along the edge where PLF1 and PLF2 intersected between the last knot added to PLF3 and the knot at the location selected at 6615. This intersection can be easily computed as it is an intersection between two line segments representing PLF1 and PLF2 between the last knot added to PLF3 and the knot at selected location. The process then specifies a knot at intersection point Q and adds this knot to PLF3 and PLF4. The PLF-value of this added knot is the PLF-value of either PLF1 or PLF2 at the offset-value of the intersection point Q. If the PLF-value of a knot at the selected knot location is smaller than the other PLF's value at this location, the process specifies a knot at the selected knot location, sets its value to the value of PLF1, and adds the specified knot to the description of PLF3 and PLF4. From 6630, the process then transitions to 6655.

If the process determines (at 6620) that the filtered PLF1 is greater than the filter PLF2 at the location selected at 6615, the process determines (at 6640) whether the state is PLF2_Lower or unknown. When the process determines at 6640 that the state is PLF2_Lower or unknown, the process (at 6645) specifies a knot at selected location, sets its value to the value of PLF2 at this location, and adds the specified knot to PLF3. At 6645, the process also sets the state to PLF2_Lower if the state was previously unknown. The process performs these operations at 6645 because (1) if the state is unknown, this knot is the first knot selected, and it is from the filter PLF2, and (2) if the state is PLF2_Lower, this knot is from the same PLF as the last knot added to PLF3 (i.e., the two PLF's have not crossed between the last knot added to PLF3 and this knot, and during this interval PLF2 has been the smaller PLF). From 6645, the process transitions to 6655.

On the other hand, when the process determines at 6640 that the state is PLF1_Lower, the knot at selected location is from a different PLF than the last knot added to PLF3. Hence, the two PLF's have crossed between the last knot added to PLF3 and the knot selected at 6615. During this interval, PLF1 started smaller and ended larger. Accordingly, the process transitions to 6650 to perform several operations to account for this crossing. At 6650, the process initially sets the state to be PLF2_Lower. It then identifies the offset value Q along the edge where PLF1 and PLF2 intersected between the last knot added to PLF3 and the knot selected at 6615. This intersection can be easily computed, as it is an intersection of two line segments representing PLF1 and PLF2 between the last knot added to PLF3 and the knot at selected location. The process then specifies a knot at intersection point Q and adds this knot to PLF3 and PLF4. The PLF-value of this added knot is the PLF-value of either PLF1 or PLF2 at the offset-value of the intersection point Q. If the PLF-value of a knot at the selected knot location is smaller than the other PLF's value at this location, the process specifies a knot at the selected location, sets its value to the value of PLF2 at this location, and adds the specified knot to the description of PLF3 and PLF4. The process then specifies a new PLF equal to PLF4 and then reinitializes PLF4. The new PLF represents a remaining portion of the filtered PLF. From 6650, the process transitions to 6655.

At 6655, the process determines whether it has examined all the unique knot locations in the sorted set produced at 6610. If not, the process returns to 6615 to select the next unique knot location in the sorted set and to perform the subsequent operations for this newly selected knot location. On the other hand, when the process determines (at 6655) that it has examined all the unique knot locations in the combined set, the process uses (at 6660) PLF3 to define the new filter function. As mentioned above, the filtered function PLF1 might not be defined over the entire domain over which the filter function PLF2 is defined. Because of this, the process 6600 performs its minimum operations for only the portion of the filter function's particle over which the filtered PLF1 is defined.

When the filtered function PLF1 and the original filter function PLF2 have the same domain, the process sets (at 6660) the particle's filter function to PLF3. On the other hand, when the filtered PLF1 is defined over a smaller portion of the filter function's particle, the process replaces the portion of the filter function (PLF2) that is defined over the filtered function's (PLF1's) domain with PLF3. The process leaves the portion of PLF2 outside of PLF1's domain intact. A boundary knot of PLF3 will be removed if it is an original knot of the filter PLF2 or if it is on a PLF segment in PLF3 that has the same slope as the original filter PLF2 at the boundary knot. At 6660, the remaining portion or portions of the filtered PLF1 are the PLF's that the process 6600 defines at 6650.

As mentioned above, the path-generation process 3500 filters (at 3512) the G PLF of a drop that it retrieves from the priority queue with the filter function of the drop's particle. For this filtering operation, the path-generation process uses a process that is identical to the process 6600 with the exception that unlike process 6600, the filtering process at 3512 does not maintain PLF3 as it does not need to identify the minimum of the filtered and filter PLF's at 3512.

(2nd) Filtering two Surface PLF's

Figure 67:
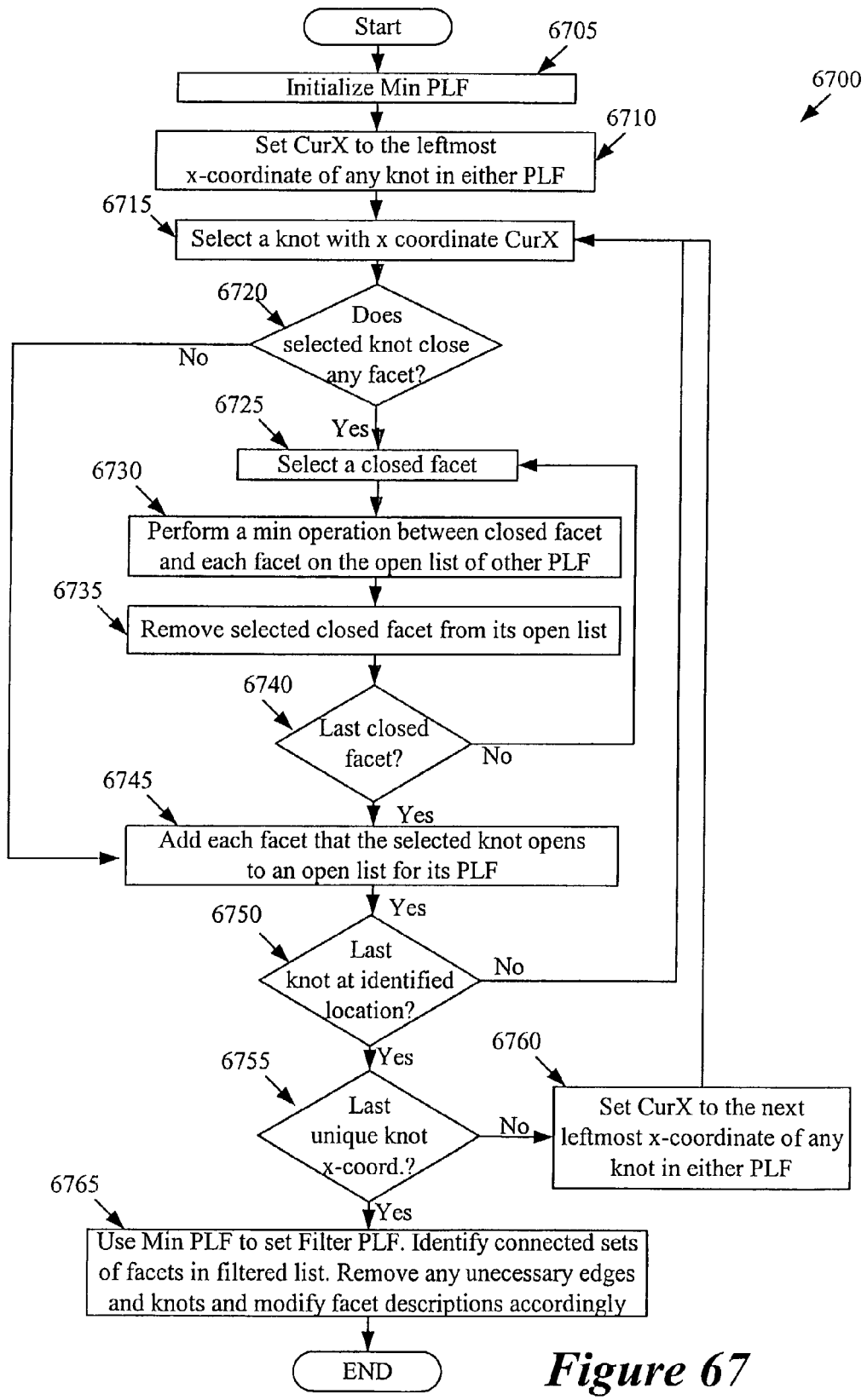
FIGS. 67 and 68 illustrate how to filter two surface PLF's.

FIG. 67 illustrates a process 6700 for filtering two surface PLF's that have overlapping but potentially different domains. To filter two such surface PLF's, the process 6700 performs a plane sweep operation that identifies the intersection of the two polygonizations. This process starts by initializing (at 6705) a Min PLF that it will use to record the minimum of the two surface PLF's that it is filtering.

It then identifies (at 6710) the leftmost unique knot location (i.e., the unique knot location with the smallest x-coordinate) in either PLF, and sets a variable CurX to the x-coordinate of the identified knot location. The process then selects (at 6715) a knot in either PLF that has an x-coordinate equal to CurX. There might be several knots with a particular x-coordinate in each PLF. To address this situation, some embodiments use the convention that when two or more knots in a PLF have the same x-coordinate, the process should select (at 6715) the knot that has the smallest y-coordinate and that has not yet been examined.

As further described below, each time the process 6700 encounters a knot that "opens" a facet (i.e., encounters a new facet) in its left-to-right sweep, it adds the facet to a list of open facets for the selected knot's PLF. To address the case where the two knots of a facet have the same x-axis coordinate, some embodiments use the convention that a knot opens a facet if (1) it is the one with the smallest x-coordinate when all the facet's knots have different x-coordinates, or (2) it is the one with the smallest x-coordinate and the smallest y-coordinate when two facet's knots have the smallest x-coordinate of all knots of the facet.

Before adding a new facet to the open list, the process 6700 determines (at 6720) whether the selected knot closes a facet in the selected knot's PLF. In some embodiments, a knot closes a facet if (1) the knot is the one with the largest x-coordinate when all the facet's knots have different x-coordinates, or (2) it is the one with the largest x-coordinate and the largest y-coordinate when two facet's knots have the largest x-coordinate of all knots of the facet. If the process determines that the selected knot does not close any facet, the process transitions to 6745, which is further described below. However, if the selected knot closes at least one facet, the process selects (at 6725) a facet that the selected knot closes. It then performs (at 6730) a min operation between the closed facet and each facet on the open list of the other PLF.

Figure 68A:
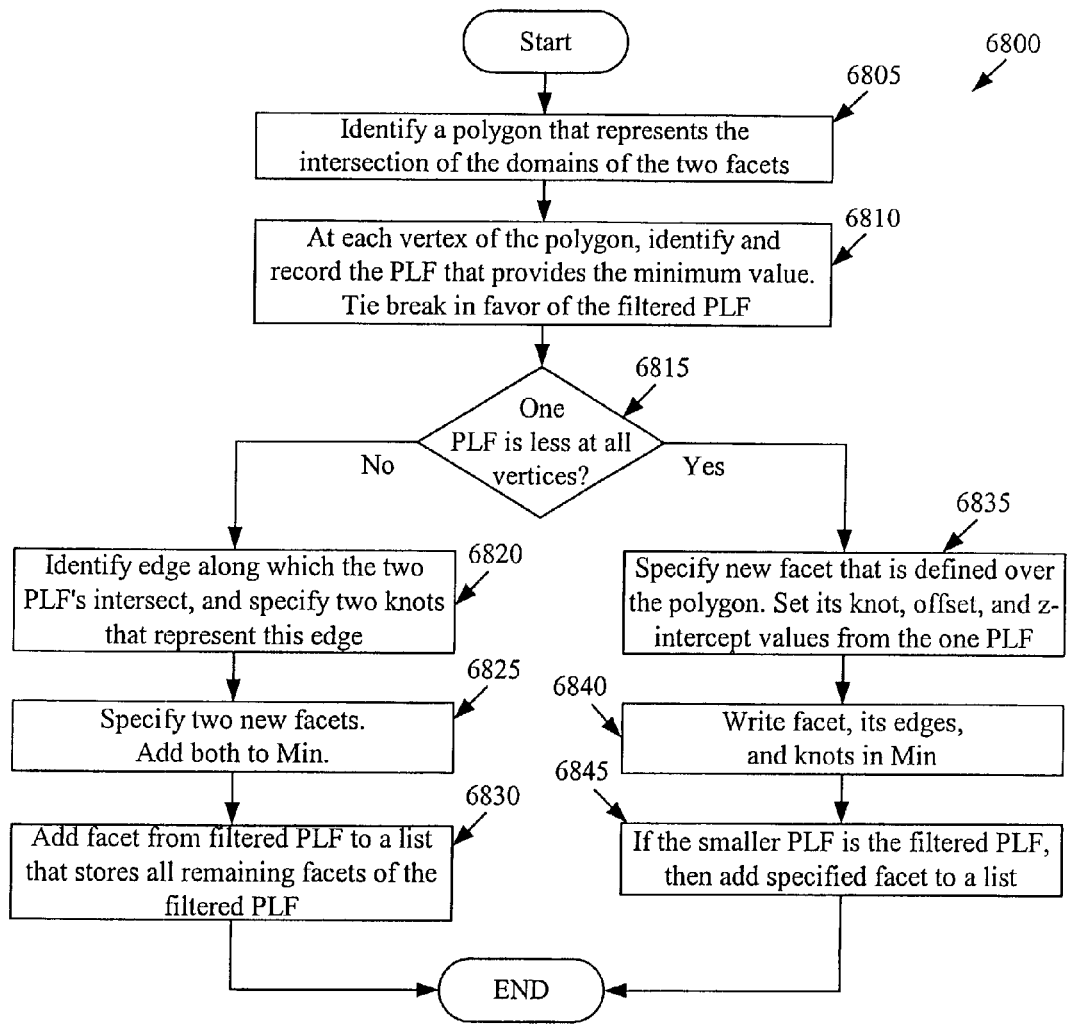

FIG. 68A illustrates the process 6800 for identifying the minimum of two facets F1 and F2 from two different PLF's. This process initially identifies (at 6805) a polygon that represents the intersection of the domains of the two facets. Next, at each vertex of the polygon, the process (at 6810) identifies and records the PLF that provides the minimum PLF-value. In case both PLF's provide the same value at a vertex, the process records the identity of the filtered PLF for the vertex at 6810. At 6810, the process also specifies a knot at each vertex of the intersection polygon. The PLF-value of a specified knot for a vertex is the value of the recorded PLF at the vertex.

Figure 68B:
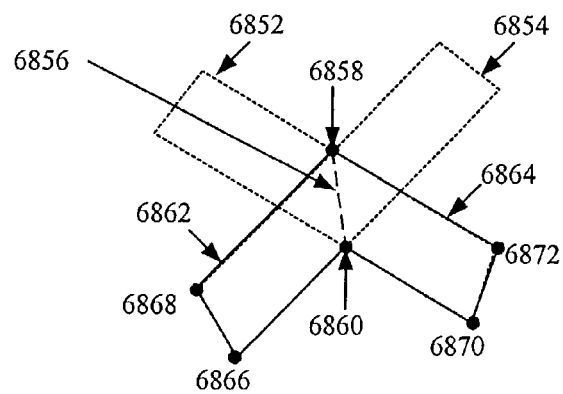

Next, the process determines (at 6815) whether one PLF provided all the lowest values at all the vertices of the polygon identified at 6805. If not, the two facets intersect and the process performs 6820–6830 to account for this intersection. These operations will be described by reference to FIG. 68B, which illustrates two facets 6852 and 6854 that intersect. At 6820, the process 6800 identifies an edge along which the two PLF's intersect, and identifies or specifies two knots that represent this edge. FIG. 68B illustrates the identified edge 6856 between the two facets 6852 and 6854, and the two knots 6858 and 6860 that define this edge.

At 6825, the process then (1) uses the knots identified at 6820 to specify two new facets F3 and F4 that represent the minimum of the intersected facets F1 and F2, and (2) adds these new facets F3 and F4 to the Min PLF. The two new facets will include the two knots identified at 6820 and one or more knots that were specified (at 6810) at the intersection polygon vertices. Each new facet will have edges between its knots.

FIG. 68B illustrates the two new facets 6862 and 6864. Facet 6862 is the portion of facet 6854 that is below than the corresponding portion of the facet 6852. Similarly, facet 6864 is the portion of facet 6852 that is below the corresponding portion of the facet 6854. The facet 6862 is represented by edges between knots 6858, 6860, 6866, and 6868, while the facet 6864 is represented by edges between knots 6858, 6860, 6870, and 6872. The process can obtain the normal and z-intercept attributes of each specified facet 6862 and 6864 from the open or closed facet 6854 and 6852 that corresponds to the specified facet. Alternatively, the process can compute the normal and z-intercept of each facet that it specifies at 6825 from its knots.

Next, at 6830, the process adds the facet that it specified at 6825 for the smaller portion of the filtered PLF to a list that stores all remaining facets of the filtered PLF. If the facet 6854 in FIG. 68B is from the filtered PLF, the process would add (at 6830) the facet 6862 to the list of the remaining facets of the filtered PLF.

If the process 6800 determines (at 6815) that one PLF provided the lowest values at all vertices of the polygon identified at 6805, the process specifies (at 6835) a new facet that is defined over the polygon and that is identical to the PLF over this polygon. It sets the values at these knots and edges from the smaller PLF, and it sets the specified facet's normal and z-intercept identical to the facet of the smaller PLF. The process then writes (at 6840) the facet specified at 6835 and its edges and knots into the Min PLF. If the smaller PLF is the filtered PLF, the process also adds (at 6845) this information (i.e., the facet specified at 6835 and its edges and knots) to the facet list that stores the remaining facets of the filtered PLF. After 6830 and 6845, the process 6800 terminates.

After the process 6700 performs (at 6735) the min process 6730 for each combination of the closed facet and the open facets on the other PLF's list, the process 6700 removes (at 6735) the selected closed facet from its open list. It then determines (at 6740) whether it has examined all the facets that the selected knot (i.e., the knot selected at 6715) closes. If not, the process transitions back to 6725 to select another closed facet. Otherwise, the process adds (at 6745) any facet that the selected knot opens to the list of "open" facets for the selected knot's PLF. The process then determines (at 6750) whether it has examined each knot in each PLF with an x-coordinate CurX. If not, the process transitions back to 6715 to select another knot with the x-coordinate CurX. If so, the process transitions to 6755, where it determines whether it has examined all the unique x-coordinates of knots in either PLF. If not, the process sets (at 6760) CurX to the next leftmost x-coordinate of any knot in either PLF.

When the process determines (at 6755) that it has examined all the unique x-coordinates of knot locations in either PLF, it examines (6765) the facets added to the filtered list, and identifies connected sets of facet. Each connected sets of facets represents a remaining portion of the filtered PLF. It associated each connected sets of facet so that the set represents one remaining portion of the filtered PLF. It also removes any unnecessary edges and knots (if any) from each associated set and modifies the definition of one or more facets of the set accordingly.

At 6765, the process also defines the filter PLF as the Min PLF. This Min PLF might include unnecessary edges and knots (e.g., at the boundaries of the facets that the process 6800 intersected). If so, before setting the filter PLF to the Min PLF, the process removes these unnecessary edges and knots at 6765 and modifies the definition of one or more facets of the Min PLF accordingly.

As mentioned above, the filter PLF might be defined over a larger domain than the filtered PLF. As an alternative to the above-described approach, some embodiment might perform the process 6700 for only the portion of the surface over which the filtered PLF1 is defined. In these embodiments, the filter PLF would be defined over a larger domain than the Min PLF. Accordingly, for such cases, the process 6700 only sets the portion of the filter PLF that is defined over the same domain as the filtered PLF to the Min PLF. The process retains the portions of the filter PLF that falls outside of the domain of the filtered PLF. To account for the boundary between retained and replaced portions of the filter PLF, the process might need to add knots and edges to the filter PLF's description and might need to modify the filter PLF's description of facets at the boundaries.

As mentioned above, the path-generation process 3500 filters (at 3512) the G PLF of a drop that it retrieves from the priority queue with the filter function of the drop's particle. For this filtering operation, the path-generation process uses a process that is identical to the process 6700 with the exception that unlike process 6700, the filtering process at 3512 does not maintain Min as it does not need to identify the minimum of the filtered and filter PLF's at 3512.

(7) Computing the Ĥ PLF

In some embodiments, the process 3500 specifies the Ĥ PLF of a particle as the lower-bound distance between the particle and a bounding octagon that encompasses the set of target particles for a path search. Some embodiments identify such a lower-bound distance by (1) identifying an axis-aligned rectangular box (i.e., a box that is aligned with the x-y coordinate axes of the layout) and a 45° rotated rectangular box (i.e., a box that is aligned with an s-t coordinate axes that is rotated by 45° with respect to the layout's x-y axes) that enclose the set of target particles, (2) identifying two PLF's that express the distance between the particle and each of these boxes, and then (3) defining the Ĥ PLF as the maximum of the two identified PLF's.

(i) Identifying the Bounding Boxes

In some embodiments, the process identifies an axis-aligned bounding box by (1) identifying the minimum and maximum x- and y-coordinates ($X_{MIN}$, $X_{MAX}$, $Y_{MIN}$, and $Y_{MAX}$) of the set of points in the design layout's coordinate space, and (2) specifying the four vertices of the box as ($X_{MIN}$, $Y_{MIN}$), ($X_{MIN}$, $Y_{MAX}$), ($X_{MAX}$, $Y_{MIN}$), and ($X_{MAX}$, $Y_{MAX}$). In some embodiments, the process 3500 identifies the minimum and maximum x- and y-coordinates of the set of points by examining the x- and y-coordinates of vertex points in the set of target particles. Each standalone point in this set is a vertex point. Also, each point in the target set that is a vertex of a polygonal shape in the set is a vertex point of the set.

The rotated bounding box is defined with respect to a coordinate system that is rotated by 45° with respect to the layout's coordinate system. The rotated coordinate system includes an s-axis that is at 45° with respect to the x-axis of the layout's coordinate space, and a t-axis that is at 135° with respect to the x-axis of the layout's coordinate space. To identify the 45° rotated bounding box, the process 3500 in some embodiments first maps the coordinates of the vertex points of the set of target particles from the layout's coordinate system to the 45° rotated coordinate system. The process performs this mapping by using the equation below.

$$S_i = \frac{X_i - Y_i}{\sqrt{2}}, \text{ and } T_i = \frac{X_i + Y_i}{\sqrt{2}}.$$

In this equation, (1) $X_i$ and $Y_i$ are the coordinates in the layout's x- and y-axes for the i-th vertex point in the target set, and (2) $S_i$ and $T_i$ are the coordinates in the rotated s- and t-axes for the i-th vertex point in the target set. If the rotated bounding box is rotated counterclockwise at an arbitrary angle $\theta$ with respect to the layout's coordinate system, the following equation could be used to perform the mapping.

$$\begin{pmatrix} S_i \\ T_i \end{pmatrix} = \begin{vmatrix} \cos\theta & -\sin\theta \\ \sin\theta & \cos\theta \end{vmatrix} \begin{vmatrix} X_i \\ Y_i \end{vmatrix}$$

After performing the mapping, the process 3500 then identifies a 45° bounding box that is defined with respect to the 45° rotated coordinate system and that surrounds the set of routed points in the s- and t-axes. In some embodiments, the process (1) identifies the minimum and maximum s- and t-coordinates ($S_{MIN}$, $S_{MAX}$, $T_{MIN}$, and $T_{MAX}$) of each vertex point in the set of routed points, and (2) specifies the four vertices of the rotated box as ($S_{MIN}$, $T_{MIN}$), ($S_{MIN}$, $T_{MAX}$), ($S_{MAX}$, $T_{MIN}$), and ($S_{MAX}$, $T_{MAX}$).

(ii) Computing the PLF's

Figure 69:
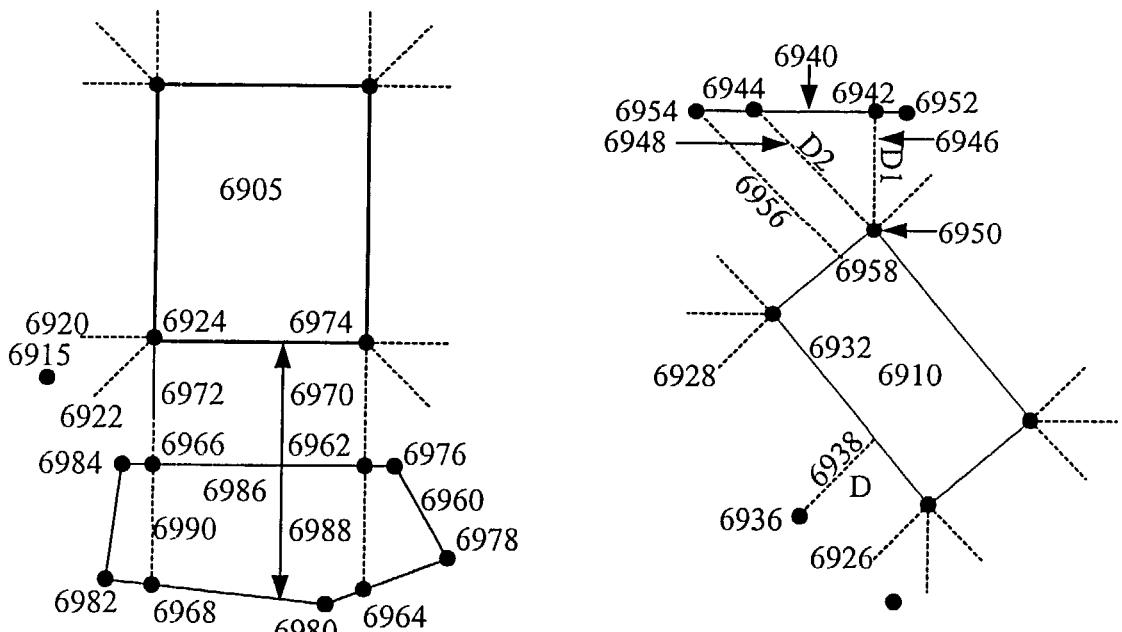
FIGS. 69 and 70 illustrate how some embodiments compute an $\hat{H}$ function.

In some embodiments, the process 3500 computes a PLF that represents the distance between a particle and a bounding box in an analogous manner to the propagating of a zero-cost function that is defined over the bounding box to the particle. FIG. 69 illustrates this computation for some embodiments that use the wiring model of FIG. 1. Specifically, this figure illustrates an axis-aligned bounding box 6905 and a 45° rotated bounding box 6910. Three vectors are projected from each vertex of each bounding box. FIG. 69 illustrates the three vectors that are projected from each vertex of the boxes 6905 and 6910. Some embodiments do not project vectors in all interconnect directions. Instead, they project only the propagation vectors that will intersect the destination particle. These propagation vectors are the vectors that fall within a triangle defined by the bounding box's vertex point and the leftmost and rightmost vertices of the destination particle.

If the topological particle is a point, the Ĥ PLF is a single value that is defined for the point. This value is the distance between the point and the bounding box. This distance is computed by (1) identifying the wedge or channel that contains the point, and (2) computing the distance according to the wedge and channel distance rules described above. For instance, in FIG. 69, the Ĥ PLF-value of the point 6915, which falls within a wedge defined by vectors 6920 and 6922 that emanate from vertex 6924, is the distance between the point 6915 and the vertex 6924. On the other hand, if the particle is point 6936 that falls within the channel defined by vectors 6926 and 6928 that emanate from the rotated box 6910, Ĥ PLF-value is the length D of a line 6938 that is parallel to vectors 6926 and 6928 and that goes from the point 6936 to the edge 6932.

If the topological particle is a line, the Ĥ PLF is a line PLF that is defined over the line. This line PLF will have knots at the intersections of the projected vectors and the line. The Ĥ PLF-value of each knot is simply the straightline distance between the intersection point and the vertex from which the intersecting vector projected. This straightline distance is along the direction of the projected intersecting vector. Also, a knot is specified at each unexamined endpoint of the line, and the value of such a knot depends on whether the endpoint falls within a channel or a wedge.

For instance, when the particle is line 6940, two knots are specified at the intersections 6942 and 6944 of the projection vectors 6946 and 6948 with the line. The PLF-value of the knot at location 6942 is the distance D1 to the vertex 6950 along the direction of vector 6946, while the PLF-value of the knot at location 6944 is the distance D2 to the vertex 6950 along the direction of vector 6948. Two knots are also specified at the endpoints 6952 and 6954 of the line 6950. The endpoint at 6952 falls within a wedge. Hence, the PLF-value of the knot specified at 6952 is based on the distance between point 6952 and vertex 6950. The endpoint at 6954, however, falls in a channel, and therefore the PLF-value of the knot defined at this point is the length D3 of the 135° line segment 6956 between the point 6954 and edge 6958.

If the topological particle is a surface, the Ĥ PLF is a surface PLF that is defined over the surface. This surface PLF will have knots at the intersections of the projected vectors and the boundary of the surface. It will also have knots at each unexamined vertex of the surface. It will further have edges between the knots, and one or more facets defined by the edges. A normal and z-intercept will also be specified for each facet. The values of each facet's normal and z-intercept will be determined by the PLF-values of the knots that define each facet.

The PLF-values of each knot that is defined at an intersection of a projected vector is simply the straightline distance between the intersection point and the vertex from which the intersecting vector projected. This straightline distance is along the direction of the projected intersecting vector. Also, the PLF-value of each knot that is specified at an unexamined vertex of the surface depends on whether the vertex falls within a channel or a wedge.

For instance, when the particle is a surface 6960 and the bounding box is box 6905, four knots are specified at the intersection 6962, 6964, 6966, and 6968 of the projection vectors 6970 and 6970 with the surface. The PLF-value of each of these knots is the distance between the knot's location and the vertex that was used to define the knot. For instance, the PLF-value of the knot at location 6962 is the distance D5 between the vertex 6974 and point 6964 along the direction of vector 6970. In this example, five other knots are specified at the unexamined vertices 6976, 6978, 6980, 6982, and 6984 of the surface. Of these vertices, only vertex 6980 falls within a channel. Accordingly, the PLF-value of the knot specified at the vertex 6980 is the length of the line segment 6986 that is parallel to vectors 6970 and 6972. The PLF-value of the knot defined at each of the other four unexamined vertices is the distance between the knot's location and the bounding box vertex that projects the vector that defines the wedge containing the knot location. For instance, the PLF-value of the knot at 6982 is the distance between vertex 6982 and the vertex 6924 of the box 6905.

The Ĥ PLF that is defined over the surface 6960 will have eleven edges. Nine of these edges will be defined about the boundary of the surface. Two of the edges 6988 and 6990 will be defined across the surface. These two edges in conjunction with the other nine boundary edges define three facets. The normal and z-intercept of each facet can be derived from the PLF-values of the knots that define the facet, by using standard plane-defining techniques.

(iii) Identifying the Maximum

After defining the Ĥ PLF's for the two bounding boxes, some embodiments identify the maximum of the two PLF's. Obtaining the maximum of two PLF's is analogous to obtaining the minimum of two PLF's, except that the portions that are discarded are the portions with the smaller PLF-values. Accordingly, the processes for computing the maximum of two line PLF's or two surface PLF's are analogous to the above-described processes for computing the minimum of such PLF's, except that the processes for computing the maximum retain the line segments or surface pieces that have the larger PLF-values.

(iv) Different Computation of the Ĥ PLF

Figure 70:
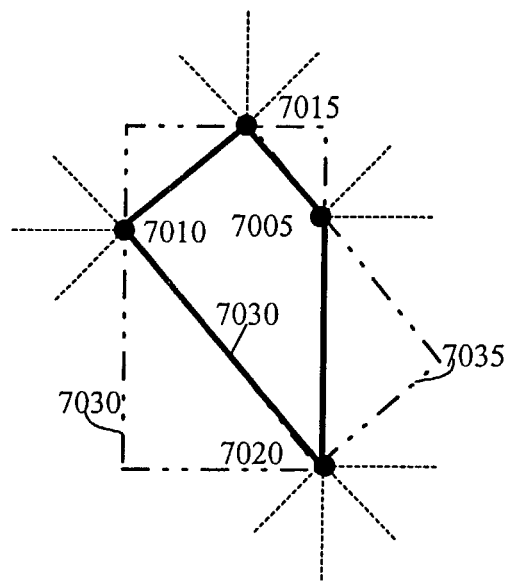

Some embodiments specify the Ĥ PLF of a particle slightly differently. These embodiments first identify a bounding polygon by identifying and intersecting two bounding rectangular boxes that enclose the set of target particles. In some of these embodiments, one box is aligned with the x-y coordinate axes of the layout while the other box is aligned with an s-t coordinate axes that is 45° rotated with respect to the layout's x-y axes. FIG. 70 illustrates an example of an octilinear bounding polygon 7025 that is identified by intersecting an axis-aligned box 7030 and a 45° rotated box 7035.

After identifying such an octilinear bounding polygon, these embodiments identify a Ĥ PLF that expresses the distance between the particle and the octilinear bounding polygon. The identification of this PLF is analogous to propagating a zero-cost function that is defined over the octilinear bounding polygon to the particle. Specifically, one or more vectors are projected from each vertex of the octilinear bounding polygon. In FIG. 70, four vectors are projected from vertex 7020, three vectors are projected from each of the vertices 7010 and 7015, and two vectors are projected from vertex 7005. These vectors are identified based on the following approach. For each vertex, two directions are identified that are perpendicular to the edges incident upon the vertex and that point away from the polygon, that is, they points left from an incoming clockwise edge, or right from an incoming counter-clockwise edge. Vectors are then projected from each vertex (1) in the two directions identified for the vertex, and (2) in any other direction that falls between the two identified directions. Some embodiments do not project vectors in all interconnect directions. Instead, they project only the propagation vectors that will intersect the destination particle. These propagation vectors are the vectors that fall within a triangle defined by the bounding polygon's vertex point and the leftmost and rightmost vertices of the destination particle.

After projecting the vectors from the vertices of the octilinear bounding polygon, the process then identifies a point PLF, a line PLF, or a surface PLF in the exact same manner as described above for the case of the axis-aligned and 45'-rotated bounding boxes. In other words, the same wedge and channel approach that was described above for the bounding boxes, can be used to identify the PLF's for the octilinear bounding polygons. One of ordinary skill will realize that the above-described Ĥ computation techniques (e.g., the wedge and channel distance computation technique) can be used with any type of bounding polygon, such as a convex hull or approximate convex hull.

(8) Specifying Topological Route

Figure 71:
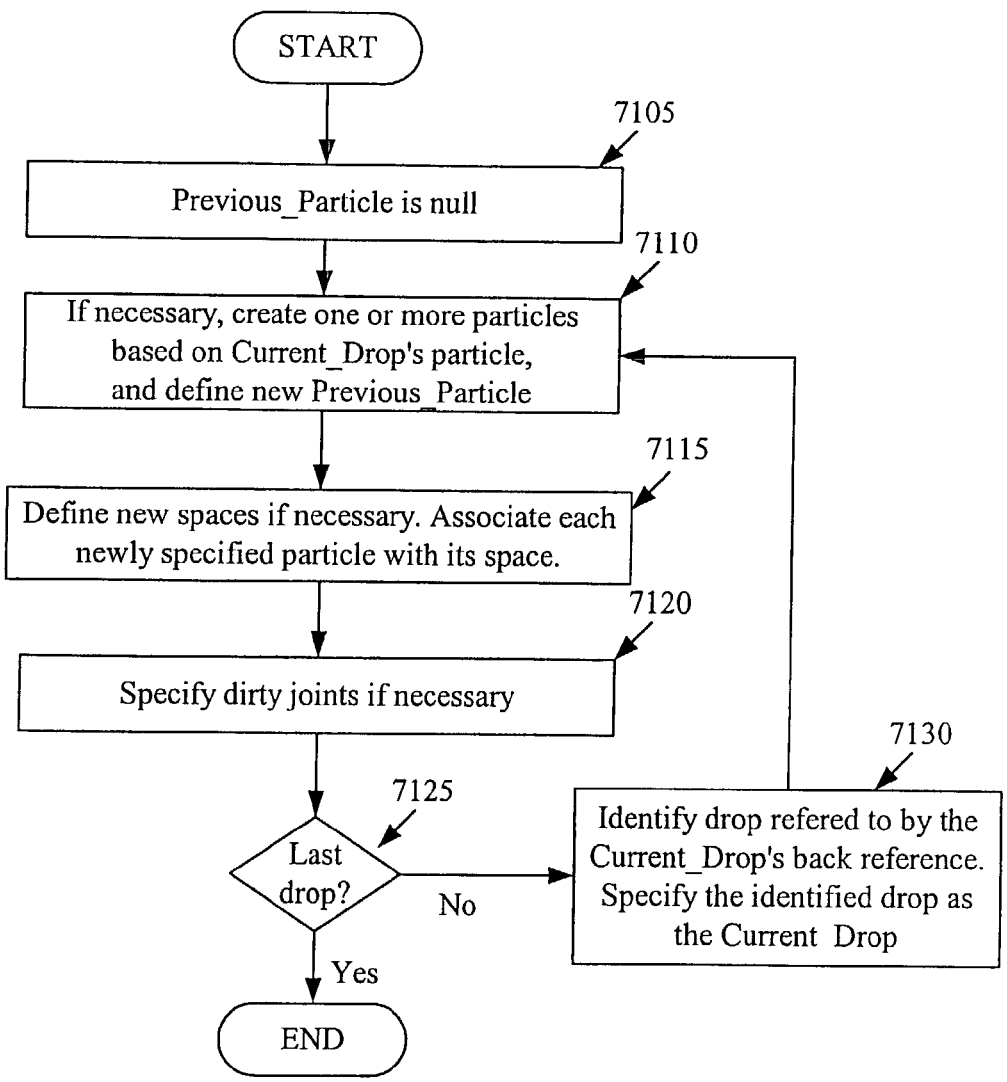
FIG. 71 illustrates a process that specifies a topological path.

FIG. 71 illustrates a process 7100 that the process 3500 performs (at 3542) to specify a topological path after it identifies a series of drops that connect the source and target sets of a path search. By the time the process 3500 reaches 3542, the Current_Drop is a drop that is on a target particle. Starting at the Current_Drop on the target, the process 7100 back traces the sequence of drops that reached the target and generates an ordered list of topological particles that define the topological path.

The process 7100 initially defines (at 7105) a Previous_Particle to be null. At 7110, the process (1) examines the Current_Drop's particle, (2) if necessary, specifies one or more topological particles, and then (3) defines a new Previous_Particle. The Current_Drop's particle might be a node, an exit, a hole, or a wall.

When the Current_Drop's particle is a node that is a target particle, the process does not specify any additional topological particles at 7110. When the Current_Drop's particle is a node that is not a target particle, the process (at 7110) specifies a wall that connects the node and the Previous_Particle, and then defines the node as the Previous_Particle.

When the Current_Drop is an exit, the process creates two new exits and a joint between the two new exits at 7110. In the edge of the Current_Drop's exit, the process replaces this exit with the two exits and the joint that it specifies at 7110. If the Current_Drop's exit was not a target particle, the process also (at 7110) specifies a wall that connects the specified joint and the Previous_Particle and then defines the joint as the Previous_Particle.

When the Current_Drop's particle is a hole, the process 7100 creates (at 7110) one via node on each layer traversed by the hole. It also specifies a wall that connects the Previous_Particle and the via node that is on the same layer as the Previous_Particle. The process then specifies the other via node (i.e., the via node that is on a different layer from the Previous_Particle) as the Previous_Particle. When the process specifies (at 7110) the via nodes, it also specifies a location for the via nodes as the process 3500 performs triangulation based on these nodes at 3544. In some embodiments, the process defines the x- and y- coordinates of the via nodes that it creates for a particular hole as a location in the hole's polygon with a minimum F PLF value. A hole's F PLF represents the actual cost at the hole of the cheapest path that traverses from a source to the target through the series of particles (including the hole) that the path search process identified between the source and target. A particle's F PLF is different than its F̂ function. The computation of a particle's F PLF is described below in next sub-section.

When the Current_Drop's particle is a wall, the wall is necessarily a target particle. In this situation, the process 7100 might create (at 7110) a Steiner to embed topologically an expansion to the wall, which represents a previously specified portion of the route of the net that is currently being routed. Before specifying a Steiner for such an expansion, the process 7100 determines whether the wall is adjacent to a previously defined Steiner. If so, the process does not create a Steiner for the expansion to the wall, but rather specifies the previously defined Steiner as the Previous_Particle. On the other hand, if no Steiner neighbors an expansion to a wall, the process 7100 (1) creates two walls and a Steiner in between the two walls, (2) replaces the previous wall (i.e., the wall to which the path expanded) with the created two walls and Steiner, and (3) specifies a wall that connects the created Steiner to the Previous_Particle.

Next, if the process 7100 defined one or more new particles at 7110, the process associates (at 7115) these particles with their respective spaces. If the process specified a wall at 7110 that divided a previously defined space into smaller spaces, the process 7100 (at 7115) defines the smaller spaces, sets the holes of the newly defined spaces, and associates the particles of the previously defined space with the newly defined smaller spaces. The process 7100 uses the process 1700 illustrated in FIG. 17 to set the holes of the newly defined spaces.

When the process 7100 inserts a joint in an edge at 7110, it specifies (at 7120) as dirty all previously defined joints on that edge. Next, at 7125, the process determines whether it has examined all the drops in the series of drops between the source and target sets. If not, the process specifies (at 7130) the Current_Drop's previous drop as the Current_Drop. It then transitions back to 7110 to repeat operations 7110–7125 for this drop. When the process determines (at 7125) that it has examined all the drops between the source and target sets, it terminates.

(9) Loosely Geometrizing Topological Route

At 3546, the process 3500 defines a loose geometric path for the topological path that it specified at 3542 and possibly modified at 3544. This entails specifying a location of each joint and Steiner on the path. For each joint, the process (at 3546) (1) identifies a G PLF and an H PLF across the joint's domain on the joint's edge (i.e., across the portion of the joint's edge that can contain the joint), (2) adds these two PLF's, and (3) identifies the location of the joint at a minimum of the added function. A joint's G PLF specifies the cost of the topological path that reached the joint from a source particle through the set of path particles between the joint and the source. This cost is a PLF that is defined across the joint's domain. This G PLF can be computed in the same manner as discussed above for G PLF's of drops for a path search. A joint's H PLF specifies the actual (not estimated) distance from the joint's domain to the target through the topological path's sequence of path particles between the joint and the target. This H PLF can be computed like the G PLF except that the only cost that the H PLF accounts for is the length cost.

The topological path that the process 3500 specifies at 3542 and possibly modifies at 3544 might include one or more Steiners. Each Steiner connects to three or more other particles (e.g., joints, nodes, etc.) through three or more walls. In some embodiments, the process 3500 specifies the location of each Steiner at the centroid of the three or more other particles to which it connects (e.g., at the centroid of the joint and nodes that it connects to).

At 3546, the process also re-computes the location of the joints that were marked dirty during the topological embedding and edge flipping operations of 3542 and 3544. This computation might also affect the location of Steiners on the paths with the dirty joints. To recompute the location of the dirty joints, the process 3500 uses one operation in addition to the three operations discussed above for the joints of a newly defined topological path. Specifically, for each topological route that has one or more dirty joints, the process identifies a path segment that contains all the dirty joints of the route and that terminates with two immovable particles (e.g., two nodes). For each joint that is between the two immovable ends of the path segment, the process (at 3546) (1) identifies a G PLF and an H PLF across the joint's domain on the joint's edge, (2) adds these two PLF's, and (3) identifies the location of the joint at a minimum of the added function. If the added function has a minimum segment, then the process selects a point on the segment such that the route being embedded does not cross any other route that was geometrically embedded before the current route during the current iteration through JG46. Also, the process identifies the location of each Steiner that falls within the two immovable ends of the path segment based on the above-described centroid approach.

The locations that the geometric embedding operation specifies are not necessarily fixed locations. The locations are specified in order to enable the Q* search to perform more accurate wirelength calculations while generating the lowest-cost paths. One of ordinary skill will realize that other embodiments do not specify such locations for the topological routes identified by the Q* topological routing engine.

One of ordinary skill will realize that other embodiments might utilize the Q* engine differently. For instance, the embodiments described above propagate cost functions to one-dimensional lines and two-dimensional surfaces. Other embodiments might propagate cost functions to and from (1) a set of associated collinear points (i.e., a set of points that can be connect by a single line passing through the points) that form a one-dimensional state and/or (2) a set of associated co-planar points (i.e., a set of points that fall within a two dimensional surface) that form a two-dimensional state.

Some embodiments propagate functions to a set of associated points by examining each point independently. Specifically, for each point in the associated set, some embodiments compute a PLF-value by identifying the wedge and/or channel containing the point, and then computing the PLF-value according to the wedge and/or channel rules described above for 5415 of FIG. 54.

Some embodiments propagate functions from a set of associated points by (1) using the above-described approach of FIGS. 46–51 to identify wedge and channels vectors that emanate from the set of points, and (2) identifying the destination state's cost function based on the identified channels and wedges. Specifically, the location of each wedge is identified by identifying the point that is the best point in the set for the wedge. Also, a channel vector might emanate from a point in the set that is on a line segment connecting two points from which two adjacent wedges emanate (i.e., from which two wedges with parallel vectors emanate). Such channel vectors can be identified based on the approach described above by reference to FIGS. 49 and 50. After identifying the wedge and channel vector emanations from the set of points, the destination state's cost function can be specified according to the approaches described above for destination points, lines, surfaces, and set of points.

2. IDA* Topological Routing Engine a. Overview

Like the Q* topological routing engine, the IDA* topological engine (1) initially decomposes each layer of the received sub-region to obtain a decomposed graph that has several nodes, edges, and faces, and then (2) uses the nodes, edges, and faces of the generated graphs to define topological routes in the received sub-region.

(1) Overview of the Decomposition Operation.

Like some embodiments described above, the IDA* engine in the embodiments described below uses a triangulation operation to decompose each layer of the received sub-region. In other words, the faces resulting from the decomposition operation are triangles and therefore have three edges. Each edge is defined to be between two nodes. In the embodiments described below, the nodes in each layer's of the decomposed sub-region are defined at the obstacle-geometry vertices, pin-geometry vertices, and the four corners of the sub-region on each layer. At the end of the triangulation operation, the IDA* topological engine adds, to the sub-region definition, a graph data structure for each layer of the sub-region. Each graph data structure includes several node, edge, and face data structures.

FIG. 72 illustrates a data structure 7200 that defines a face. As shown in this figure, a face is defined to refer (e.g., to point) to its 3 edges and its 3 nodes. The face also includes up to two references (e.g., two pointers) to up to two topological items (called face items), which as described below are used to define topological vias and Steiner points. Some embodiments limit the number of face items in a face to two in order to improve run-time speed. Other embodiments, on the other hand, might allow a face to have more than two face items, or might limit a face to have only one face item.

FIG. 73 illustrates a data structure 7300 that defines an edge. An edge can be shared between two faces, or it can simply be part of one face. Accordingly, as shown in FIG. 73, the edge data structure 7300 has two references, each of which can be assigned to refer to a face of the edge.

The edge data structure also specifies the capacity of the edge. It further specifies the wire flow across each edge. This flow equals the width of the nets crossing the edge plus the spacing between the crossing nets and between the nets and the edge nodes. This data structure also has a Boolean flag to indicate whether the edge is a constrained edge. This flag is used during the triangulation when the edge is specified as a constrained edge, as described above.

In addition, the edge data structure 7300 includes a linked list of topological items on the edge. During triangulation, this linked list is initialized to start with one of the edge's nodes and end with the other. When topological routes are inserted in the triangulated graphs, a topological item (called an edge item) is inserted between the end nodes of the edge's linked list for each topological route that crosses the edge. The edge items of several topological routes that intersect an edge are inserted between the edge nodes in the order that their corresponding topological routes cross the edge. This ordering will be further explained below by reference to FIGS. 77 and 78. The data structure for a node will also be described below.

(2) Embedded Topological Routes

After triangulation, the IDA* topological engine embeds multi-layer topological routes in the triangulated graphs. It uses the nodes, edges, and faces of these graphs to define the topological direction of these routes. Specifically, the IDA* topological engine defines a topological route as a linked list of topological items that represent various points along the route. These topological items include nodes, edge items, and face items. Nodes and face items can serve as via locations, Steiner points, or both. Nodes can also serve as end points of a topological route.

FIGS. 74–76 illustrate the data structure of nodes, edge items, and face items. As shown in FIG. 74, a node data structure 7400 includes a net identifier, which, when the node is on a net's topological route, specifies this net. This structure also has one or more planar-path references. When the node is part of a topological route, a planar-path reference refers to a planar topological item (i.e., an item on the same layer as the node) that is adjacent to the node in its topological route. The node data structure can have more than one planar-path reference (e.g., has more than one such reference when the node serves as a Steiner point).

In the embodiments described below, a node can serve as the location for a via. Accordingly, the node data structure 7400 includes a pair of via-path references. When a topological via is placed at the location of a node, one or both via references refer to face items or nodes in the layer above and/or below.

The node data structure further includes a list of edges connected to the node. For each edge, it includes an edge reference to the next or previous topological item (i.e., node or edge item) on the edge. It also has a reference to the geometry of the node, and a vertex number that identifies the point in the geometry corresponding to the node. The node structure further specifies the location of the node.

FIG. 75 illustrates the data structure for an edge item. This data structure has a reference to its edge. In addition, like a node data structure, an edge item's data structure includes a net identifier that specifies the net of the edge-item's topological route. This structure also includes a pair of edge references that refer to the next and previous topological item (i.e., node or edge item) on its edge. The edge-item data structure also has a pair of planar-path references that refer to the planar topological items (i.e., items on the same layer as the edge item) that are adjacent to the edge item in its topological route.

FIG. 76 illustrates the data structure for a face item. The face-item data structure 7600 has a reference to its face. In addition, like the data structure of a node or an edge item, a face item's data structure includes a net identifier that specifies the net of the face item's topological route. This structure can also includes up to three planar-path references. Each planar-path reference refers to a planar topological item (i.e., an item on the same layer as the face item) that is adjacent to the face item in its topological route. The face-item data structure can have up to three planar-path references since the face-item can serves as a Steiner point for up to three topological paths.

In the embodiments described below, a face item can serve as the topological position of a via. Accordingly, the face item data structure 7600 includes a pair of via-path references. When a topological via is placed at a face item, one via-path reference can refer to a node or face item in the layer above the face item's layer, while the other via-path reference can refer to a node or face item in the layer below the face item's layer. The face-item data structure also specifies a bounding convex polygon that approximates the region where the center of the face item can be legally placed in the face containing the face item. In some embodiments, this data structure also specifies a set of constraining points and distances for the face item in its layer. The use of the bounding polygon and the constraining points and distances will be further described below.

The layer of the topological items can be identified as follows. A node's layer can be identified by referring to its geometry. A face's or edge's layer corresponds to the layer of its nodes. In addition, a face item's layer corresponds to the layer of its face, and an edge item's layer corresponds to the layer of its edge.

Figure 77:
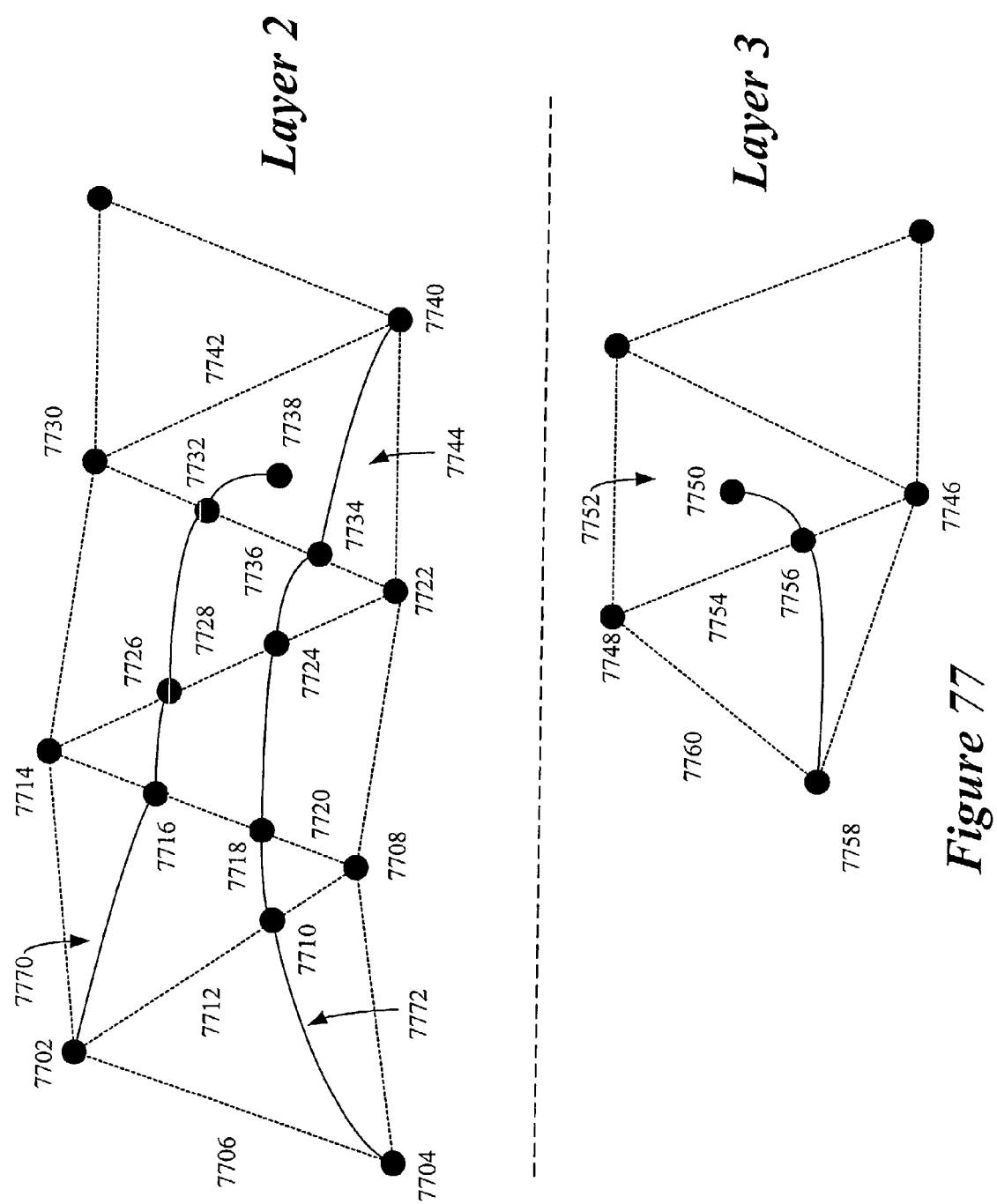
FIGS. 77 and 78 illustrate an example of topological routes.
Figure 78:
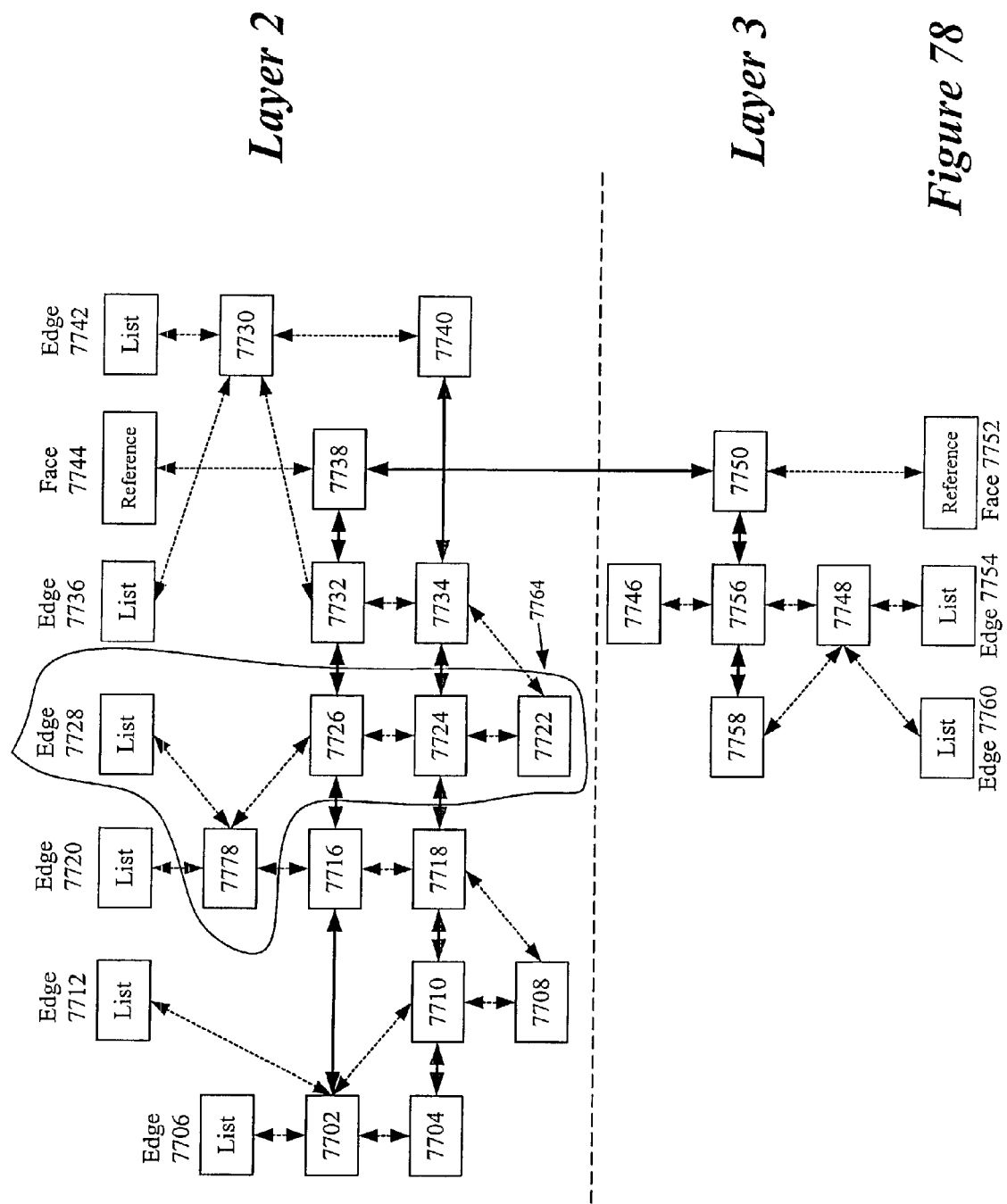

FIGS. 77 and 78 illustrate one example of topological routes. FIG. 77 presents two topological routes 7770 and 7772. The route 7770 is a multi-layer topological route that (1) starts at node 7702 of layer 2, (2) intersects edges 7720, 7728, and 7736 on layer 2, (3) vias up to layer 3 through face items 7738 on layer 2 and 7750 on layer 3, (4) intersect edge 7754 on layer 3, and (5) terminates on node 7758 on layer 3. This route's intersections with edges 7720, 7728, 7736, and 7754 are specified by edge items 7716, 7726, 7732, and 7756.

The route 7772 is a topological route that only traverses layer 2. This route (1) starts at node 7704, (2) intersects edges 7712, 7720, 7728, and 7736, and (3) terminates on node 7740. This route's intersections with edges 7712, 7720, 7728, and 7736 are specified by edge items 7710, 7718, 7724, and 7734.

FIG. 78 illustrates the data structure representation of these topological routes 7770 and 7772. Each of these routes is specified by two sets of linked lists. One set includes a linked list of path references, and the other set includes linked lists of edge references. The path linked list of route 7770 starts at node 7702, goes through edge items 7716, 7726, 7732, face items 7738 and 7750, edge item 7756, and terminates on node 7758. The path linked list of route 7772 starts at node 7704, goes through edge items 7710, 7718, 7724, and 7734, and terminates on node 7740.

As shown in FIG. 78, the nodes and edge items are inserted on their edge's linked list in the order that they are placed on their respective edge. For instance, the edge list 7764 of edge 7728 starts with node 7714, traverses through edge items 7726 and 7724, and then terminates on node 7722. This order of these nodes and edge item on edge list 7764 matches the order (illustrated in FIG. 77) of these nodes and edge items on edge 7728.

b. Overall Flow of IDA* Topological Router

Figure 79A:
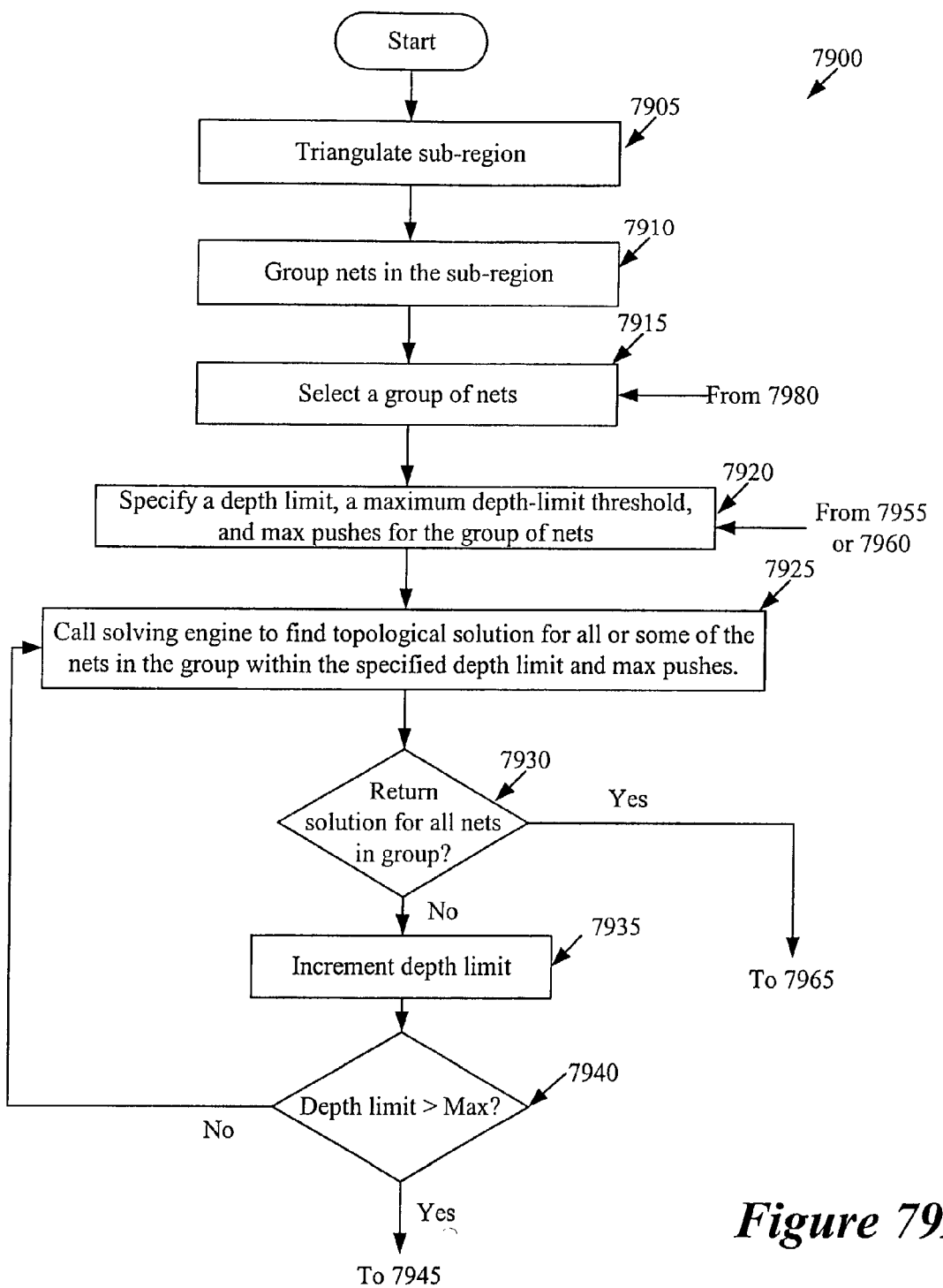
FIG. 79 illustrates a process that provides the overall flow of an IDA* topological engine in some embodiments of the invention.
Figure 79B:
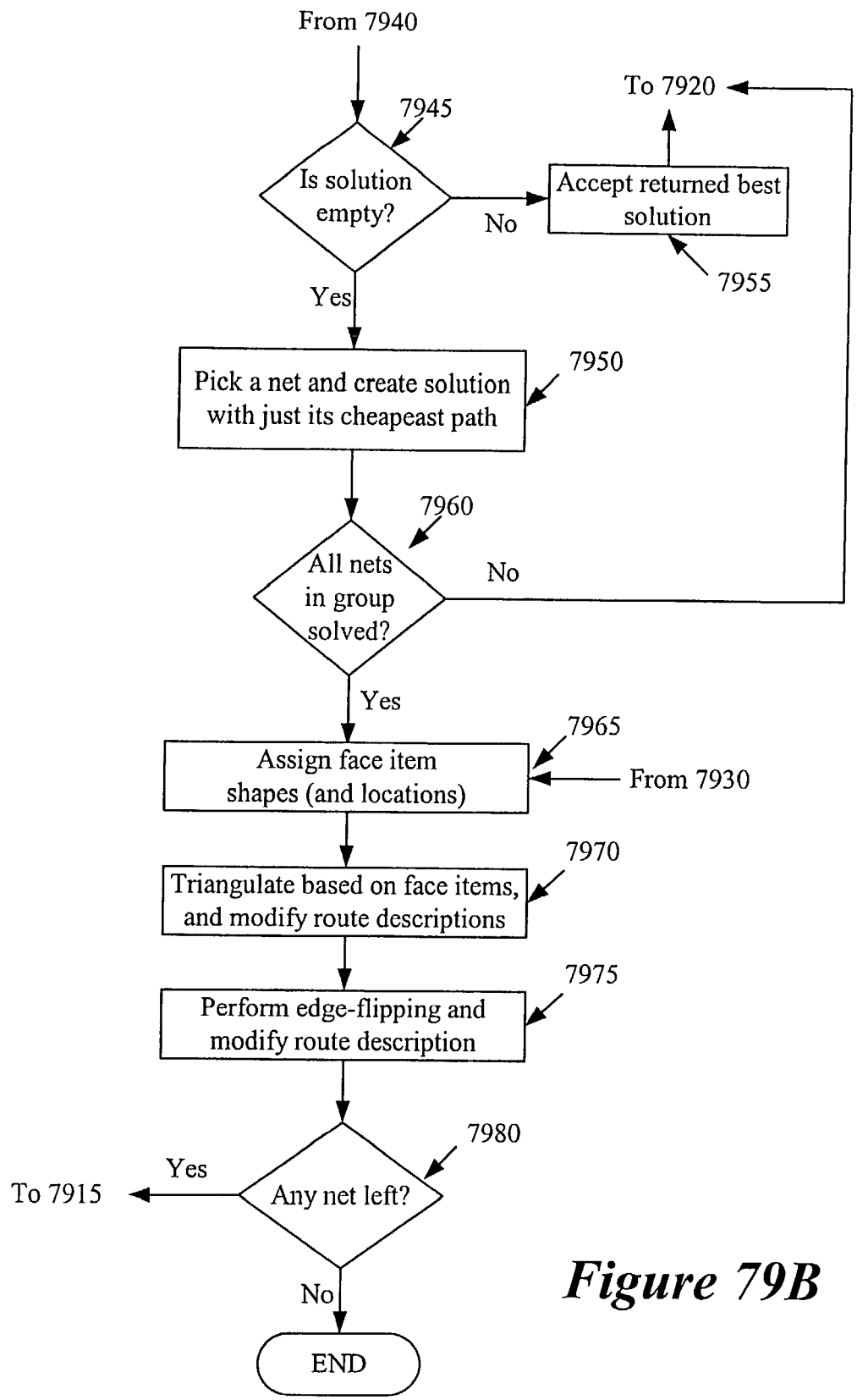

FIG. 79 illustrates a process 7900 that provides the overall flow of the IDA* topological engine in some embodiments of the invention. As shown in this figure, the process initially triangulates (at 7905) the sub-region defined at 205. This triangulation operation is similar to the one described above by reference to FIG. 9. There are few minor differences, however. For instance, the IDA* triangulation in some embodiments decomposes the port geometries. Also, the IDA* triangulation does not define holes or spaces. U.S. patent application entitled "Method and Apparatus for Generating Multi-Layer Routes," and having the Ser. No. 10/076,121, discloses a triangulation technique that is used for the IDA* engine in some embodiments. This application is incorporated herein by reference.

After the triangulation, the process groups (at 7910) the nets in the sub-region. Different embodiments group the nets in the sub-region differently. Some embodiments group the nets based on a clustering approach. Some of these embodiments cluster the nets by (1) defining, for each net, a three-dimensional bounding box that contains the net's pins, (2) pair-wise intersecting the bounding box of each net with each of the other nets, (3) computing the volume of intersection between the intersections, and (4) clustering each net with the other nets that have the greatest overlapping volume (i.e., that are likely to have the most amount of overlap). Some of these embodiments order the nets in each group. For instance, some embodiments sort each group based on entropy (e.g., based on descending order of entropies, where a high entropy net has lots of equivalently good options, while a low entropy net has only a few good routes).

Next, the process selects (at 7915) one of the groups identified at 7910 for routing. Different embodiments process the selected group of nets differently. The embodiments described below solve all the nets in the selected group before selecting another group of nets.

Other embodiments, however, might process the nets differently. For instance, some embodiments might order the nets based on an entropy value (e.g., might order the nets in a descending order of entropies), and select the group of nets based on this order. Some of these embodiments then use a two-tiered approach in selecting the group of nets at 7915. First, from the top of the set of unsolved nets in the ordered netlist, these embodiments select a fixed number (e.g., 20) nets. When this list does not have the fixed number of nets remaining, the process selects all the remaining nets. Second, after selecting the group of nets, these embodiments return the nets in the selected group that they cannot solve within an acceptable cost in a pre-defined number of tries. Accordingly, these embodiments statically try to select a fix-number of nets each time at 7915, but then dynamically return some of the selected nets as unsolved nets when the selected group proves too hard to route entirely at the same time. The returned unsolved nets are then treated like the remaining unsolved nets. In other words, these embodiments perform the two operations listed above on all the remaining unsolved nets (i.e., from the list of unsolved nets that includes the returned unsolved nets, these embodiments (1) select and try to process a number of nets, and (2) return any nets that they cannot solve within an acceptable cost).

In the embodiments described below, the IDA* topological engine uses an IDA* solving engine that deterministically searches for the best routing solution for the selected group of nets. An IDA* searching technique involves searching the solution space in an iteratively deepening manner, up to a particular depth limit.

Accordingly, at 7920, the process specifies a particular depth limit for the IDA* solving engine. Some embodiments compute the depth limit as the sum of the cheapest topological routes for all the unsolved nets in the sub-region. One manner of computing the cheapest topological routes will be explained below by reference to FIG. 106.

Some embodiments generate the cheapest route for each unsolved net by ignoring the routes of the other unsolved nets. Accordingly, these embodiments generate the cheapest routes for each net in the first group of nets being solved in an empty sub-region (i.e., a sub-region that does not contain the topological routes of any other nets in the group). However, the cheapest routes for the subsequent groups of nets are computed for a sub-region that contains the topological routes of the previously routed nets.

At 7920, the process also computes a maximum depth-limit threshold. In some embodiments, the maximum threshold value is 50% greater than the initial depth limit specified at 7920. The process also specifies (at 7920) a maximum number of iterative attempts, referred to below as pushes, for the IDA* solving engine.

At 7925, the process then calls the IDA* solving engine to find a topological route for all or some of the nets in the selected group within the specified depth limit and max pushes. The operation of the IDA* solving engine will be further described below. Next, the process determines (at 7930) whether the IDA* solving engine returned a solution for all the nets in the selected group. If so, the process transitions to 7965, which will be described below. If not, the process increments (at 7935) the depth limit. Some embodiments increment the depth limit by 10%. Accordingly, the solution found by incrementing the depth limit in this manner is always with 10% of the optimal solution.

The process then determines (at 7940) whether the depth limit exceeds a maximum value. If not, the process transitions back to 7925 to direct the IDA* solving engine to find a solution within the incremented depth limit. On the other hand, if the process determines (at 7940) that the current depth limit is greater than the maximum threshold value, the process determines (at 7945) whether the IDA* solving engine returned an empty solution set in response to the call at 7925.

As further described below, the IDA* solving engine returns an incomplete non-empty solution when it can only find topological routes for some of the nets in the selected group. If the process determines (at 7945) that the IDA* solving engine has returned an incomplete non-empty solution, it accepts (at 7955) the topological routes for some of the nets that the IDA* solving engine returned. The process then returns to 7920 to try to find topological routes for the remaining unsolved nets of the group selected at 7915. In other words, the process (1) specifies (at 7920) a depth limit, a maximum depth-limit threshold, and a max number of pushes for the remaining unsolved nets, (2) calls (at 7925) the IDA* solving engine for these nets, and then (2) based on the solutions returned by the IDA* solving engine, performs some or all the operations 7930-7945 as described above.

On the other hand, if the process determines (at 7945) the IDA* solving engine did not find a solution for any net, the process selects (at 7950) one of the nets in the selected group and creates a solution for this net based just on this net's cheapest topological route. The process then determines (at 7952) whether it has found a topological route for all the nets in the group identified at 7915. If not, the process returns to 7920 to try to find topological routes for the remaining unsolved nets of the group selected at 7915. Like the transition back to 7920 from 7955, this transition results in the process (1) specifying (at 7920) a depth limit, a maximum depth-limit threshold, and a max number of pushes for the remaining unsolved nets, (2) calling (at 7925) the IDA* solving engine for these nets, and then (2) based on the solutions returned by the IDA* solving engine, performing some or all the operations 7930–7945 as described above.

On the other hand, if the process determines (at 7952) that it has found a solution for all the nets in the group identified at 7915, the process (at 7965) specifies a shape for each face item that the IDA* solving engine defined while routing the nets. The face items can form topological vias or Steiner points. Different embodiments use different shapes for face items. For instance, the face items can be hexagonal, octagonal, circles, squares, diamonds, etc. Some embodiments select the shape of the face items based on the wiring model that the geometric engine uses. Several of these shapes, and the uses of these shapes for different wiring models, are described in the above-incorporated U.S. patent application Ser. No. 10/076,121.

After assigning face-item shapes, the topological-routing process 7900 then triangulates (at 7970) the sub-region layers based on the face items. This triangulation is performed by inserting a node in the triangulated graph in the location of each face item (e.g., in the center of each face item shape defined at 7965), and then triangulating each face that contains a face item based on the location of the inserted node. In some embodiments, the process 7900 specifies the location of each face item at 7965. For instance, at 7965, the process 7900 can identify the location of a non-via face item at the center of its bounding polygon, and identify the location of a via-forming face item at the center of the bounding polygon for its via (i.e., at the center of the intersection of the bounding polygons of the items that form the via). In other embodiments, the location of each face item is specified while routing the group of nets selected at 7915. For instance, as further described by reference to FIG. 91, a face item's location can be identified and modified by an optimization process. Some embodiments might also insert nodes about the periphery of a face item shape in order to triangulate the face-item shape into smaller triangles.

At 7970, the process also modifies the topological description of the routes that cross the new triangulated edges. After this triangulation, the process (at 7975) performs a follow-up edge-flipping operation. If the process ends up flipping any edges at 7975, it also modified at 7975 the topological description of the routes that crossed the old or now cross the new edge. At 7980, the process determines whether there are any unsolved nets in the sub-region. If so, the process returns to 7915 to select the next group of nets for solving. If not, the process ends.

C. IDA* solving Engine (1) Jointly Routing Groups of Nets with an IDA* Search Engine As mentioned above, the IDA* topological routing engine calls (at 7925) its IDA* solving engine to identify topological routes for a group of nets. In the embodiments described below, the IDA* solving engine uses an IDA* searching technique to try to identify the optimal set of routes for the group of nets. In other words, the IDA* solving engine traverses through the solution space to deterministically identify the best possible combination of topological routes for the group of nets.

Figure 80:
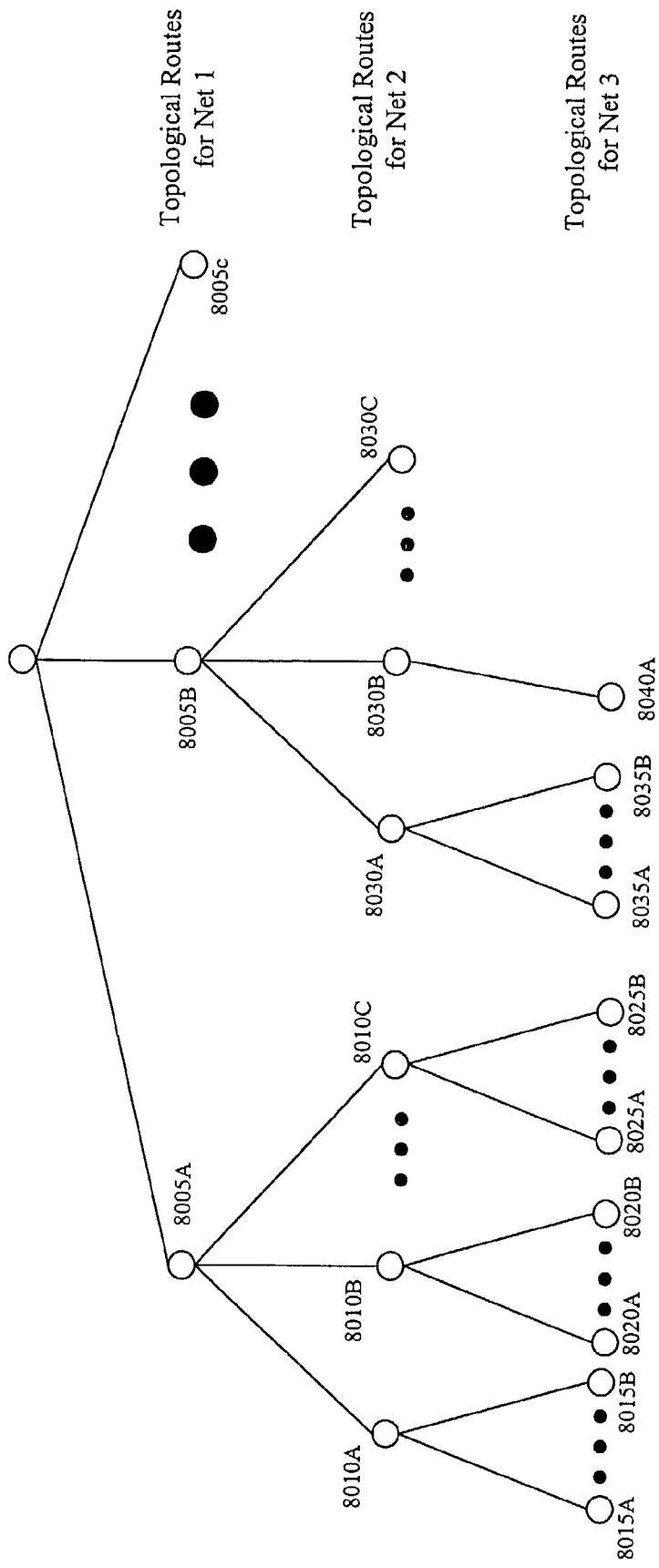
FIG. 80 pictorially illustrates an example of a solving engine's IDA*-searching operation for a set of three nets.

The IDA* solving engine traverses the solution space in an iterative-deepening manner up to a particular depth limit. FIG. 80 pictorially illustrates an example of this engine's IDA*-searching operation for a set of three nets. As shown in this figure, the IDA* solving engine initially identifies several topological routes 8005a–05c for a first net. One advantage of using topological routes is that the IDA* solving engine can define fewer possible routing solutions for each net at this stage. This is because there are fewer topological routes than geometric routes for a net, as one topological route can represent a plethora of diffeomorphic geometric routes.

After identifying the solutions for the first net, the IDA* solving engine selects a topological-routing solution for the first net. At each level of iteration, the search selects the solutions according to a quality metric. In the embodiments described below, this quality metric is the length of the topological routes. Other embodiments might use different quality metrics. In the example illustrated in FIG. 80, the topological routes for each net get longer from left to right (i.e., the solutions get worse going from left to right).

Accordingly, in the example illustrated in FIG. 80, the first selected solution for the first net is the best solution 8005a. Next, the IDA* solving engine determines whether embedding the selected solution 8005a in the received sub-region (i.e., the sub-region supplied by the IDA* topological engine at 7940) would cause the routing to exceed the depth limit specified by the IDA* topological engine. In the example illustrated in FIG. 80, this embedding does not make the routing exceed its depth limit. Hence, the engine embeds the selected solution 8005a in the sub-region, and then generates several solutions 8010a–c for the second net in the sub-region that contains the embedded solution 8005a of the first net.

After identifying the solutions for the second net, the IDA* solving engine selects the best solution 8010a for the second net, and determines whether embedding this selected solution in the current sub-region (i.e., the sub-region containing the embedded topological route 8005a) would make it exceed the depth limit specified by the IDA* topological engine. In the example illustrated in FIG. 80, this embedding does not make the routing exceed its depth limit. Hence, the engine embeds the selected solution 8010a in the sub-region, and then generates several solutions 8015a–c for the third net in the sub-region that contains the embedded routes 8005a and 8010a of the first and second nets.

After examining all the solutions 8015a–8015b for the third net in the sub-region that contains the embedded routes 8005a and 8010a of the first and second nets, the IDA* solving engine discover that all these solutions 8015a–8015b would make the route exceed the depth limit specified by the IDA* topological engine. Consequently, the combination of the best solutions 8005a and 8010a for first and second nets did not lead to an acceptable routing solution.

The IDA* solving engine then determines whether it has examined all the previously defined solutions for the net at the previous level of the search. At this stage, this previous example is net 2, and the IDA* solving engine has not yet examined other routing solutions 8010b–8010c of net 2. Accordingly, the IDA* solving engine selects the next best solution 8010b for net 2 in the sub-region that contains solution 8005a for net 1. It then embeds this route 8010b as this embedding does not violate the depth limit, and then generates several routes 8020a–8020b for the third net in the sub-region that the embedded routes 8005a and 8010b of the first and second nets.

However, the IDA* solving engine cannot embed any of these routes 8020a–8020b. In this example, the IDA* solving engine then determines that it can embed all other routing solutions of net 2, but each time it determines that it cannot embed any of the resulting routing solutions for net 3. This means that the best solutions 8005a for first net does not lead to an acceptable routing solution. Hence, once the IDA* solving engine determines that it has examined all the previously defined solutions for the net 2 at the current level of the search, it determines whether it has examined all the previously defined solutions for the net at the previous level of the search. At this stage, this previous example is net 1, and the IDA* solving engine has not yet examined other routing solutions 8005b–8005c of net 1.

Accordingly, the IDA* solving engine examines the solution space that results from the selection of the next best solution 8005b for net 1. Eventually, in this example, the IDA* solving engine finds a solution for all three nets, when it determines that embedding the topological route 8040a for the third net does not cause the routing to exceed the depth limit. This solution includes route 8005b for net 1, route 8030b for net 2 in the sub-region that contains route 8005b, and route 8040a for net 3 in the sub-region that contains routes 8005b and 8030b.

This solution will be the optimal solution or very close to it so long as the depth limit is increased by small increments from its lowest possible value. For instance, when the depth limit is increment by 10%, the solution will be within 10% of the optimal solution.

Some embodiments described below introduce two additional constraints in the operation of the IDA* solving engine. First, these embodiments limit the IDA* solving-engine's IDA* search to a maximum number of iterative attempts, referred to below as pushes. This is to decrease the run-time of the IDA* solving engine. Limiting the number of pushes might cause the IDA* solving engine to return a solution that is not the optimal, but this might be acceptable in some situations as a reasonable tradeoff for run-time speed.

Second, the IDA* solving engine in these embodiments considers the impact of the routes selected for the nets in the selected group on the nets not yet selected. In other words, while IDA* solving the selected group of nets, the IDA* solving engine considers the routing cost of nets that have not yet been selected. In the embodiments described below, the IDA* solving engine generates a lower bound estimate on the cost of the unselected nets, and ensures that the depth limit is not exceeded by the sum of this estimate and the actual or predicted costs of the nets in the selected group.

(2) Solving

Figure 81A:
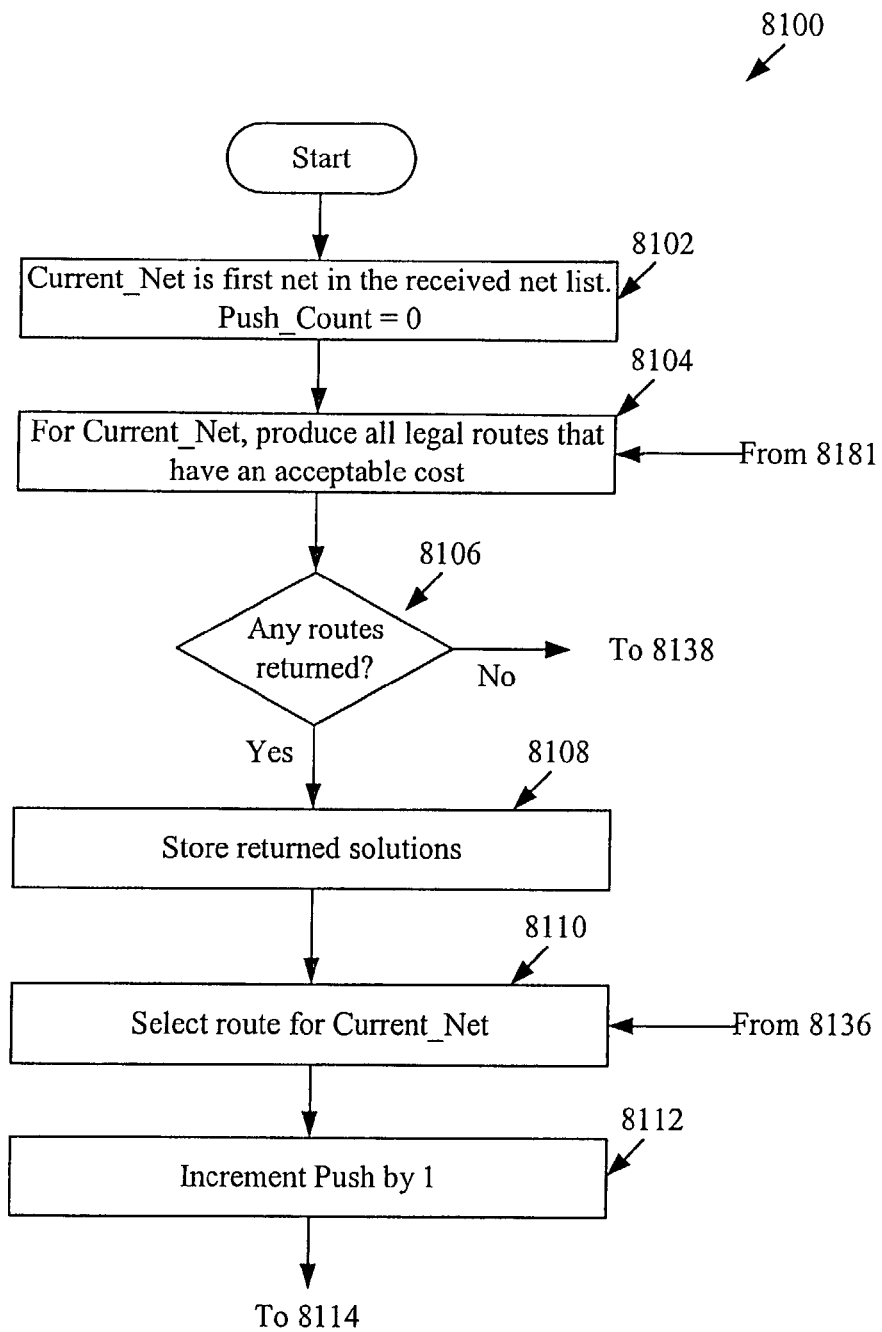
FIG. 81 illustrates a more detailed process used by the solving engine in some embodiments of the invention.
Figure 81B:
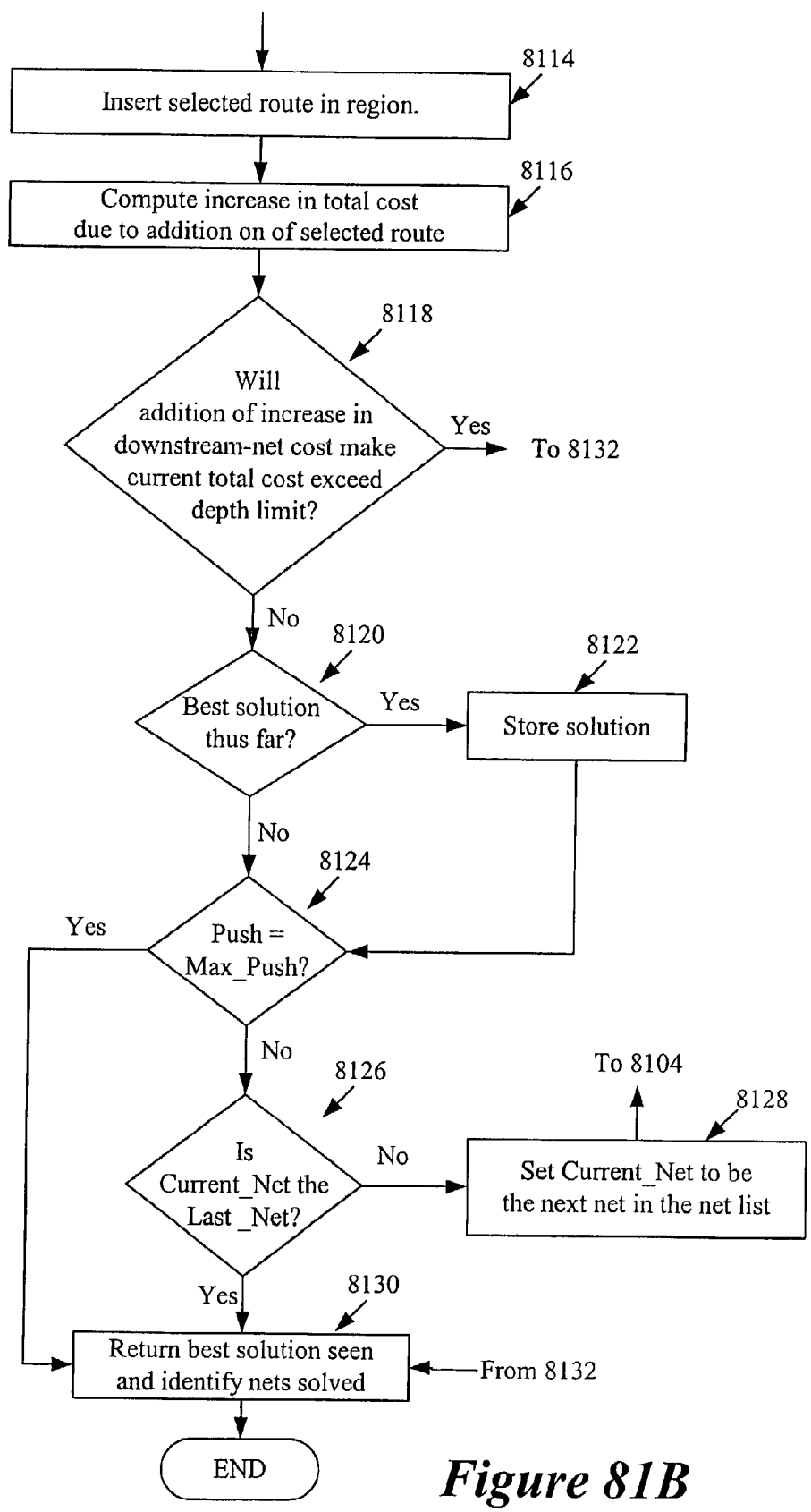
Figure 81C:
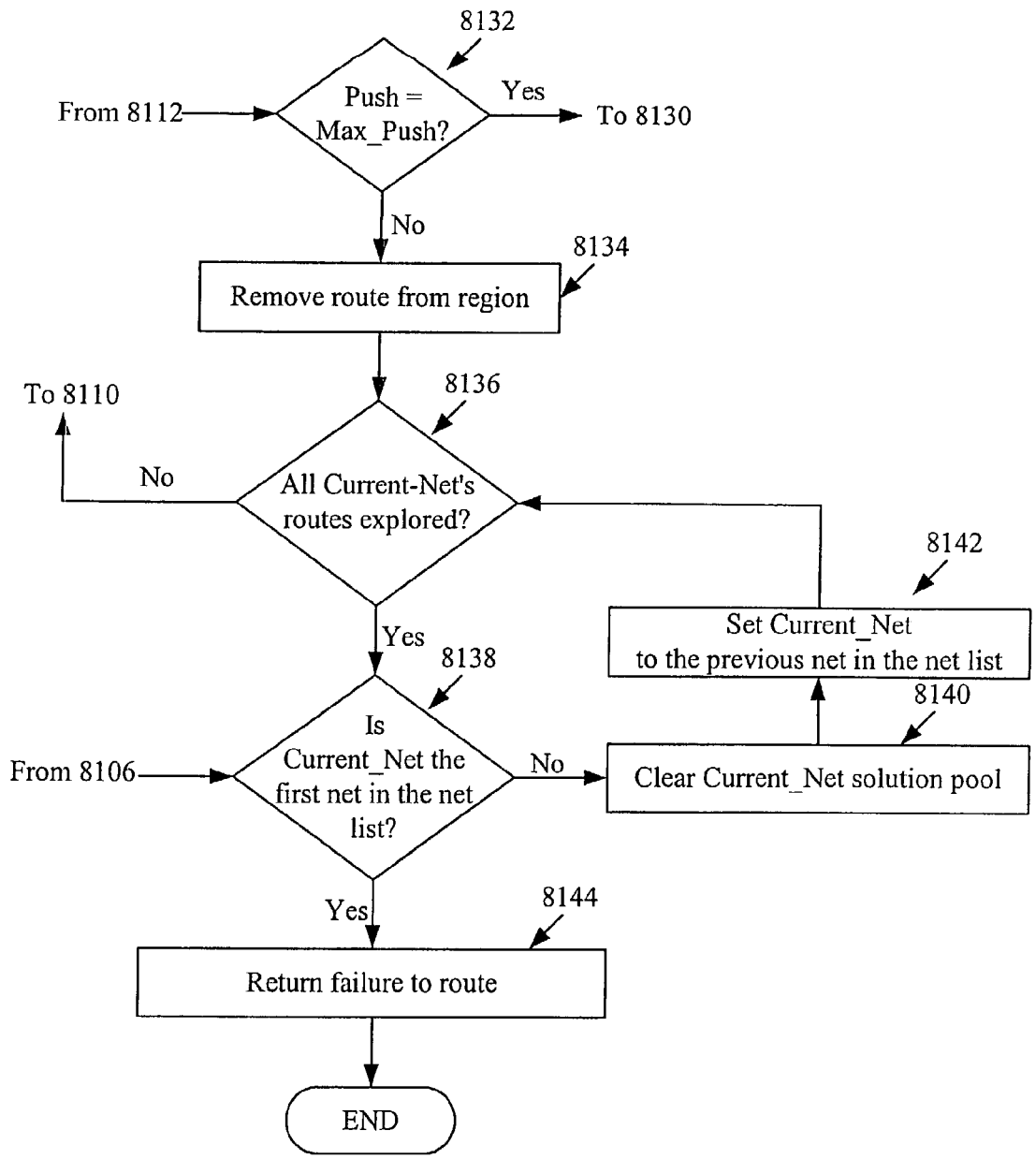

FIG. 81 illustrates a more detailed process 8100 used by the IDA* solving engine in some embodiments of the invention. As mentioned above, the process 8100 is performed each time that the process 1500 calls it at 1525 and specifies a selected group of nets to route within a given sub-region, depth limit, and maximum number of pushes. As shown in FIG. 81, the process 8100 identifies (at 8102) the Current_Net as the first net in the specified group of nets. At 8102, the process also sets a Push_Count to 0. For the Current_Net, the process then generates (at 8108) all the legal routes within the sub-region that have an acceptable cost. The acceptable cost is the depth limit minus the total cost of the routed nets minus the estimated cost of all the nets below the Current_Net, plus the estimated cost of the Current_Net.

When the specified group of nets is not the first group of nets that the IDA* solving engine has solved (i.e., if the topological route has called the IDA* solving engine previously to solve a different group of nets), the sub-region includes the topological routes of the previously solved nets.

In addition, when the process 8100 generates the topological routes for the first net of the specified group, the sub-region does not include the topological route of any net within this group. However, each time the process 8100 embeds a topological route of one of the earlier specified nets, it generates the routes of the subsequent specified nets for a sub-region that contains the routes of the earlier embedded nets. In other words, when the process 8100 generates the topological routes for specified nets other than the first specified net, the sub-region includes previously embedded topological routes of previous specified nets. At 8104, the process 8100 also stores the cost associated with each topological route that it generates. The route-generating process will be described below by reference to FIG. 82.

After 8104, the process determines (at 8106) whether it was able to generate (at 8104) any topological route for the Current_Net. If not, the process 8100 transitions to 8142, which will be described below. On the other hand, if the process generated (at 8104) one or more topological routes for the Current_Net, the process 8100 stores (at 8108) the generated routes.

Some embodiments store the routes in an array of N data objects, where N corresponds to the number of nets that the IDA* solving engine is trying to solve. In other words, there is one data object for each of the N nets. Each data object can store the route solution pool of its net, and includes a pointer into this pool that specifies the solution currently being explored. This pointer traverses through the solution pool as the IDA* solving engine examines the solutions of its net.

At 8110, the process selects one of the topological routes. In the embodiments described below, the process selects the shortest routes first. The process then increments (at 8112) the Push_Count by 1. Next, at 8114, the process embeds the selected route in the current sub-region, and subtracts the cost of this embedded route from the depth limit to obtain a new depth limit. At 8116, the process computes a revised total cost to account for the increase in cost due to addition of the selected route. This revised cost equals the old total cost minus the estimated cost of the Current_Net plus the actual cost of the inserted route.

Next, the process determines (at 8118) whether the total cost will exceed the depth limit after the cost increase in the downstream nets is added to the total cost. In some embodiments, the process adds the increase in the cost of each downstream net in a loop that checks after the addition of each downstream net's delta whether the addition has caused the total cost to exceed the depth limit. Such an approach allows the process 8100 to quickly identify that the route inserted at 8112 has caused the depth limit to be exceed. In some embodiments, the process 8100 uses the cheapest-route calculation process of FIG. 106 to compute the new cost of a downstream net. It also stores the downstream costs of each net (e.g., stores these costs in a stack), and computes the net's delta downstream by subtracting the appropriate stored cost from the computed cost.

When the process determines (at 8118) that the total cost exceeds the depth limit, it transitions to 8132 to decide whether it has also exceeded its maximum number of pushes. This determination will be further described below. On the other hand, if the process determines (at 8118) that the inserted route did not cause the depth limit to be exceeded, the process determines (at 8120) whether the insertion of the selected route at 8116 resulted in the best solution thus far. When the process reaches 8120, it has identified routes for a current set of one or more nets in the specified group. Hence, at 8120, the solution for the current set of nets is the best solution (1) if the process has not previously identified a solution for more than the current set of nets, or (2) if the process has previously identified a best solution for as many nets of the specified group of nets, but the sum of the cost of the routes in the previous solution is more the sum of the costs of the routes in the current solution.

If the process determines (at 8120) that the current set of embedded routes for the current set of nets do not provide the best solution obtained thus far, it transitions to 8124, which is described below. Otherwise, the process stores (at 8122) the current set of embedded routes as the best solution, and then transitions to 8124.

At 8124, the process determines whether it's Push_Count equals the maximum number of pushes that it received from the IDA* topological-routing process 1500. If the Push_Count equals the maximum number of pushes, the process returns (at 8130) the best solution that it recorded during its search, and then ends.

On the other hand, if the Push_Count is not equal to the maximum number of pushes, the process determines (at 8126) whether the Current_Net is the last net of the specified group of nets. If so, the process returns (at 8130) the best solution that it recorded during its search, and then ends.

If not, the process (at 8132) sets the Current_Net to be the next net of the specified group of nets. The process then transitions back to 8104 to generate all legal routes for this new Current_Net, and then perform the subsequent operations to try to embed one of these generated routes in the sub-region.

As mentioned above, the process 8100 transitions to 8132 when it determines (at 8118) that the total cost for inserting the selected route exceeds the depth limit. At 8132, the process determines whether its Push_Count equals the maximum number of pushes received from the IDA* topological-routing process 1500. If so, the process returns (at 8130) the best solution that it recorded during its search, and then ends.

On the other hand, if the process determines (at 8132) that the Push_Count does not equal the received maximum number of pushes, the process removes (at 8134) the route inserted at 8114. The process then determines (at 8136) whether it has examined all the topological routes generated for the Current_Net at 8104. If not, the process transitions back to 8110 to select the next best route (e.g., next shortest route) for the Current_Net from the array described above, and then perform some of subsequent operations described above for the newly selected route.

If the process determines (at 8136) that has examined all the topological routes generated for the Current_Net, the process determines (at 8138) whether the Current_Net is the first net in the specified group of nets. If so, the process has failed to embed any of the routes of the first net in the specified group, and hence returns (at 8144) its failure to route to the topological-routing process 1500.

If not, the process clears (at 8140) the Current_Net's solution pool in the above-described array. The process then defines (at 8142) the net before the Current_Net on the specified group as the new Current_Net. It next determines (at 8136) whether it has already explored all the routes for the Current_Net defined at 8142. Depending on this determination, the process transitions either to 8110 or 8138, as described above.

(3) Route Generation

Figure 82A:
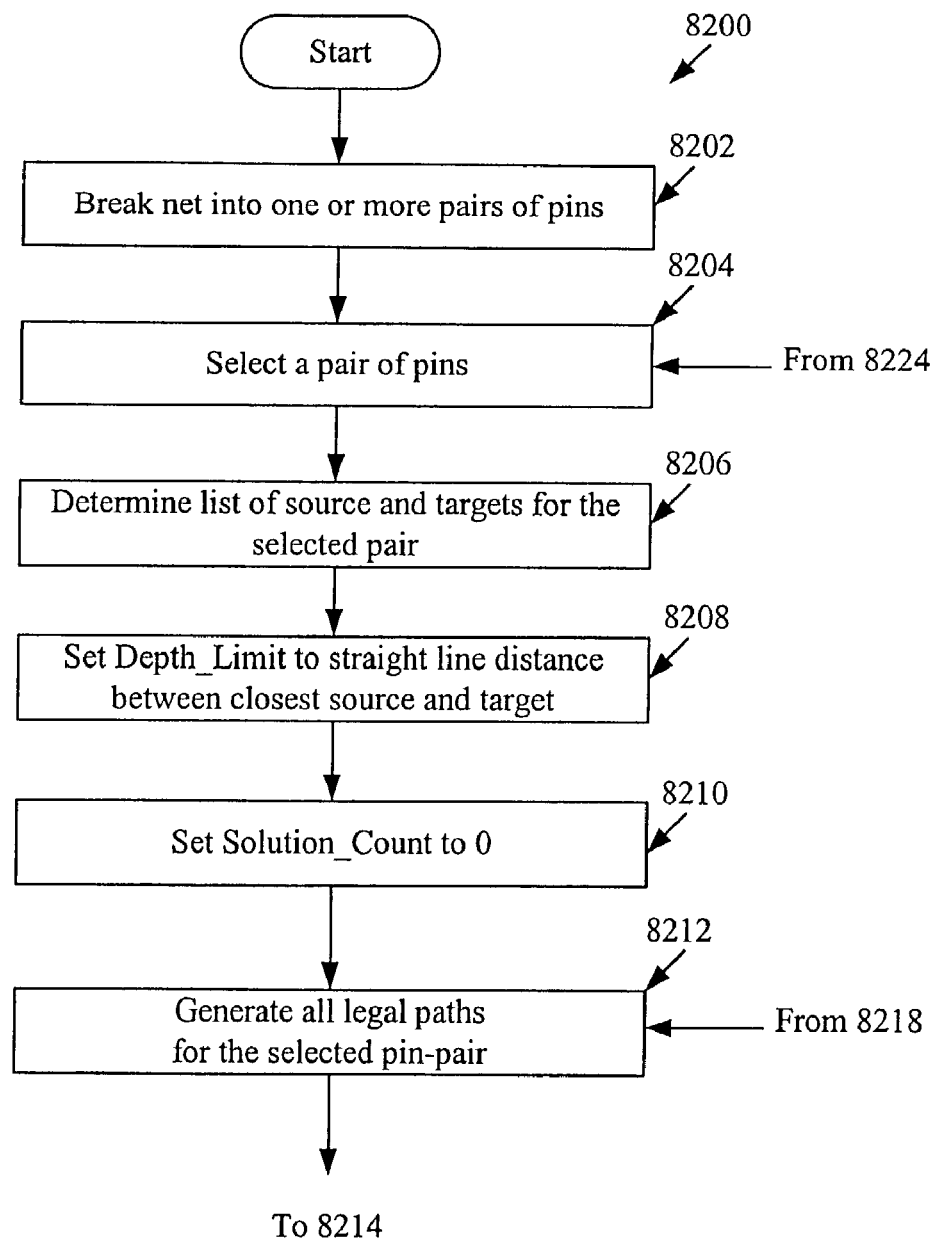
FIG. 82 illustrates a process that the solving engine uses to generate topological routes.
Figure 82B:
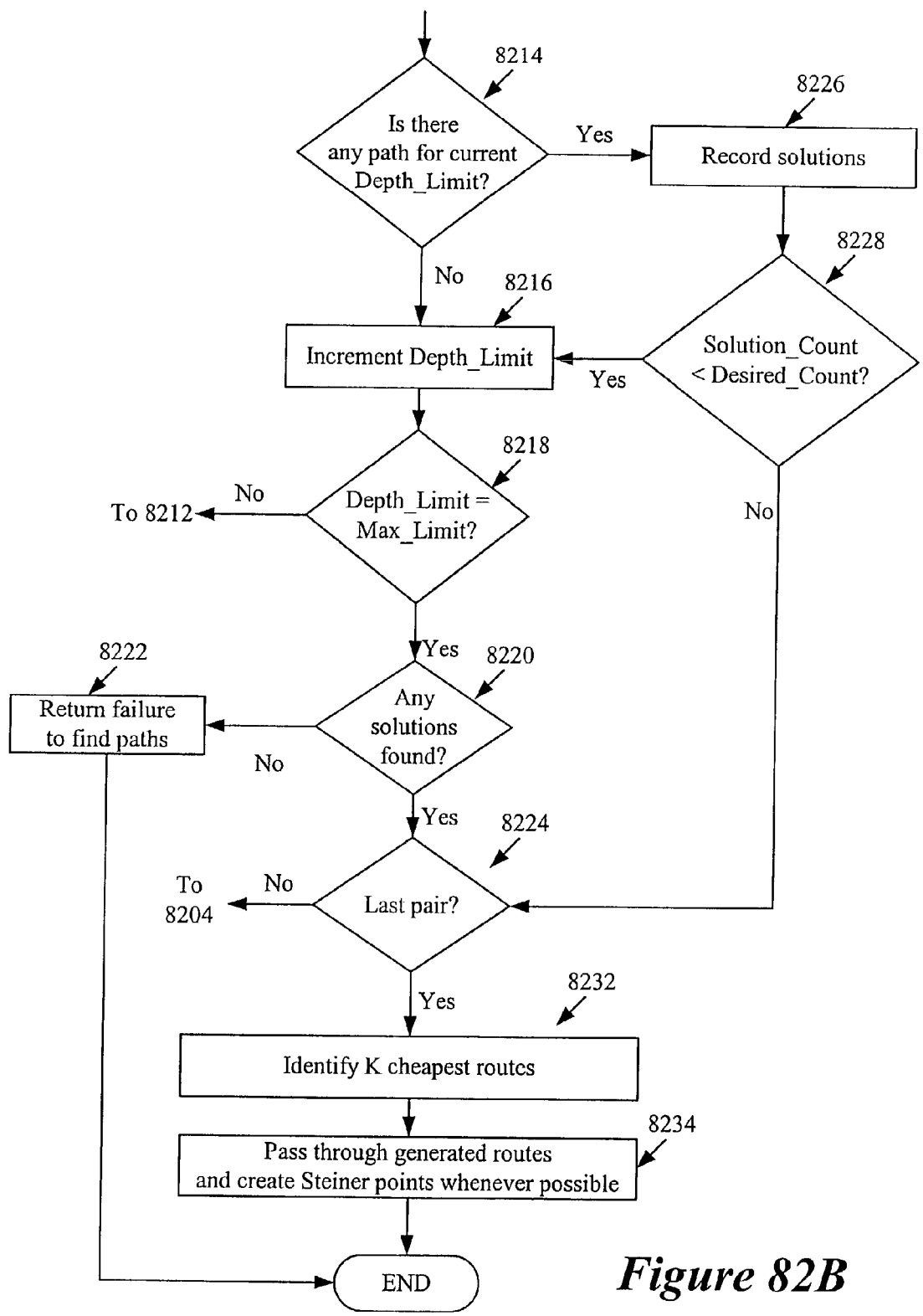

FIG. 82 illustrates a process 8200 that the solving engine uses at 8104 to generate topological routes for a net. Like the solving engine, the route generating process uses an IDA* search technique to identify the several routes for each net.

As shown in FIG. 82, the process 8200 initially identifies (at 8202) one or more pairs of pins for the Current_Net in the sub-region. It then selects (at 8204) a pair of pins for the net. The process next identifies (at 8206) a list of source and target port-geometries for the selected pair of pins of the Current_Net.

The process then identifies (at 8208) a Depth_Limit for generating routing path between the source and target geometries. In the embodiments described below, the Depth_Limit is set to the shortest distance between the closest source and target geometries. After 8208, the process defines (at 8210) Solution_Count to be equal to 0.

Next, the process generates (at 8212) all legal paths between the source and target geometries identified at 8206. The path-generating process will be described below by reference to FIG. 84. After 8212, the process determines (at 8214) whether it was able to generate (at 8212) any legal path between the source and target geometries. If not, the process transitions to 8216, which will be described below.

If so, at 8226, the process (1) records the generated path or paths and the cost for each path, and (2) increments Solution_Count by the number of paths generated at 8212. The process next determines (at 8228) whether Solution_Count is less than the desired number of solutions. If so, the process transitions to 8216, which will be described below. Otherwise, when the number of solutions exceeds the desired number of solutions, the process transitions to 8224, which will be described below.

As mentioned above, the process can transition to 8216 from 8214 or 8228. At 8216, the process increments the Depth_Limit. The process then determines (at 8218) whether the Depth_Limit exceeds a maximum depth limit. In some embodiments, the initial depth limit is the Euclidean distance between closest source and target, and the depth limit is incremented at each iteration by 1.1 times the cost of cheapest branch pruned for cost during previous iteration.

If the Depth_Limit does not exceed the maximum depth limit, the process transitions to 8212 to generate legal paths between the source and target geometries for the Depth_Limit incremented at 8216. Otherwise, the process determines (at 8220) whether it was able to record any solutions for the pair of pins selected at 8204.

If the process determines (at 8220) that it was not able to record solutions for the selected pair of pins, it returns (at 8222) its failure to find routes for the net, and then ends. Otherwise, the process determines (at 8224) whether it has examined the last pin-pair identified at 8202. If not, the process transitions back to 8204 to select the next pin-pair.

On the other hand, if the process determines that it has examined all the pin-pairs, the process (at 8232) identifies up to K cheapest routes for the net, and records the costs of these routes. When the net has more than two pins in the sub-region, the process 8200 generates more than one set of paths for more than one set of pin-pairs. In such a situation, the process has to generate (at 8232) the K-cheapest combination of paths for the different pin-pairs to generate the K-cheapest routes. When the net has three pins in the sub-region and the process has identified two sets of paths for two pin-pairs, the process selects (at 8232) the cheapest combination of paths from the two sets. On the other hand, when the net has more than three pins in the sub-region and the process has identified more than two sets of paths for more than two pin-pairs, the process (1) initially computes the minimum spanning tree ("MST") for the net pins, and (2) selects the cheapest combination of paths for the pin-pairs that are the endpoints of the MST's edges.

After 8232, the process inserts (at 8234) any applicable Steiner nodes in the generated routes. In some embodiments, the process does this by passing through the edges intersected by each generated route to determine whether any two consecutive edge items are for the same route. Two such edge items are illustrated in FIG. 83A. When the process identifies two such edge items, it removes one of the edge items and in its place inserts a face item as a Steiner node for merging the two paths as shown in FIG. 83B.

After 8234, the process ends.

(4) Path Generation

Figure 84A:
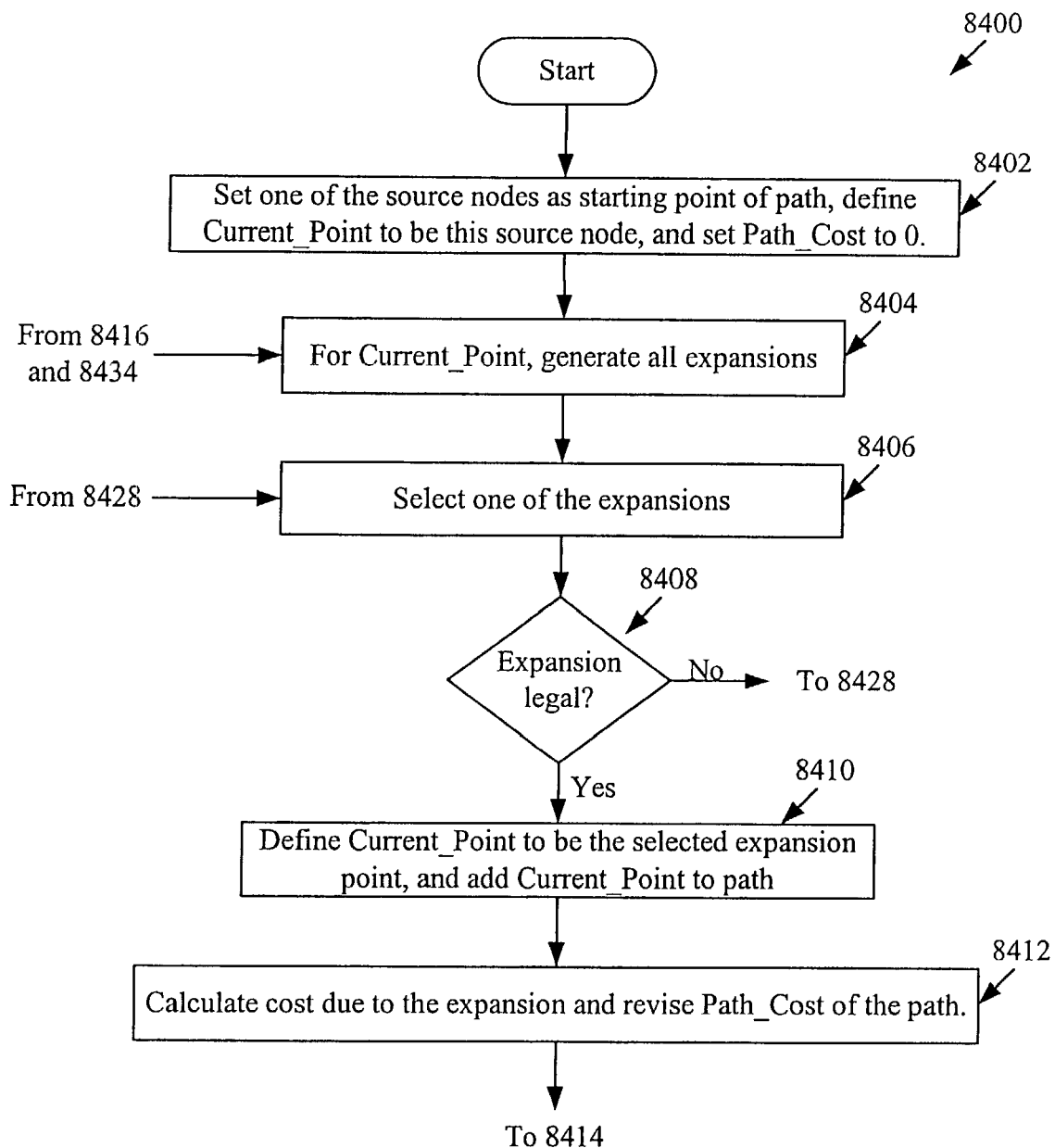
FIG. 84 illustrates a process for generating paths between one or more sources and one or more targets for a selected pin-pair.
Figure 84B:
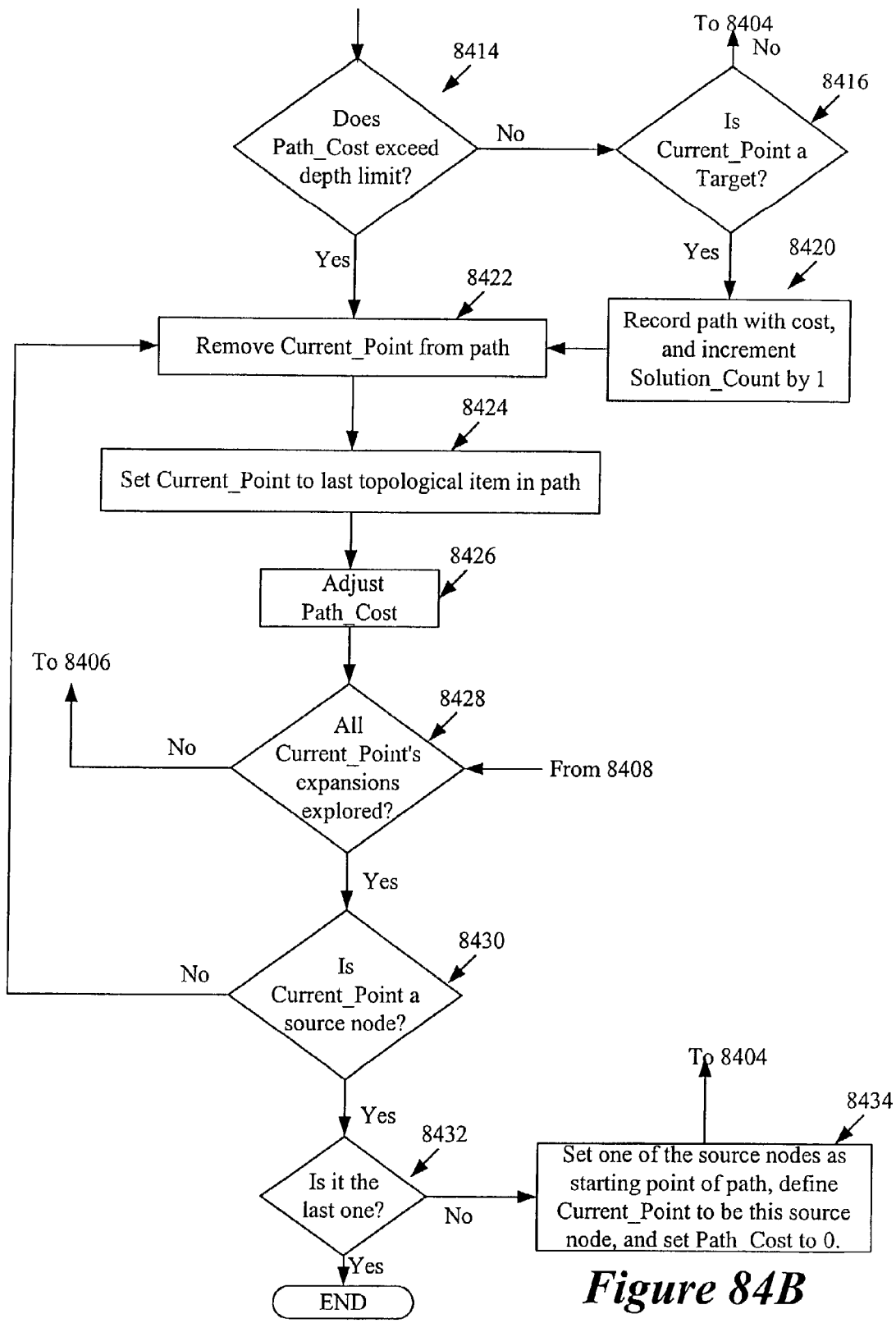

FIG. 84 illustrates a process 8400 for generating (at 8212) paths between one or more sources and one or more targets for a selected pin-pair. As shown in this figure, this process initially defines (at 8402) one of the source nodes as the starting point of a path. At 8402, the process also defines the starting point as the Current_Point, and sets the Path_Cost to 0.

The process then identifies (at 8404) all possible path expansions from the Current_Point. FIGS. 85–89 illustrate the possible expansions from edge items, nodes, and face items. FIG. 85 illustrates that an edge item can expand (1) towards the opposing edges of its face, (2) towards its face's node that is not on its edge, and (3) towards its face's face item.

FIG. 86 illustrates that a node can expand (1) towards the opposing edges of two faces that abut the node, (2) towards the other nodes of these two faces, (3) towards face items of these two faces, and (4) towards one or more nodes and face items above or below it. A node can via up or down to more than one node or face item, when more than one triangulated graph is above or below the node. Some embodiments explore each potential via expansion possibility of a node.

FIG. 87 illustrates that a face item can expand towards the three nodes and edges of its face. Some embodiments do not allow a planar expansion from a face item (i.e., an expansion to an item in the same face as the face item) when the face item was reached through a planar expansion. In other words, these embodiments only allow a via expansion from a face item, when the face item was reached through a planar expansion. Like via-path expansion from a node, a path can via up or down from a face item. Some embodiments do not allow a via expansion in a particular direction (e.g., down) from a face item, when the face item was reached in a direction opposite to the particular direction (e.g., up).

Also, like a node, a face item can via up or down to more than one node or face item above or below it, since more than one face of the above/below triangulated graph can be above or below the face item. As with a node, some embodiments explore each potential via expansion possibility of a face item. Also, as illustrated in FIGS. 88 and 89, when the face item serves as the destination of a via from another layer, the face item has more expansion possibilities if topological routes intersect its face. For instance, in FIG. 88, one net runs through the destination face item's face, and the face item has eight expansion possibilities, with five of them being on one side of the router and the other three being on the other side of the route. In FIG. 89, two nets run through the destination face item's face, and the face item has ten expansion possibilities.

When it is time to expand from a destination face item, some of the expansion possibilities might be quickly eliminated if there is no space for the via to be located in a region that gives rise to the expansion possibilities. For instance, in FIG. 89, the only viable via location might be in the region between the two crossing routes. In such a circumstance, the three and five expansion possibilities on the other sides of these route will not be explored.

After identifying the expansions from the Current_Point at 8404, the process selects (at 8406) one of the expansions identified at 8404. The process then determines (at 8408) whether this expansion is legal. The legality check will be further described below.

If the process determines (at 8408) that the expansion is not legal, the process transitions to 8428, which will be described below. On the other hand, if the expansion is legal, the process (at 8410) defines the Current_Point to be the selected expansion point, and adds this new Current_Point to the path. Next, the process calculates (at 8412) the cost due to the expansion, and adds this calculates cost to the Path_Cost. In some embodiments, the process computes the cost of each legal expansion (which when amalgamated for complete routes define the cost of the resulting routes) by using a shortest-path approach. Such an approach is disclosed in "Geodesic Path Inside Polygons," by Simon Mak and Sung Soo Kang, which can be found at:

www.cs.mcgill.ca/~skang5/cs507/welcom.htm.

Essentially, this approach can be used to compute the shortest path within a polygon defined by the sequence of edges intersected by the route. As this approach simply computes the shortest distance, it does not disfavor or penalize any potential wiring directions for one preferred direction. It should be noted that some embodiments compute this shortest distance based on the routing directions of their wiring model. For instance, some embodiments that expand a route on an octilinear layer calculate the cost of an expansion as the shortest distance that can be traversed by only using horizontal, vertical, and ±45° interconnect lines.

At 8412, the process also adds a via cost for a planar expansion to a face item. In the embodiments that allow stack vias, the process also adds a via cost for a via expansion (i.e., non-planar expansion) to a face item when the previous expansion was also a via expansion to a face item. As mentioned above, in some embodiments, this via cost is proportional to the metric cost that a via introduces into the design. Specifically, a via introduces a variety of costs in a design, and the via penalty can take into account all these costs. For instance, from a resistance or delay point of view, a via might cost fifty times more than the resistance or delay of a unit length of a wire. In this situation, the via can be costed as 50 units of wirelength (i.e., the via can be counted as a wire that is 50 units long). Alternatively, each via might reduce the manufacturing yield by some amount. This reduction can also be accounted for by equating it to a metric cost and adding this cost to the total cost. The via cost can be different for vias that are between different layers if the cost introduced by vias between different layer pairs is different.

After 8412, the process determines (at 8414) whether the Path_Cost exceeds the depth limit. If so, the process transitions to 8422, which will be described below. If not, the process determines (at 8416) whether the Current_Point is a target node. If it is not, the process transitions back to 8404 to generate all expansions for the Current_Point. However, if the Current_Point is a target node, the process (at 8420) records the path with its Path_Cost, and increments the Solution_Count by one. The process then transitions to 8422.

At 8422, the process removes that Current_Point from the path. It then defines (at 8424) the Current_Point to be the last topological item in the path. Next, the process subtracts (at 8426) from the Path_Cost the cost of the expansion that was removed at 8422. At 8428, the process determines whether it has examined all the expansions of the Current_Point. If not, the process returns to 8406 to select another expansion. If so, the process determines (at 8430) whether the Current_Point is a source node.

If the Current_Point is not a source node, the process transitions to 8422 to remove it from the path. However, if the Current_Point is a source node, the process determines (at 8432) whether there are any other source nodes that it has not yet examined. The process ends when it has examined all the source nodes. On the other hand, if there are one or more such nodes, the process (at 8434) defines one of such nodes as the starting point of a path, defines the starting point as the Current_Point, and sets the Path_Cost to 0. The process then transitions to 8404 to generate all expansions from this Current_Point.

(5) Legality Check

For some embodiments, FIG. 90 provides a table that illustrates the types of legality checks performed for different combination of expansions. The vertical axis lists the starting points of the expansion, and the horizontal axis lists the destination points of the expansion. As shown in FIG. 90, the are three types of legality checking. These are: planarity, via checking, and edge capacity.

(i) Edge Capacity Check

The edge capacity check is performed each time a path tries to intersect an edge. This legality check requires that the flow across the destination edge after the potential move not exceed this edge's capacity. The flow computation is like the one described above for the Q* engine.

(ii) Via Legality Check

Figure 91:
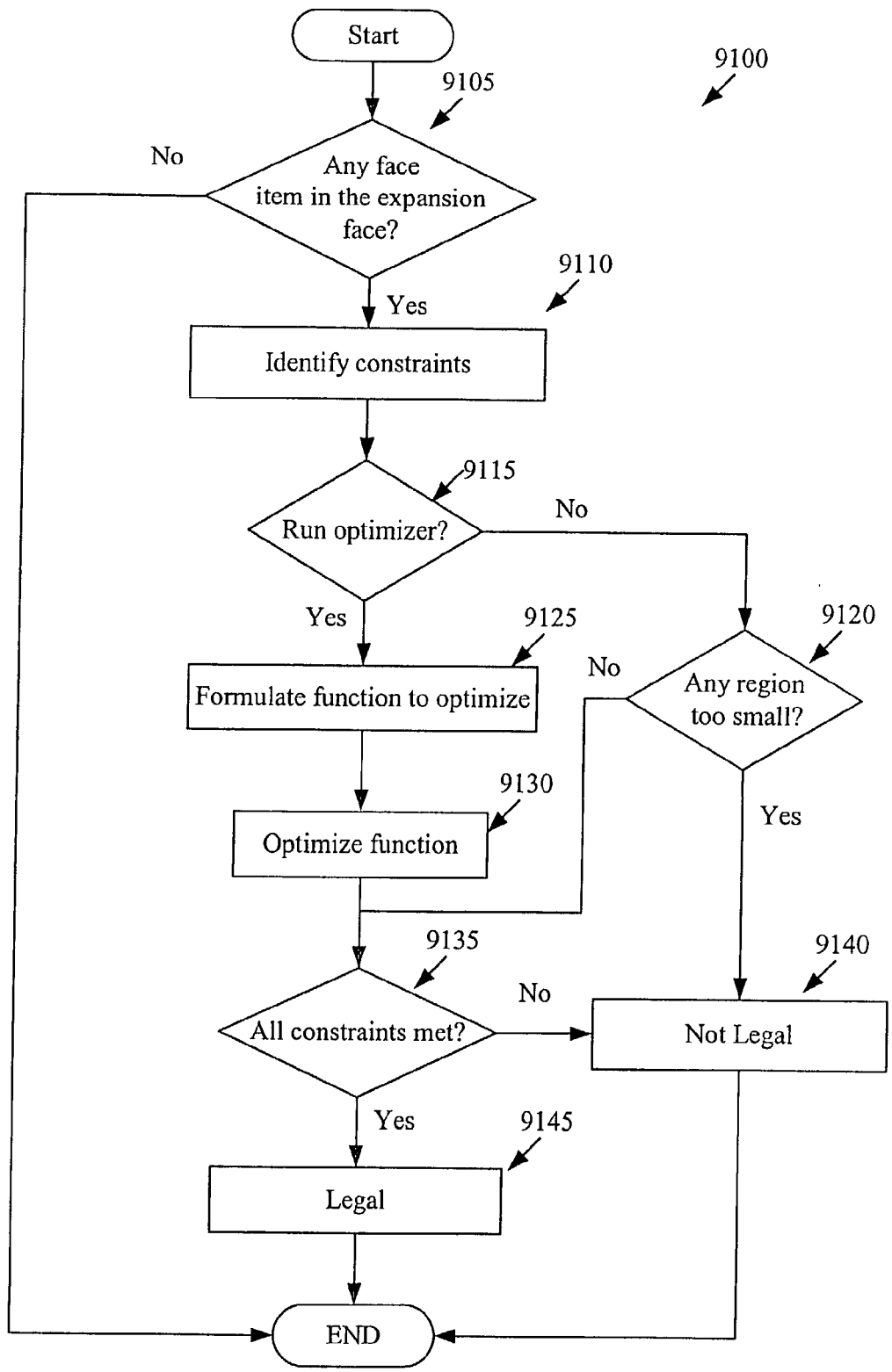
FIGS. 91 and 92 illustrate two via-checking processes.
Figure 92:
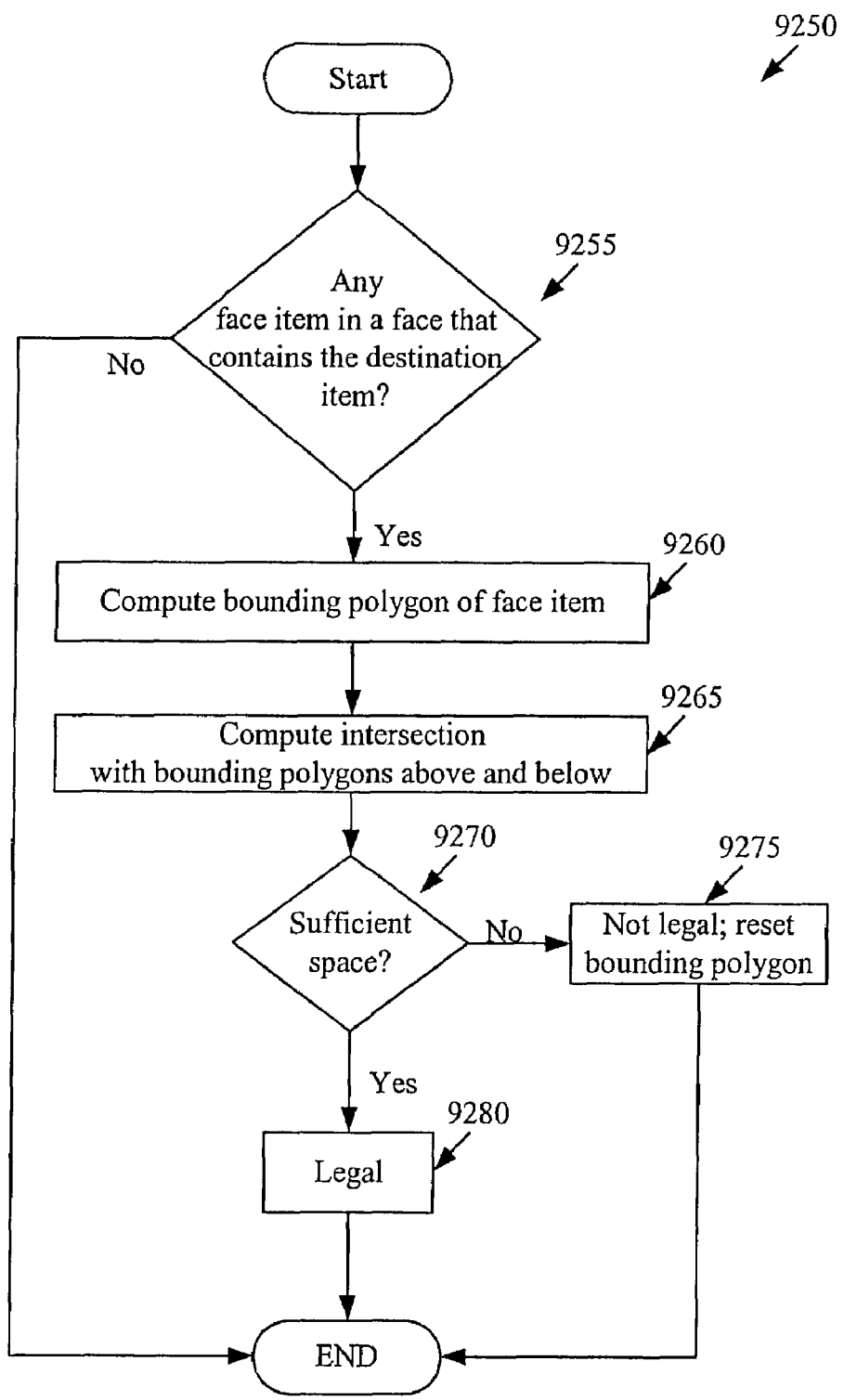

As indicated in FIG. 89, the via check is performed for each possible expansion. Different embodiments of the invention perform the via-checking operation differently. FIGS. 91 and 92 illustrate two different processes for performing this checking operation.

(1st) Optimization Technique

FIG. 91 illustrates a process 9100 that uses an optimization technique to perform the via-checking operation. The process 9100 initially determines (at 9105) whether the expansion face has a face item within it. A path expansion can be between source and destination items on the same layer (i.e., can be a planar expansion) or it can be between source and destination items on different layers (i.e., can be a via expansion). In the embodiments described below, an expansion face (1) is the face that contains both the source and destination items in a planar expansion, and (2) is the face that contains a face-item destination in a via expansion.

In the embodiments described below, there is no expansion face when a node is the destination of a via expansion. The process 9100 does not specify an expansion face for a via expansion to a node in order to improve run-time efficiency. Otherwise, the process 9100 would have to examine every face that is connected to the via-destination node. Similarly, an expansion face for a planar expansion is defined as the face that contains both the source and destination items, in order to reduce the number of faces that are examined and thereby improve run-time efficiency.

However, some embodiments could examine each face that contains a path-expansion's destination item, as this approach has several advantages. For instance, such a check would allow the router to detect an illegal via-path expansion when the router imposes a larger minimum-spacing requirement for a destination node that serves as a via than for a destination node that does not.

If the expansion is a via expansion to a node, there is no face to check at 9105, and the process 9100 thereby terminates. Similarly, if the expansion is a planar expansion to an item in an expansion face without a face item, then there is no via check necessary and the process ends.

On the other hand, if the identified expansion is to a face item or, in a planar expansion, to a node or edge item in an expansion face with a face item, the process 9100 identifies (at 9110) constraints for each face item in each face involved with the path expansion. For a via expansion, a face is involved with a path expansion if it includes an item that forms the via. For a planar expansion, the expansion face is the face involved with the path expansion.

For a face item in a face involved with a path expansion, the constraints include constraining points and minimum required distance to each constraining point. If the face item is moveable, the face item's set of constraints also specifies a legal x,y region that can contain the face item. Some embodiments allow each face to have up to two face items. When a face item is within a face that contains another face item, the process 9100 identifies a repulsion constraint that specifies the minimum required distance between the two face items.

FIGS. 93–105 present several examples that illustrate the type of constraints identified by the process 9100.

Constraints for A Single Face Item.

FIG. 93 illustrates a potential face item F1 in a face 9300 on a particular layer. This face 9300 has nodes N1–N3 and edges E1–E3, and it is intersected by four nets a, b, c, and d. The potential face item F1 is a potential expansion of net d in the face 9300. For the face item F1, the process 9100 would identify edge and node constraints for the layer on which this face item exists.

In the embodiments described below, the edge and node constraints of a face item are the minimum required distances from the face item to the edges and nodes of the face that contains the face item. Specifically, for the face item, the constraint with respect to each node represents the required width and spacing of the minimum set of topological items (if any) that separate the face item from the node. For the face item, the constraint with respect to each edge is the required width and spacing of the minimum set of topological items (if any) that topologically separate the face item from the edge. One manner of computing edge and node constraints is further described below.

FIG. 94 illustrates the edge and node constraints for the potential face item F1. In this example, as well as the other examples illustrated in FIGS. 95–104, the acronyms can be understood as follows: (1) Wx signifies width of a route of a net x, (2) SNY-x signifies minimum required spacing between node Y and an adjacent net route x, (3) Sx-z signifies minimum required spacing between adjacent routes for nets x and z, (4) SFQ-x signifies minimum required spacing between face item FQ and adjacent net route x, and (5) SFQ-NY signifies minimum required spacing between node Y and adjacent face item FQ.

As shown in FIG. 94, the face item F1's edge constraints for edges E1 and E3 are null, while its edge constraints for edge E2 is Wb+SF1-b. Also, this face item's (1) node constraint for node N1 is SF1-N1, (2) node constraint for node N2 is Wb+SF1-b+Wc+SN2-c+Sc-b, and (3) node constraint for node N3 is Wa+SN3-a+SF1-a.

The process 9100 would identify the nodes N1–N3 of the face 9300 as the set of constraining points for the face item F1. This process would also identify each node's constraint as the minimum required distance to the constraining point corresponding to the node. FIG. 95 illustrates nodes N1–N3 as constraining points of the face item F1. This figure also illustrates the minimum required distance to each of the points N1-N3 as a circular arc that has at its center one of the nodes N1–N3 and has as its radius the node's corresponding node constraint.

The process 9100 would also identify a legal region that can contain the face item F1 from this face item's edge constraints. This legal region can be obtained by bringing each edge of the face 9300 towards its center in the direction of the edge's normal by the amount of the edge's constraint. In the example illustrated in FIGS. 93 and 94, the constraints for two edges E1 and E3 are 0, and the constraint for the edge E2 is Wb+SF1-b. Accordingly, as illustrated in FIG. 95, the face item F1's legal region 9500 can be obtained by bringing edge E2 towards the center of the face 9300 in the direction of its normal by the amount Wb+SF1-b, and leaving the other two edges E1 and E3 unadjusted. This legal region is a triangle defined by nodes N1', N2', and N3. As further described below, an optimizer can search through the legal region 9500 to identify the optimal position for the face item F1.

Each time the process 9100 first identifies the constraining points, distances, and/or legal region for a face item, it stores these values in the face items data structure. Also, each time the process makes a routing operation that changes the constraining distances and/or legal region of the face item, it modifies the stored values in the face item's data structure. Storing these parameters in the face item data structures speeds up the operation of the router in the instances where it can simply retrieve these values from the data structures.

Figure 96:
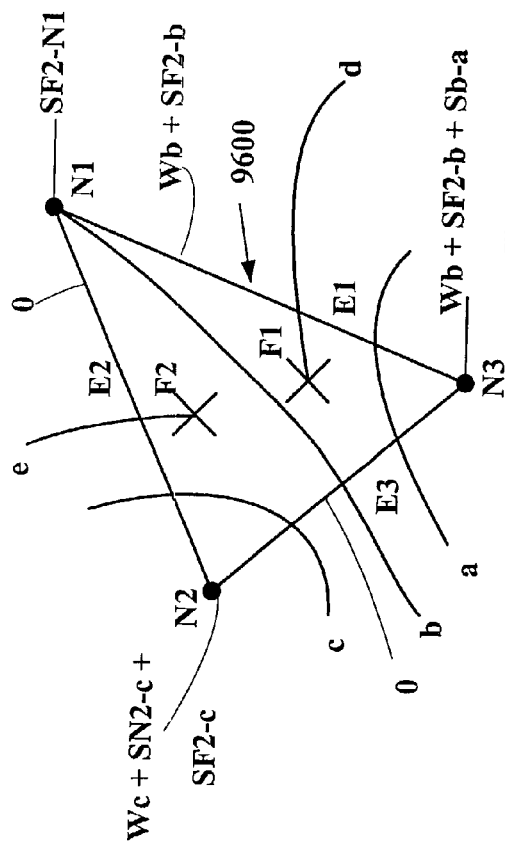

Constraints for Two Face Items in the Same Face and Two Face Items Forming a Via FIG. 96 illustrates an example identical to the example illustrated in FIG. 93, except that the face 9600 in FIG. 96 includes two face items. One face item is face item F1, which still represents the potential expansion of net d into face 9600. The other face item is a face item F2 that connects to (1) a face item F3 in a face 9700 (illustrated in FIG. 97) in a layer above the face 9600's layer, and (2) a face item F4 in a face 91030 (illustrated in FIG. 98) in a layer below the face 9600's layer.

The process 9100 would compute node and edge constraints for face items F1 and F2. Also, based on these constraints, the process would identify (1) sets of constraining points and distances, and (2) a legal region for each face item. The process would also identify a repulsion constraint that specifies the minimum spacing between the two face items.

Figure 99:
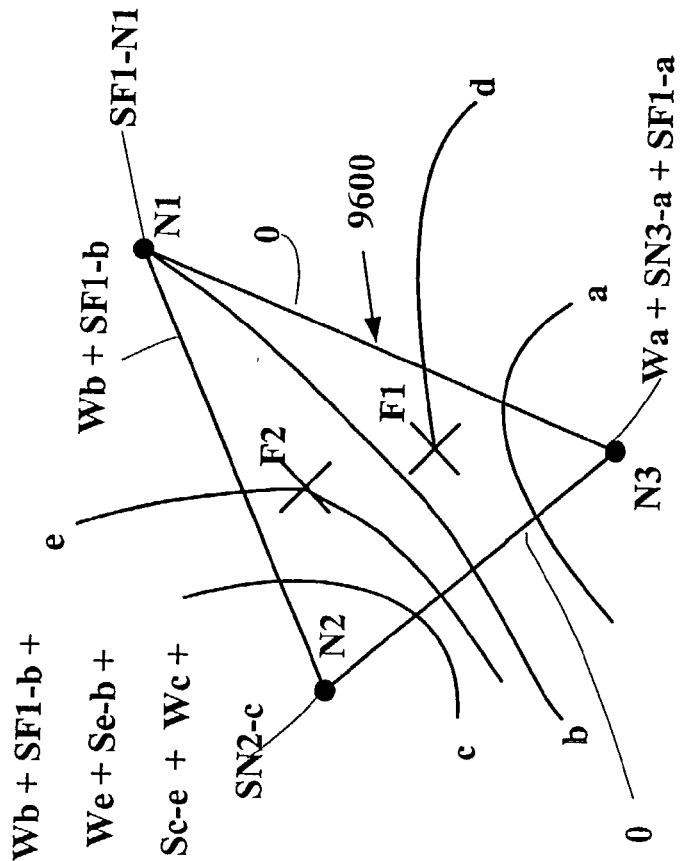

For the example illustrated in FIG. 96, the node and edge constraints for the face item F1 are identical to the constraints shown for this face item in the example illustrated in FIG. 93. In other words, the face item F2 does not affect the node and edge constraints of the face item F1. If the face item F2 connected to more than one edge of the face 9600, then it would affect the face item F1's constraint for node N2. FIG. 99 illustrates one such example. As shown in this figure, the connection of the face item F2 to edges E2 and E3 changes face item F1's constraint for node N2. After identifying the node and edge constraints for the face item F1, the process would identify the legal region that can contain this face item. As before, this legal region is the region 9500 illustrated in FIG. 95.

FIG. 96 illustrates node and edge constraints for the face item F2 with respect to the nodes and edges of the face 9600. Like the constraints for the face item F1, the route connected to the face item F1 does not affect the edge and node constraints for the face item F2. These constraints would have been affected if the face item F1 connected to more than one edge of the face 9600.

Figure 97:
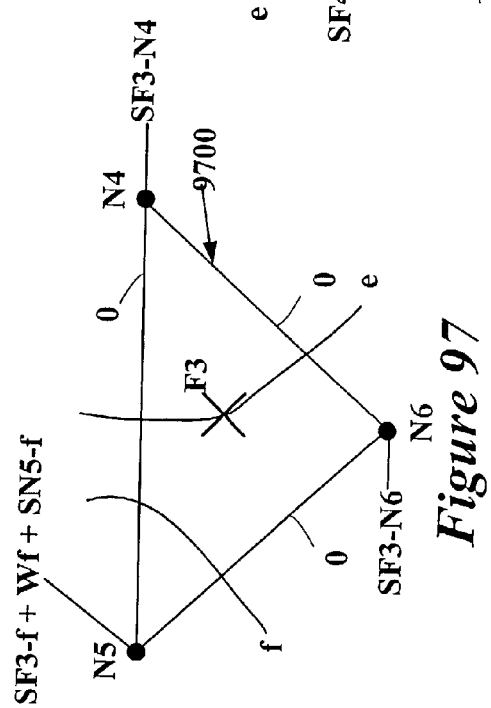
Figure 98:

The face item F2 forms a via with the face items F3 and F4 in the layers above and below. The constraints on all three face items F2, F3 and F4 constrain the location of this via. Accordingly, the process 9100 would identify node and edge constraints for face items F3 and F4 with respect to the nodes and edges of the faces that contain them. These constraints are illustrated in FIGS. 97 and 98.

Figure 100:
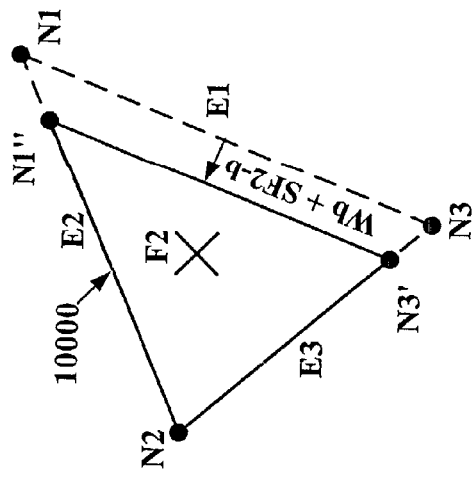

For the via formed by these three face items, the process 9100 then would identify a legal region in each face 9600, 9700, and 91030. The legal region in each of these faces is obtained by moving each edge of the face towards the face's center by the amount of the edge's constraint. As the constraints of all the edges in faces 9700 and 91030 are null, the legal region for the face item F3 is the entire face 9700 and the legal region for the face item F4 is the entire face 91030. The legal region for the face item F2, however, is different than the face containing this face item. FIG. 100 illustrates this legal region 100, which is obtained by moving edge E1 towards the center of face 9600 by the amount of its constraint Wb+SF2-$b$.

Figure 101:
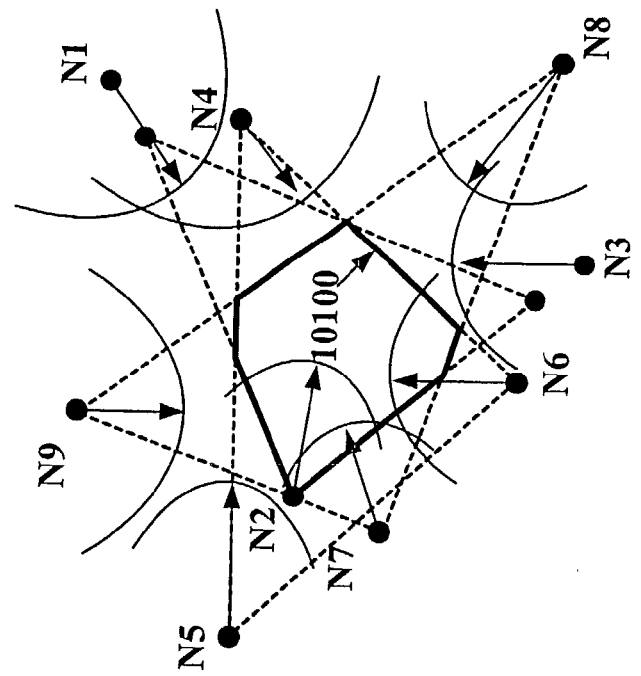

Based on the identified legal region and node constraints for each face traversed by the via that F2, F3, and F4 form, the process would specify a combined legal region and set of constraining points and distances for this via. The process would generate the combined region by intersecting the legal regions identified for face items F2, F3, and F4. FIG. 101 illustrates this combined legal region 10100. The combined set of points and distances for this via are simply the union of the set of points and set of distances identified for the face items F2, F3, and F4. FIG. 101 illustrates the combined sets of points, which are nodes N1-N9, and the combined sets of distances for these nodes.

As mentioned above, the process 9100 would also identify a repulsion constraint that specifies the minimum required spacing between the face items F1 and F2. The required distance between two such face items is the sum of the width of each route between these face items plus the required minimum spacing between the route(s) and face items. In this example, the required distance between face items F1 and F2 is equal to SF1-$b$+Wb+SF2-$b$ (i.e., is equal to the sum of the required spacing between F1 and net b, the width of net b, and the required spacing between F2 and net b).

As mentioned above, some embodiments allow a face to have at most two face items. These embodiments limit the number of face items to improve run-time efficiency. Other embodiments, however, might allow a face to have more than two face items. These embodiments would identify node, edge, and region constraints similarly to the examples described above. They would also analogously identify repulsion constraints between face items in a face except that, in a face with three or more face items, the required constraint between two face items would be the sum of the width of each route and/or face item between these two face items plus the required minimum spacing between the route(s) and face items.

Figure 103:
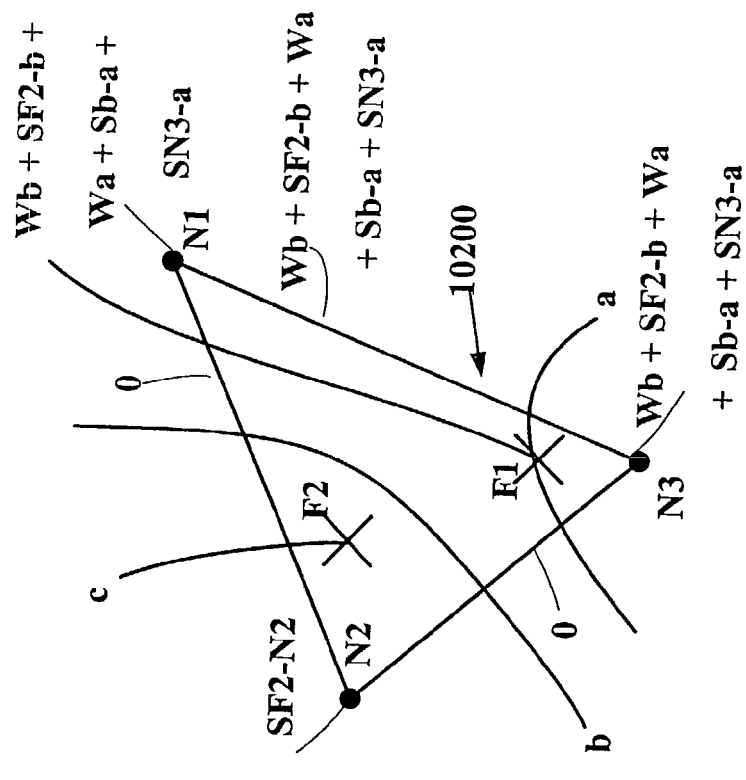
Figure 102:
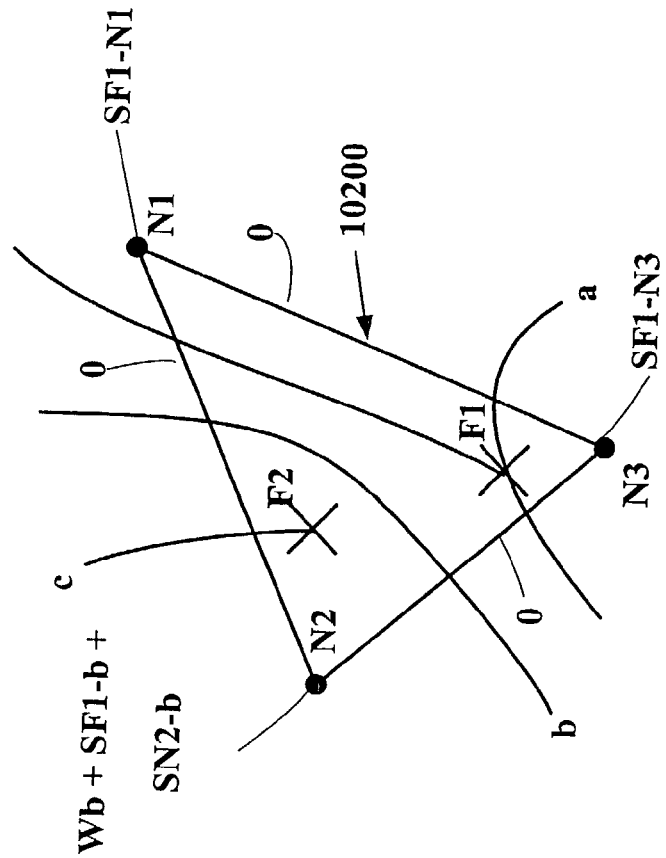

A face could also include a face item that is a Steiner point. FIG. 102 illustrates a face 10200 that is intersected by the routes of nets a, b, and c. This face includes two face items F1 and F2. Face item F1 is a Steiner point for a route of a net a, while face item F2 is a potential expansion of the route c into the face 10200. FIG. 102 illustrates the node and edge constraints for the face item F1, while FIG. 103 illustrates the node and edge constraints for the face item F2.

Constraints for Face Item that Connects to a Node in a Different Layer

The process 9100 treats all vias that start or end with a node as fixed vias. This is the case even for the via nodes that are moveable by the routability engine, which is further described below. In other words, as far as the process 9100 is concerned, vias that start or end with nodes are fixed entities.

Accordingly, when a via starts or ends with a node, the process 9100 does not specify node and edge constraints for the node in the face that contains the node. However, if the node forms a via by connecting to a face item above or below it, the process 9100 identifies constraining points and distances for the connected face item. The constraining points for such a face item are the nodes of the face containing the face item. The constraining distance to each node of the face is its node constraint.

Figure 104:
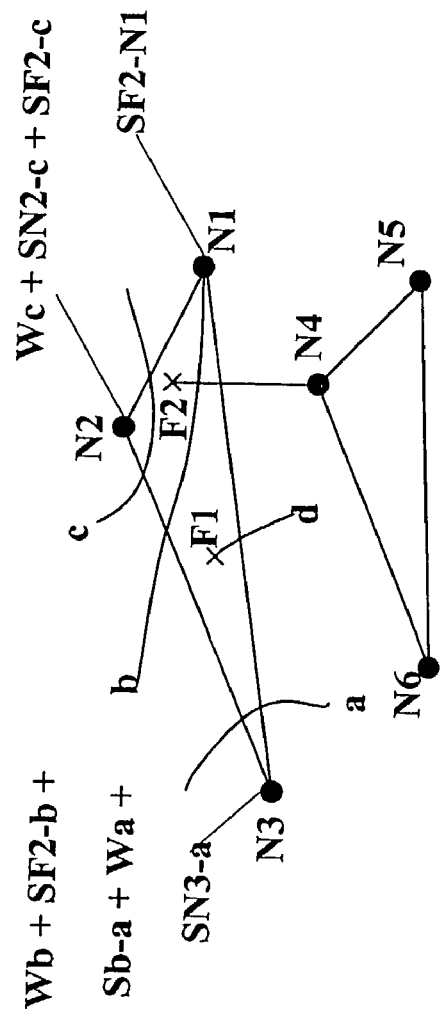

FIG. 104 illustrates an example of a via formed between a node N4 and a face item F2 that are on two different layers. The constraining points for the face item F2 are the nodes N1, N2, and N3. The constraining distance to each node N1, N2, or N3 is a node constraint for the face item F2 and the node. As illustrated in FIG. 104, the face item F2's (1) distance constraint for node N1 is SF2-N1, (2) distance constraint for node N2 is We+SF2-$c$+SN2-$c$, and (3) distance constraint for node N3 is Wb+SF2-$b$+SN3-$a$+Sb-$a$+Wa.

Figure 105:
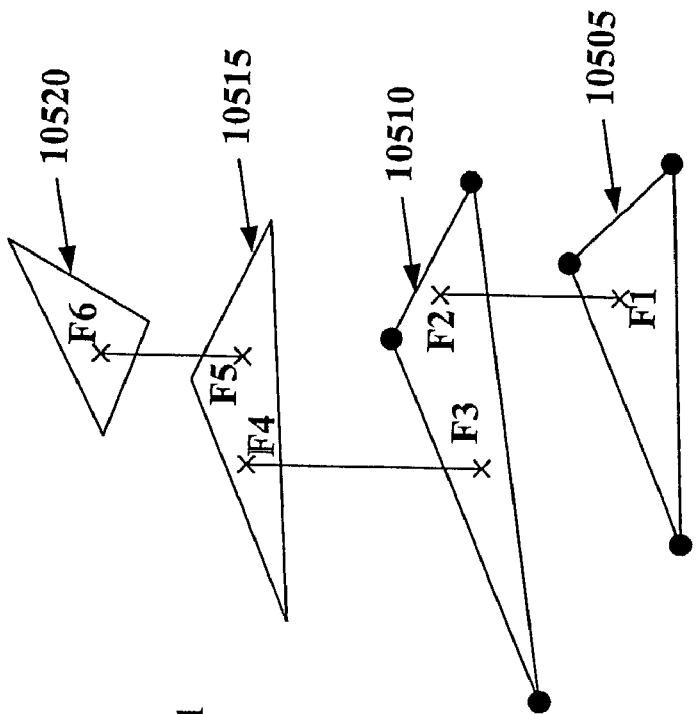

Constraints for Face Items in Faces Connected by Vias to Faces Involved with an Expansion A face item might exist on a face that connects through a via to a face involved with an expansion. FIG. 105 illustrates an example of such a face item. This figure illustrates a potential expansion between face items F1 and F2. The faces involved with this expansion are faces 10505 and 10510. Accordingly, the process 10500 would identify constraining points and distances for the face-item pair F1 and F2 and the face-item pair F3 and F4 on the faces 10505 and 10510. The process would also identify repulsion constraint specifying the minimum required distance between face items F2 and F3.

The face 10515 is a face that is not involved with the expansion but connects to face 10510 (which is involved with the expansion) through the via formed by face items F3 and F4. The process 9100 would treat face item F5 in face 10515 as a fixed face item. For the face item F4, it would compute a repulsion constraint that specifies the minimum required distance between the face items F4 and F5.

Identifying Node and Edge Constraints

In some embodiments, the process 9100 modifies (at 9110) the node and edge constraints for a face item in the following manner. The process traverses in a particular direction (e.g., counterclockwise) the edges of the face-item's face starting at the edge item on the edge connected to the face item. During its traversal of the edges, the process identifies the minimum required distance to the starting edge item for different points along its traversal.

In some embodiments, the process uses a stack to keep track of the minimum required distances as it traverses the edges. In traversing the edges, the process might encounter routes for three types of other nets. The first type does not connect to a face item within the face. The second type connects to a face item with a degree greater than one (i.e., connects to a face item that connects to more than one topological item on the face boundary). The third type connects to a face item with a degree one (i.e., connects to a face item that only connects to one topological item on the face boundary).

The process adds to the stack the required width plus spacing distances of the encountered routes for the first- and second-type nets when it encounters these routes for the first time while traversing the identified face's edges. The process removes from the stack the distances of each such route when it encounters the route for the last time while traversing the identified face's edges. When the process encounters a route for a third-type net while traversing the identified face's edges, the process does not add any space and width distance to the stack.

Additionally, when the process encounters either a second- or third-type route while traversing the edges, the process identifies and stores the required repulsion distance between the face item that it is currently examining and the face item that is connected to the encountered second- or third-type route.

The process 9100 sets the constraint for a node when it reaches the node while traversing the boundary of the identified face. The constraint for a node that does not connect to any route is the current value at the top of the stack plus the minimum required distance between the last edge item encountered and the node.

Identifying the constraint for a node that connects to a route is slightly more involved. When the process encounters such a node, it determines whether it is the last time that it will encounter the route connected to the node before completing its loop traversal about the identified faces edges.

If so, this node constraint is (1) the value on the stack after the removal from the stack of the spacing and width distances of net route that connects to the node, plus (2) the minimum required distance between the last edge item encountered and the node. If not, this node constraint is (1) the value on the stack before the addition to the stack of the spacing and width distances of net route that connects to the node plus (2) the minimum required distance between the last edge item encountered and the node.

Each time the process 9100 reaches a node, it also sets the constraint for the edge that it was just traversing to reach that node. This edge constraint is the smallest value that appeared at the top of the stack since the last node.

After identifying constraints at 9110, the process 9100 determines (at 9115) whether it needs to run an optimization process to identify the location of any face item within a face that is involved with the path expansion. The process needs to run an optimization process when at least one non-via face item, or at least one set of via face items, for which it generated a constraint is moveable within a legal region that is larger than a threshold amount.

If the process determines (at 9115) that it does not need to use the optimization process, it determines (at 9120) whether it identified at 9110 a legal region that was smaller than the threshold amount. If so, the process transitions to 9140, which is further described below. If not, the process transitions to 9135. For each face item that the process identified a set of constraints at 9110, the process determines (at 9135) whether the face item satisfies its set of constraints. If the process determines (at 9135) that all constraints are not met, it specifies (at 9140) the expansion as illegal, and then ends. On the other hand, if the process determines (at 9135) that all constraints are met, it specifies (at 9145) the expansion as legal, and then ends.

If the process determines (at 9115) that for at least one face item it has defined a region in which the face item can move, the process formulates (at 9125) a function to optimize. This function can include one or more sub-functions in some embodiments. Several different types of sub-functions are described below.

Sub-function for Non-Via Face Item in a Face Affected by an Expansion

For each non-via face item in a face involved with the expansion, the process 9100 specifies one sub-function based on the point and distance constraints that it identified (at 9110) for the face item. The sub-function takes the form of:

$$f = \sum_{p=1}^{P} \frac{r_p}{d_p},$$

where p is a variable that represents a point in the set of constraining points for the face item, P is the final point in the set, $d_p$ represents the distance from a variable x,y location of the face item to the current point p, and $r_p$ represents the identified minimum constraining distance to the point p. This sub-function varies with the x,y location of the face item in the region identified for it at 9110. Region 9500 of FIG. 95 is an example of such a region for a non-via face item in a face affected by the expansion. As further described below, the optimizer searches through this region and specifies an x,y location of the face item.

Sub-function for Via-Forming Face Item in a Face Affected by an Expansion

For a face item that forms a via with a node (i.e., a face item that has a fixed position for the process 9100), the process 9100 identifies a sub-function that has the same form:

$$f = \sum_{p=1}^{P} \frac{r_p}{d_p},$$

where p is a variable that represents a point in the set of constraining points for the face item, P is the final point in the set, $d_p$ represents the distance from the fixed x,y location of the face item to the current point p, and $r_p$ represents the identified minimum constraining distance to the point p. This sub-function is a constant because its x,y location is fixed, and so is its distance $d_p$ from each of its constraining points. Face item F2 of FIG. 104 is an example of such a fixed face item. When a via is formed by first and second face items in first and second layers and a node in a third layer, the sub-function is similar to the one described above, except that the set of constraining points and distances include points and distances that constrain both face items.

For a set of face items that form a moveable via, the sub-function again has the form:

$$f = \sum_{p=1}^{P} \frac{r_p}{d_p}. \tag{6}$$

In this equation, p is a variable that represents a point in the set of constraining points for all the face items, P is the final point in the set, and $r_p$ represents the identified minimum constraining distance to the point p. In this sub-function, $d_p$ represents the distance from the x,y location of the current point p to a variable x,y location of the via (i.e., of the set of face items) within its region, which is an intersection of the legal region of each of the via's face items. Region 10100 of FIG. 101 is an example of such a region for a via that is formed by the face items F2, F3, and F4 of faces 9600, 9700, and 91030 of FIGS. 96, 97, and 98. As further described below, the optimizer searches through this region 10100 and specifies an x,y location for the via formed by the face items F2, F3, and F4.

Sub-function for Two face items in the same face

When a face examined by the process 9100 includes two face items, the process specifies a sub-function for expressing the repulsion constraint between the two face items. This sub-function $f_{1,2}$ is as follows, $$f_{1,2} = \frac{r_{1 \text{ to } 2}}{g_{1 \text{ to } 2}}, \quad (7)$$

where $d_{1to2}$ represents the distance from the x,y location of face item 1 to the x,y location of face item 2, and $r_{1to2}$ represents the identified minimum required distance between the two face items.

When both face items are moveable, the x,y location for both face items can vary within regions defined for them. For the two face items F2 and F3 illustrated in FIG. 105, Equation (7) above can be used to specify a sub-function $f_{2,3}$. In this example, the face item F2 can be at any x,y location within the region that is obtained by intersecting the legal region for face items F1 and F2, while the face item F3 can be at any x,y location within the region that is obtained by intersecting the legal region for face items F3 and F4. Also, in this example, $r_{2to3}$ represents the identified minimum required distance between face items F2 and F3.

In Equation (7), a face item's x,y location is fixed when it forms a via with a node. For example, for the two face items F1 and F2 illustrated in FIG. 104, Equation (7) above can be used to specify a sub-function $f_{1,2}$. In this example, the face item F1 can be at any x,y location within its legal region, while the face item F2 has a fixed x,y location defined as the x,y location of node N4. In this example, $r_{1to2}$ represents the identified minimum required distance between face items F1 and F2.

In Equation (7), a face item's x,y location is also fixed when the face item is on a face that (1) is not involved with a path expansion but (2) connects through a via formed by another face item to a face that is involved with an expansion. For instance, face item F5 in FIG. 105 illustrates one such face item. This face item F5 is on a face 10515 that is not involved with the path expansion from F1 to F2 but connects to face, which is involved with this path expansion. The process 9100 would use Equation (7) to specify a sub-function $f_{4,5}$, which expresses the repulsion constraint between face items F4 and F5. In this example, the face item F4 can be at any x,y location within the region that is the intersection of the legal region for face item F3 and F4, while the face item F5 has a fixed x,y location that is its previously defined position. In this example, $r_{4to5}$ represents the identified minimum required distance between face items F4 and F5.

At 9125, the process 9100 formulates the cost function as a sum of all sub-functions that it specifies to express the location and repulsion constraints for the face items in the faces involved with the path expansion. For instance, the process specifies the following function for the example illustrated in FIG. 105.

$$f = f_1 + f_3 + f_{2,3} + f_{4,5}.$$

In this function, (1)$f_1$ is a sub-function according to Equation (6) for specifying a cost based on the location of the via formed by face items F1 and F2, (2)$f_3$ is a sub-function according to Equation (6) for specifying a cost based on the location of the via formed by face items F3 and F4, (3)$f_{2,3}$ is a sub-function according to Equation (7) for specifying a cost based on the repulsion between face items F2 and F3, and (4)$f_{4,5}$ is a sub-function according to Equation (7) for specifying a cost based on the repulsion between face items F4 and F5.

The function formulated at 9125 can be just one sub-function. For instance, the function is just the sub-function express by Equation (7) when the path expands to a non-via face item in a face with only one face item. This is the case for the example illustrated in FIG. 93. Also, the cost-function formulation approach described above works for the embodiments that allow more than two face items in a face. The cost function in these embodiments would typically have more sub-functions as there are more location and repulsion constraints to consider.

After formulating the cost function at 9125, the process 9100 (at 9130) has a minimizer search through the legal region of each moveable non-via face item or set of via-forming face items to identify an x,y location for each face item that minimizes the function. In some embodiments, the process 9100 uses the method of steepest descent for the minimization operation. This method is discussed in Numerical Recipes in C: The Art of Scientific Computing, by William Press, et al., Second Edition (1992).

After performing the minimization operation, the process 9100 determines (at 9135) whether the location identified for each face item satisfies the point, distance, and/or repulsion constraints identified for it. Specifically, the process determines whether each face item is away from each of its constraining points by at least the required minimum distance for that point. Also, if the face item is in a face with another face item, the process determines whether the face items are away from each other by at least their minimum required distance. If a face item does not satisfy its distance or repulsion constraint, then the process 9100 transitions to 9140 to specify as illegal the expansion that triggered the via check. Otherwise, the process specifies (at 9145) the expansion as legal.

(2nd) Non-Optimization Technique

FIG. 92 illustrates a process 9250 that performs a simpler via-checking operation than the process 9100 of FIG. 91. Some embodiments that use this process limit each face to have at most one face item. This process initially determines (at 9255) whether the face that contains the destination node, face item, or edge item has a face item within it. When the destination item is part of several faces, some embodiments execute the process 9250 for each face, and specify an expansion as illegal when the expansion fails the via-legality check for just one of these faces. On the other hand, like the process 9100 of FIG. 91A, other embodiments might not examine each face that contains the destination item, but rather might only examine the expansion face as defined above for 9105.

If the process 9250 determines (at 9255) that a face that contains the destination item does not contain a face item, the process ends as a via-check is unnecessary. Otherwise, the process computes (at 9260) the bounding polygon of the face item. Some embodiments compute this polygon by computing the closest point to each node on each edge of the face that the face item can be (i.e., the node, offset along the edge by the flow on that edge between the node and the face item).

Next, the process computes (at 9265) the intersection of the face item's bounding polygon with via destination (if any) in the layer above or below. The process then examines (at 9270) the size of the intersection to determine whether there is sufficient space for the face item. If the intersection is too small, then the process determines (at 9275) that the expansion is not legal, resets (if necessary) the face-item's bounding polygon to its original shape before 9260, and then ends. If the intersection is big enough for the face-item, the process indicates (at 9280) via-check legality, and then ends.

(iii) Planarity Check

As indicated in FIG. 90, the planarity check is performed for four of the expansions. For the node to node expansion, the planarity check simply ensures that there is no route crossing the shared edge between two nodes. All other planarity checks are performed by traversing the linked list of edges from the source towards the destination node/edge, checking that no other net's route blocks a direct connection between the source and destination items of the path expansion.

(6) Cheapest Path Calculation

Figure 106:
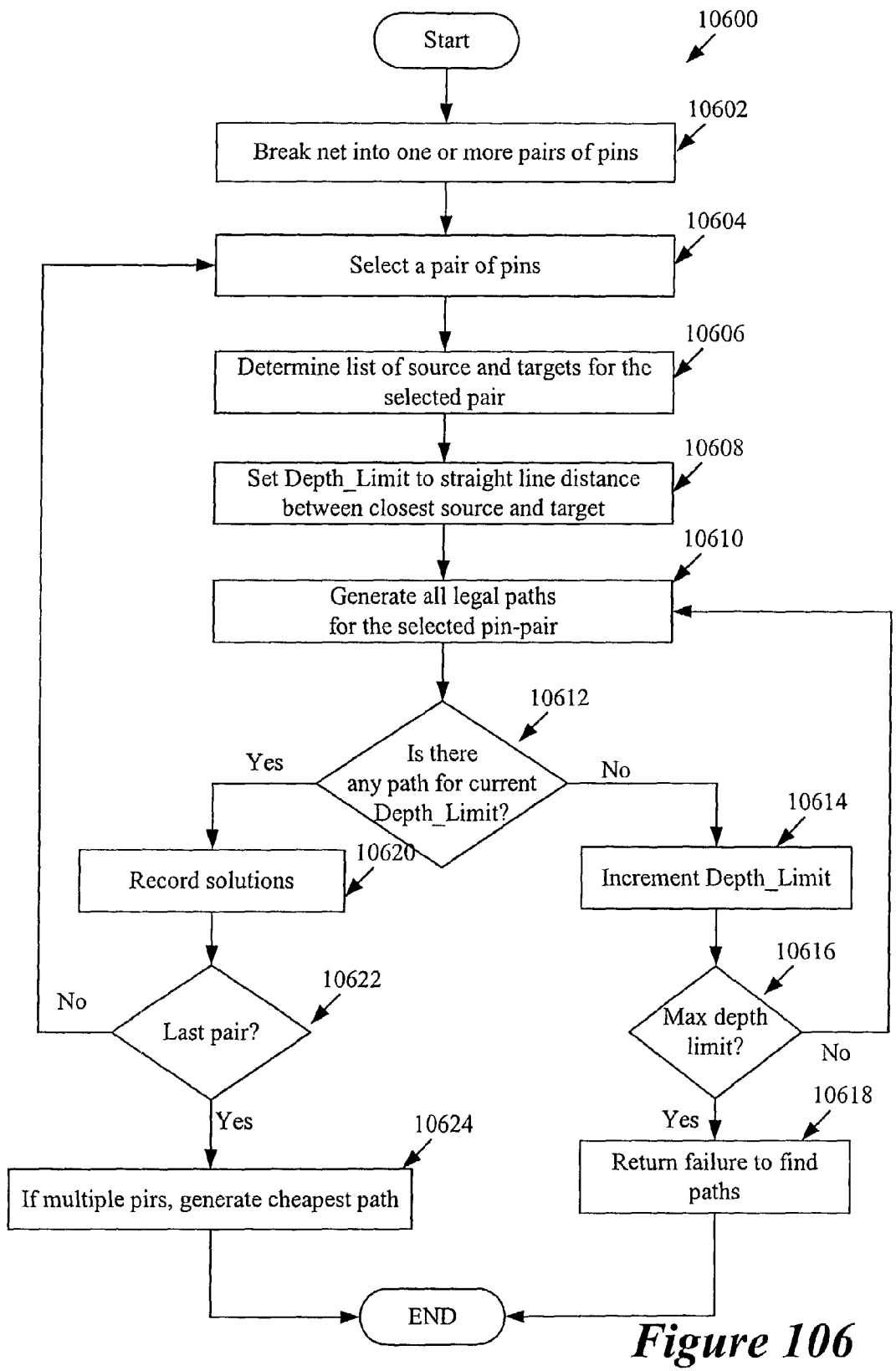
FIG. 106 illustrates a process for computing the cheapest-route cost for a net.

FIG. 106 illustrates a process for computing the cheapest-route cost for a net. As shown in FIG. 106, the process 10600 initially identifies (at 10602) one or more pairs of pins for the net. It then selects (at 10604) a pair of pins for the net. The process next identifies (at 10606) a list of source and target port-geometries for the selected pair of pins of the net.

The process then identifies (at 10608) a Depth_Limit for generating routing path between the source and target geometries. In the embodiments described below, the Depth_Limit is set to the shortest distance between the closest source and target geometries. After 10608, the process generates (at 10610) all legal paths between the source and target geometries identified at 10606. At 10610, the process 10600 can use a path-generating process similar to the one described above by reference to FIG. 84.

After 10610, the process determines (at 10612) whether it was able to generate (at 10610) any legal path between the source and target geometries. If not, the process increments (at 10614) the Depth_Limit. The process then determines whether the Depth_Limit exceeds a maximum depth limit. If so, the process indicates (at 10618) failure to route the net. Otherwise, the process transitions to 10610 to generate legal paths between the source and target geometries for the Depth_Limit incremented at 10614.

If the process determines (at 10612) that it was able to generate (at 10610) a legal path between the source and target geometries, the process records (at 10620) the generated path or paths and the cost for each path. The process then determines (at 10622) whether it has examined the last pin-pair identified at 10602. If not, the process transitions back to 10604 to select the next pin-pair.

On the other hand, if the process determines that it has examined all the pin-pairs, the process (at 10624) identifies the cheapest routes for the net, and records the costs of this route. When the net has more than two pins in the sub-region, the process 10600 generates more than one set of paths for more than one set of pin-pairs. In such a situation, the process has to identify (at 10624) the cheapest combination of paths for the different pin-pairs to generate the cheapest route. The process 10600 identifies the cheapest combination of paths in the same manner as described above for process 8200 at 8232. After 10632, the process ends.

D. Routability Checking

At 315, the process 300 determines whether the topological routes identified at 310 are geometrically routable (i.e., whether there exists a design-rule-correct geometric route for each identified topological route). If so, the detail-routing process embeds the generated topological routes at 320, which is further described below. If not, this process initially directs the topological router to generate additional topological routes that are more-likely to have design-rule-correct geometric routes. As mentioned above, if the topological router repeatedly fails to generate geometrically routable topological routes, the detail-routing process flags one or more nets as unroutable, re-defines topological routes for some or all the nets, and then transitions to 320 to embed the generated topological routes.

Figure 107:
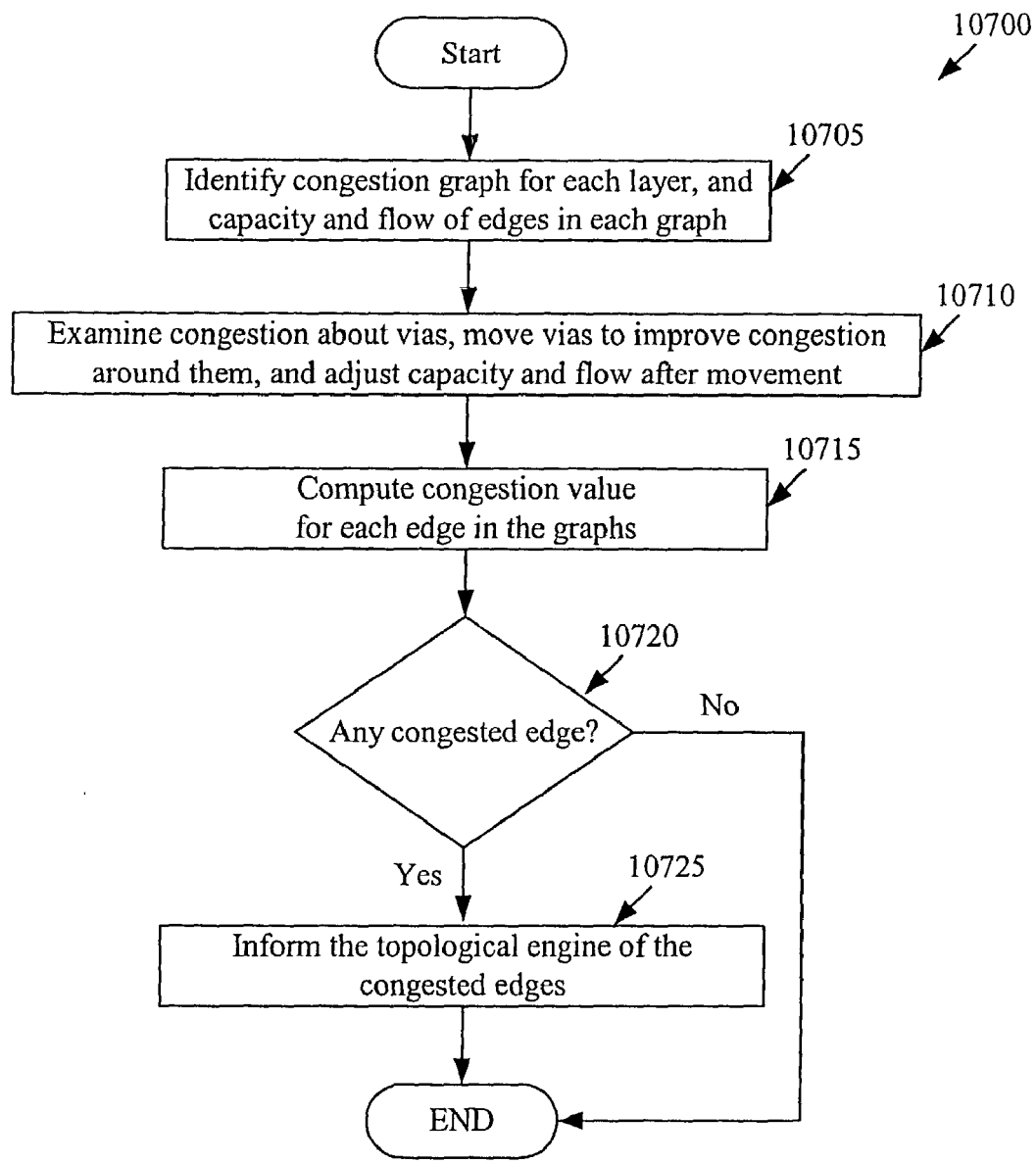
FIG. 107 conceptually illustrates a process performed by a routability engine in some embodiments of the invention.

In some embodiments, the routability checking is performed by a routability engine that initially reduces wiring congestion by moving vias, and then determines whether the identified topological routes are geometrically routable. FIG. 107 conceptually illustrates a process 10700 performed by this routability engine in some embodiments of the invention.

As shown in this figure, the routability process 10700 initially identifies (at 10705) a congestion graph for each layer of the IC sub-region being routed. Each graph includes a number of edges that are used to quantify the congestion in the IC sub-region. The routability process also determines (at 10705) the capacity and flow across each edge. Several manners of constructing congestion graphs and defining their edge capacity and flow are described below.

After identifying congestion graphs and determining the capacity and flow of edges in these graphs, the process 10700 tries (at 10710) to reduce congestion in the layout by examining the congestion about the moveable vias and moving some or all the moveable vias to improve congestion around them. One process for performing this will be described below.

Next, the process 10700 computes (at 10715) a congestion value for each congestion edge in each congestion graph. The process then determines (at 10720) whether any of the congestion-graph edges are over congested. If not, the process ends. If so, the process directs (at 10725) the topological engine to revise some of the topological routes to alleviate the congestion of the identified over-congested routes, and then ends. The operations of 10715-10725 will be further described below.

1. Congestion Graphs.

a. Defining Congestion Graphs.

Different embodiments of the invention construct different congestion graphs to measure the congestion in the IC sub-region being routed. For instance, some embodiments construct a visibility graph for each sub-region layer, while other embodiments generate for each layer a graph that is an approximation of the visibility graph (an "approximated visibility graph").

Some embodiments construct a visibility graph for a layer by taking the triangulated graph for the layer and adding additional visibility edges. For instance, in some embodiments, the visibility graph includes a node for each corner of its sub-region layer and each point of a port or obstacle geometry, vpin, and vias. These embodiments then define an edge between every two nodes that have an unobstructed view of (i.e., an unobstructed path to) each other. For each node, these embodiments also define an edge for each unobstructed projection of the node onto each of its layer's bounding sides.

Other embodiments construct an approximate visibility graph for each sub-region layer. Some embodiments construct such a graph for each layer by duplicating the triangulated graph of the layer and adding additional edges about the nodes of the duplicated triangulated graph. Specifically, for each particular node in the triangulated graph, these embodiments identify the faces adjacent to the particular node. For each identified face that is a boundary face (i.e., a face that has a portion of the layer's boundary as one of its edges), a new edge is defined for the projection onto the boundary of the face's node that is not on the boundary. On the other hand, for each identified face that is not a boundary face, these embodiments identify the other face ("opposing face") that shares the edge that is opposite to the particular selected node. If the identified and opposing faces form a convex quadrangle, these embodiments then determine whether the identified edge between these two faces can be flipped. If so, a new flipped edge is defined (i.e., an edge is defined between the particular selected node and the opposing face's node that is not on the shared edge). This new-flipped edge results in two new faces that connect to the selected particular node. This process is repeated for all the identified and resulting faces to define additional edges that connect the particular node to other nodes "visible" to it.

b. Computing Capacity and Flow for Each Congestion Graph Edge.

A layer's visibility or approximate visibility graph takes the layer's triangulated graph and adds additional edges. In both cases, the capacity and flow of each edge that is part of a triangulated graph were previously computed during the topological routing process as described above. On the other hand, the routability engine has to compute the capacity of each congestion-graph edge that is unique to this graph (i.e., each edge that is not in the corresponding triangulated graph). The capacity of an edge that is unique to a visibility or approximate visibility graph can be computed by performing the operations described above by reference to FIGS. 19 and 20.

The routability engine also has to compute the flow of each unique-congestion graph edge (i.e., each edge that is not in the corresponding triangulated graph but is only in the congestion graph). For both the visibility and approximate visibility graph, the flow of each unique congestion-graph edge can be computed based on the flow of the edges that surround and/or intersect the unique congestion-graph edge. When only two edges surround the unique congestion-graph edge (such as when the unique congestion-graph edge represents the projection of a boundary-face node onto a boundary), the flow of the unique congestion-graph edge can be derived from the flow of the two surrounding edges.

On the other hand, the unique congestion-graph edge can be shared by two faces that form a quadrangle. The unique-congestion graph edge is one of the diagonal edges of such a quadrangle. The quadrangle can have another diagonal edge that intersects the unique congestion-graph edge. When the unique congestion-graph edge is shared by two faces, the process for performing this computation for a visibility graph is recursive. This is because one or more of the edges that surround or intersect a unique congestion-graph edge might themselves be unique congestion-graph edges. On the other hand, the flow of each unique non-boundary, congestion-graph edge in the approximate visibility graph can be computed non-recursively, since the flow of each unique congestion graph edge can be defined based on the previously-computed flows of its surrounding and intersecting edges.

2. Reducing Congestion.

As mentioned above, the process 10700 tries (at 10710) to reduce congestion in the layout after identifying congestion graphs and identifying the capacity and flow of edges in these graphs. Specifically, at this stage, the routability engine examines the congestion about the moveable vias to determine whether it can move some moveable vias to improve congestion. In some embodiments, vias that are not formed by port-geometry nodes are moveable, while those that are partially or completely formed by port-geometry nodes are not moveable. In other embodiments, even vias that are formed by port-geometry nodes are moveable. For instance, some embodiments define a number of discrete via-node locations in some or all port-geometry nodes. Accordingly, in these embodiments, the routability engine can move a via that connects to such a port geometry to different via-node locations of the port geometry, so long as the move is viable.

Figure 108:
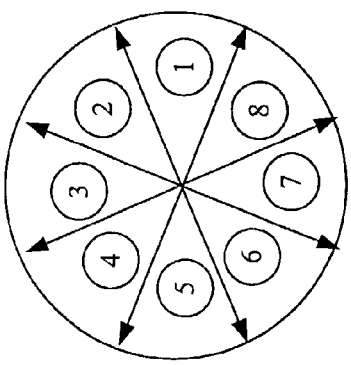
FIG. 108 illustrates eight sectors that are defined around a via based on eight routing directions of an octilinear wiring model.

To examine congestion about vias, the routability engine defines a congestion sector for each the legal routing direction. FIG. 108 illustrates eight such sectors that are defined around the eight routing directions of the octilinear wiring model illustrated in FIG. 1. As mentioned above, some embodiments define an edge's capacity based on the projection of the edge's capacity vector onto the closest legal routing direction. Accordingly, each sector in FIG. 108 identifies one type of projection of the edge-capacity vector.

In other words, (1) sector one identifies the projection onto the 0° routing direction of the capacity vectors with directions between ±22.5, (2) sector 2 identifies the projection onto the 45° routing direction of the capacity vectors with directions between 22.5°and 67.5°, (3) sector 3 identifies the projection onto the 90° routing direction of the capacity vectors with directions between 67.5°and 112.5, (4) sector 4 identifies the projection onto the 135° routing direction of the capacity vectors with directions between 112.5°and 157.5°, (5) sector 5 identifies the projection onto the 180°routing direction of the capacity vectors with directions between 157.5°and 202.5°, (6) sector 6 identifies the projection onto the 225° routing direction of the capacity vectors with directions between 202.5° and 247.5, (7) sector 7 identifies the projection onto the 270° routing direction of the capacity vectors with directions between 247.5° and 292.5, and (8) sector 8 identifies the projection onto the 315° routing direction of the capacity vectors with directions between 292.5° and 337.5. Other embodiments might define the eight sectors differently. For instance, some embodiments might use the approach illustrated in FIG. 20B to define the eight sectors and associate each of these eight sectors to one of the eight routing directions of the wiring model of FIG. 1 (e.g., associate the 90° routing directions with the sector between 90−α° and 90+α° associate the 225°routing directions with the sector between 180+α° and 270−α°).

Figure 109:
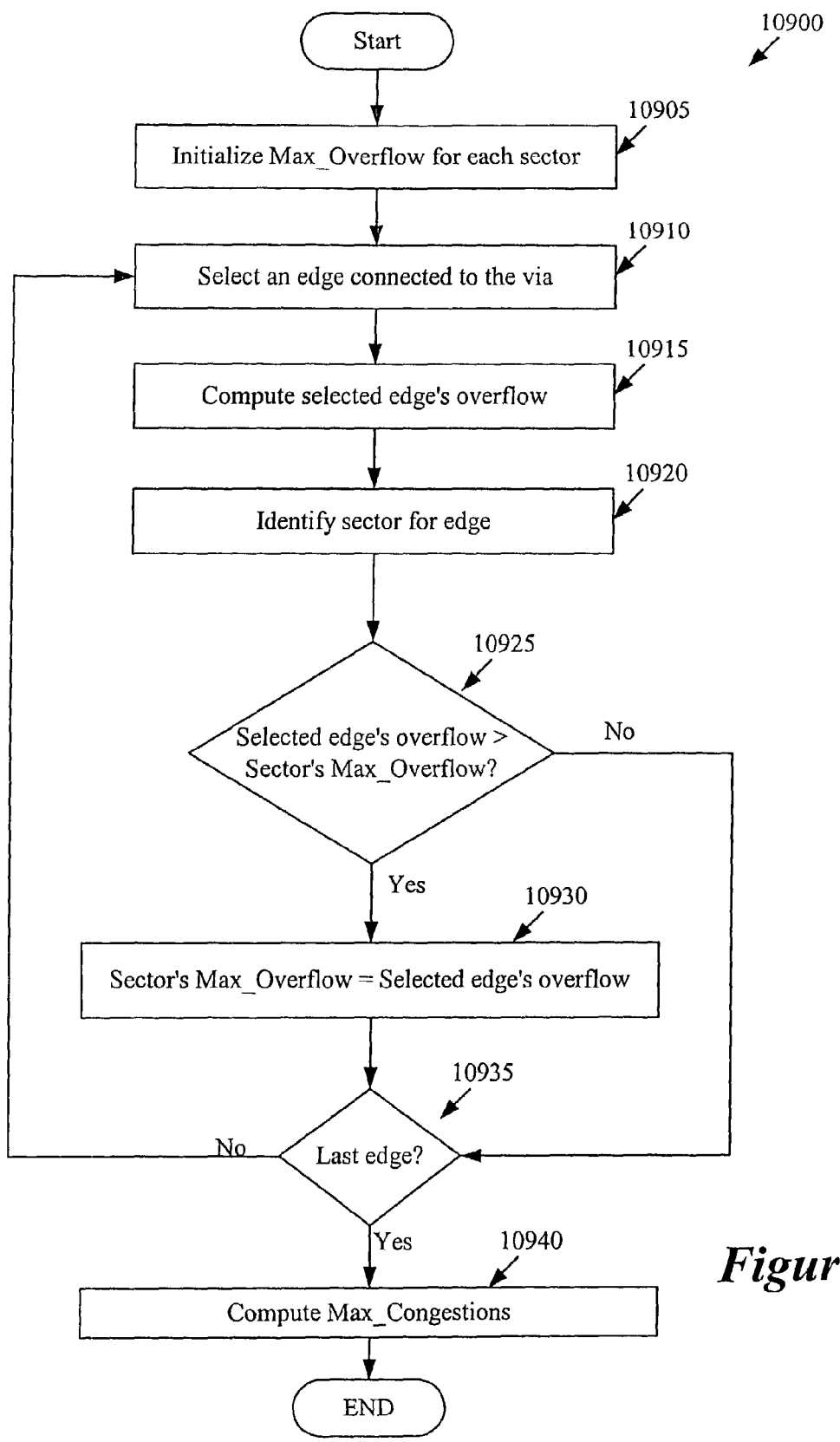
FIG. 109 illustrates a process for measuring the sector congestion about a via.

FIG. 109 illustrates a process 10900 for measuring the sector congestion about a via. Some embodiments perform this process for all layers of the sub-region at once. As shown in FIG. 109, the process 10900 initializes (at 10905) a Max_Overflow variable for each congestion sector about the moveable via. For instance, when the process 10900 uses the congestion sectors identified in FIG. 108, its initializes eight Max_Overflow variables at 10905. In some embodiments, the process 10900 initializes each Max_Overflow to a large negative number.

The process then selects (at 10910) one of the edges that connects to the via's node on the congestion graph of one of the sub-region layers. It next computes (at 10915) an overflow value for the edge selected at 10910. Some embodiments calculate the selected edge's overflow value as the edge's flow minus its capacity.

At 10920, the process then identifies the sector for the edge's capacity vector. The identification of an edge's capacity vector was described above by reference to FIGS. 19 and 20. Also, the sector of the capacity vector can be identified based on the direction of the capacity vector, as mentioned above by reference to FIG. 108.

Next, the process determines (at 10925) whether the selected edge's overflow is greater than the Max_Overflow of its capacity vector's sector. If not, the process transitions to 10935, which will be described below. Otherwise, the process defines the identified sector's Max_Overflow equal to the selected edge's overflow.

The process then determines (at 10935) whether it has examined all the edges (on all the layers) that connect to the via. If not, the process returns to 10910 to select another edge to examine for the via. When the process 10900 determines that has examined all the edges that connect to the via, it then computes (at 10940) eight Max_Congestions, and then ends.

Figure 110:
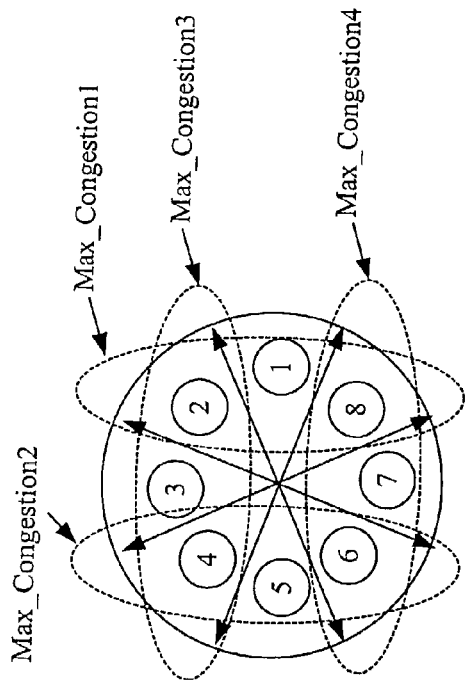
Figure 111:
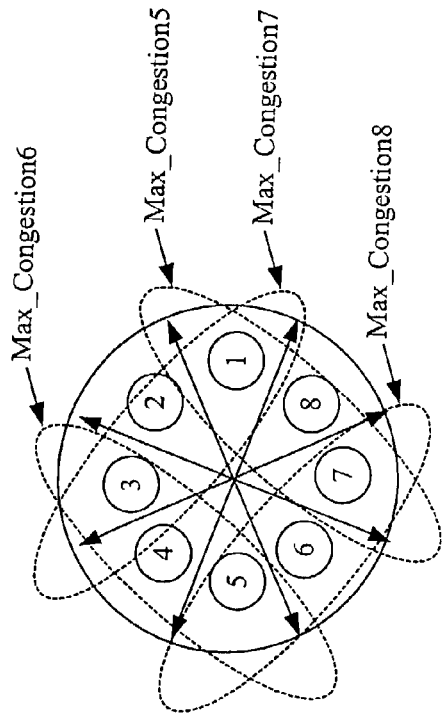
FIG. 111 illustrates four sets of adjacent 45° sectors.

Each Max_Congestion is the largest Max_Overflow among three adjacent sectors. FIG. 110 illustrates four sets of adjacent Manhattan sectors, while FIG. 111 illustrates four sets of adjacent 45° sectors. Accordingly, each Max_Congestion value is defined along one of the octilinear directions.

More specifically, FIG. 110 illustrates (1) a Max_Congestion1 that quantifies the congestion in the positive x-direction in the Manhattan axis, (2) a Max_Congestion2 that quantifies the congestion in the negative x-direction in the Manhattan axis; (3) a Max_Congestion3 that quantifies the congestion in the positive y-direction in the Manhattan axis; and (4) a Max_Congestion4 that quantifies the congestion in the negative y-direction in the Manhattan axis.

FIG. 111 illustrates (1) a Max_Congestion5 that quantifies the congestion in the positive x-direction in the 45° axis; (2) a Max_Congestion6 that quantifies the congestion in the negative x-direction in the 45° axis; (3) a Max_Congestion7 that quantifies the congestion in the positive y-direction in the 45° axis; (4) a Max_Congestion8 that quantifies the congestion in the negative y-direction in the 45° axis.

To identify the particular Max_Congestion value for a particular set of sectors, two of the three Max_Overflow values have to be projected onto the particular octilinear direction corresponding to the particular Max_Congestion value. For instance, the Max_Congestion 1 value for sectors 1, 2, and 8, which are defined about the x-direction in the Manhattan axis, is defined as the largest value among (1) the Max_Overflow value of sector 1, (2) the projection of the Max_Overflow of sector 2 onto the x-direction in the Manhattan axis, and (3) the projection of the Max_Overflow of sector 8 onto the x-direction in the Manhattan axis. Similarly, the Max_Congestion5 value for sectors 1, 7, and 8, which are defined about the x-direction in the 45° axis, is defined as the largest value among (1) the Max_Overflow value of sector 8, (2) the projection of the Max_Overflow of sector 1 onto the x-direction in the 45° axis, and (3) the projection of the Max_Overflow of sector 7 onto the x-direction in the 45° axis.

Once the process 10900 computes the Max_Congestions, the routability engine can determine whether it can move the via. Some embodiments perform process 10900 for all or some of the moveable vias, before attempting to move some of them. However, the embodiments described below perform process 10900 for one moveable via, and then determine whether to move the via, before performing process 10900 for another moveable via.

Based on the computed Max_Congestions, the routability engine determines whether it can move the via. Specifically, the routability engine makes this determination by examining corresponding pairs of Max_Congestion values. Each pair relates to two opposite directions on the Manhattan or 45° axis. For the Manhattan axis, one corresponding pair includes the Max_Congestion1 and Max_Congestion2 for the positive and negative x-axis directions, while the other pair includes the Max_Congestion3 and Max_Congestion4 for the positive and negative y-axis directions. For the 45° axis, one corresponding pair includes the Max_Congestion5 and Max_Congestion6 for the positive and negative x-axis directions, while the other pair includes the Max_Congestion7 and Max_Congestion8 for the positive and negative y-axis directions.

Some embodiments use the following criteria to determine whether a move is possible in a particular axis direction of the Manhattan or 45° axis. If the corresponding pair of Max_Congestions for a particular axis direction (e.g., for the positive and negative Manhattan x-directions) are both positive, the via is not moved in either direction specified by the pair (e.g., it is not moved in the positive or negative Manhattan x-directions).

On the other hand, when one Max_Congestion of a corresponding Max_Congestion pair (e.g., the total for the positive Manhattan x-direction) is negative, while the other (e.g., the total for the negative Manhattan x-direction) is positive, the via can be moved in the direction with the negative Max_Congestion (e.g., in the positive Manhattan x-direction) until one of the Max_Congestions for the pair is 0. When the corresponding pair of Max_Congestions for a particular axis direction (e.g., for the positive and negative Manhattan x-directions) are both negative, the via can be moved in the direction with the more negative Max_Congestion until both Max_Congestions are equal.

As mentioned above, some embodiments define the edge capacity and flow in terms of the edge length and net width, which, in turn, makes distance the unit for quantifying congestion. Accordingly, in these embodiments, the amount of a via move is directly specified by the congestion values. For instance, when the Max_Congestion of the +x-axis Manhattan direction is 25 while that of the −x-axis Manhattan direction is −75, the via can be moved in the −x-axis direction by 50 units. In some embodiments, each unit is to equal to the IC-manufacturing-grid unit.

Based on the criteria recited above, the routability engine examines the potential for moving the via on each axis of the Manhattan and 45° coordinate systems. If the routability engine determines that the via movement is only possible within one of the coordinate systems, then the routability engine moves the via according to the potential x- and/or y-axis of this coordinate system.

On the other hand, if the routability engine determines that the via movement is possible within both coordinate systems, it identifies the best coordinate system for the movement. For each particular pair of corresponding directions in the Manhattan and 45° coordinate systems, some embodiments compute a balance factor that measures the difference in Max_Congestions of the particular pair after the potential move in the axis direction of the pairs. For each coordinate system, these embodiments then generate an overall balance factor that combines the two balance factors for the two axis directions of the coordinate system. Some embodiments generate the overall balance factor of a coordinate system by summing up the balance factors for the x- and y-axes directions. The routability engine then picks the via movement in the coordinate system with the better overall balance factor.

After moving a via, the routability engine has to recompute the capacity and flow of edges that connect to the via on any layer of the sub-region. The operations for computing the capacity and flow of an edge are identical to those discussed above for the topological router.

The process for reducing congestion by moving vias can be performed several times. Some embodiments perform several such iterations, because each iteration might move one or more vias, which, in turn, would affect the congestion of nearby edges, which, in turn, might allow or necessitate additional via movements.

3. Computing Congestion and Interacting with Topological Router

After moving vias to reduce congestion, the routability process 10700 computes (at 10715) a congestion value of each edge in the congestion graphs. In some embodiments, the congestion value equals the edge's capacity minus the edge's flow. The routability process then examines (at 10720) the computed congestion values to identify any edge that is congested. In some embodiments that compute the congestion value as the edge's capacity minus the edge's flow, the congested edges are the ones with the negative congestion values.

If the process identifies no congested edges, it ends. However, if it identifies congested edges, the process directs (at 10725) the topological engine to revise some of the topological routes to alleviate the congestion of the identified over-congested routes, and then ends. In different embodiments, the routability and topological engine interact in different ways to identify other topological routes. In some embodiments, the routability engine needs to identify the edges that are congested to the topological engine. In some of these embodiments, the congested edges are often the edges that are unique congestion-graph edges (i.e., are edges that are not in the topological router's triangulated graphs). Hence, in some embodiments, the routability engine needs to relay to the topological router the congestion problem without referring to unique congestion-graph edges that are not used by the topological router.

Figure 112:
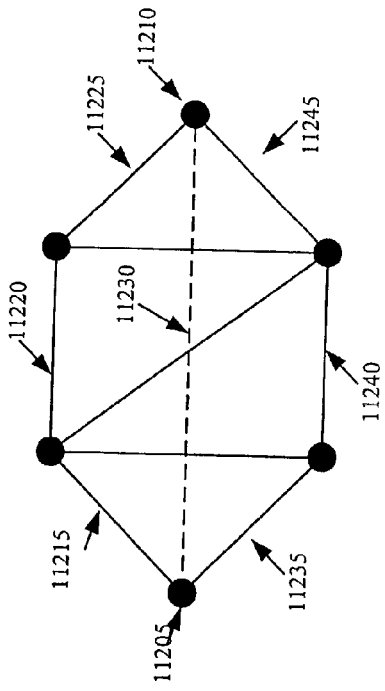
FIG. 112 illustrates a unique-congestion graph edge that is between two nodes.

In some embodiments, the routability engine conveys the congestion problem of a unique congestion-graph edge by identifying the triangulated-graph edges that connect the same endpoints as the unique congestion-graph edge. For instance, FIG. 112 illustrates a unique-congestion graph edge 11230 that is between two nodes 11205 and 11210. When the edge 11230 is over congested, the routability engine needs to inform the topological router of this congestion but it cannot refer to edge 11230, which is not part of the triangulated graph used by the topological router. Hence, in place of 11230, the routability engine identifies triangulation-graph edges 11215, 11220, and 11225 that connect the same endpoints as the unique congestion-graph edge. The routability engine can identify triangulation-graph edges 11235, 11240, and 11245 as well. In some embodiments, the routability engine also specifies the maximum flow across the identified triangulation-graph edges, where this maximum flow corresponds to the capacity of the congestion graph edge 11230.

The topological router can then use the edge-identity information in several ways. For instance, it can reduce the flow of the identified edges and then identify topological routes for the nets that previously crossed the identified edges. Alternatively, for each particular triangulation-graph edge, the topological router keeps in some embodiments a record of the number of other edges that need to be analyzed with the particular edge during the edge-capacity-checking operations of the route generation process. Accordingly, when the routability engine identifies a set of edges that need to be collectively analyzed in order to capture the congestion of a particular congestion-graph edge, the topological router stores the identified set (once for all edges in the set or once for each edge in the set); each time a path tries to cross one of the edges in the set, the path generation process not only checks the edge's individual capacity, but also compares the remaining capacity of all the edges with the specified capacity of the congestion-graph edge.

If the topological router repeatedly fails to generate geometrically routable topological routes for a particular set of edges, the routability engine flags one or more nets as unroutable, directs the topological router to define routes the remaining nets crossing the set of edges, and then transitions to 320 to embed the generated topological routes.

E. Geometric Engine

After the routability checking, the process 300 generates geometric routes and stores these routes in a detail-routing storage structure (such as a database). A geometric routing engine generates and embeds geometric routes. In order to generate the geometric routes, the geometric engine in some embodiments generates a new routing representation for each topological route in the sub-region. The new routing representation is one that is design-rule correct (i.e., a representation that complies with the design rule spacing and positioning).

In some embodiments, the geometric engine generates the design-rule-correct routes by referring to path-defining edges. These edges are specified about vpins, vias, ports, and obstacles in directions that constrain the embedding of geometric routes about obstacles and unrelated vpins, vias, and ports. In some embodiments, the geometric engine performs four operations to generate the design-rule-correct routes for topological routes on a layer. These operations are explained for the octilinear wiring model of FIG. 1. This wiring model has four constraining angles, $\pm 22.5°$ and $\pm 67.50$, that constrain the embedding of geometric routes.

Figure 113:
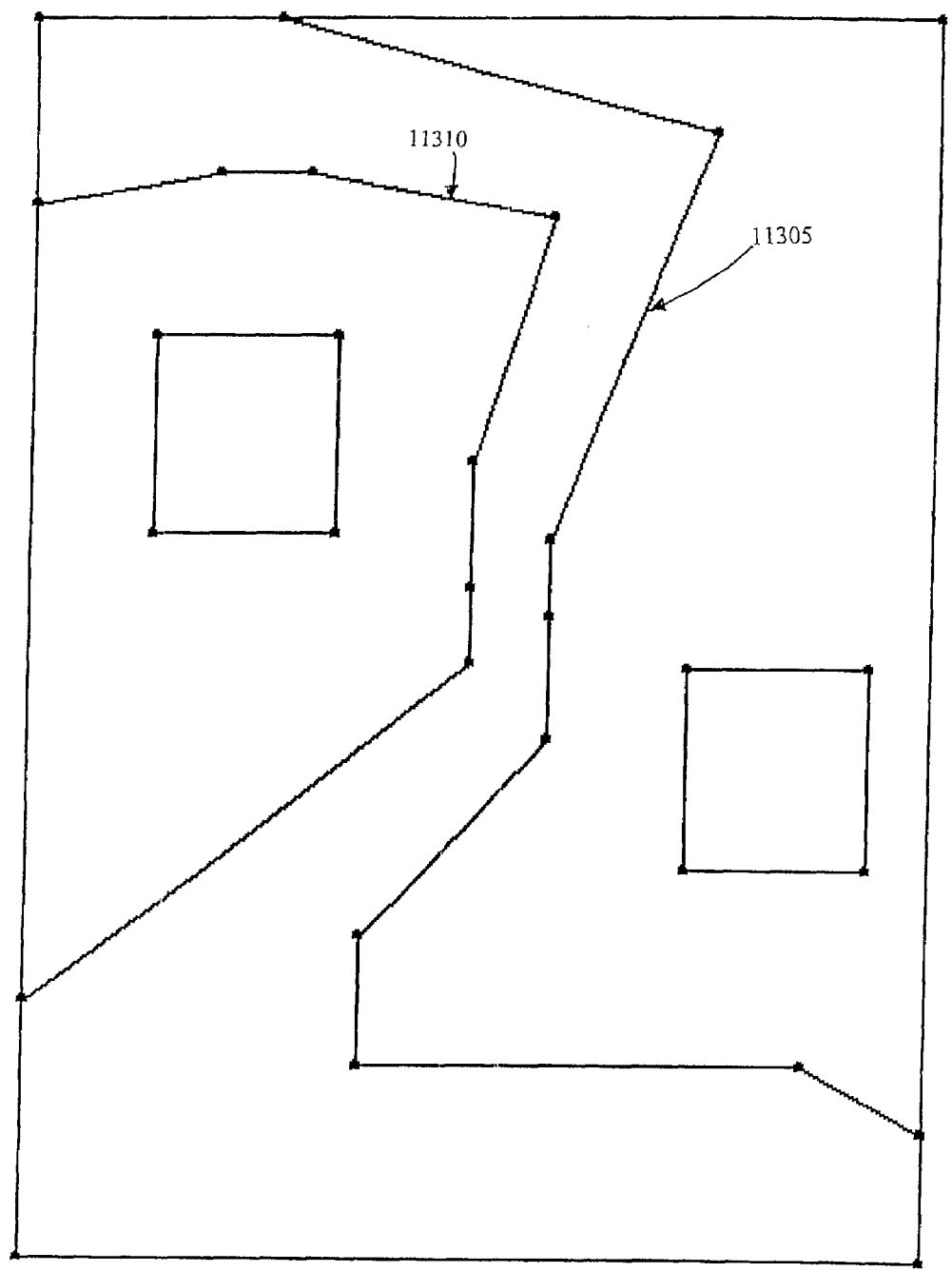
FIG. 113 illustrate a simple example of a layout portion that has two obstacles about which two topological routes for two nets are defined by the topological router.
Figure 114:
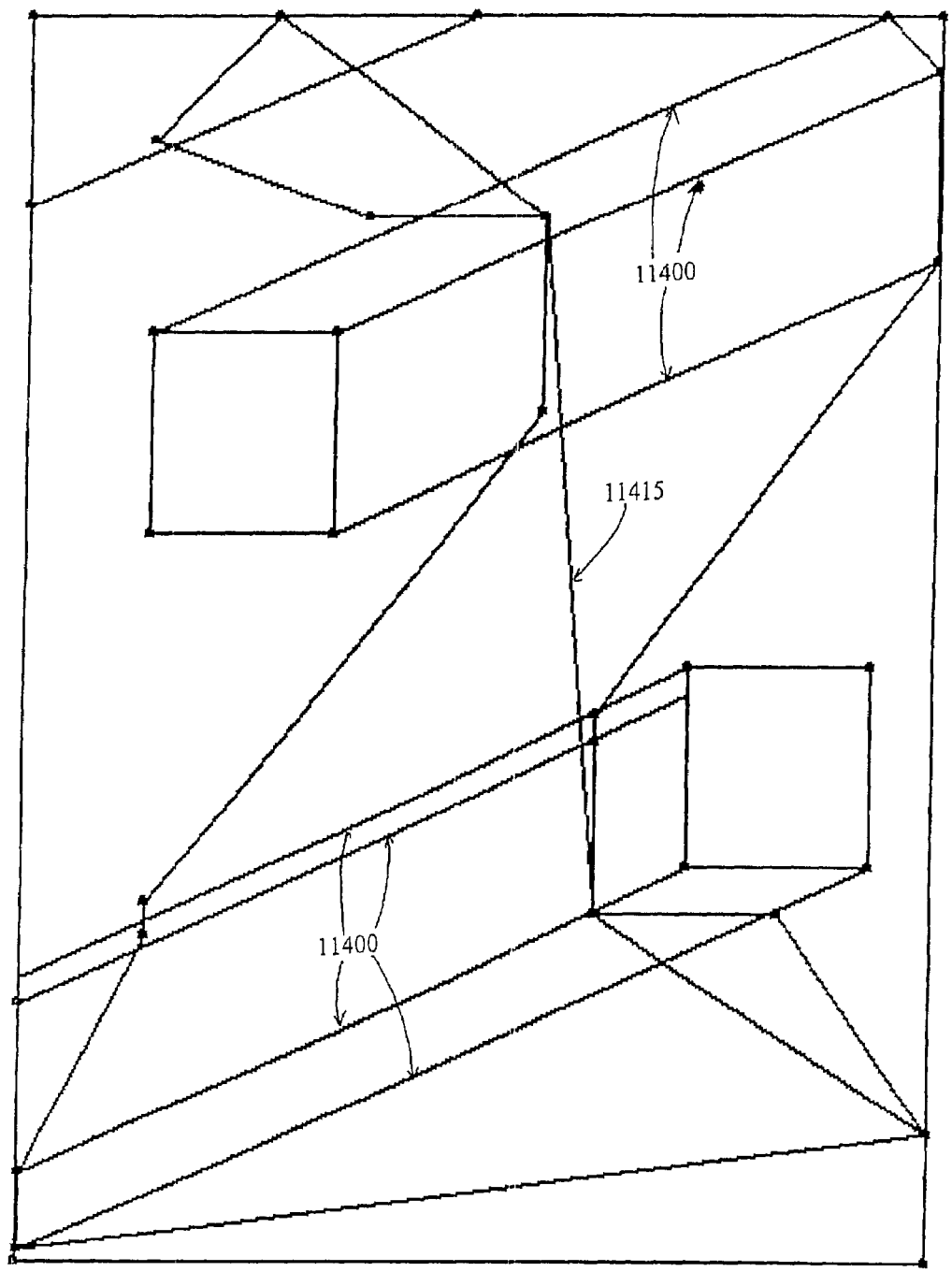
FIGS. 114–117 illustrate four sets of path defining edges for this example.
Figure 115:
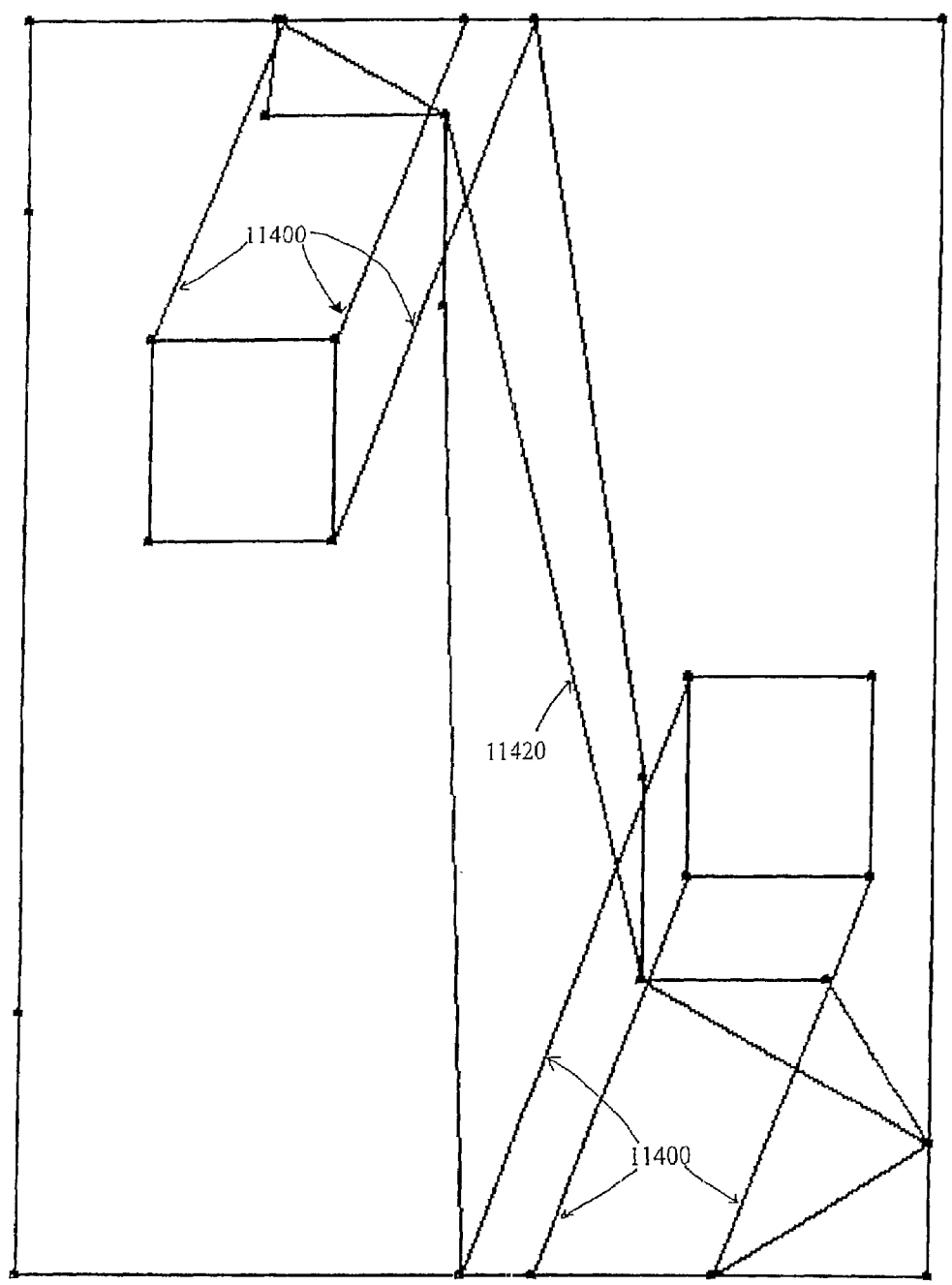
Figure 116:
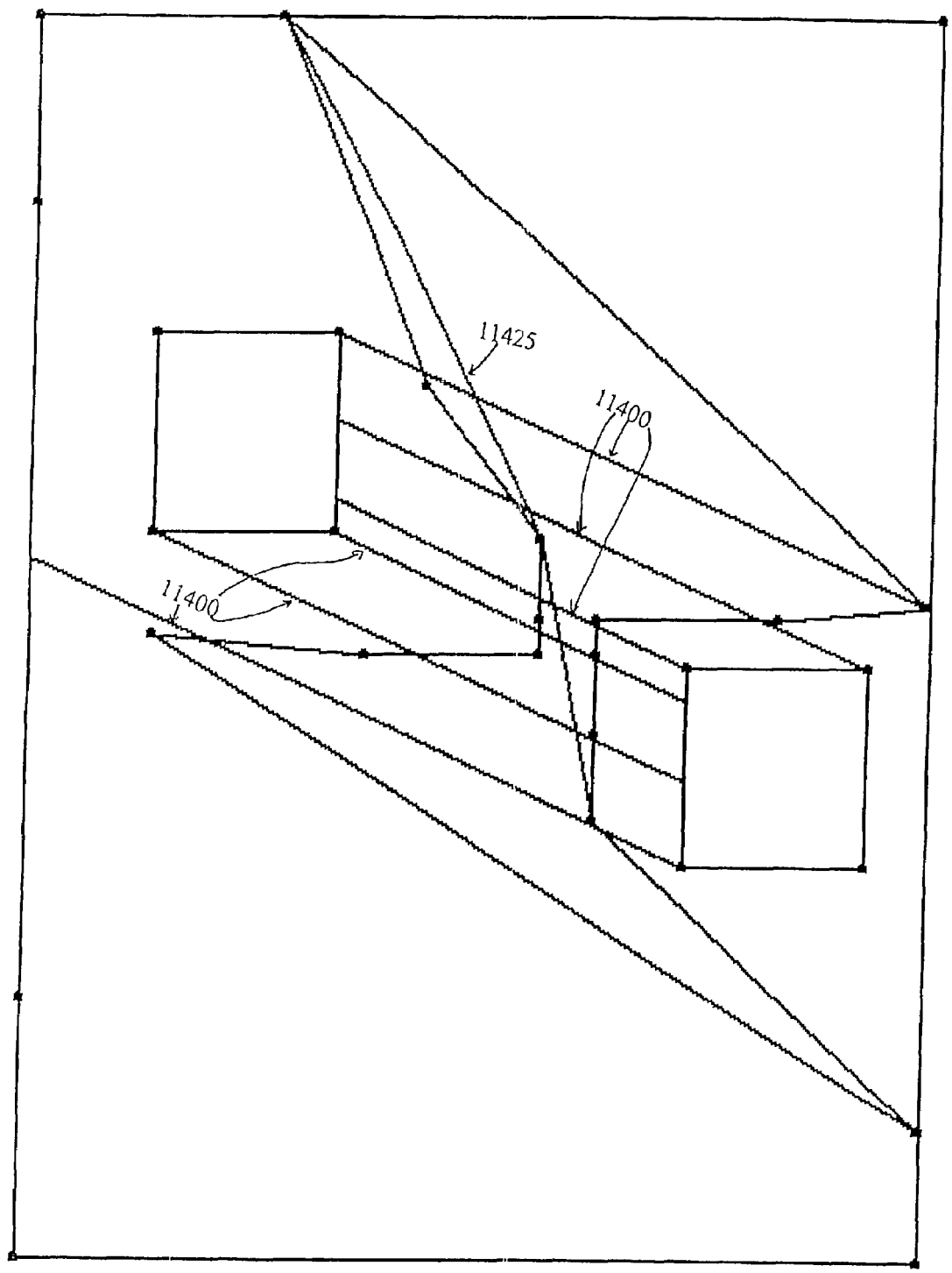
Figure 117:
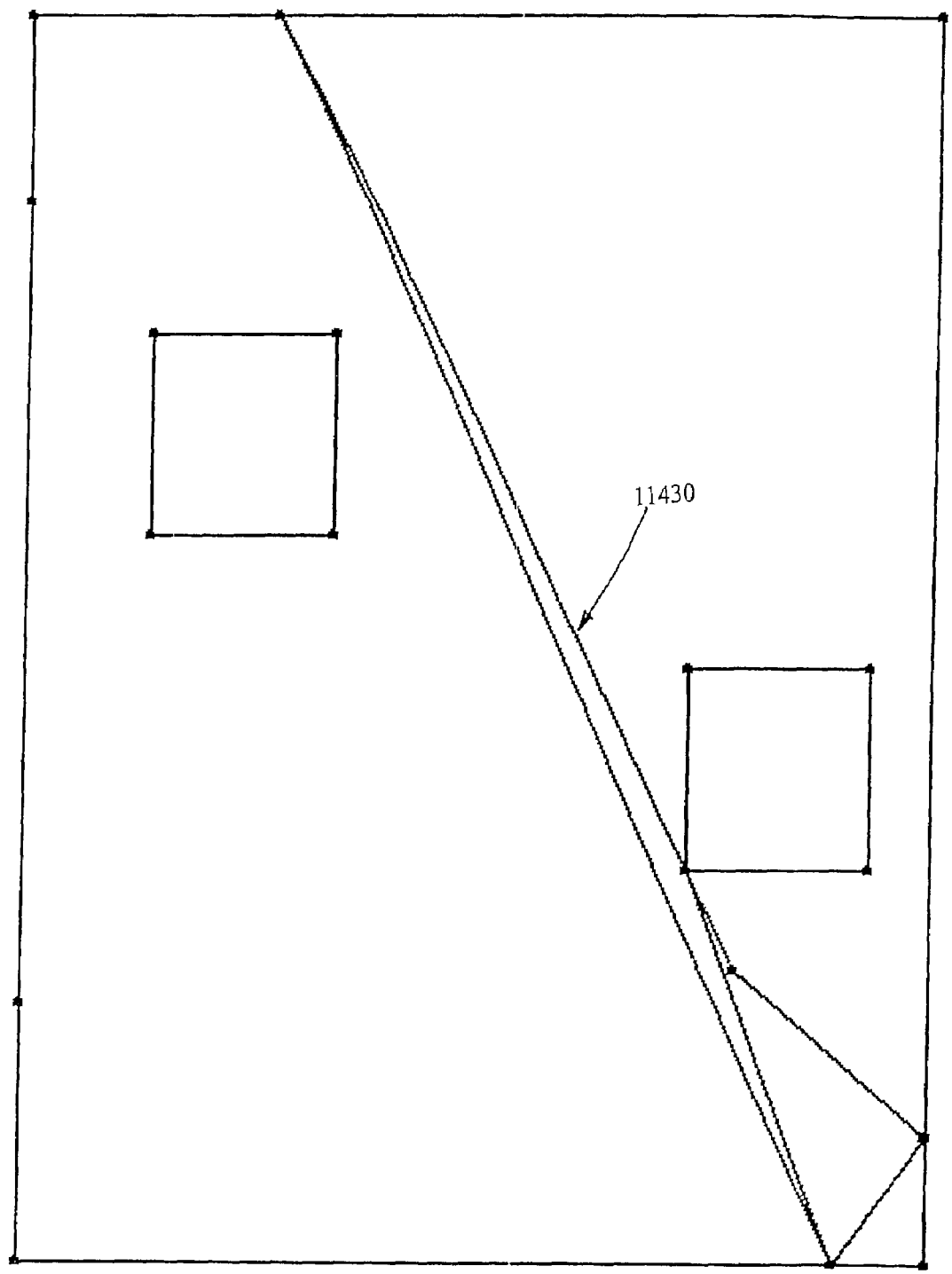

First, for each of the four constrained directions, the geometric engine generates one set of path-defining edges about the geometric points in the layer. In other words, four sets of path-defining edges are defined along $\pm 22.5°$ and $\pm 67.5°$ directions. FIGS. 113 illustrate a simple example of a portion of a layout that has two obstacles about which two topological routes for two nets 11305 and 1310 are defined by the topological router. FIGS. 114-117 illustrate four sets of path defining edges 11400 for this example.

Second, the geometric engine generates four "partial" route representations for each topological route. Each partial route is defined with respect to one set of path-defining edges. In addition, the geometric engine produces each partial design-rule-correct route for a net's topological route on a layer by (1) identifying the path-defining edges intersected by the topological route, (2) based on the design rules, identifying the segments of the intersected path-defining edges that are available for constructing the partial route, and (3) generating the shortest path between the endpoints of the topological route (on that layer) that traverses the identified segments. Some embodiments identify the constrained boundaries of path-defining segments that a net's route can intersect based on the location of the center-line of the net. Some embodiments also require that all the nodes in the path-defining-edge graph lie on the manufacturing grid.

FIGS. 114–117 specify with dots the segments of the path defining edges that have been constrained for net 11305. These constraints are due to spacing requirements between net 11305 and net 11310 and the net 11305 and the endpoints of the path defining edges. In these figures, the constraining endpoints sometime appear to the side of the path-defining edge because, in order to snap the interconnect lines to the manufacturing grid, some embodiments identify the spacing and width requirements on each constraining direction based on these requirement on the closest Manhattan wiring direction, and then round up the identified values to ensure proper design each time.

FIGS. 118 and 119 provide two more-detailed examples for identifying the spacing and width requirements on the constraining directions. FIG. 118 illustrates two nets 11805 and 11810 that have routes that intersect a 22.5° path-defining edge that originates from a vertex 11820 of an obstacle 11815. In the example illustrated in FIG. 118, the x-coordinate of the left-most constrained endpoint 11825 for the center-line of the net 11810 is (1) the minimum spacing (S1) between the first net and the vertex 11820, plus (2) the width (W1) of the net 11805, plus (3) the minimum spacing (S2) between the nets 11805 and 11810, plus (4) half of the width (W2) of the net 11810. The y-coordinate (Y) for this endpoint 11825 is computed as follows:

$Y=Y1+Y2+Y3+Y4,$ where, $Y1=ceil(S1*\tan 22.5°),$ (8)

$Y2=ceil(W1*\tan 22.5°),$ (9)

$Y3=ceil(S2*\tan 22.5°),$ and (10)

$Y4=[ceil(W2*\tan 22.5°)]/2,$ (11)

and "ceil" signifies rounding up to the next manufacturing grid. This manner of defining the y-coordinate of the left-most constrained endpoint 11825 ensures that the vertices of the net 11810's partial route boundary (i.e., the vertices of the polygon representing this net's partial route shape) are positioned on the manufacturing grid. Vertices 11830 and 11835 in FIG. 118 are examples of two such vertices.

FIG. 119 illustrates nets 11805 and 11810 that have routes that intersect a 67.5°path-defining edge that originates from a vertex 11820 of an obstacle 11815. In the example illustrated in FIG. 119, the y-coordinate of the left-most constrained endpoint 11840 for the center-line of the net 11810 is (1) the minimum spacing (S1) between the first net and the vertex 11820, plus (2) the width (W1) of the net 11805, plus (3) the minimum spacing (S2) between the nets 11805 and 11810, plus (4) half of the width (W2) of the net 11810. The x-coordinate (X) for this endpoint 11840 is computed as follows:

$X=X1+X2+X3+X4,$ where, $X1=ceil(S1*\tan 22.5°),$ (12)

$X2=ceil(W1*\tan 22.5°),$ (13)

$X3=ceil(S2*\tan 22.50),$ and (14)

$X4=[ceil(W2*\tan 22.5°)]/2.$ (15)

This manner of defining the x-coordinate of the left-most constrained endpoint 11840 ensures that the vertices of the net 11810's partial route boundary (i.e., the vertices of the polygon representing this net's partial route shape) are positioned on the manufacturing grid. Vertices 11845 and 11850 in FIG. 119 are examples of two such vertices.

After identifying the path-defining edges intersected by the topological route, and identifying the constrained segments of the intersected path-defining edges that are available for constructing the partial route, the geometric engine generates the shortest path between the endpoints of the topological route that traverses the identified segments. FIGS. 114-117 illustrate the shortest paths 11415, 11420, 11425, and 11430 for net 11305 along each set of constrained edges. As was the case with the IDA* topological router, the geometric router can identify the shortest path that traverses across several constrained edges by using common techniques such as the one described in "Geodesic Path Inside Polygons," by Simon Mak and Sung Soo Kang. As this approach simply computes the shortest distance, it does not favor any one preferred direction over the other wiring directions. However, unlike the case for the IDA* topological router which defined the shortest distance within a polygon, the geometric engine identifies the shortest distance among a set of parallel path-defining edges. Whenever this engine is defining constraints on the path defining edges, it detects when a route bends 180° around an obstacle or unrelated geometry (i.e., bends around the obstacle or geometry and intersects a path-defining edge that is collinear with a previous path-defining edge), and breaks the path into two structures around the bend in order to avoid inflection points. It then computes the shortest path for each structure, and later joins the resulting paths for these structures to define a partial path.

FIG. 120 illustrates another example of identifying a shortest partial path after constraining segments of the intersected path-defining edges. This figure illustrates five 22.5° path-defining edges 12005–12025 (that have been rotated to simplify the presentation), and a net 12030 that has a starting point 12035 and an ending point 12040. In this figure, left and right constrained endpoints are defined for each path-defining edge for the center-line 12045 of the net 12030. The left and right constrained endpoints in FIG. 120 can be used to define a routing area for the net. These constrained endpoints are slightly off the path-defining edges in order to ensures that the vertices of the polygon representing the shape of the net 12030's route are positioned on the manufacturing grid. Two such vertices that are aligned with the manufacturing grid are vertices 12050 and 12055. These two vertices are vertices of the net's representative polygon that bends at the center-line endpoint 12060 to achieve the shortest path between endpoints 12035 and 12040.

Figure 122:
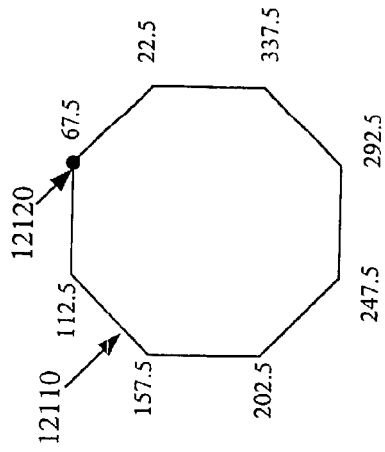
FIGS. 121 and 122 illustrate two octagons that represent the octilinear wiring model of FIG. 1, while FIG. 123 identifies the eight possible directions that can be constrained by the four constraining angles, ±22.5° and ±67.5°, for the octilinear wiring model.
Figure 121:
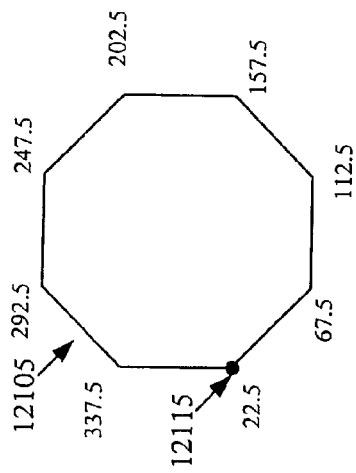

Third, the geometric engine examines the points of the four partial paths defined during the previous operation and removes points that should not be considered for the merged path. Fourth, the geometric engine merges the four partial routing solutions into a single design-rule-correct route. In some embodiments, the geometric engine performs the third and fourth operations by using polygons that represent the wiring model being used. For instance, FIGS. 121 and 122 illustrate two octagons that represent the octilinear wiring model of FIG. 1. The octagon 12105 of FIG. 121 is referred to below as the negative polygon, while the octagon 12110 of FIG. 122 is referred to below as the positive polygon.

Figure 123:
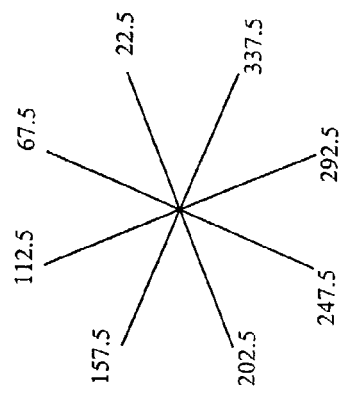

Each of these octagons has a specific vertex for connecting to a partial-path point that is defined along a specific constraining direction. FIG. 123 identifies the eight possible directions that can be constrained by the four constraining angles, ±22.5° and ±67.5°, for the octilinear wiring model. FIGS. 121 and 122 identify constrained directions that correspond to their octagon vertices. For instance, the negative octagon's vertex 12115, which is labeled 22.5°, corresponds to the 22.5°constraining direction. Similarly, the positive octagon's vertex 12120, which is labeled 67.5°, corresponds to the 67.5°constraining direction.

To identify an unnecessary partial-path point, the geometric engine places the negative octagon's vertex that corresponds to the point's constraining direction on the point. The geometric engine determines to take out the point, if either segment that connects to this point on the partial path falls within the negative octagon. In the examples of FIGS. 114–117, all the partial-path points of the −22.5° and −67.5° angles can be eliminated by using this approach.

Similar approaches are used to merge the partial paths. Specifically, to identify the first point of the merged paths, the positive octagon is placed on the first points of each partial path that remains after the point-removal operation. The positive octagon is placed on each point at its vertex that corresponds to the constraining direction used to identify the point. The point that is selected is the first point of the solution whose first path (i.e., the path from the starting point to the first point) does not intersect the positive octagon or lies on the octagons border.

To select each successive point except the last, one positive octagon is placed on the last selected point and another is placed on the next point in the selected point's partial path. If the segment connecting these two points does not fall within either positive octagon, then the next point in the partial path is selected as the next point in the merged path. On the other hand, if the segment connecting these two points falls within either octagon, then the next point in the selected point's partial path is not selected. Rather, the next point in the merged path is identified to be the next remaining point of the solution set whose constraining direction is clockwise or counterclockwise adjacent to the constraining direction of the last selected point. The solution of the adjacent clockwise direction is selected when the constraining node of the last selected point was on the right of the oriented path segment to the last selected point. On the other hand, the solution of the adjacent counter-clockwise direction is selected when the last point's constraining node was on the left of the oriented path segment to the last selected point. When all the partial solutions are empty except one, the last point or points are selected from the remaining non-empty partial solution.

Figure 124:
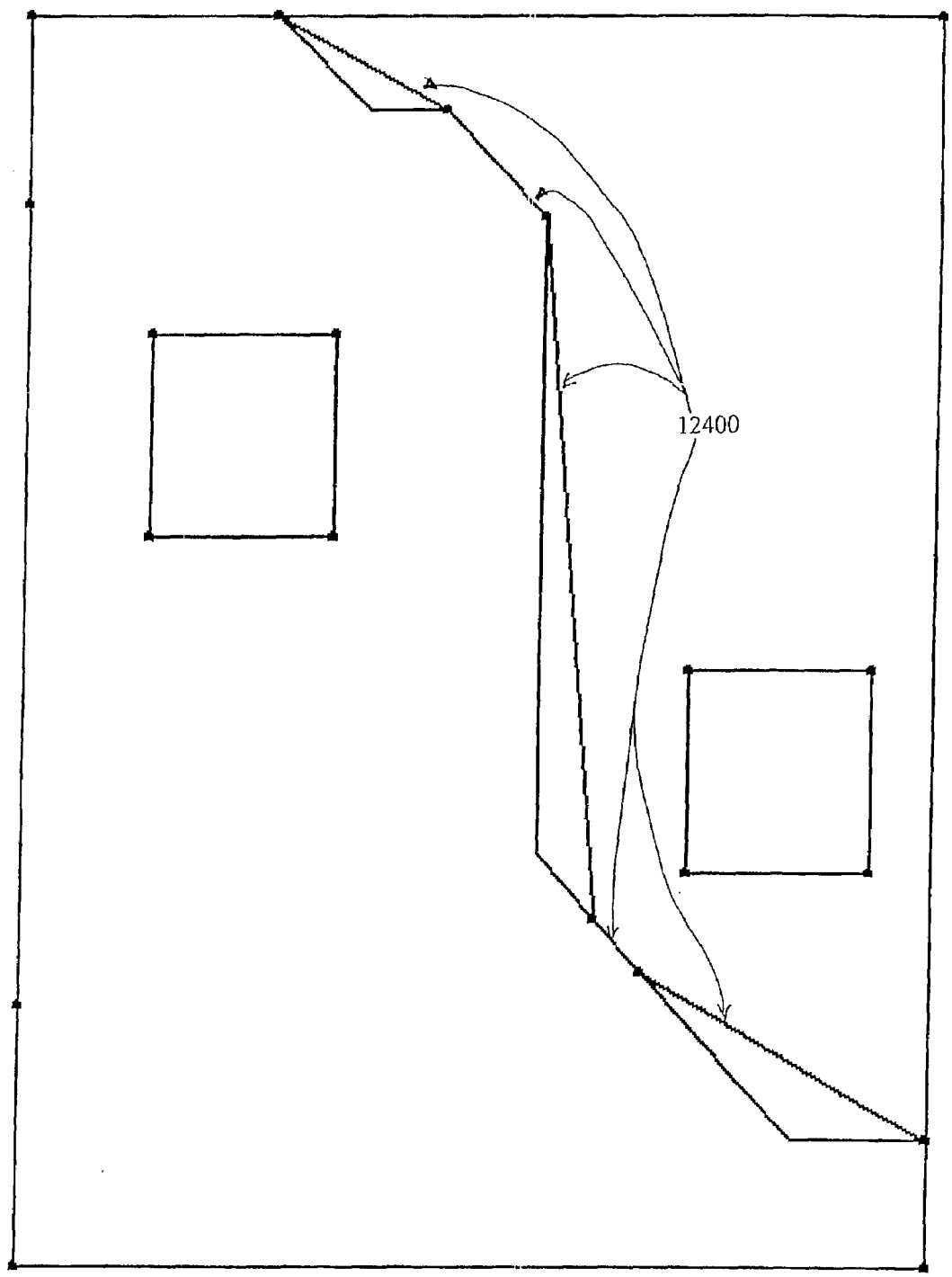
FIG. 124 illustrates a merged path for the examples illustrated in FIGS. 114–117.

FIG. 124 illustrates the merged path 124000 for the examples illustrated in FIGS. 114–117. FIG. 125 provides another example of merged routes. Specifically, this figure illustrates a portion of the merged route for net 11810. This merged-route portion 11860 of this net's center-line is created by connecting the constraining endpoints 11825 and 11840 that are defined for the 22.5° and 67.5° path-defining edges. As illustrated in FIG. 125, the width of the net 11810 is larger than W2 (it is W2+e) due to the definition of the center-line constraints on the 22.5° and 67.5° directions.

After generating a merged design-rule-correct route, the geometric engine can then generate and embed a geometric route based on the merged route. The geometric engine directly embeds all segments of the merged path that are in one of the octilinear directions illustrated in FIG. 1. The geometric engine embeds a non-octilinear segment (i.e., line segment connecting two points in the merged path) by projecting it onto one of the octilinear directions (e.g., projecting it onto the 0° direction). In some embodiments, the geometric engine is free to project the non-octilinear segments onto any octilinear direction, but once it picks a direction it uses this direction for all non-octilinear segments.

Figure 126:
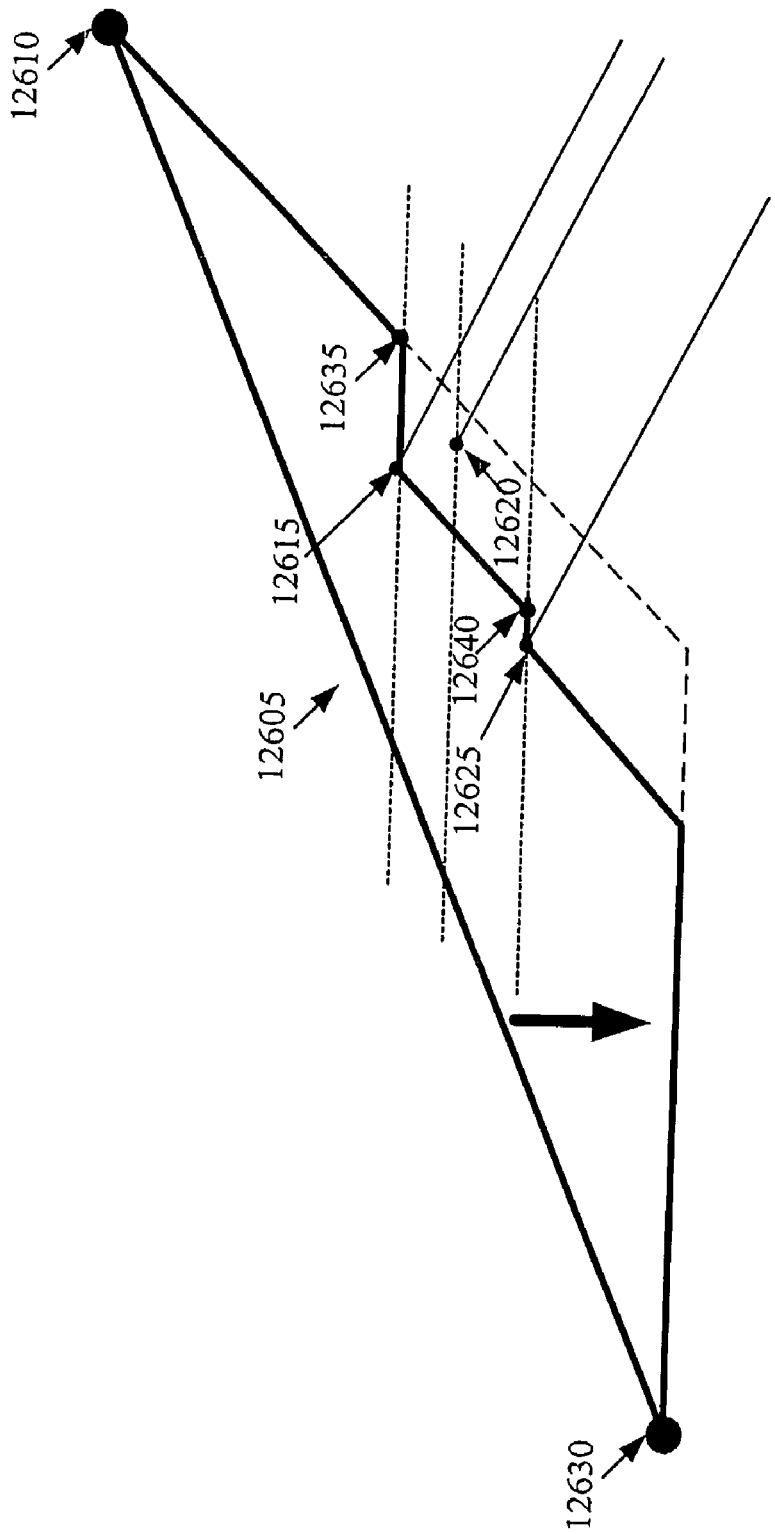
FIG. 126 illustrates the geometric projection of a segment onto a horizontal direction.

FIG. 126 illustrates the projection of a segment 12605 onto the horizontal direction. When a segment is projected towards one of the octilinear directions, the geometric engine needs to ensure that the projection respect the design-rule constraints on the path's traversal. The endpoints of a non-octilinear segment are from the same partial solution. In the example illustrated in FIG. 126, the partial solution for segment 12605's endpoints are generated in the −22.5° direction. The geometric engine retrieves the path constraints that were previously computed for the −22.5° direction between the endpoints of the segment, in order to determine how these retrieved constraints bound the geometric embedding of segment 12605. The geometric engine then sorts the constraints in a direction perpendicular to either octilinear direction resulting from the projection. At this stage, the geometric engine has defined a sorted structure of points that it needs to analyze. In the example illustrated in FIG. 126, the constraints are sorted in the Y-axis direction (in the direction perpendicular to the x-axis direction). Also, this sorting leads the geometric engine to store a list of sorted points, starting with node 12610, constraining endpoints 12615-12625, and then node 12630.

The geometric engine stores the node 12610 as the first point of the geometric route. It then selects point 12615, and determines that the node 12610 is behind a 45° diagonal line running through 12615. Hence, it identifies point 12635 as an optimal bending point from 12610 to 12615, and thereby stores node 12635 and then node 12615 as the second and third points of the geometric route. The next point on the sorted order is point 12620. The engine then determines whether a 45° diagonal line passing through this point is ahead or behind the 45° diagonal line passing through the last item on the embedded geometric route. In this case, the line through point 12620 is behind the line through previous point 12615, and hence constraint point 12620 does not affect the geometric route.

The engine then selects the next sorted point, which is point 12625. The 45° diagonal line passing through this point 12625 is ahead of the 45° diagonal line passing through the last item on the embedded geometric route (i.e., point 12615). Accordingly, the engine identifies point 12640 as an optimal bending point from 12615 to 12625, and thereby stores point 12640 and then points 12625 as the fourth and fifth points of the geometric route. As the node 12630 is the last item in the sorted order and it is the end node for the segment, the geometric engine adds it as the last point of the geometric route segment for segment 12605.

Figure 127:
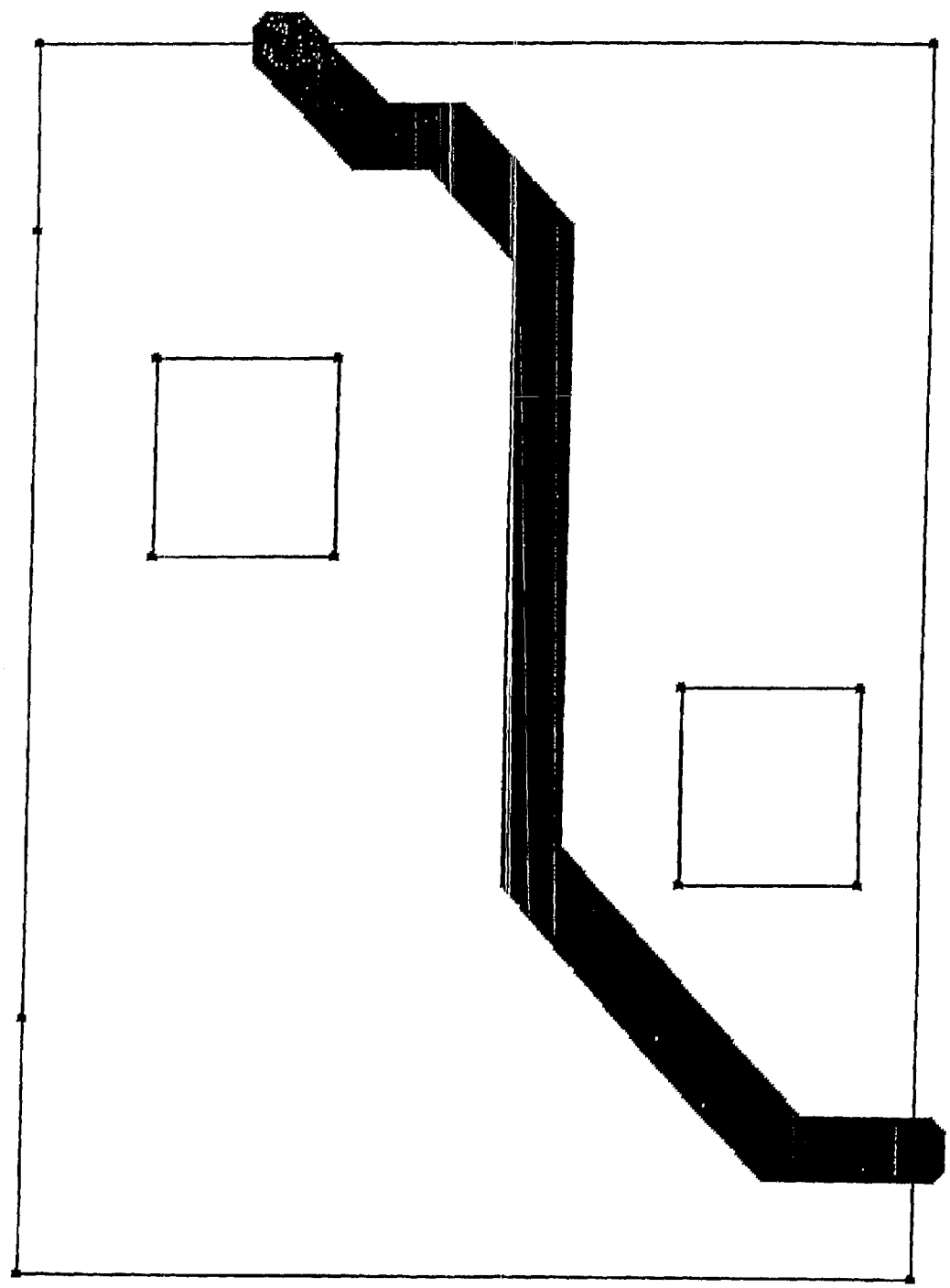
FIG. 127 illustrates a net-width view of the route illustrated in FIG. 124.

FIG. 124 illustrates the center-point line for the geometric route of the merged route of net 4935. FIG. 127 illustrates a net-width view of this route for this net. As evident from FIG. 127, this route is a gridless, NPD route. This route was generated without forcing the router to select an arbitrary preferred direction for an interconnect layer, or to use an arbitrary, non-manufacturing grid. As mentioned above, some embodiments simply require the router to snap the vertices of interconnect lines to the manufacturing grid.

Figure 128A:
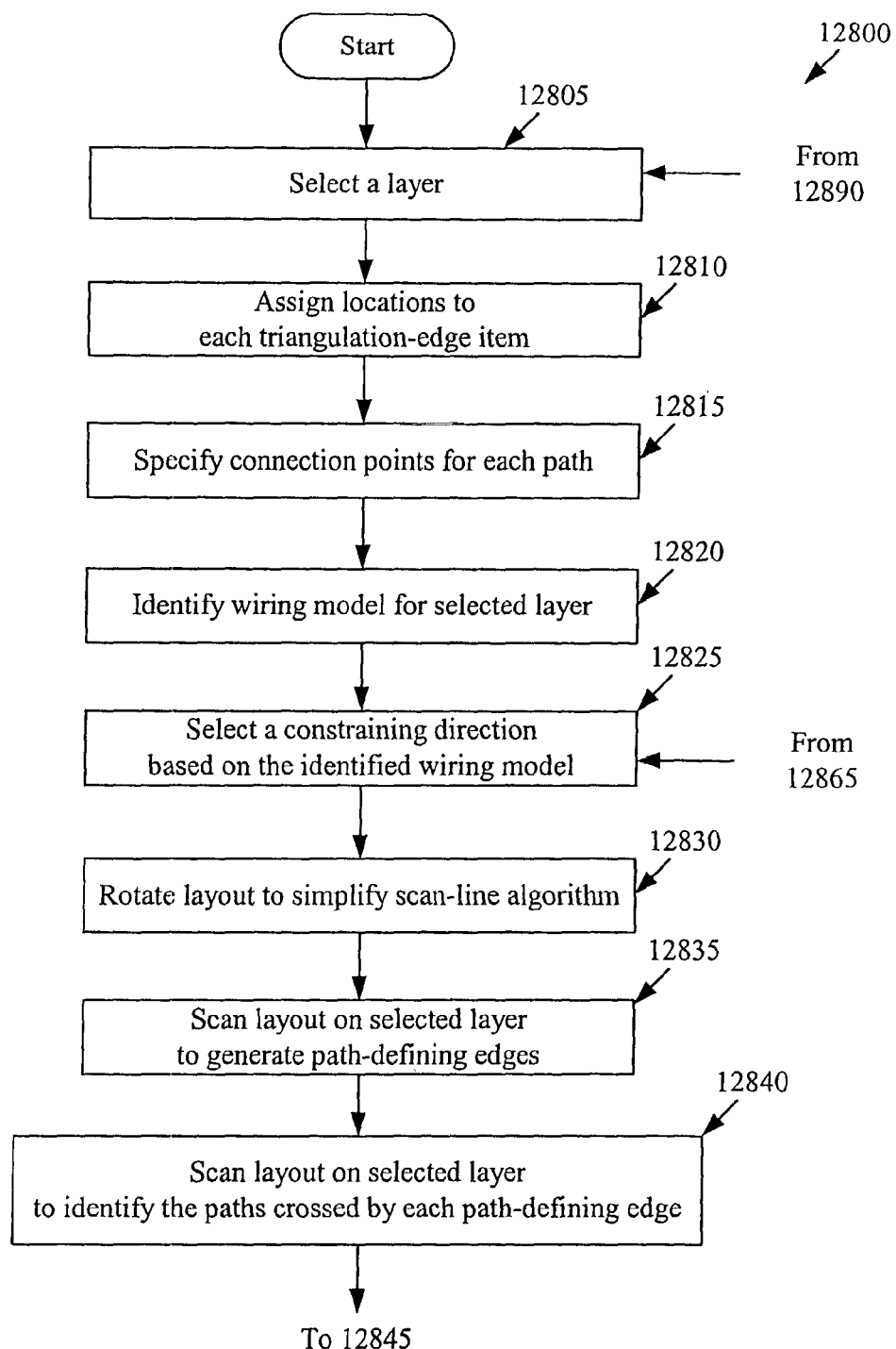
FIG. 128 presents a geometric-routing process performed by the geometric engine of some embodiments of the invention.
Figure 128B:
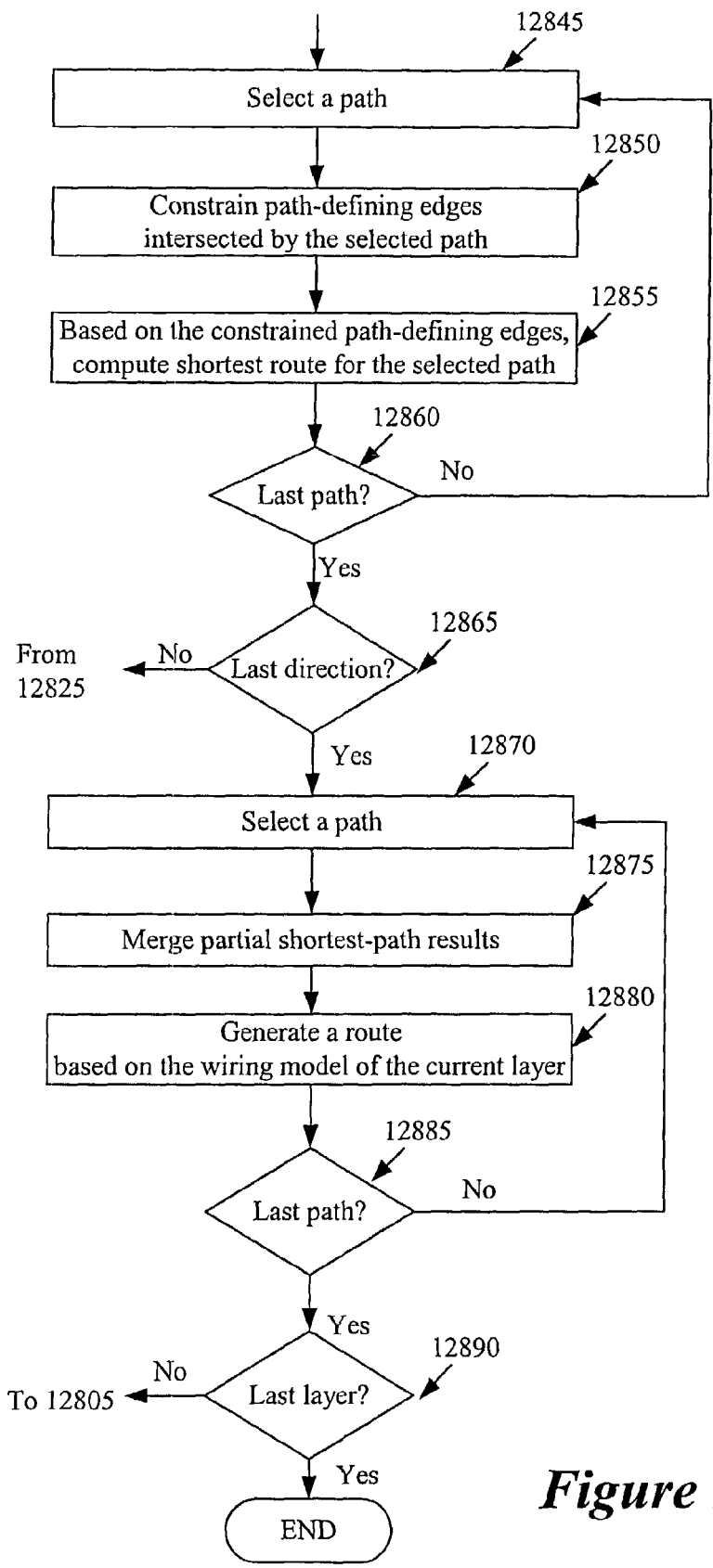

FIG. 128 presents a geometric-routing process performed by the geometric engine of some embodiments of the invention. As shown in this figure, the process 12800 initially selects (at 12805) a layer of the sub-region being routed. Next, the process assigns (at 12810) locations to each edge item (i.e., a joint in the Q* engine or an edge item in the IDA* engine) of the triangulated graph on the selected layer. Some embodiments assign locations to each item on the selected layer by distributing uniformly the edge items on their edges.

After assigning locations to each edge item on the selected layer, the process 12800 specifies (at 12815) connection points for each topological route. Some embodiments define the connection points for some routes (e.g., routes that endpoints were originally inside of non-convex geometries) on the selected layer on the boundaries of the port geometries. Some embodiments also specify Steiner points produced by the Q* topological engine as connection points.

At 12820, the geometric-routing process identifies a wiring model for the selected layer. This information is provided by the designer in some embodiments, or it might be automatically determined based on some criteria, such as an attribute (e.g., shape) of the routed region. The embodiments described below utilize the octilinear wiring model described above by reference to FIG. 1 for all the layers. Other embodiments use different wiring models. Also, some embodiments use different wiring models for different layers.

After selecting a wiring model, the process 12800 selects one of four constraining angles (±22.5° and ±67.5°) for the selected octilinear wiring model. The process 12800 then rotates (at 12830) the selected layout in the opposite direction to the selected constraining angle to simplify performing a horizontal scan-line algorithm at 12835. The process 12800 performs this algorithm at 12835 to generate path-defining edges.

Like a triangulated-graph edge, a path-defining edge has a data structure that includes a linked list of items on the edge, where each item on the list points to the next and previous items in the list. This list starts and ends with the endpoints of the edge. As mentioned below, edge items are added between the edge's endpoints to represent routes as routes are inserted in the edge.

After specifying the path-defining edges in the constraining angle selected at 12825, the process 12800 performs (at 12840) another scan line algorithm on the rotated layout layer, in order to identify the routes that cross each path-defining edge. Each time the process identifies a route that crosses an edge, it inserts an edge item in the edge's linked list to represent the intersecting route. In some embodiments, the geometric engine (at 12840) starts analyzing the routing problem in terms of two point paths instead of routes, which can connect multiple connection points. In these embodiments, each path's data structure defines a linked list of items on the path.

A path's linked list starts and ends with the endpoints of the path, and in between can include edge items on one or more path-defining edges. Hence, after 12840, the process has defined two sets of linked lists that define paths and the relative position of paths with respect to the constraining angle in the selected layer. In some embodiments, the process also (at 12840) cleans up each paths definition with respect to the path-defining edges. Specifically, if two contiguous edge items on a path-defining edge are for the same path and are adjacent points on the same path, then these edge items are removed.

After creating the new route descriptions at 12840, the process then selects (at 12845) a path. The process then uses (at 12850) the design rule to identify the segments of the path-defining edge intersected by the selected path that are available for constructing the partial route of the selected path. Whenever the process defines constraints on the path defining edges, and it detects when a route bends 180° around an obstacle or unrelated geometry, it breaks the path into two structures around the bend in order to avoid inflection points.

After identifying the path-defining-edge segments that are available for constructing the partial path of the selected path, the process 12800 computes (at 12855) the shortest path between the endpoints of the selected path that traverses the identified segments. This shortest path serves as one of the partial solutions. If the process broke the path into smaller structure, it computes (at 12855) the shortest path for each structure, and then joins the resulting solutions for these structures to define a partial path.

The process then determines (at 12860) whether it has examined all the paths. If not, it returns to 12845 to select another path. If so, it determines (at 12865) whether it has generated partial solutions for all constraining angles. If it has not examined all the constraining angles, it returns to 12825 to select another constraining angle and generate partial solutions for this direction.

When the process 12800 has examined all the constraining angles, it then has to merge the partial solutions. Hence, the process selects a path (at 12870) and merges (at 12875) the partial routing solutions for this path. One manner of merging paths was described above. Next, the process generates (at 12880) a geometric route and embeds this route. This geometric route is based on the wiring model of the current layer. One manner of embedding merged paths was described above.

The process then determines (at 12885) whether it has embedded all the paths in the current layer. If not, it returns to 12870 to select another path for embedding. Otherwise, the process determines (at 12890) whether it has examined all the layers of the sub-region. If not, the process transitions back to 12805 to select another layer for geometric routing. If so, the process ends.

Some embodiments define geometric routes slightly differently than the embodiments described above. These embodiments allow for different widths and spacings in the Manhattan and diagonal directions. Specifically, for the same layer, these embodiments allow a net's route to have one width $W_i^m$ in the Manhattan directions and another width $W_1^d$ in the diagonal directions. Similarly, these embodiments allow one spacing constraint (e.g., a spacing between two nets) for a layer to be different in the Manhattan and diagonal directions (i.e., $S_k^m \neq S_k^d$).

To accept different widths and spacings in the Manhattan and diagonal directions, some of these embodiments modify the above-described geometric embedding operations in two ways. First, they use the above-described equation (1) to compute a constraining angle α for the worst width and spacing combination. They then define the constraining directions (which are used at 12825 in a manner described in FIGS. 118 and 119) according to this angle. These embodiments define the constraining directions as ±α and ±90-α, instead of ±22.5 and ±67.5 that were described above.

Second, to compute the constrained route and spacing endpoints that are defined on the manufacturing grid, these embodiments use the above-described equations (2) and (3). Hence, if in the example illustrated in FIG. 118 the spacings and widths were different in the diagonal and Manhattan directions, these embodiments would compute the y-coordinate (Y) of the endpoint 11825 as follows:

$$Y=Y1+Y2+Y3+Y4,$$

where, $$Y1 = ceil(S_1^d * \sqrt{2} - S_1^m); \quad (16)$$

$$Y2 = ceil(W_1^d * \sqrt{2} - W_1^m); \quad (17)$$

$$Y3 = ceil(S_2^d * \sqrt{2} - S_2^m); \text{ and} \quad (18)$$

$$Y4 = \frac{\lfloor ceil(W_2^d * \sqrt{2} - W_2^m) \rfloor}{2}. \quad (19)$$

In these equations, $S_1^d$ is the spacing constraint between net 11805 and obstacle 11815 in the diagonal directions, $S_1^m$ is the spacing constraint between net 11805 and obstacle 11815 in the Manhattan directions, $W_1^d$ is the width of the net 11805 in the diagonal directions, $W_1^m$ is the width of the net 11805 in the Manhattan directions, $S_2^d$ is the spacing constraint between nets 11805 and 11810 in the diagonal directions, $S_2^m$ is the spacing constraint between nets 11805 and 11810 in the Manhattan directions, $W_2^d$ is the width of the net 11810 in the diagonal directions, and $W_2^m$ is the width of the net 11810 in the Manhattan directions.

Similarly, if in the example illustrated in FIG. 119 the spacings and widths were different in the diagonal and Manhattan directions, these embodiments would compute the x-coordinate (X) for the endpoint 11840 as follows:

$$X = X1 + X2 + X3 + X4,$$

where, $$X1 = ceil(S_1^d * \sqrt{2} - S_1^m); \quad (20)$$

$$X2 = ceil(W_1^d * \sqrt{2} - W_1^m); \quad (21)$$

$$X3 = ceil(S_2^d * \sqrt{2} - S_2^m); \text{ and} \quad (22)$$

$$X4 = \frac{\lfloor ceil(W_2^d * \sqrt{2} - W_2^m) \rfloor}{2}. \quad (23)$$

Some wire editor tools also require the center lines of geometric routes to be on the manufacturing grid. Some embodiments accomplish this by using a particular convention to round the coordinates of the center line in the Manhattan and diagonal directions. For instance, some embodiments (1) use a "floor" operation that rounds the center line down to the next manufacturing grid point when the intersected constraining edge (i.e., the constraining edge intersected by the route) emanates from a vertex in the +x-direction, and (2) use a ceil operation that rounds the center line up to the next manufacturing grid point when the intersected constraining edge emanates from a vertex in the −x-direction. In the example illustrated FIG. 118, the center line of the route of net 11810 has a x-coordinate that is $S_1^m + W_1^m + S_2^m + $floor $(W_2^m/2)$, and an y-coordinate Y4 that is the floor of equation (11) or equation (19), depending on which of these equations is used to calculate the y-coordinate Y4. Similarly, in the example illustrated FIG. 119, the center line of the route of net 11810 has a y-coordinate that is $S_1^m + W_1^m + S_2^m + $floor $(W_2^m/2)$, and an x-coordinate X4 that is the floor of equation (15) or equation (23), depending on which of these equations is used to calculate the x-coordinate X4.

Figure 129:
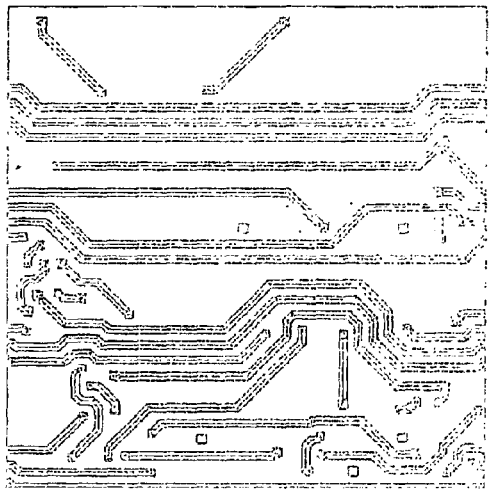
FIG. 129 illustrates one layer of wiring produced by some embodiments.
Figure 130:
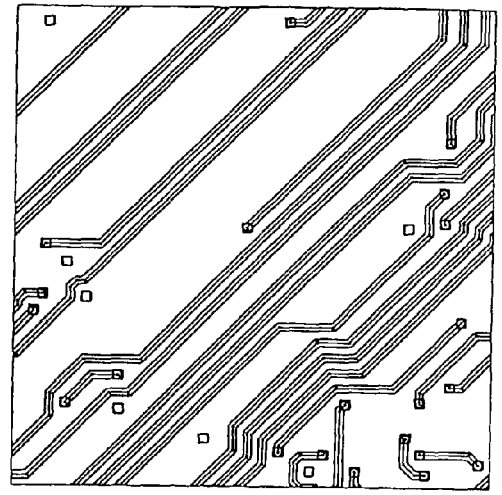
FIG. 130 illustrates a second layer of wiring produced by some embodiments.
Figure 131:
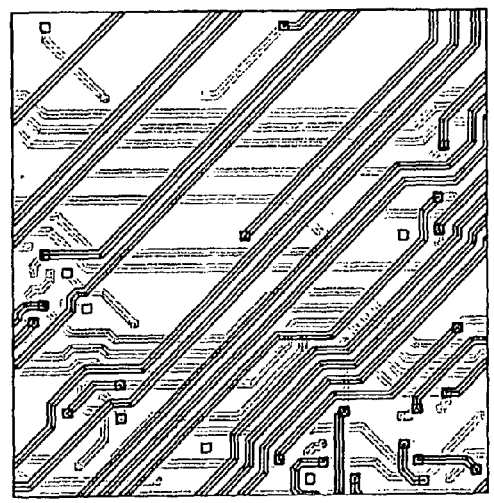
FIG. 131 illustrates the two layers of wiring superimposed.

FIGS. 129–131 illustrate a pictorial representation of two layers of NPD routes in a region of the layout. Specifically, FIG. 129 illustrates one layer of NPD wiring, while FIG. 130 illustrates a second layer of NPD wiring. FIG. 131 then illustrates the two layers of wiring superimposed. The routes illustrated in these figures were generated by taking an output of a preferred-direction global router, and generating non-preferred direction routes based on the wiring model of FIG. 1. These routes are also gridless, as they only align with the manufacturing grid. Also, some of these routes are multi-layer NPD routes that via from the layer of FIG. 129 to the layer of FIG. 130. In these figures, some of the routes use rectangular vias. However, as described above, these routes could have used octagonal vias (or other shaped vias, if a different wiring model was used).

Figure 132:
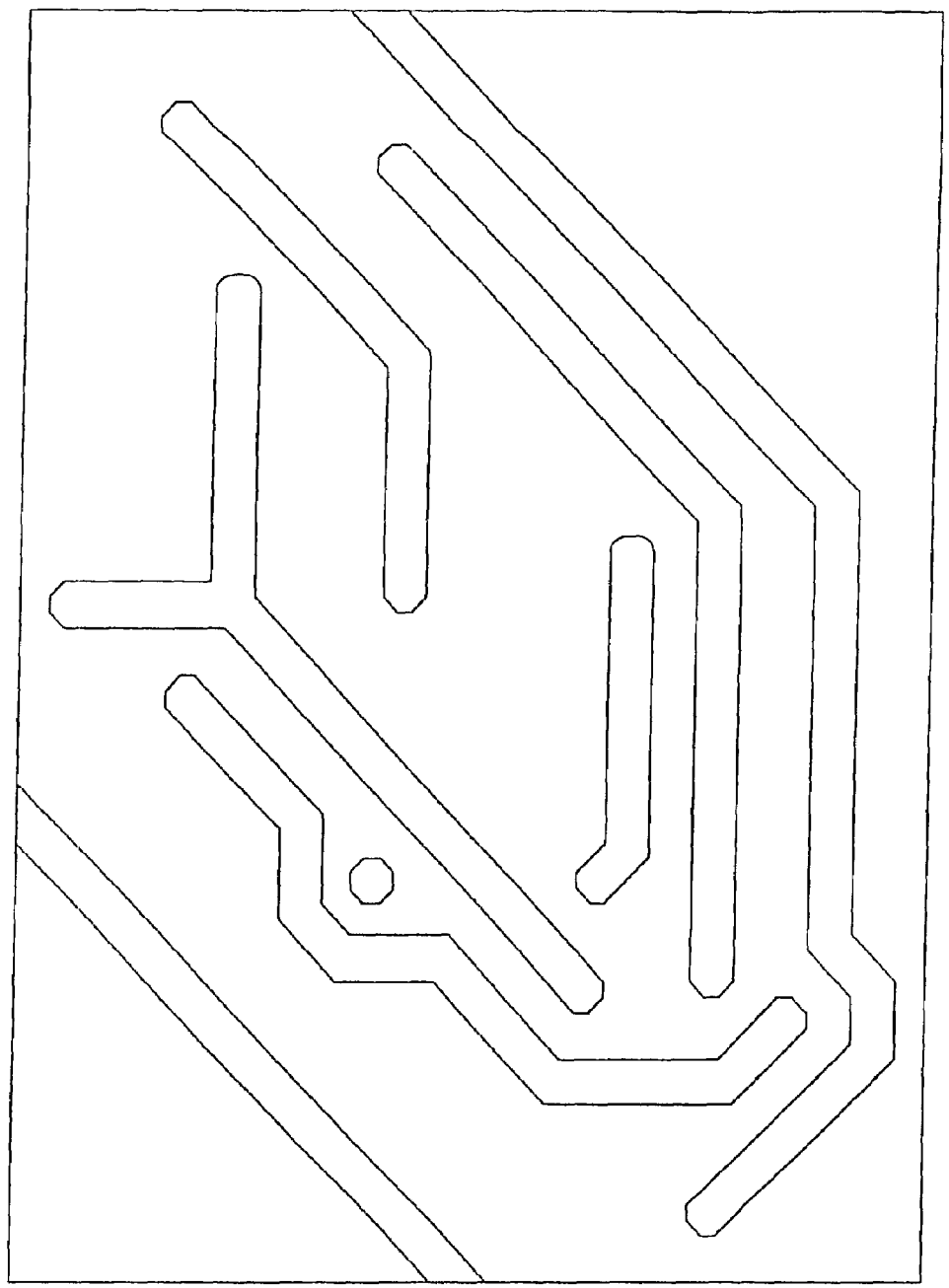

FIG. 132 presents a diagram of a portion of a mask that is made based on a design layout that uses diagonal lines. In this figure, the mask is based on a design layout that uses a gridless, non-preferred direction wiring model. Accordingly, the etching patterns are in shape of the design layout's non-preferred direction routes. The use of such a mask will result in an IC that has interconnect lines on one layer in the shape of the etching patterns of this mask.

IV. THE COMPUTER SYSTEM

Figure 133:
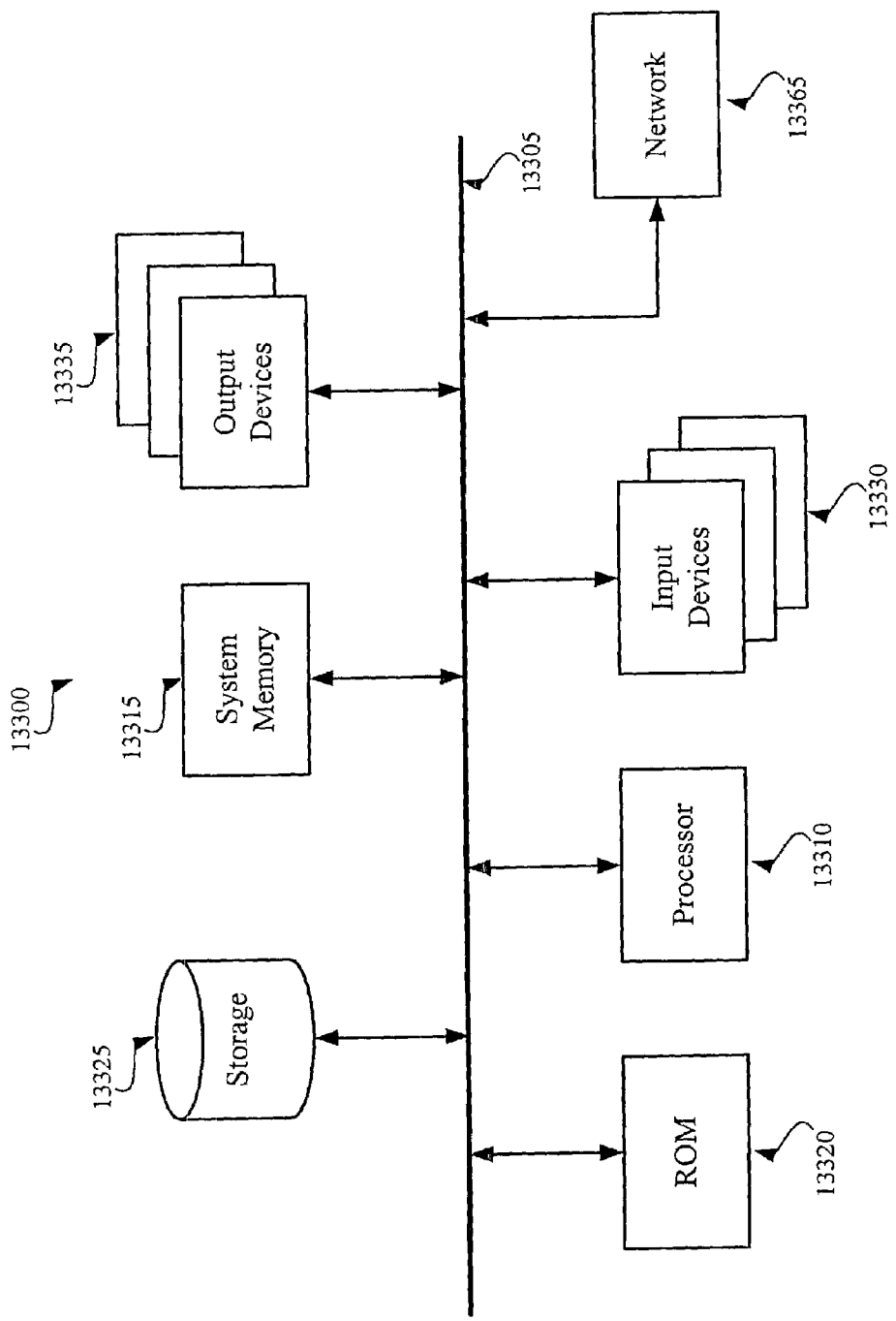
FIG. 133 illustrates a computer system used in some embodiments.

FIG. 133 presents a computer system with which one embodiment of the present invention is implemented. Computer system 13300 includes a bus 13305, a processor 13310, a system memory 13315, a read-only memory 13320, a permanent storage device 13325, input devices 13330, and output devices 13335.

The bus 13305 collectively represents all system, peripheral, and chipset buses that communicatively connect the numerous internal devices of the computer system 13300. For instance, the bus 13305 communicatively connects the processor 13310 with the read-only memory 13320, the system memory 13315, and the permanent storage device 13325.

From these various memory units, the processor 13310 retrieves instructions to execute and data to process in order to execute the processes of the invention. The read-only-memory (ROM) 13320 stores static data and instructions that are needed by the processor 13310 and other modules of the computer system. The permanent storage device 13325, on the other hand, is read-and-write memory device. This device is a non-volatile memory unit that stores instruction and data even when the computer system 13300 is off. Some embodiments of the invention use a mass-storage device (such as a magnetic or optical disk and its corresponding disk drive) as the permanent storage device 13325. Other embodiments use a removable storage device (such as a floppy disk or zip® disk, and its corresponding disk drive) as the permanent storage device. Like the permanent storage device 13325, the system memory 13315 is a read-and-write memory device. However, unlike storage device 13325, the system memory is a volatile read-and-write memory, such as a random access memory. The system memory stores some of the instructions and data that the processor needs at runtime. In some embodiments, the invention's processes are stored in the system memory 13315, the permanent storage device 13325, and/or the read-only memory 13320.

The bus 13305 also connects to the input and output devices 13330 and 13335. The input devices enable the user to communicate information and select commands to the computer system. The input devices 13330 include alphanumeric keyboards and cursor-controllers. The output devices 13335 display images generated by the computer system. For instance, these devices display IC design layouts. The output devices include printers and display devices, such as cathode ray tubes (CRT) or liquid crystal displays (LCD).

Finally, as shown in FIG. 133, bus 13305 also couples computer 13300 to a network 13365 through a network adapter (not shown). In this manner, the computer can be a part of a network of computers (such as a local area network ("LAN"), a wide area network ("WAN"), or an Intranet) or a network of networks (such as the Internet). Any or all of the components of computer system 13300 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A region of an integrated-circuit ("IC") layout comprising:
   a) a plurality of nets having a plurality of routable elements;
   b) a plurality of routes for connecting the routable elements of nets, wherein the routes traverse preferred non-Manhattan interconnect directions that are specified by a wiring model;
   c) wherein the only grid that the routes are aligned with is the manufacturing grid.

2. The IC-layout region of claim 1, wherein the non-Manhattan wiring directions are at angles of ±A° with respect to a coordinate axis of the layout, wherein A does not equal 0 or 90.

3. The IC-layout region of claim 2, wherein A equals 45.

4. The IC-layout region of claim 1, wherein the wiring model specifies horizontal, vertical, and ±45° directions.

5. The IC-layout region of claim 1, wherein the routes comply with design rules.

6. The IC-layout region of claim 5, wherein the design rules specify minimum spacing between routes.

7. The IC-layout region of claim 5, wherein the design rules specify minimum spacing between routes and layout items unrelated to the routes.

8. The IC-layout region of claim 1, wherein the region is the entire layout.

9. The IC-layout region of claim 1, wherein the region is a portion of the layout.

10. A method of routing nets in a region of an integrated-circuit ("IC") layout, the method comprising:
    a) selecting a net having a plurality of routable elements;
    b) defining a route for the net by using a wiring model that specifies preferred non-Manhattan wiring directions, and using a manufacturing grid as the only grid for constraining location of interconnect lines for connecting the net's routable elements.

11. The method of claim 10, wherein the wiring model specifies horizontal, vertical and ±45 degree diagonal lines.

12. The method of claim 10 further comprising using design rules to constrain the location of interconnect lines for connecting the net's routable elements.

13. The method of claim 12, wherein the design rules specify minimum spacing between routes.

14. The method of claim 12, wherein the design rules specify minimum spacing between routes and layout items unrelated to the routes.

15. The method of claim 10, wherein using the manufacturing grid comprises using the manufacturing grid as the only grid for defining a set of vertices that define the route.

16. The method of claim 15, wherein defining the set of vertices includes using design rules to define the boundary of a routing area that contains the set of vertices.

17. A computer readable medium comprising a computer program having executable code, the computer program for routing nets in a region of an integrated-circuit layout, the computer program comprising sets of instructions for:
    a) selecting a net having a plurality of routable elements;
    b) defining a route for the net by using a wiring model that specifies non-Manhattan wiring directions, and using a manufacturing grid as the only grid for constraining location of interconnect lines for connecting the net's routable elements.

18. The computer readable medium of claim 17, wherein the wiring model specifies horizontal, vertical and ±45 degree diagonal lines.

19. The computer readable medium of claim 17, wherein the computer program further comprises a set of instructions for using design rules to constrain the location of interconnect lines for connecting the net's routable elements.

20. The computer readable medium of claim 17, wherein the set of instructions for using the manufacturing grid comprises a set of instructions for using the manufacturing grid as the only grid for defining a set of vertices that define the route.

21. The computer readable medium of claim 20, wherein the set of instructions for defining the set of vertices includes a set of instructions for using design rules to define the boundary of a routing area that contains the set of vertices.

22. A method of manufacturing an integrated circuit, the integrated circuit having a plurality of wiring layers, the method comprising:
    a) specifying a layout for the integrated circuit by using a wiring model that specifies preferred non-Manhattan wiring directions, and using a manufacturing grid as the only grid for constraining location of interconnect lines for routable elements in the layout;
    b) using the layout to fabricate the integrated circuit.

23. The method of claim 22, wherein using the layout to fabricate the integrated circuit comprises using the layout to generate a mask for the particular wiring layer.

24. The method of claim 23, wherein the mask has patterns that are in shape of interconnect lines.

25. The method of claim 22, wherein the wiring model further specifies Manhattan wiring directions.

26. The method of claim 25, wherein the wiring model specifies Manhattan and non-Manhattan wiring directions on the same wiring layer.

27. A integrated circuit mask having etching patterns that are based on wiring a model that specifies preferred non-Manhattan wiring directions and that uses a manufacturing grid as the only grid for constraining location of the wiring.

28. The mask of claim 27, wherein the wiring model further specifies Manhattan wiring directions.

29. The mask of claim 28, wherein the wiring model specifies Manhattan and non-Manhattan wiring directions on a same wiring layer.

30. A integrated-circuit mask having etching patterns in non-Manhattan directions, wherein the etching patterns of the mask align with a manufacturing grid, wherein the manufacturing grid is the only grid with which the mask's etching pattern aligns.

31. The mask of claim 30 further having etching patterns in Manhattan direction.

* * * * *

UNITED STATES PATENT AND TRADEMARK OFFICE
CERTIFICATE OF CORRECTION

PATENT NO. : 6,957,411 B1
DATED : October 18, 2005
INVENTOR(S) : Steven Teig et al.

It is certified that error appears in the above-identified patent and that said Letters Patent is hereby corrected as shown below:

Title page,
Item [75], Inventors, "Etienne Jacques, Sunnyvale, CA (US)" should read -- Etienne Jacques, Palo Alto, CA (FR) --.

Column 106,
Line 57, "in Manhattan direction." should read -- in Manhattan directions. --.

Signed and Sealed this

Twenty-fourth Day of January, 2006

JON W. DUDAS
*Director of the United States Patent and Trademark Office*